US009698187B2

(12) United States Patent
Tomimatsu

(10) Patent No.: US 9,698,187 B2
(45) Date of Patent: Jul. 4, 2017

(54) METHOD FOR MANUFACTURING IMAGING APPARATUS, AND IMAGING APPARATUS

(71) Applicant: RENESAS ELECTRONICS CORPORATION, Koutou-ku, Tokyo (JP)

(72) Inventor: Takahiro Tomimatsu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/894,298

(22) PCT Filed: Jun. 14, 2013

(86) PCT No.: PCT/JP2013/066444
§ 371 (c)(1),
(2) Date: Nov. 25, 2015

(87) PCT Pub. No.: WO2014/199509
PCT Pub. Date: Dec. 18, 2014

(65) Prior Publication Data
US 2016/0111456 A1 Apr. 21, 2016

(51) Int. Cl.
*H01L 29/49* (2006.01)
*H01L 27/146* (2006.01)

(52) U.S. Cl.
CPC ...... *H01L 27/1463* (2013.01); *H01L 27/1462* (2013.01); *H01L 27/14612* (2013.01);
(Continued)

(58) Field of Classification Search
CPC ........... H01L 27/1463; H01L 27/14612; H01L 27/1462; H01L 27/14689
See application file for complete search history.

(56) References Cited

U.S. PATENT DOCUMENTS 6,657,267 B1 * 12/2003 Xiang ................. H01L 21/2652 257/213
6,686,248 B1 * 2/2004 Yu ..................... H01L 21/26586 257/408

(Continued)

FOREIGN PATENT DOCUMENTS

JP 2006-073885 A 3/2006
JP 2006-216615 A 8/2006

(Continued)

OTHER PUBLICATIONS

Itonaga, K. et al.; "Extremely-Low-Noise CMOS Image Sensor with High Saturation Capacity"; IEDM, Session 8.1; Dec. 5, 2011.

(Continued)

*Primary Examiner* — Michael Shingleton
(74) *Attorney, Agent, or Firm* — Shapiro, Gabor and Rosenberger, PLLC

(57) ABSTRACT

A gate electrode of a field effect transistor is formed. Next, an offset spacer film with a double-layer structure including a silicon oxide film as a lower-layer film and a silicon nitride film as an upper-layer film is formed on a sidewall surface of the gate electrode. The silicon nitride film serves as a supply source of an element for terminating dangling bonds of silicon in a device formation region. Next, treatment for leaving the offset spacer film intact or treatment for removing the silicon nitride film of the offset spacer film is performed. Thereafter, a sidewall insulating film is formed on the sidewall surface of the gate electrode.

12 Claims, 126 Drawing Sheets

(52) U.S. Cl.
CPC .. *H01L 27/14614* (2013.01); *H01L 27/14689* (2013.01); *H01L 27/14643* (2013.01)

(56) References Cited

U.S. PATENT DOCUMENTS

| | | | |
|---|---|---|---|
| 2010/0233861 | A1 | 9/2010 | Kimizuka et al. |
| 2012/0037968 | A1 | 2/2012 | Yutani et al. |
| 2012/0175707 | A1 | 7/2012 | Jung |

FOREIGN PATENT DOCUMENTS

| | | | |
|---|---|---|---|
| JP | 2007-294540 | A | 11/2007 |
| JP | 2009-026848 | A | 2/2009 |
| JP | 2009-212339 | A | 9/2009 |
| JP | 2010-212536 | A | 9/2010 |
| JP | 2010-283859 | A | 12/2010 |
| JP | 2011-155248 | A | 8/2011 |
| WO | WO 2010/122657 | A1 | 10/2010 |

OTHER PUBLICATIONS

International Search Report from International Patent Application No. PCT/JP2013/066444, Jul. 16, 2013.

Office Action issued Sep. 27, 2016, in Japanese Patent Application No. 2015-522366.

Office Action issued Mar. 28, 2017, in Japanese Patent Application No. 2015-522366.

* cited by examiner

METHOD FOR MANUFACTURING IMAGING APPARATUS, AND IMAGING APPARATUS

TECHNICAL FIELD

The present invention relates to a method for manufacturing an imaging apparatus, and an imaging apparatus. In particular, the present invention can be suitably used for a method for manufacturing an imaging apparatus including a photodiode for an image sensor.

BACKGROUND ART

An imaging apparatus including, for example, a CMOS (Complementary Metal Oxide Semiconductor) image sensor is applied to a digital camera or the like. In such an imaging apparatus, there are formed a pixel region in which a photodiode for converting incident light into a charge is arranged, and a peripheral region in which peripheral circuits for processing or otherwise handling the charge converted by the photodiode as an electrical signal are arranged. In the pixel region, the charge generated in the photodiode is transferred by a transfer transistor to a floating diffusion region. The transferred charge is converted by an amplification transistor into an electrical signal, is output as an image signal, and the output image signal is processed in the peripheral region.

In the pixel region and the peripheral region, a semiconductor device such as a photodiode or a field effect transistor is formed in a device formation region defined by a device isolation region. In recent years, so-called trench isolation (STI: Shallow Trench Isolation) is adopted for a device isolation region, in order to accommodate miniaturization of imaging apparatuses.

CITATION LIST

Non Patent Document

NPD 1: K. Itonaga, et al., "Extremely-Low-Noise CMOS Image Sensor with High Saturation Capacity", IEDM, Session 8.1 (Dec. 5, 2011).

SUMMARY OF INVENTION

Technical Problem

Conventional imaging apparatuses adopting trench isolation (STI) have a problem about read-out noise.

Namely, NPD 1 reports that, in an imaging apparatus adopting device isolation by pn junction as device isolation, read-out noise increases substantially linearly as the width of a transistor within a pixel becomes shorter, whereas in an imaging apparatus adopting trench isolation (STI), read-out noise increases exponentially when the channel width of a field effect transistor within a pixel becomes shorter than 0.3 μm. As read-out noise increases, the SN ratio (Signal-to-Noise ratio) worsens, and image sharpness, contrast, a feeling of depth of color, and the like are lost.

Other problems and new features will become clear from the description of the present specification and the attached drawings.

Solution to Problem

With a method for manufacturing an imaging apparatus in accordance with one embodiment, in the step of forming a semiconductor device in each of a plurality of device formation regions defined by forming a device isolation insulating film in trenches, a photoelectric conversion portion and a transistor having a gate electrode portion are formed. The step of forming the gate electrode portion includes the steps of: forming a gate electrode; forming a film which is to be an offset spacer film having a first insulating film as a lower-layer film and a predetermined film different from the first insulating film as an upper-layer film, to cover the gate electrode; forming the offset spacer film including at least the first insulating film, on a sidewall surface of the gate electrode, by working the film which is to be the offset spacer film; and forming a sidewall insulating film on the sidewall surface of the gate electrode, with said offset spacer film being interposed therebetween. In the step of forming the film which is to be the offset spacer film, a film containing at least one of nitrogen (N) and hydrogen (H) as an element for terminating dangling bonds in a predetermined device formation region is formed as the predetermined film. In the step of forming the offset spacer film, the first insulating film is worked to leave a first portion which covers the sidewall surface of the gate electrode, and a second portion which extends from a lower end portion of the first portion to a side opposite to a side on which the gate electrode is located, and covers a surface of the predetermined device formation region. In the step of forming the sidewall insulating film, the sidewall insulating film is formed to cover an end surface of the second portion of the first insulating film.

An imaging apparatus in accordance with another embodiment has a plurality of device formation regions defined by a trench isolation insulating film, and a semiconductor device formed in each of the plurality of device formation regions. The semiconductor device includes a photoelectric conversion portion, and a transistor having a gate electrode portion. The gate electrode portion includes a gate electrode, an offset spacer film having at least a first insulating film, and a sidewall insulating film. The first insulating film of the offset spacer film includes a first portion which covers a sidewall surface of the gate electrode, and a second portion which extends from a lower end portion of the first portion to a side opposite to a side on which the gate electrode is located, and covers a surface of a predetermined device formation region. The sidewall insulating film is formed to cover an end surface of the second portion of the first insulating film.

Advantageous Effects of Invention

According to the method for manufacturing the imaging apparatus in accordance with one embodiment, an imaging apparatus which achieves a reduction in read-out noise can be manufactured.

According to the imaging apparatus in accordance with the other embodiment, a reduction in read-out noise can be achieved.

BRIEF DESCRIPTION OF DRAWINGS

FIG. 63A is a cross sectional view of the pixel region and the like showing a step performed after the step shown in FIGS. 62A and 62B in the same embodiment.

FIG. 63B is a cross sectional view of the peripheral region showing the step performed after the step shown in FIGS. 62A and 62B in the same embodiment.

FIG. 64A is a cross sectional view of the pixel region and the like showing a step performed after the step shown in FIGS. 63A and 63B in the same embodiment.

FIG. 64B is a cross sectional view of the peripheral region showing the step performed after the step shown in FIGS. 63A and 63B in the same embodiment.

FIG. 65A is a cross sectional view of the pixel region and the like showing a step performed after the step shown in FIGS. 64A and 64B in the same embodiment.

FIG. 65B is a cross sectional view of the peripheral region showing the step performed after the step shown in FIGS. 64A and 64B in the same embodiment.

FIG. 66A is a cross sectional view of the pixel region and the like showing a step performed after the step shown in FIGS. 65A and 65B in the same embodiment.

FIG. 66B is a cross sectional view of the peripheral region showing the step performed after the step shown in FIGS. 65A and 65B in the same embodiment.

FIG. 67A is a cross sectional view of the pixel region and the like showing a step performed after the step shown in FIGS. 66A and 66B in the same embodiment.

FIG. 67B is a cross sectional view of the peripheral region showing the step performed after the step shown in FIGS. 66A and 66B in the same embodiment.

FIG. 68A is a cross sectional view of the pixel region and the like showing a step performed after the step shown in FIGS. 67A and 67B in the same embodiment.

FIG. 68B is a cross sectional view of the peripheral region showing the step performed after the step shown in FIGS. 67A and 67B in the same embodiment.

Figure 68A:
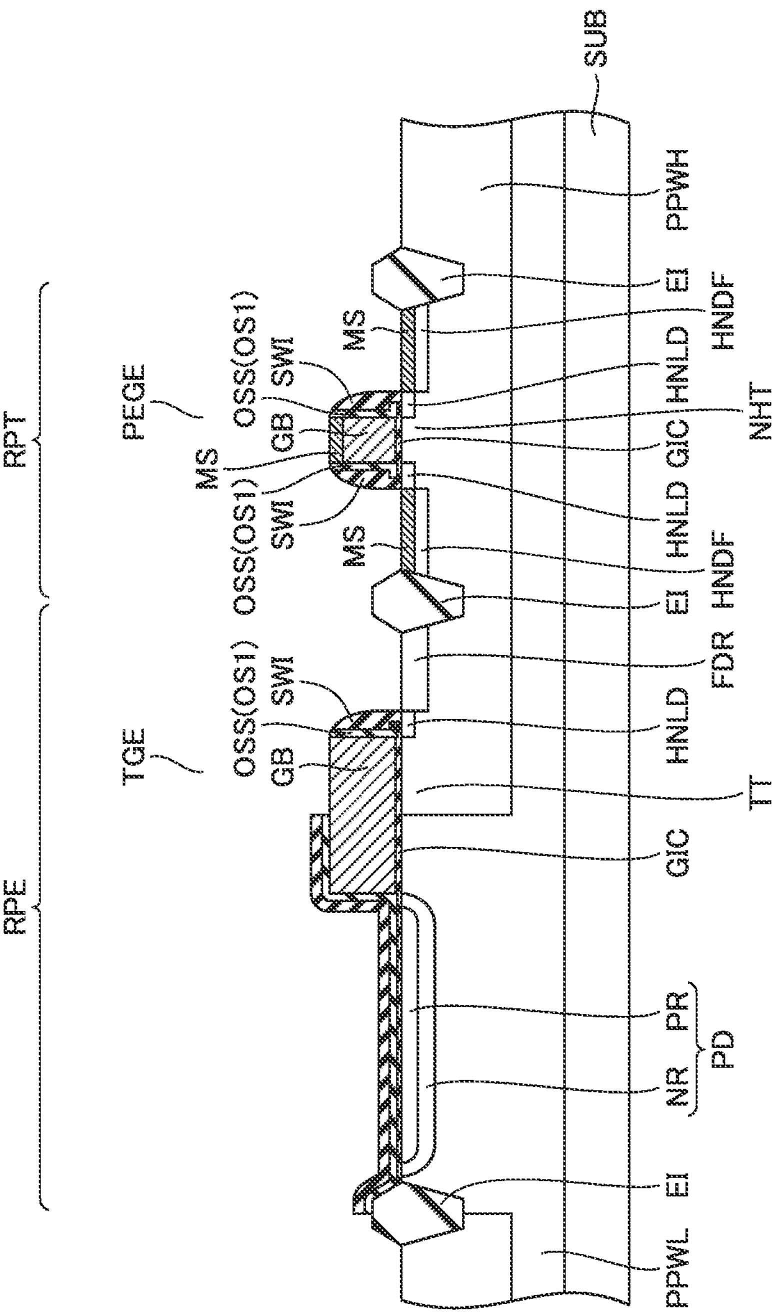
Figure 68B:
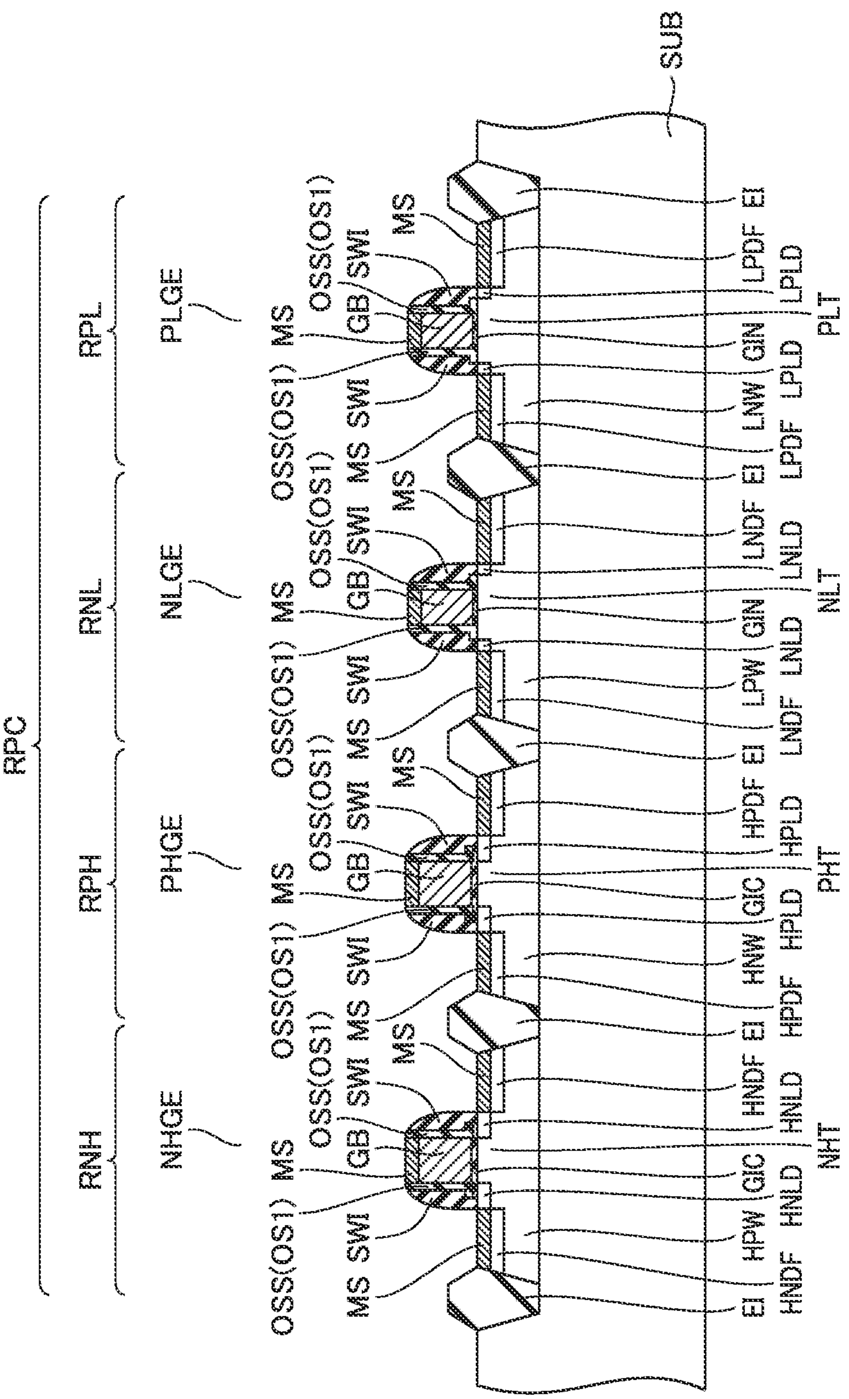
Figure 69A:
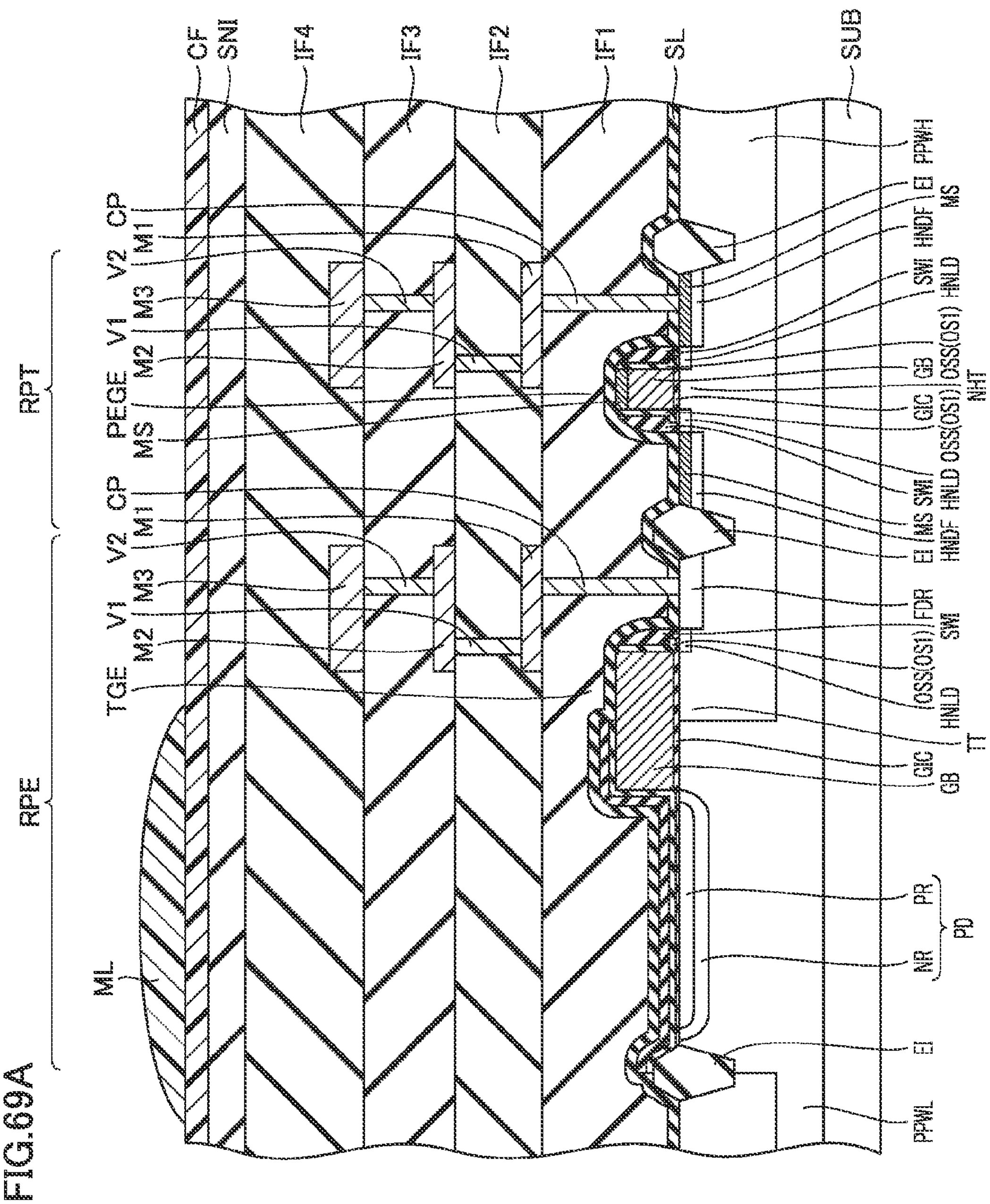

FIG. 69A is a cross sectional view of the pixel region and the like showing a step performed after the step shown in FIGS. 68A and 68B in the same embodiment.

Figure 69B:
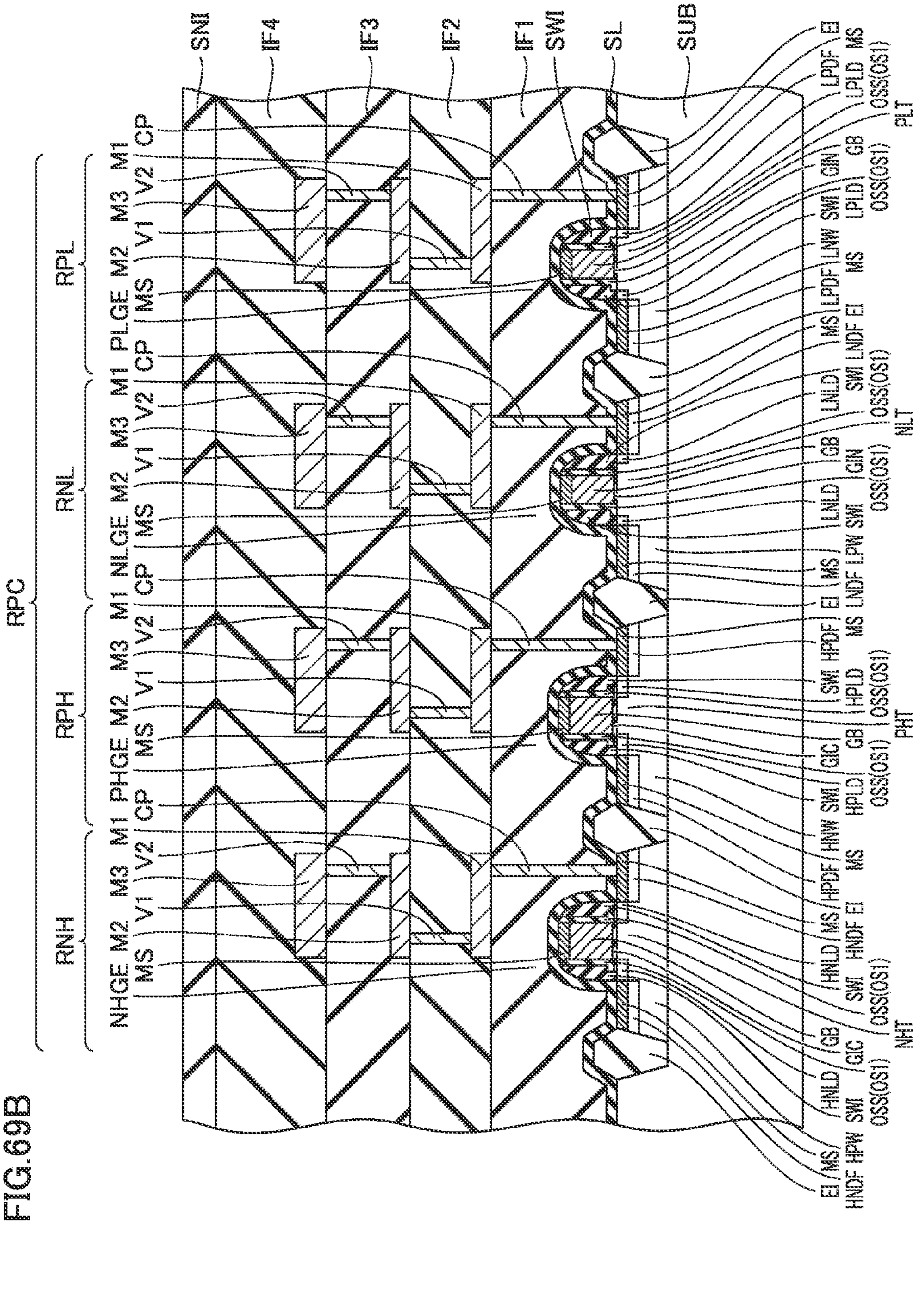

FIG. 69B is a cross sectional view of the peripheral region showing the step performed after the step shown in FIGS. 68A and 68B in the same embodiment.

DESCRIPTION OF EMBODIMENTS

Figure 1:
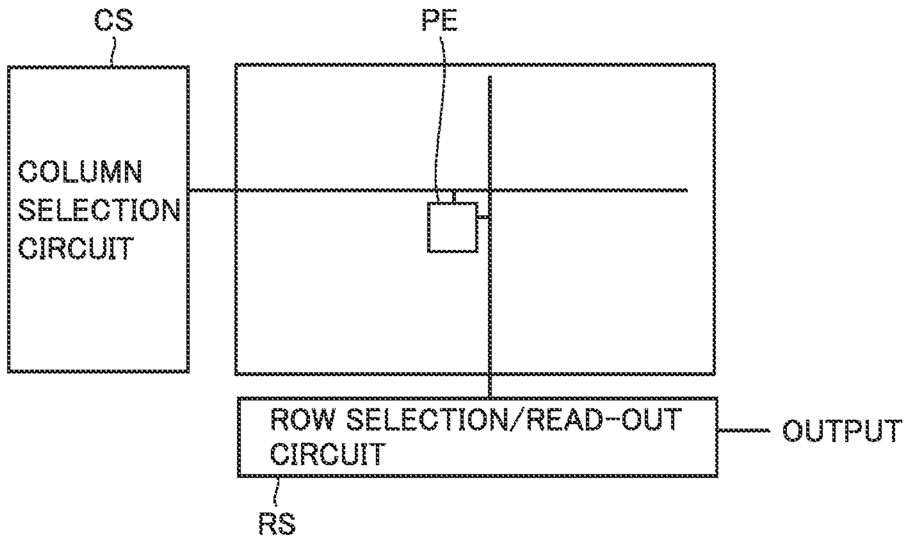
FIG. 1 is a block diagram showing a circuit in a pixel region in an imaging apparatus in accordance with each embodiment.
Figure 2:
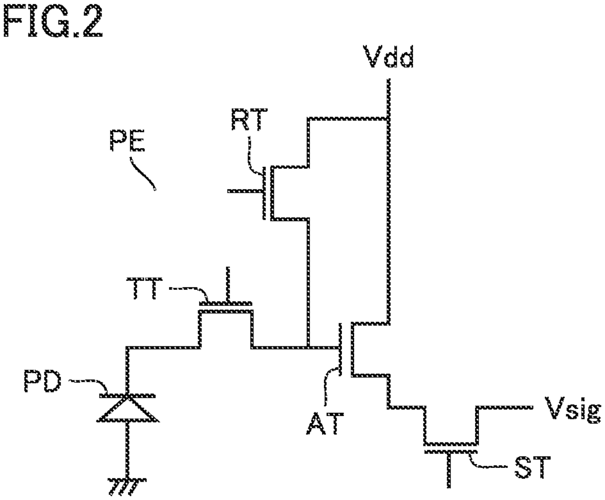
FIG. 2 is a view showing an equivalent circuit in one pixel region of the imaging apparatus in accordance with each embodiment.

First, an overall configuration (circuit) of an imaging apparatus will be described. The imaging apparatus is constituted of a plurality of pixels arranged in a matrix. As shown in FIG. 1, a column selection circuit CS and a row selection/read-out circuit RS are connected to a pixel PE. It should be noted that FIG. 1 shows one pixel PE of the plurality of pixels for simplification of the drawing. As shown in FIG. 2, that pixel is provided with a photodiode PD, a transfer transistor TT, an amplification transistor AT, a selection transistor ST, and a reset transistor RT.

In photodiode PD, light from an object is accumulated as a charge. Transfer transistor TT transfers the charge to a floating diffusion region (not shown). Before the charge is transferred to the floating diffusion region, reset transistor RT resets a charge in the floating diffusion region. The charge transferred to the floating diffusion region is input to a gate electrode of amplification transistor AT, converted into a voltage (Vdd), and amplified. When a signal for selecting a specific row of the pixel is input to a gate electrode of selection transistor ST, the signal converted into a voltage is read out as an image signal (Vsig).

Figure 3:
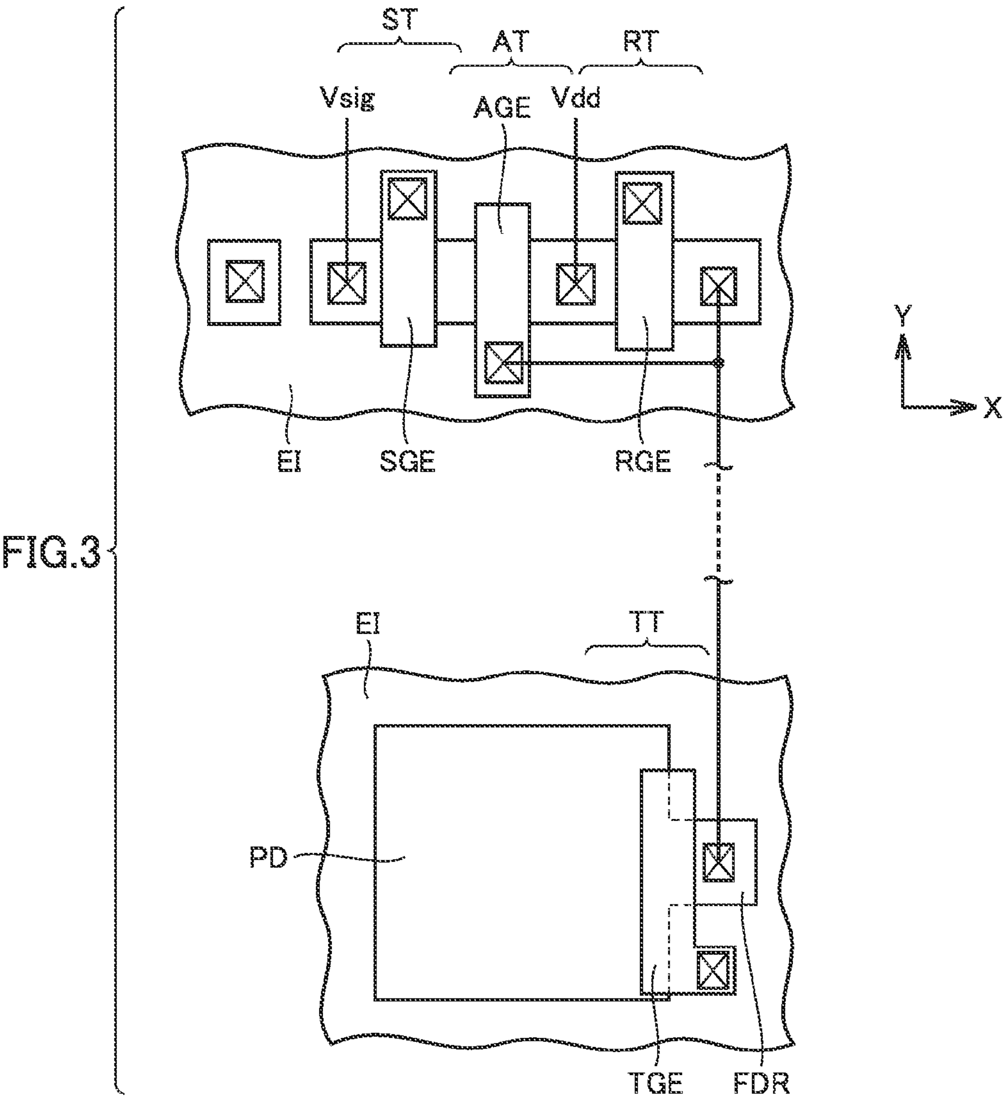
FIG. 3 is a partial plan view showing an example of a planar layout of the pixel region of the imaging apparatus in accordance with each embodiment.

Next, an example of a planar structure of the imaging apparatus will be described. As shown in FIG. 3, photodiode PD and transfer transistor TT are formed in one device formation region defined by a device isolation insulating film EI. Photodiode PD is formed in a portion of the device formation region located on one side, and a floating diffusion region FDR is formed in a portion of the device formation region located on the other side, with a gate electrode portion TGE of transfer transistor TT being sandwiched therebetween.

Reset transistor RT, amplification transistor AT, and selection transistor ST are formed in another device formation region defined by device isolation insulating film EI. A gate electrode portion RGE of reset transistor RT, a gate electrode portion AGE of amplification transistor AT, and a gate electrode portion SGE of selection transistor ST are arranged to traverse the other device formation region with being spaced from each other. Gate electrode portion AGE of amplification transistor AT and a source/drain region of reset transistor RT are electrically connected to floating diffusion region FDR.

Next, a summary of a method for manufacturing the imaging apparatus will be described. In the method for manufacturing the imaging apparatus in accordance with each embodiment, an offset spacer film with a double-layer structure including a silicon nitride film, as an example of a predetermined film containing an element for terminating dangling bonds of silicon, is formed as an offset spacer film. Further, the method for manufacturing the imaging apparatus is divided into two cases: i.e., the case of forming a sidewall insulating film with a double-layer structure, and the case of forming a sidewall insulating film with a single-layer structure, as a sidewall insulating film.

Figure 4:
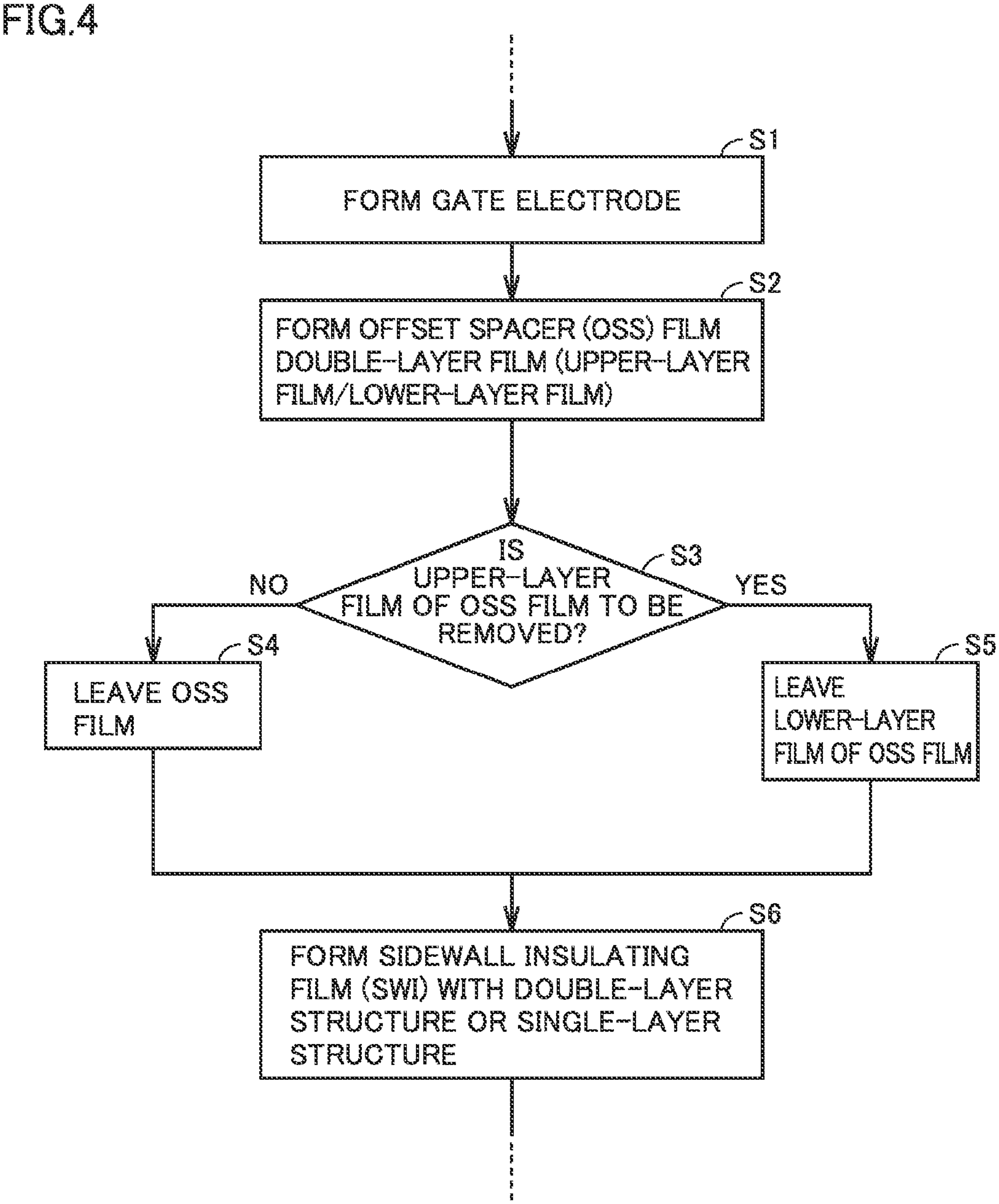
FIG. 4 is a partial flowchart showing a main part in a method for manufacturing the imaging apparatus in accordance with each embodiment.

FIG. 4 shows a flowchart of main steps thereof. A gate electrode of a field effect transistor including an amplification transistor and a transfer transistor is formed (step S1). Next, an offset spacer film is formed on a sidewall surface of the gate electrode (step S2). The offset spacer film has a double-layer structure including a silicon oxide film (a lower-layer film) and a silicon nitride film (an upper-layer film). The silicon nitride film serves as a supply source of an element (mainly nitrogen (N) and hydrogen (H)) for terminating dangling bonds of silicon (Si) of a Si (111) plane at an end portion of trench isolation (STI) which defines a device formation region.

Next, treatment for leaving the offset spacer film intact or treatment for removing the upper-layer film (silicon nitride film) of the offset spacer film is performed (step S3, step S4, step S5). Thereafter, a sidewall insulating film is formed on the sidewall surface of the gate electrode (step S6). In this step, the method is divided into two cases: i.e., the case of forming a sidewall insulating film with a double-layer structure including a silicon oxide film (a lower-layer film) and a silicon nitride film (an upper-layer film), and the case of forming a sidewall insulating film with a single-layer structure made of a silicon nitride film.

Hereinafter, variations of a method for manufacturing the offset spacer film and the sidewall insulating film will be specifically described in each embodiment.

First Embodiment

Here, a description will be given of a case where a sidewall insulating film with a double-layer structure is formed, with an offset spacer film with a double-layer structure being left intact.

First, device formation regions are defined by trench isolation. A silicon oxide film TOF and a silicon nitride film TNF are formed to cover a semiconductor substrate (SUB) (see FIG. 5A, FIG. 5B). Next, silicon oxide film TOF and silicon nitride film TNF are subjected to predetermined photolithographic treatment and working, and thereby silicon nitride film TNF and silicon oxide film TOF are patterned to cover each region in which a semiconductor device such as a field effect transistor is to be formed (a device formation region) and to expose each region in which a trench is to be formed.

Figure 5A:
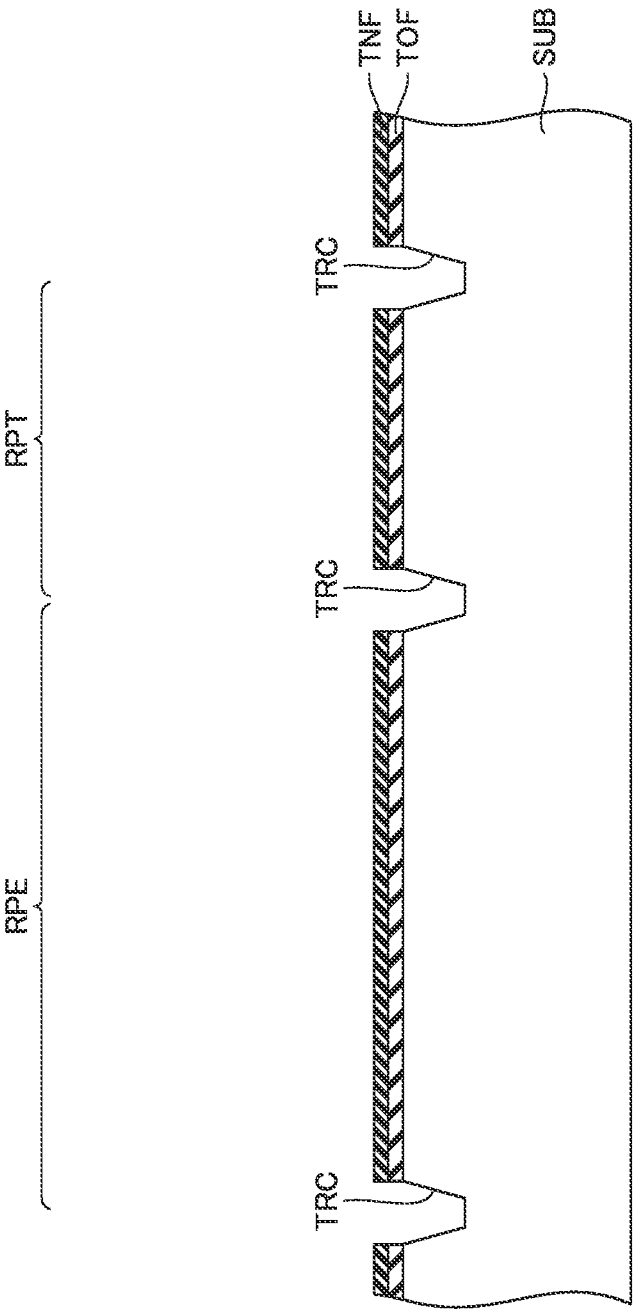
FIG. 5A is a cross sectional view of a pixel region and the like showing one step of a method for manufacturing an imaging apparatus in accordance with a first embodiment.
Figure 5B:
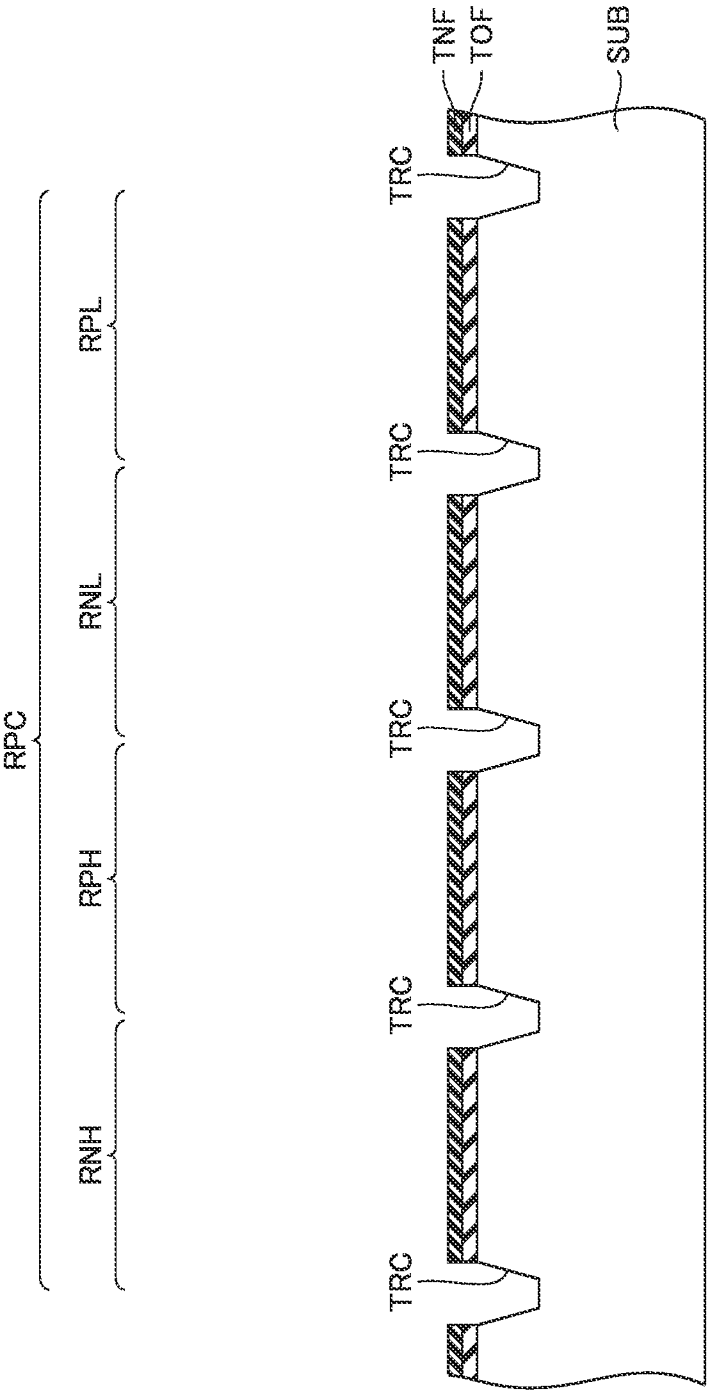
FIG. 5B is a cross sectional view of a peripheral region showing the one step of the method for manufacturing the imaging apparatus in accordance with the first embodiment.
Figure 6A:
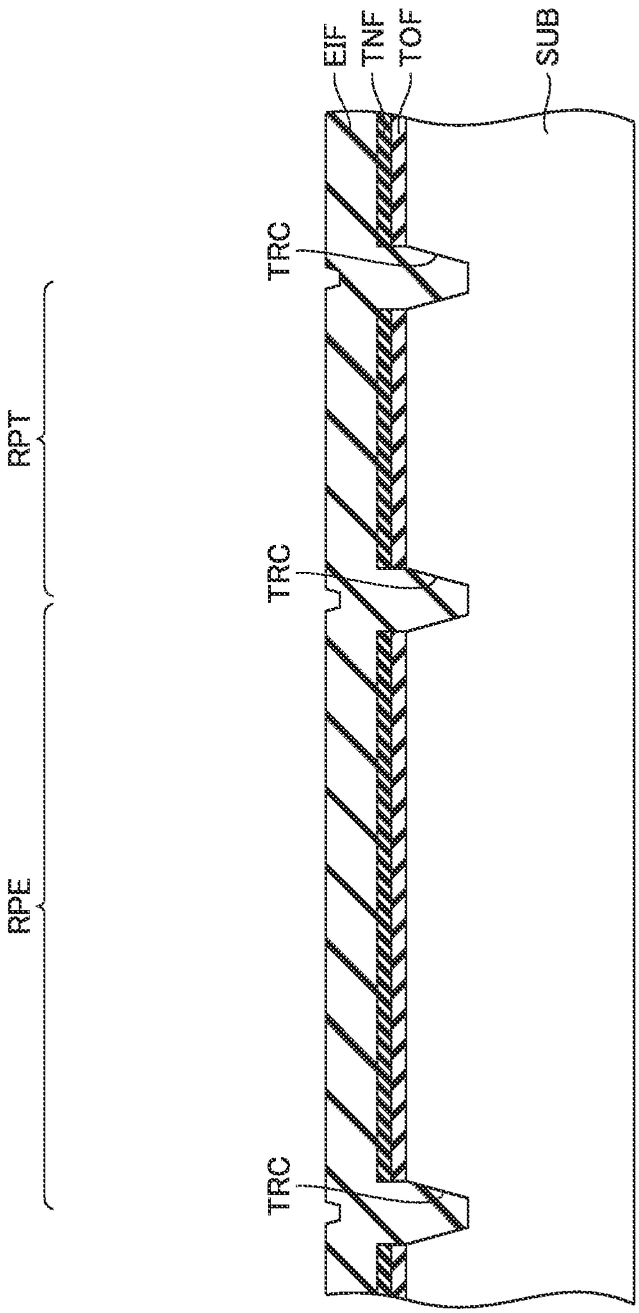
FIG. 6A is a cross sectional view of the pixel region and the like showing a step performed after the step shown in FIGS. 5A and 5B in the same embodiment.
Figure 6B:
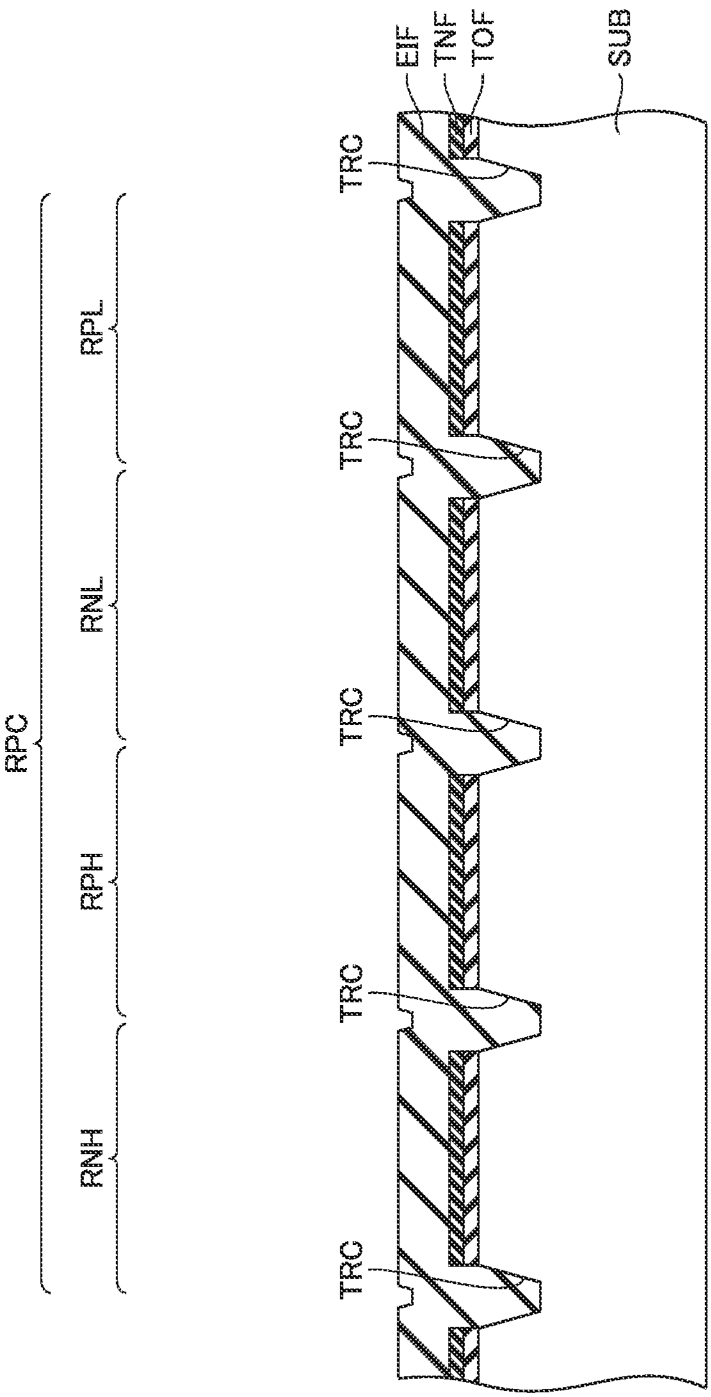
FIG. 6B is a cross sectional view of the peripheral region showing the step performed after the step shown in FIGS. 5A and 5B in the same embodiment.

Next, using patterned silicon nitride film TNF and silicon oxide film TOF as a mask, etching treatment is performed on semiconductor substrate SUB (silicon), and thereby trenches TRC having a predetermined depth are formed as shown in FIG. 5A and FIG. 5B. Next, an insulating film EIF which is to be a device isolation insulating film made of, for example, a silicon oxide film is formed to cover semiconductor substrate SUB, in a manner to fill trenches TRC, as shown in FIG. 6A and FIG. 6B.

Figure 7A:
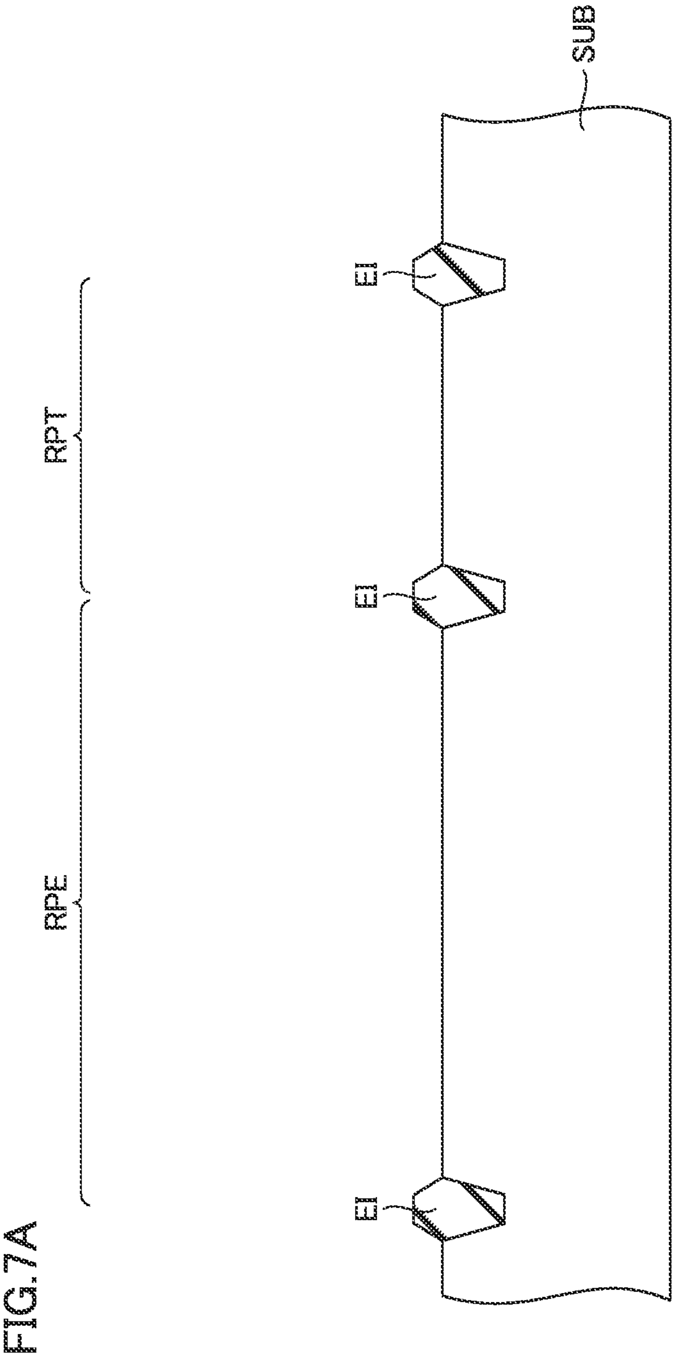
FIG. 7A is a cross sectional view of the pixel region and the like showing a step performed after the step shown in FIGS. 6A and 6B in the same embodiment.
Figure 7B:
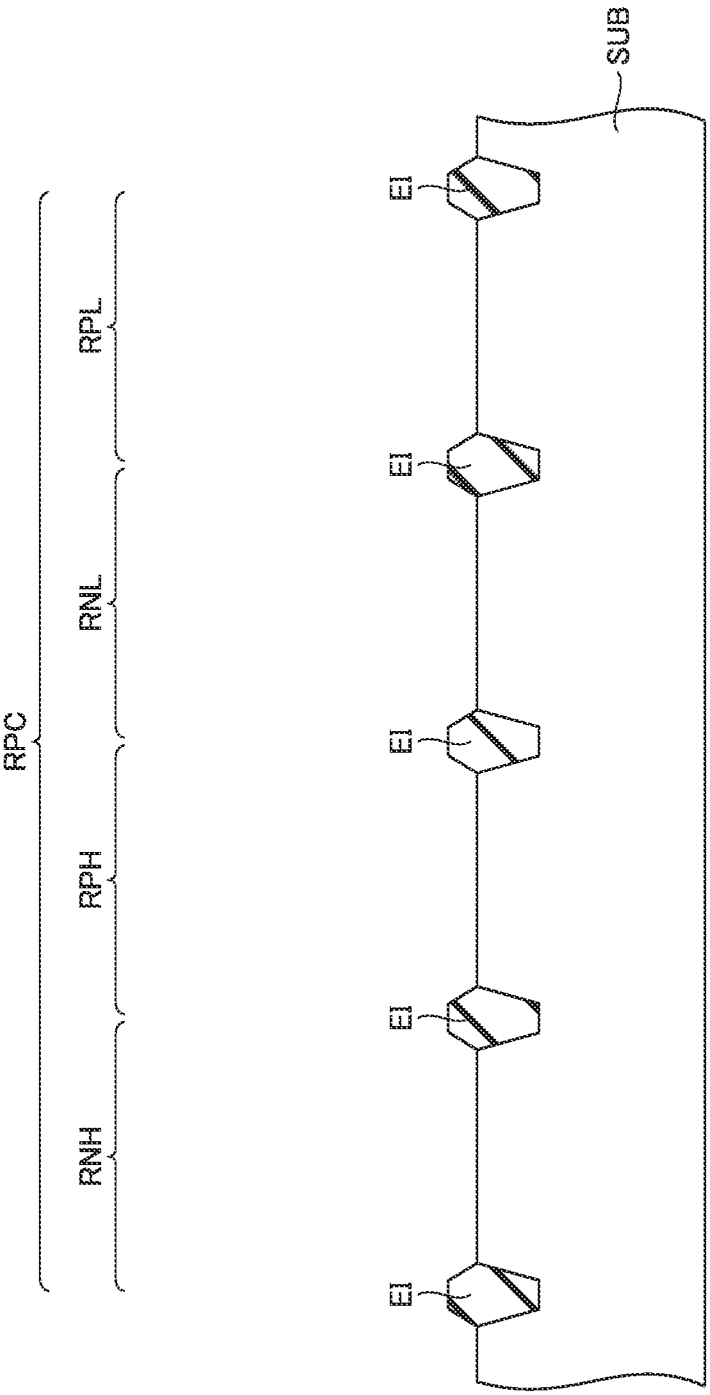
FIG. 7B is a cross sectional view of the peripheral region showing the step performed after the step shown in FIGS. 6A and 6B in the same embodiment.

Next, a portion of insulating film EIF located on an upper surface of semiconductor substrate SUB is removed for example by chemical mechanical polishing (CMP), with portions of insulating film EIF located in trenches TRC being left. Next, remaining silicon nitride film TNF and silicon oxide film TOF are removed by predetermined etching treatment. Thereby, device isolation insulating films EI are formed as shown in FIG. 7A and FIG. 7B.

Device isolation insulating films EI define a pixel region RPE, a pixel transistor region RPT, a peripheral region RPC, and the like, as device formation regions. A photodiode and a transfer transistor are to be formed in pixel region RPE. A reset transistor, an amplification transistor, and a selection transistor are to be formed in pixel transistor region RPT. It should be noted that, for simplification of the drawings as drawings showing steps, these transistors will be represented by one transistor.

In peripheral region RPC, regions RNH, RPH, RNL, and RPL are further defined as regions in which respective field effect transistors are to be formed. In region RNH, an n-channel type field effect transistor driven at a relatively high voltage (for example, about 3.3 V) is to be formed. Further, in region RPH, a p-channel type field effect transistor driven at a relatively high voltage (for example, about 3.3 V) is to be formed. In region RNL, an n-channel type field effect transistor driven at a relatively low voltage (for example, about 1.5 V) is to be formed. Further, in region RPL, a p-channel type field effect transistor driven at a relatively low voltage (for example, about 1.5 V) is to be formed.

Figure 8A:
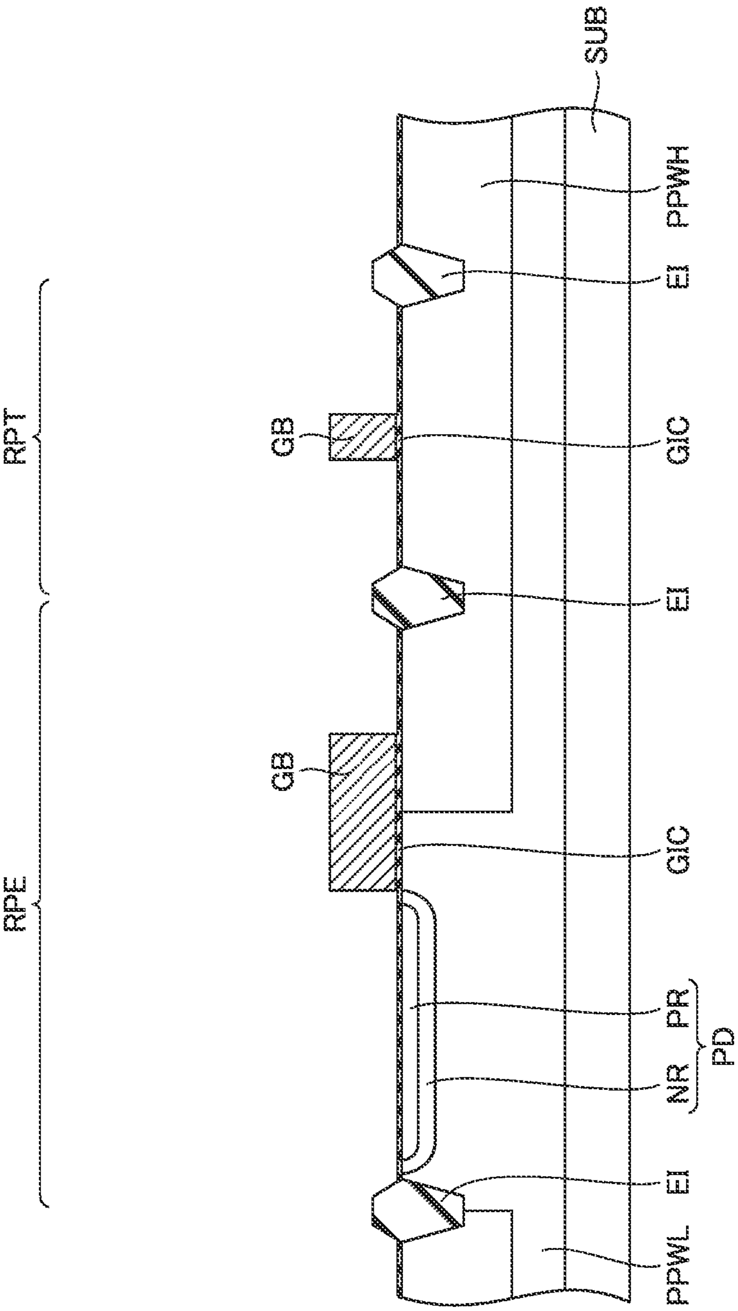
FIG. 8A is a cross sectional view of the pixel region and the like showing a step performed after the step shown in FIGS. 7A and 7B in the same embodiment.
Figure 8B:
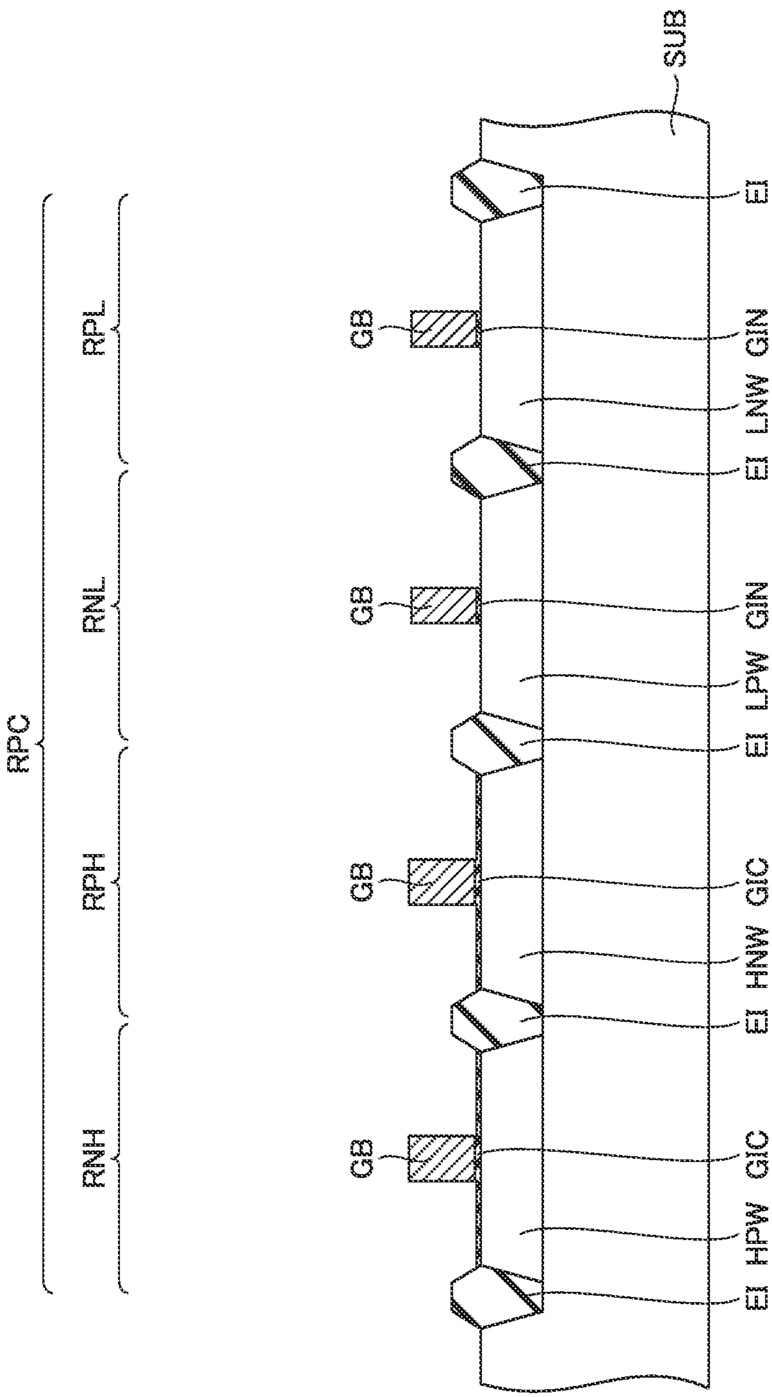
FIG. 8B is a cross sectional view of the peripheral region showing the step performed after the step shown in FIGS. 7A and 7B in the same embodiment.

Next, the step of forming a predetermined resist pattern (not shown) by photolithographic treatment, and the step of implanting an impurity having a predetermined conductivity type by using the resist pattern as an implantation mask are sequentially performed, and thereby a well having the predetermined conductivity type is each formed. As shown in FIG. 8A and FIG. 8B, a P well PPWL and a P well PPWH are formed in pixel region RPE and pixel transistor region RPT. P wells HPW, LPW and N wells HNW, LNW are formed in peripheral region RPC.

The impurity concentration in P well PPWL is lower than the impurity concentration in P well PPWH. P well PPWH is formed in a region which extends from a surface of semiconductor substrate SUB to a position shallower than P well PPWL. P wells HPW, LPW and N wells HNW, LNW are each formed from the surface of semiconductor substrate SUB to a predetermined depth.

Figure 9A:
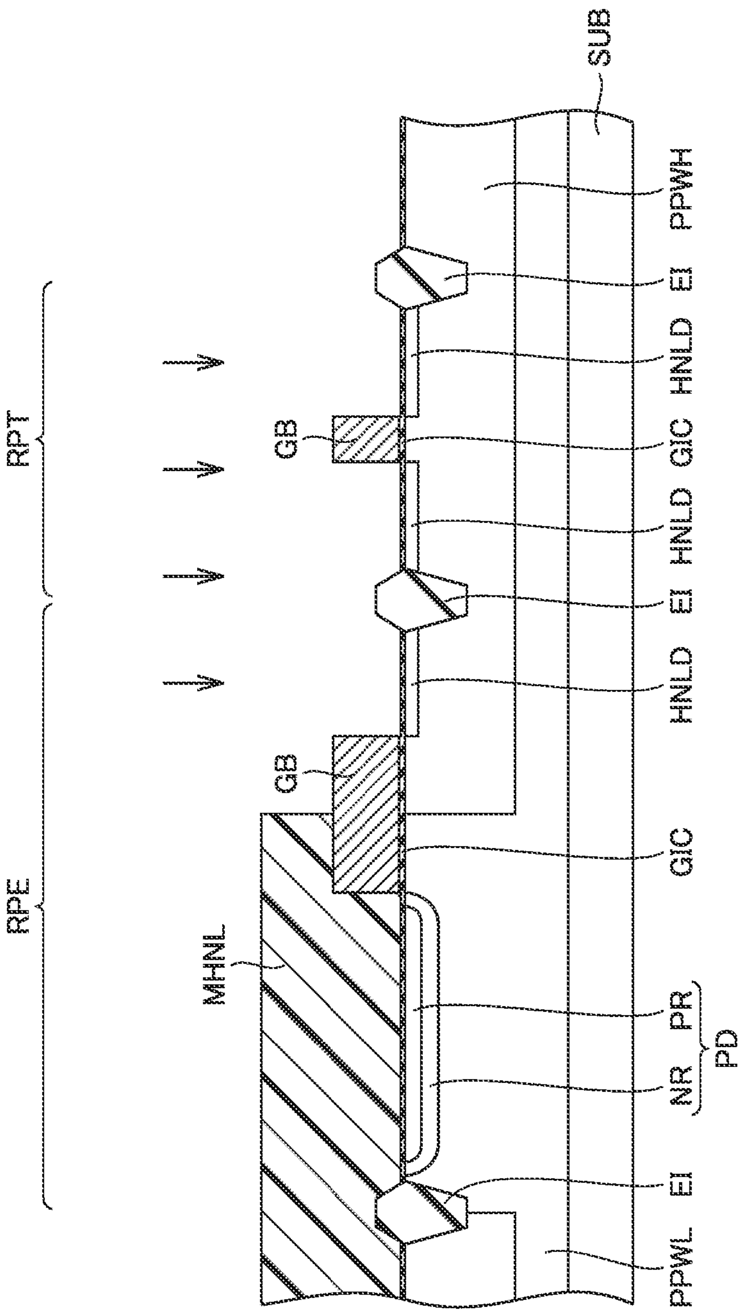
FIG. 9A is a cross sectional view of the pixel region and the like showing a step performed after the step shown in FIGS. 8A and 8B in the same embodiment.
Figure 9B:
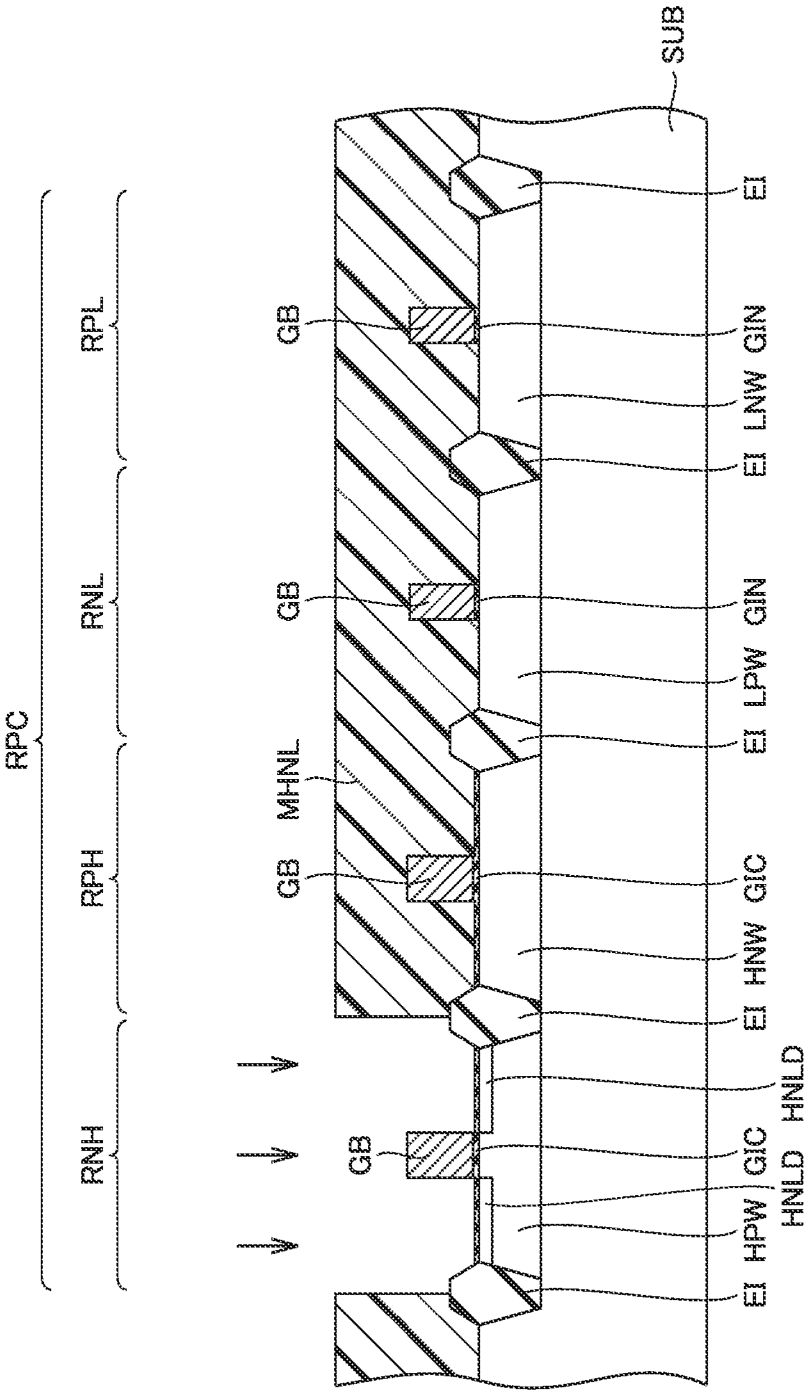
FIG. 9B is a cross sectional view of the peripheral region showing the step performed after the step shown in FIGS. 8A and 8B in the same embodiment.

Next, photodiode PD and a gate electrode GB are formed in pixel region RPE, and gate electrodes GB are formed in pixel transistor region RPT and peripheral region RPC. Here, as gate insulating films immediately below gate electrodes GB, a gate insulating film GIC having a relatively thick film thickness and a gate insulating film GIN having a relatively thin film thickness are formed. Next, extension (LDD) regions are formed in each of pixel transistor region RPT and regions RNH, RPH in which the field effect transistor driven at a relatively high voltage is to be formed. By performing predetermined photolithographic treatment, a resist pattern MHNL which exposes pixel transistor region RPT and region RNH and covers other regions is formed as shown in FIG. 9A and FIG. 9B.

Next, by implanting an n-type impurity using resist pattern MHNL and gate electrodes GB as an implantation mask, n-type extension regions HNLD are formed in each of exposed pixel transistor region RPT and region RNH. Further, in pixel region RPE, extension region HNLD is formed at a portion of P well PPWH on a side opposite to a side on which photodiode PD is formed, with gate electrode GB being sandwiched therebetween. Thereafter, resist pattern MHNL is removed.

Figure 10A:
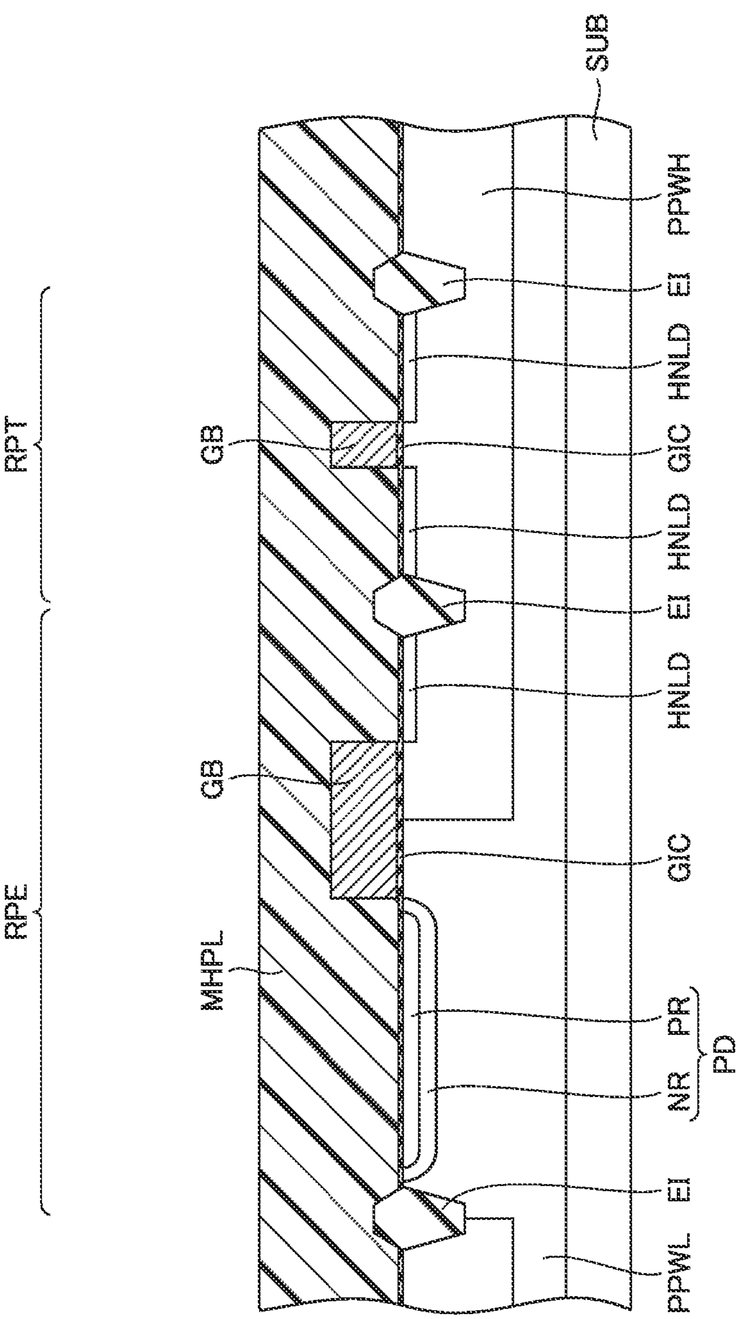
FIG. 10A is a cross sectional view of the pixel region and the like showing a step performed after the step shown in FIGS. 9A and 9B in the same embodiment.
Figure 10B:
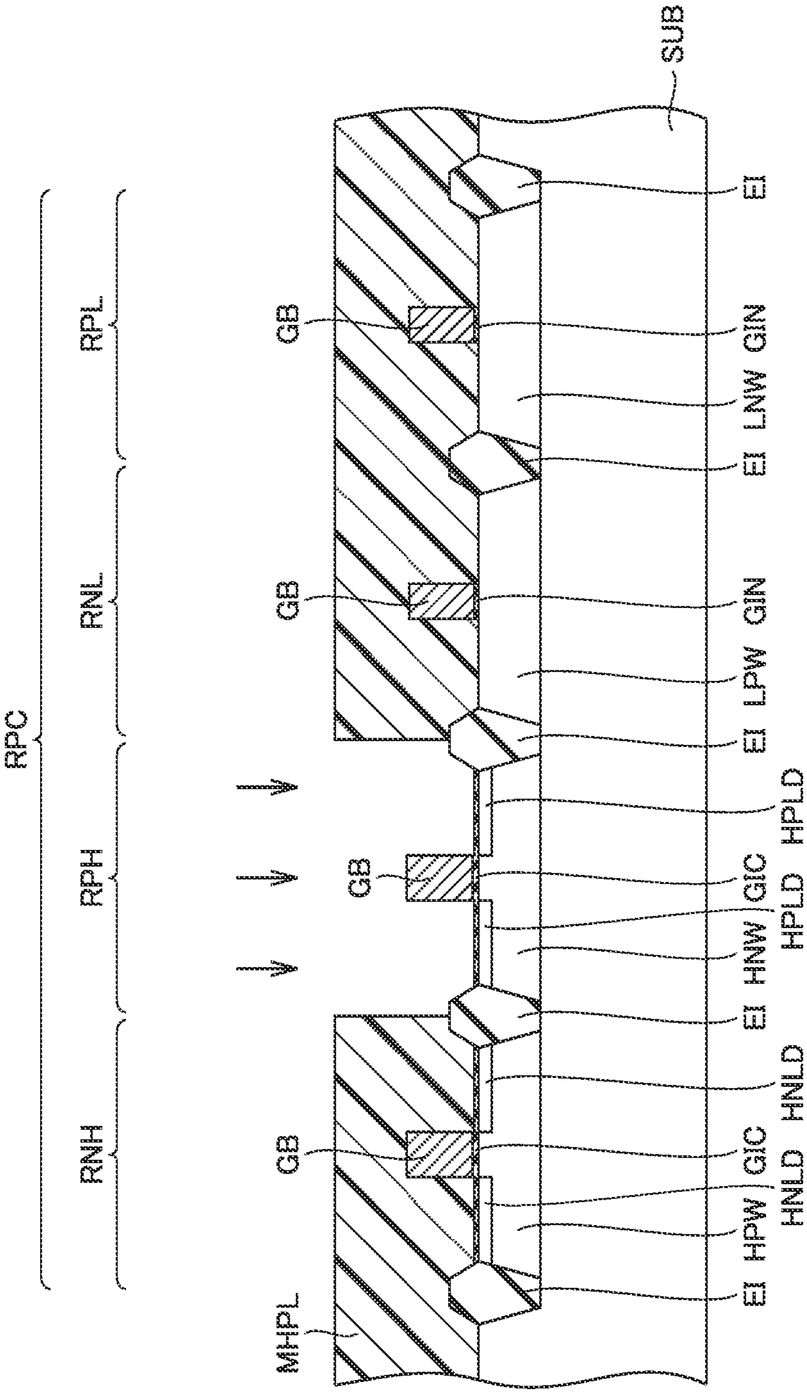
FIG. 10B is a cross sectional view of the peripheral region showing the step performed after the step shown in FIGS. 9A and 9B in the same embodiment.

Next, by performing predetermined photolithographic treatment, a resist pattern MHPL which exposes region RPH and covers other regions is formed as shown in FIG. 10A and FIG. 10B. Next, by implanting a p-type impurity using resist pattern MHPL and gate electrode GB as an implantation mask, p-type extension regions HPLD are formed in exposed region RPH. Thereafter, resist pattern MHPL is removed.

Figure 11A:
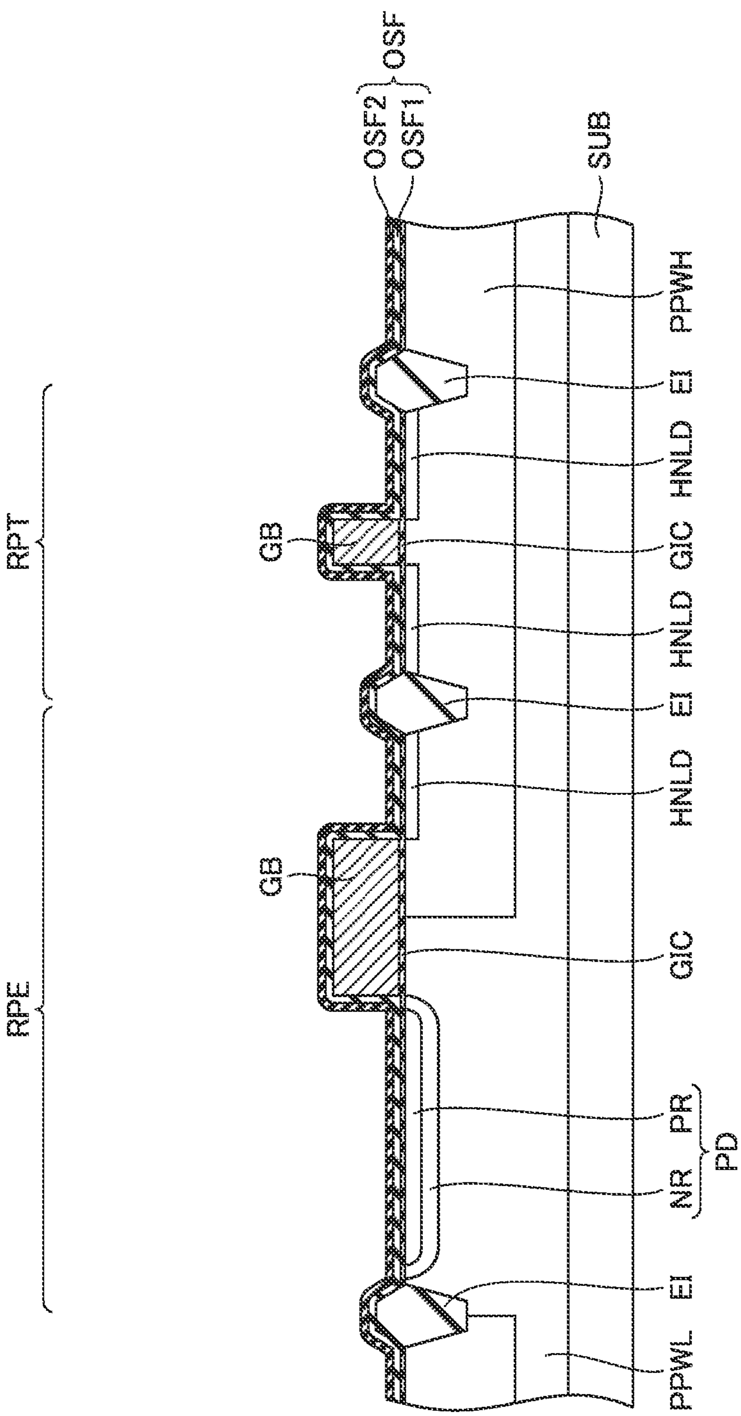
FIG. 11A is a cross sectional view of the pixel region and the like showing a step performed after the step shown in FIGS. 10A and 10B in the same embodiment.
Figure 11B:
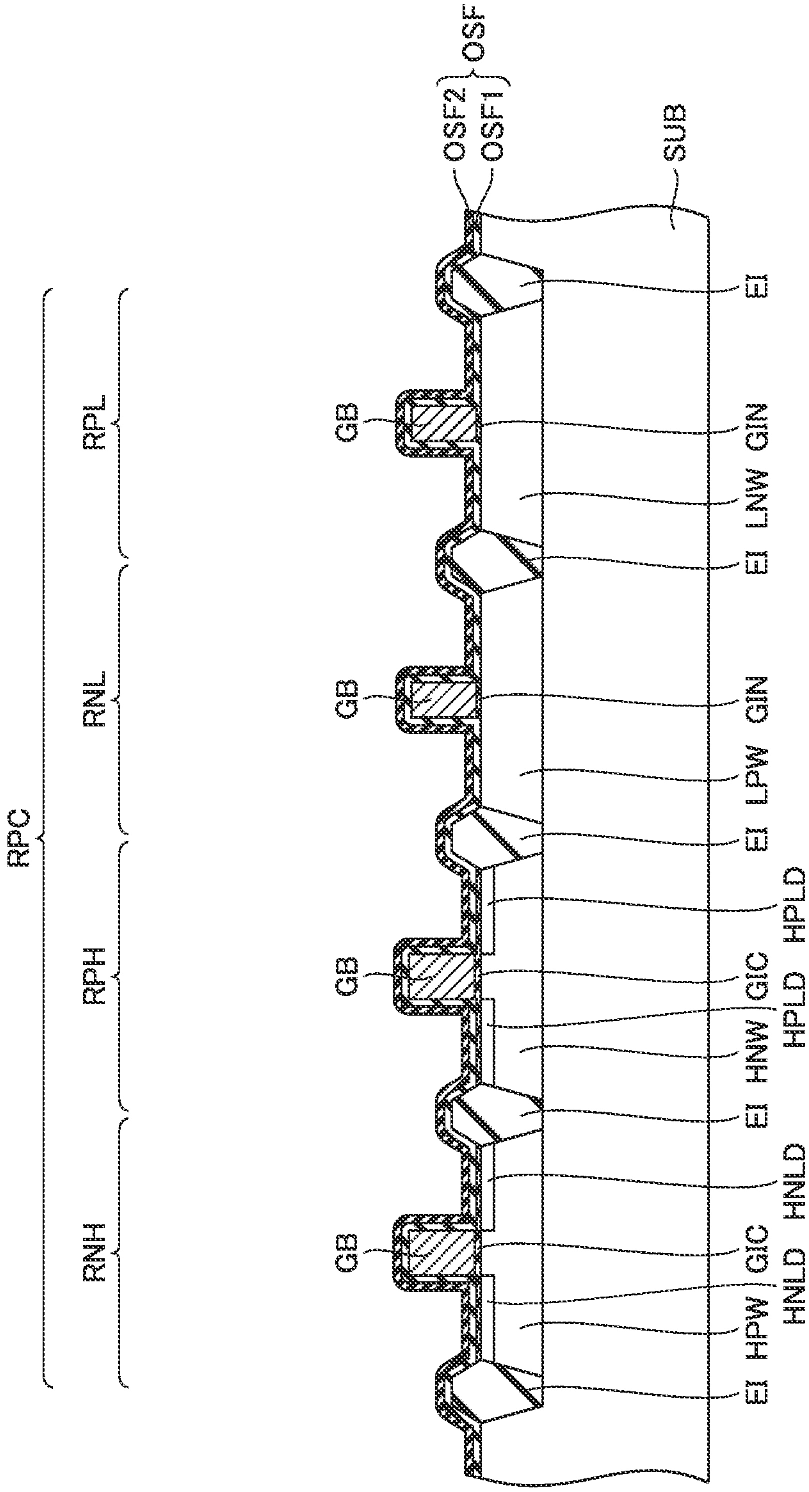
FIG. 11B is a cross sectional view of the peripheral region showing the step performed after the step shown in FIGS. 10A and 10B in the same embodiment.

Next, an insulating film OSF which is to be an offset spacer film is formed to cover gate electrodes GB, as shown in FIG. 11A and FIG. 11B. As insulating film OSF, first, a TEOS (Tetra Ethyl Ortho Silicate glass)-based silicon oxide film OSF1 is formed. Next, a silicon nitride film OSF2 is formed to cover silicon oxide film OSF1. When silicon nitride film OSF2 is formed, Hexa Chloro Disilane (HCD) is used, for example, as a source gas. Insulating film OSF has a film thickness of, for example, more than a dozen nanometers. It should be noted that, instead of forming the silicon nitride film using HCD, the silicon nitride film may be formed, for example, by an ALD (Atomic Layer Deposition) method by which atomic layers are deposited one by one.

Figure 12A:
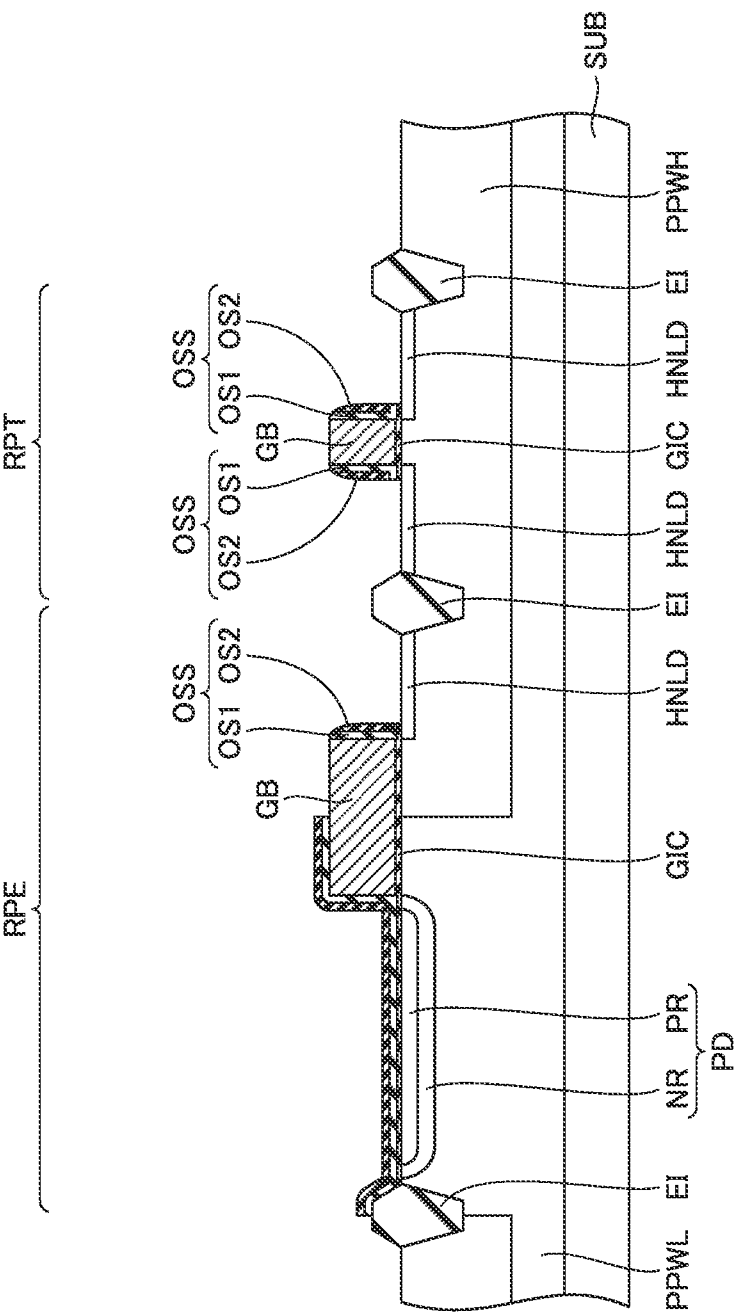
FIG. 12A is a cross sectional view of the pixel region and the like showing a step performed after the step shown in FIGS. 11A and 11B in the same embodiment.
Figure 12B:
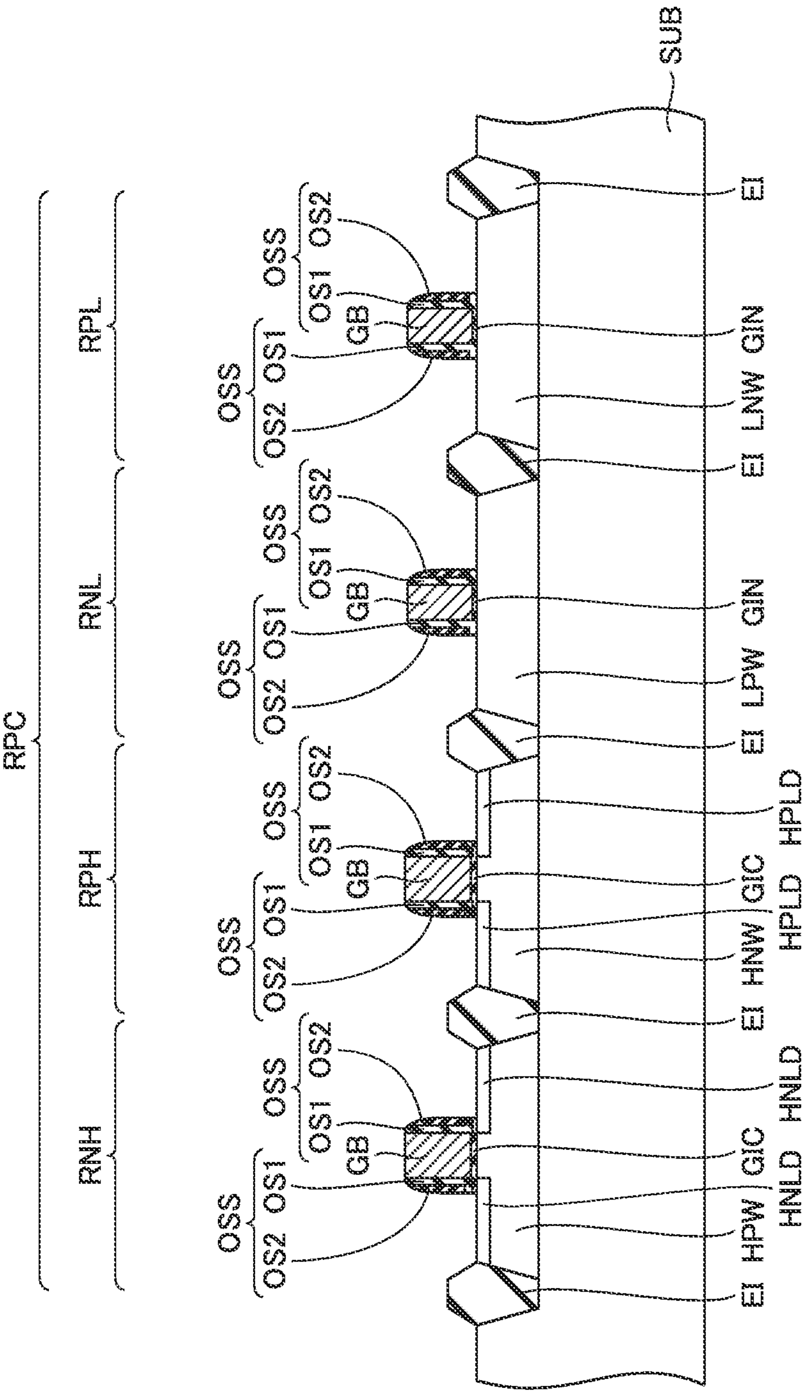
FIG. 12B is a cross sectional view of the peripheral region showing the step performed after the step shown in FIGS. 11A and 11B in the same embodiment.

Next, anisotropic etching treatment is performed on insulating film OSF which is to be the offset spacer film. Thereby, portions of insulating film OSF located on upper surfaces of gate electrodes GB are removed, and offset spacer films OSS are formed by portions of insulating film OSF left on sidewall surfaces of gate electrodes GB (each portion including a silicon oxide film OS1 and a silicon nitride film OS2), as shown in FIG. 12A and FIG. 12B.

Figure 13A:
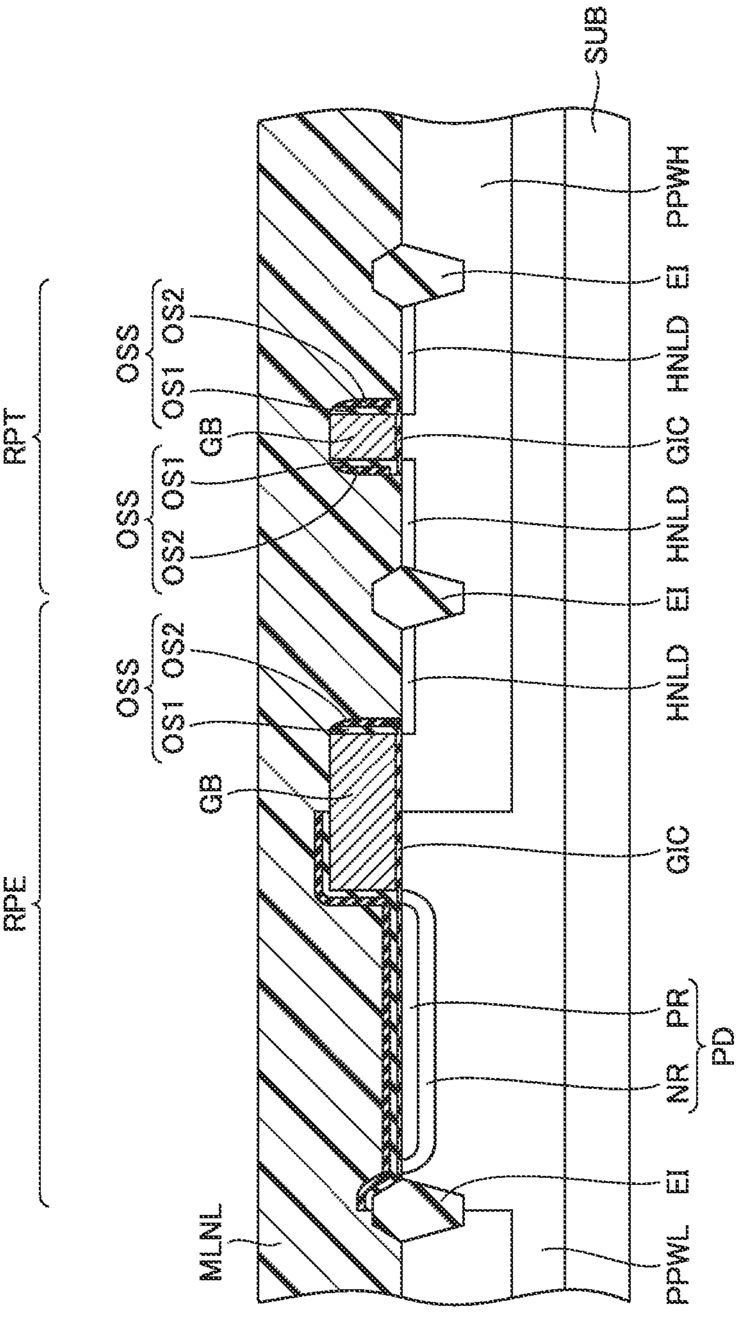
FIG. 13A is a cross sectional view of the pixel region and the like showing a step performed after the step shown in FIGS. 12A and 12B in the same embodiment.
Figure 13B:
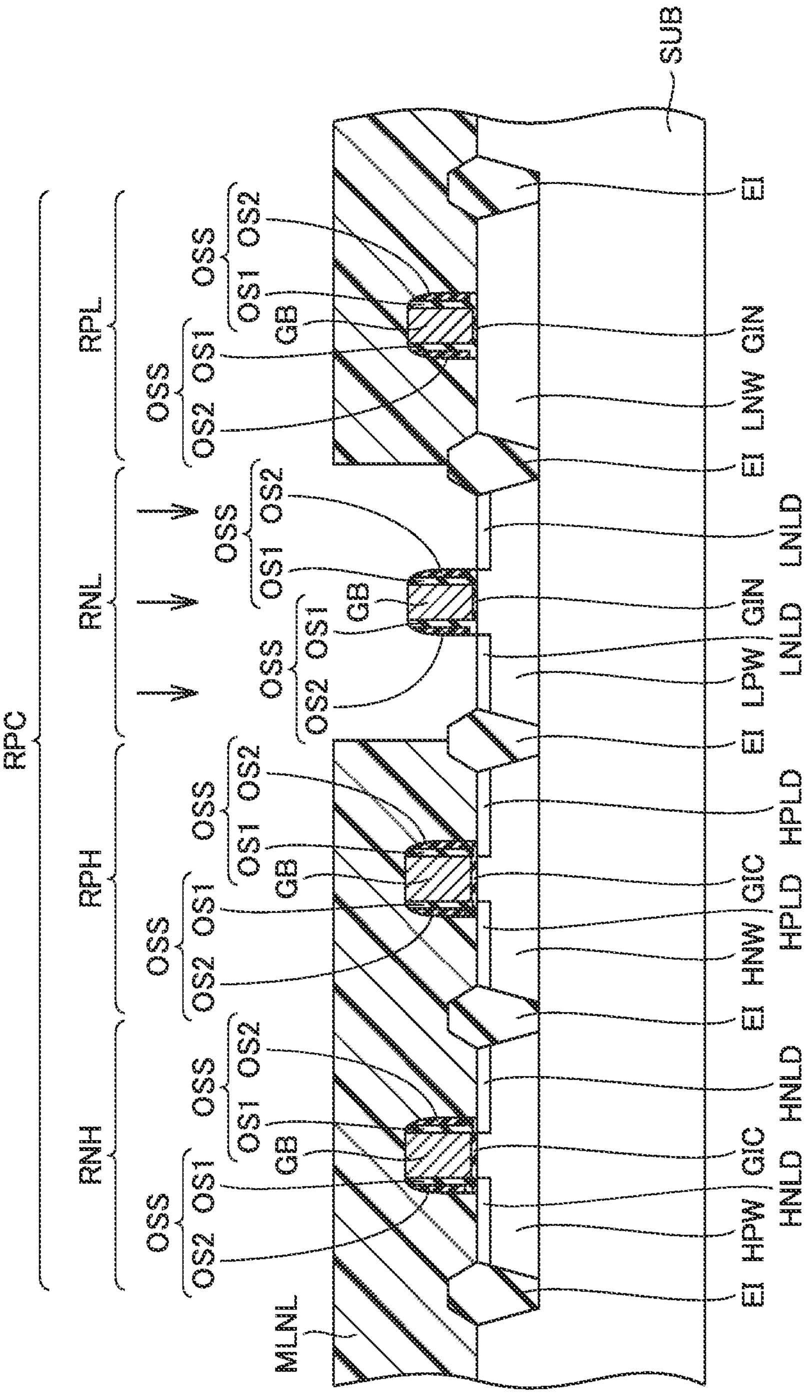
FIG. 13B is a cross sectional view of the peripheral region showing the step performed after the step shown in FIGS. 12A and 12B in the same embodiment.

Next, extension (LDD) regions are formed in each of regions RNL, RPL in which the field effect transistor driven at a relatively low voltage is to be formed. By performing predetermined photolithographic treatment, a resist pattern MLNL which exposes region RNL and covers other regions is formed as shown in FIG. 13A and FIG. 13B. Next, by implanting an n-type impurity using resist pattern MLNL, offset spacer film OSS, gate electrode GB, and offset spacer film OSS as an implantation mask, extension regions LNLD are formed in exposed region RNL. Thereafter, resist pattern MLNL is removed.

Figure 14A:
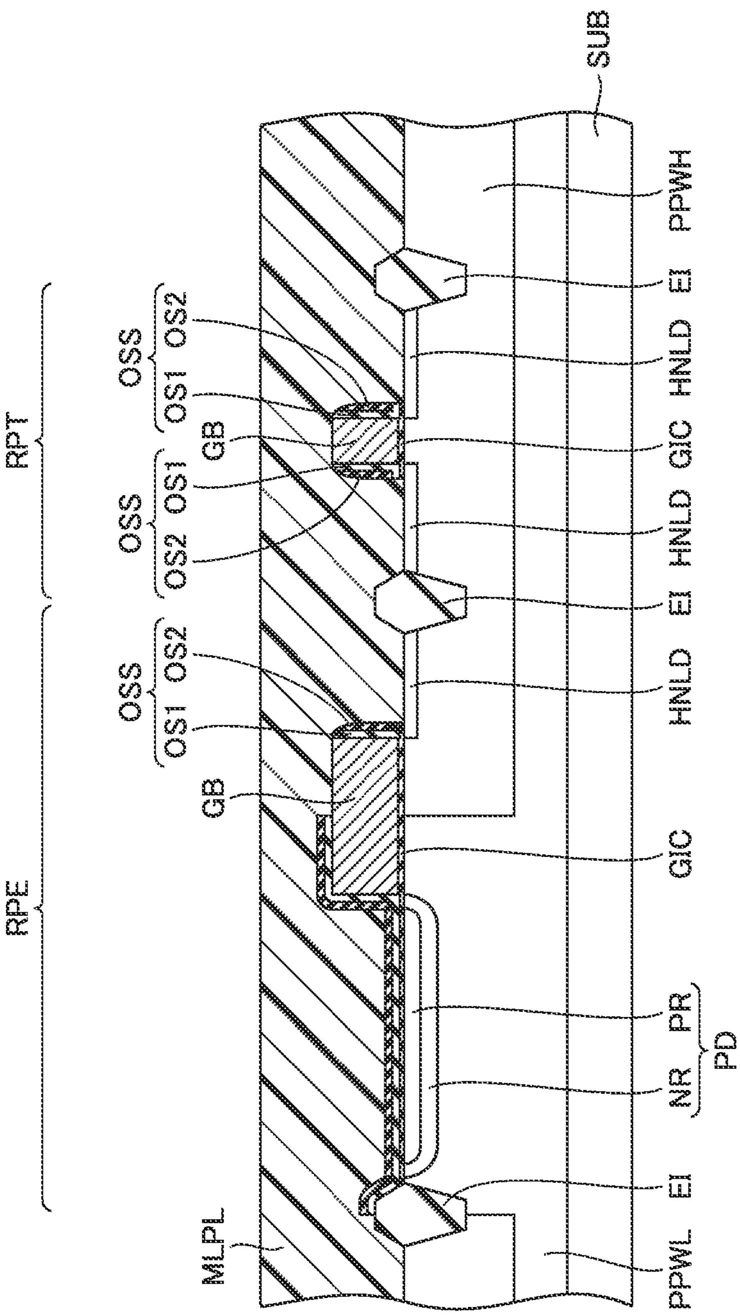
FIG. 14A is a cross sectional view of the pixel region and the like showing a step performed after the step shown in FIGS. 13A and 13B in the same embodiment.
Figure 14B:
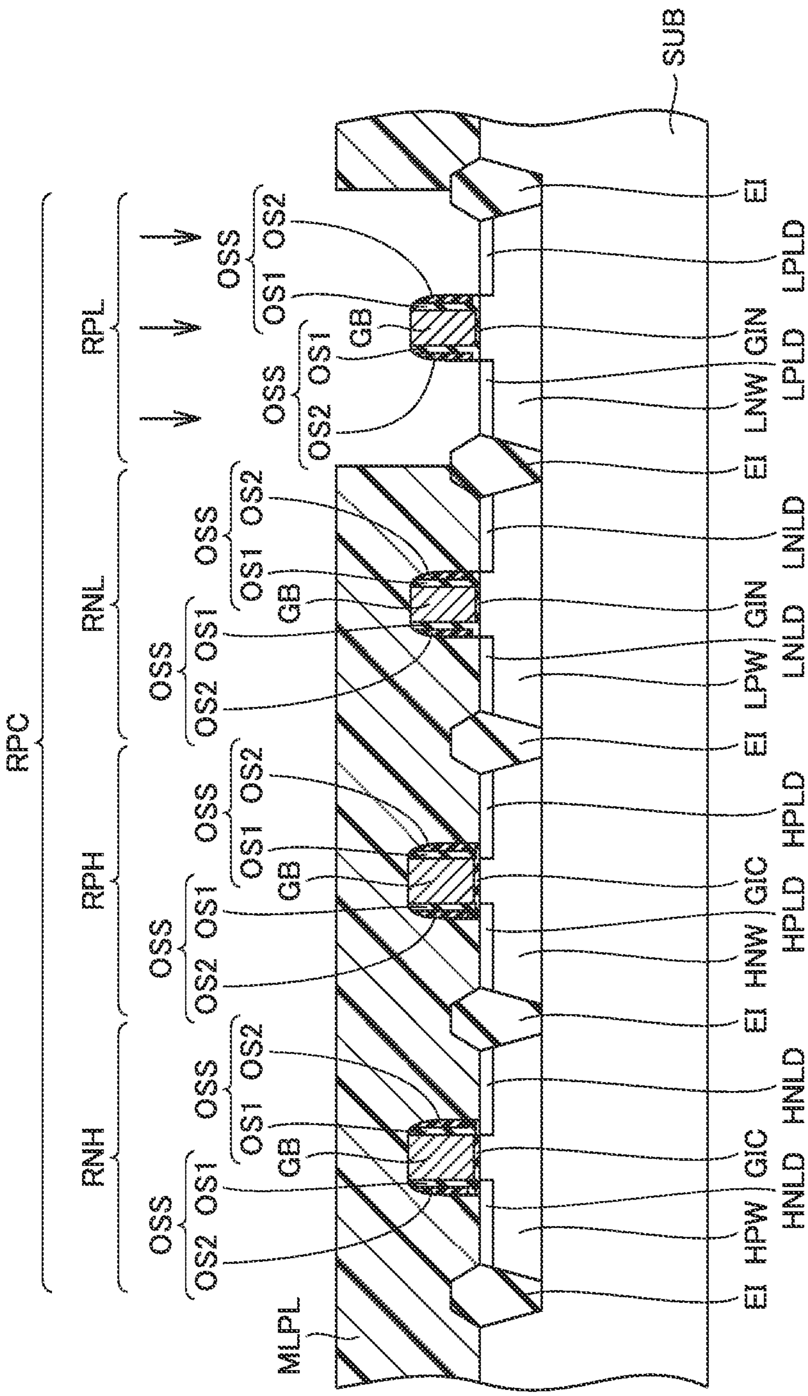
FIG. 14B is a cross sectional view of the peripheral region showing the step performed after the step shown in FIGS. 13A and 13B in the same embodiment.
Figure 15A:
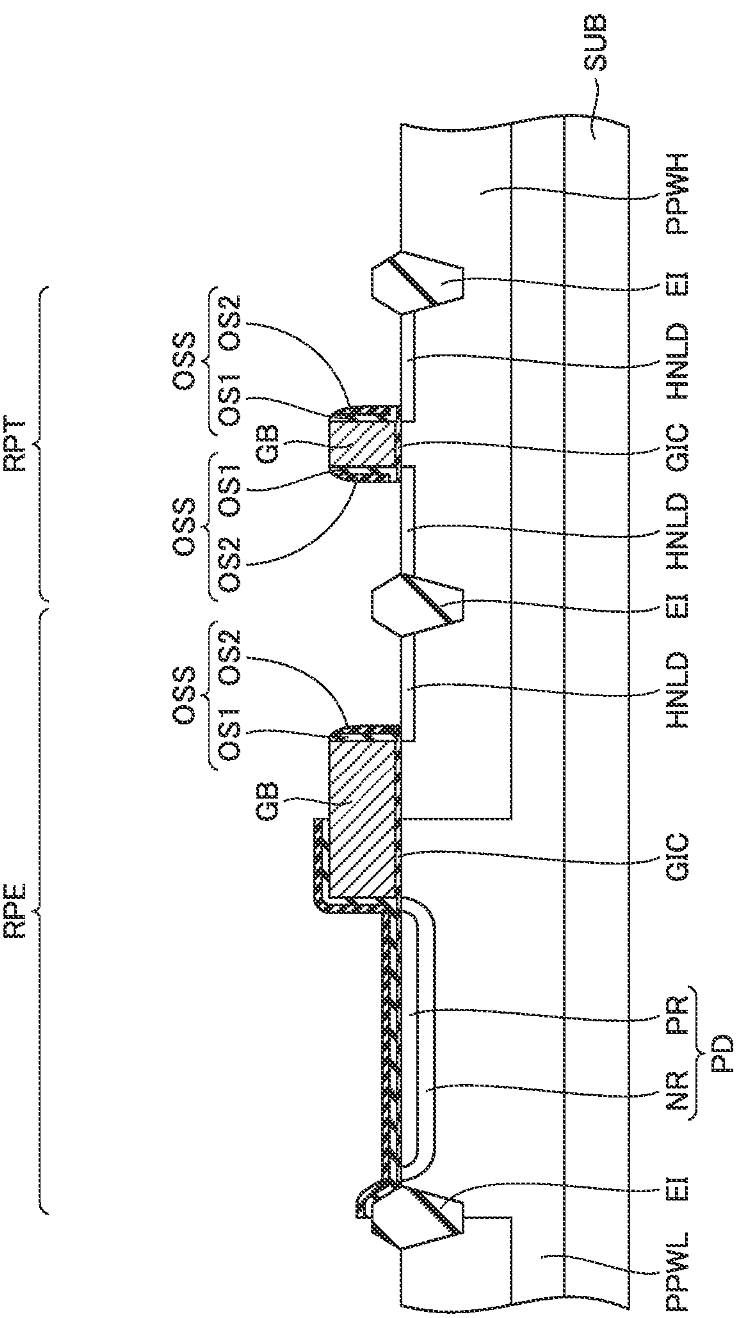
FIG. 15A is a cross sectional view of the pixel region and the like showing a step performed after the step shown in FIGS. 14A and 14B in the same embodiment.
Figure 15B:
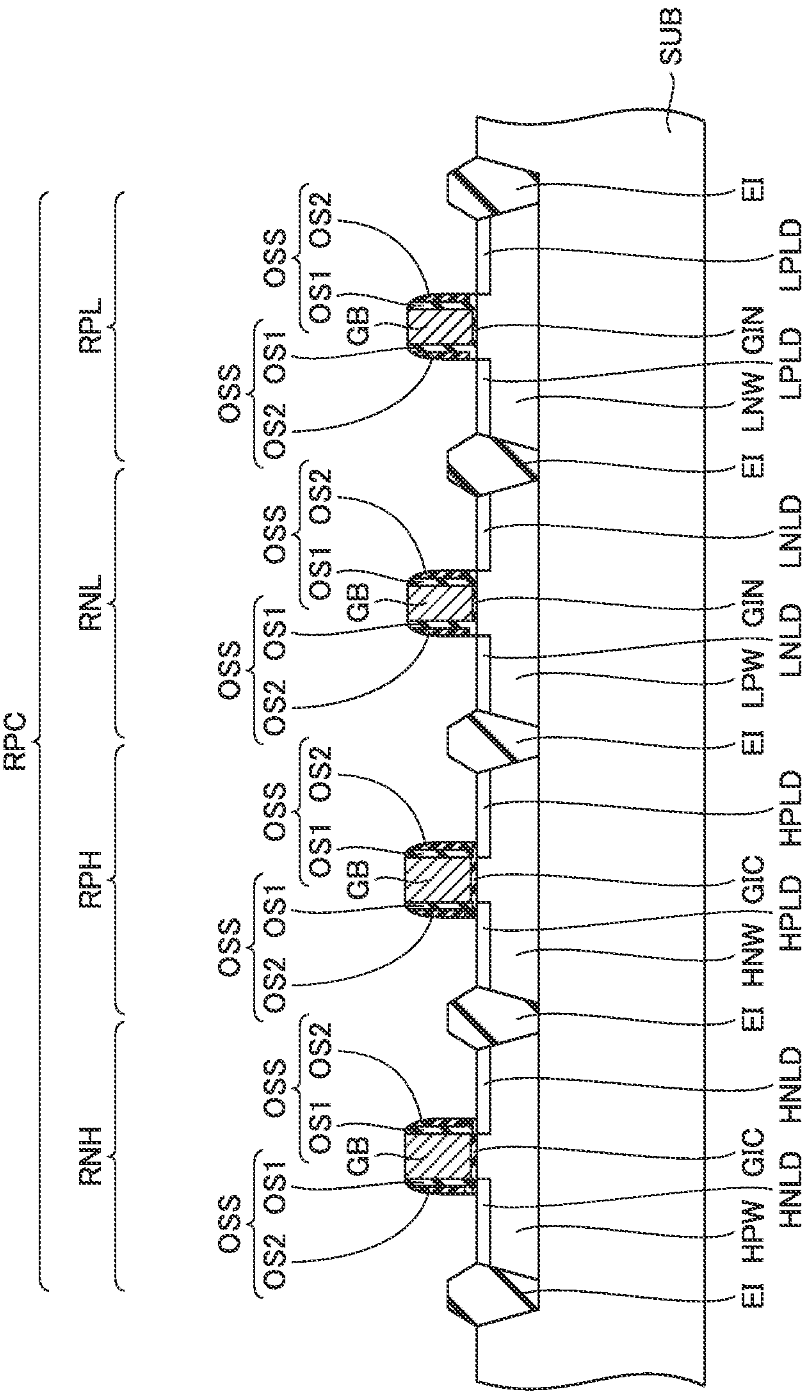
FIG. 15B is a cross sectional view of the peripheral region showing the step performed after the step shown in FIGS. 14A and 14B in the same embodiment.

Next, by performing predetermined photolithographic treatment, a resist pattern MLPL which exposes region RPL and covers other regions is formed as shown in FIG. 14A and FIG. 14B. Next, by implanting a p-type impurity using resist pattern MLPL, gate electrode GB, and offset spacer films OSS as an implantation mask, extension regions LPLD are formed in exposed region RPL. Next, by removing resist pattern MLPL, gate electrodes GB, offset spacer films OSS, and the like are exposed, as shown in FIG. 15A and FIG. 15B.

Figure 16A:
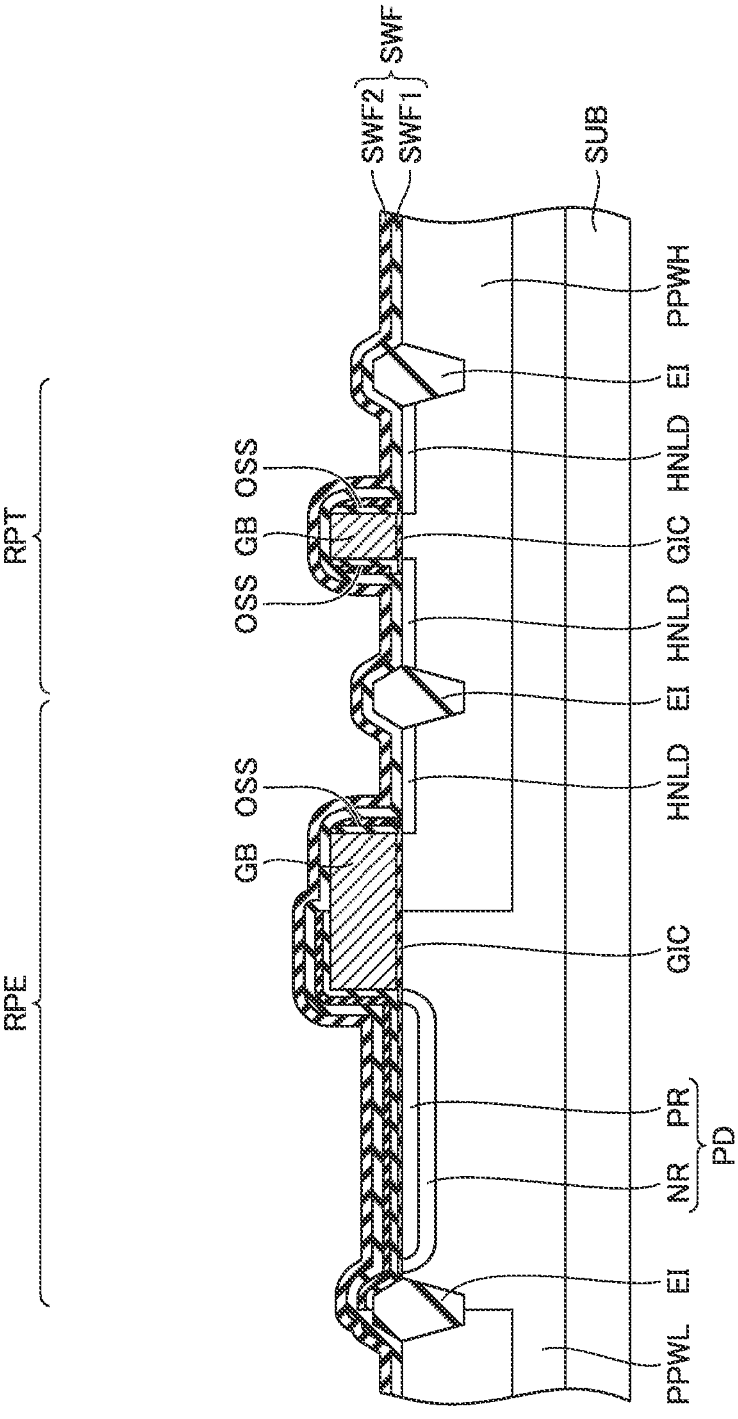
FIG. 16A is a cross sectional view of the pixel region and the like showing a step performed after the step shown in FIGS. 15A and 15B in the same embodiment.
Figure 16B:
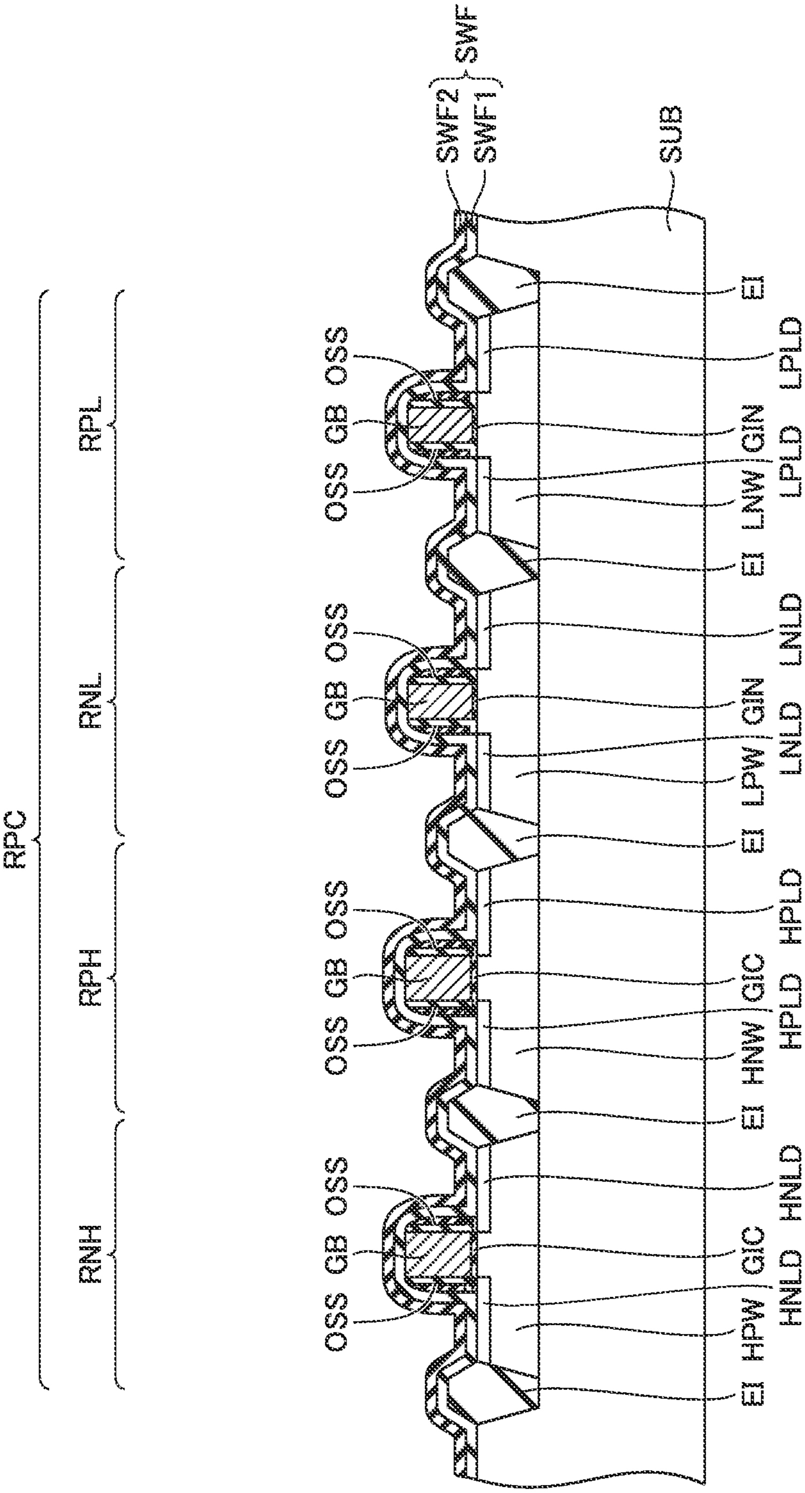
FIG. 16B is a cross sectional view of the peripheral region showing the step performed after the step shown in FIGS. 15A and 15B in the same embodiment.

Next, a sidewall insulating film is formed with offset spacer film OSS being left. An insulating film SWF which is to be the sidewall insulating film is formed to cover gate electrodes GB and offset spacer films OSS, as shown in FIG. 16A and FIG. 16B. As insulating film SWF, first, a silicon oxide film SWF1 is formed. Then, a silicon nitride film SWF2 is formed to cover silicon oxide film SWF1.

Figure 17A:
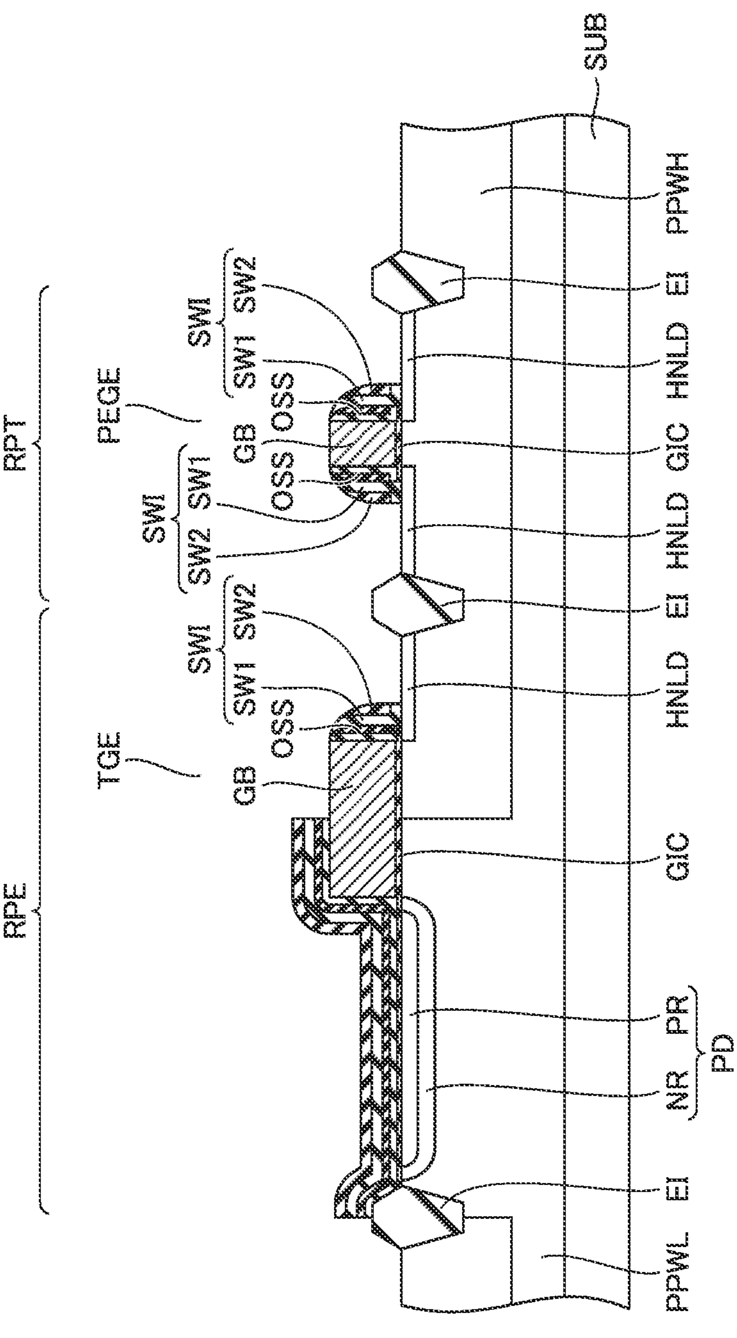
FIG. 17A is a cross sectional view of the pixel region and the like showing a step performed after the step shown in FIGS. 16A and 16B in the same embodiment.
Figure 17B:
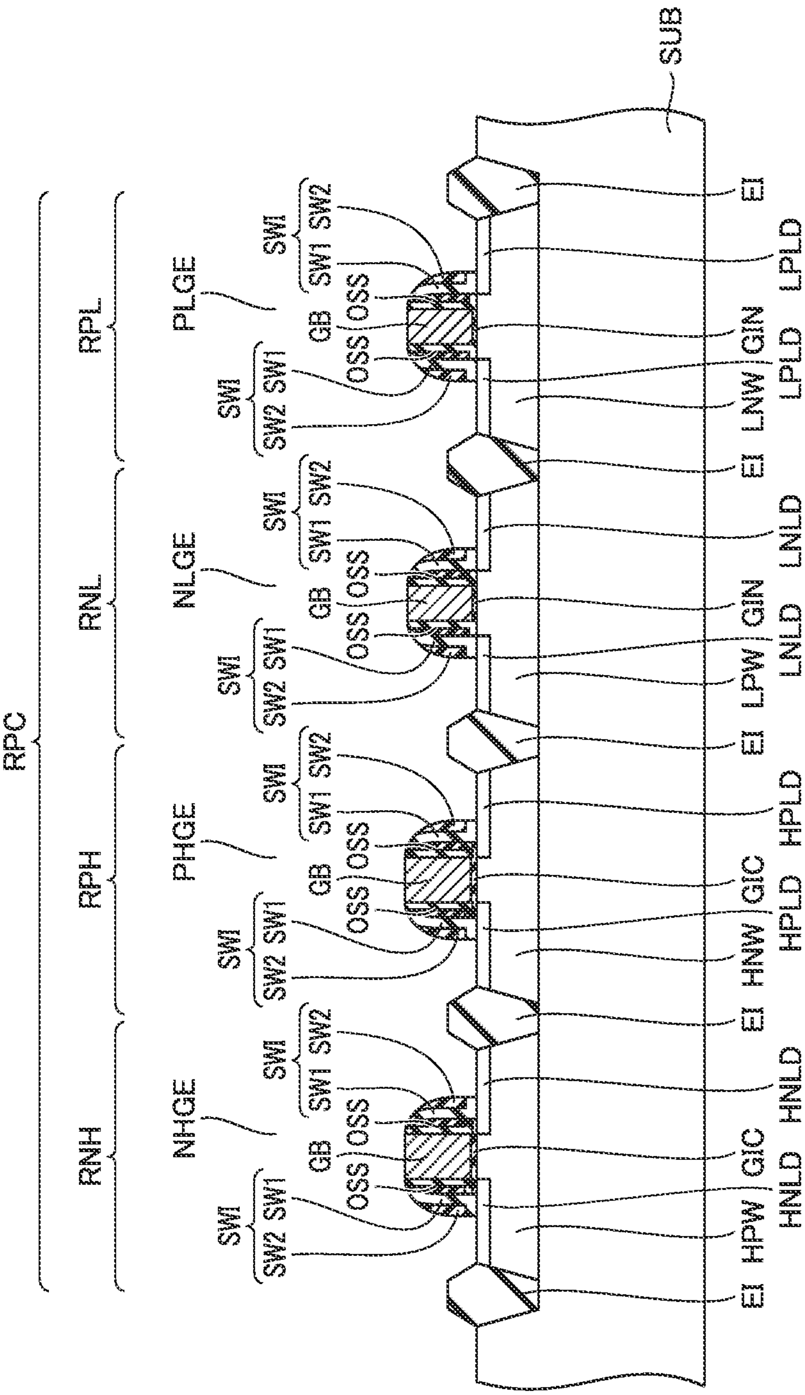
FIG. 17B is a cross sectional view of the peripheral region showing the step performed after the step shown in FIGS. 16A and 16B in the same embodiment.

Next, anisotropic etching treatment is performed on insulating film SWF. Thereby, portions of insulating film SWF located on the upper surfaces of gate electrodes GB are removed, and sidewall insulating films SWI are formed by portions of insulating film SWF left on the sidewall surfaces of gate electrodes GB (each portion including a silicon oxide film SW1 and a silicon nitride film SW2), as shown in FIG. 17A and FIG. 17B.

In pixel region RPE, gate electrode portion TGE of the transfer transistor is formed by gate electrode GB, offset spacer film OSS, and sidewall insulating film SWI. In pixel transistor region RPT, a gate electrode portion PEGE of the amplification transistor and the like is formed by gate electrode GB, offset spacer films OSS, and sidewall insulating films SWI.

Of peripheral region RPC, in region RNH, a gate electrode portion NHGE of the n-channel type field effect transistor driven at a relatively high voltage is formed by gate electrode GB, offset spacer films OSS, and sidewall insulating films SWI. In region RPH, a gate electrode portion PHGE of the p-channel type field effect transistor operated at a relatively high voltage is formed. In region RNL, a gate electrode portion NLGE of the n-channel type field effect transistor driven at a relatively low voltage is formed. In region RPL, a gate electrode portion PLGE of the p-channel type field effect transistor operated at a relatively low voltage is formed.

Figure 18A:
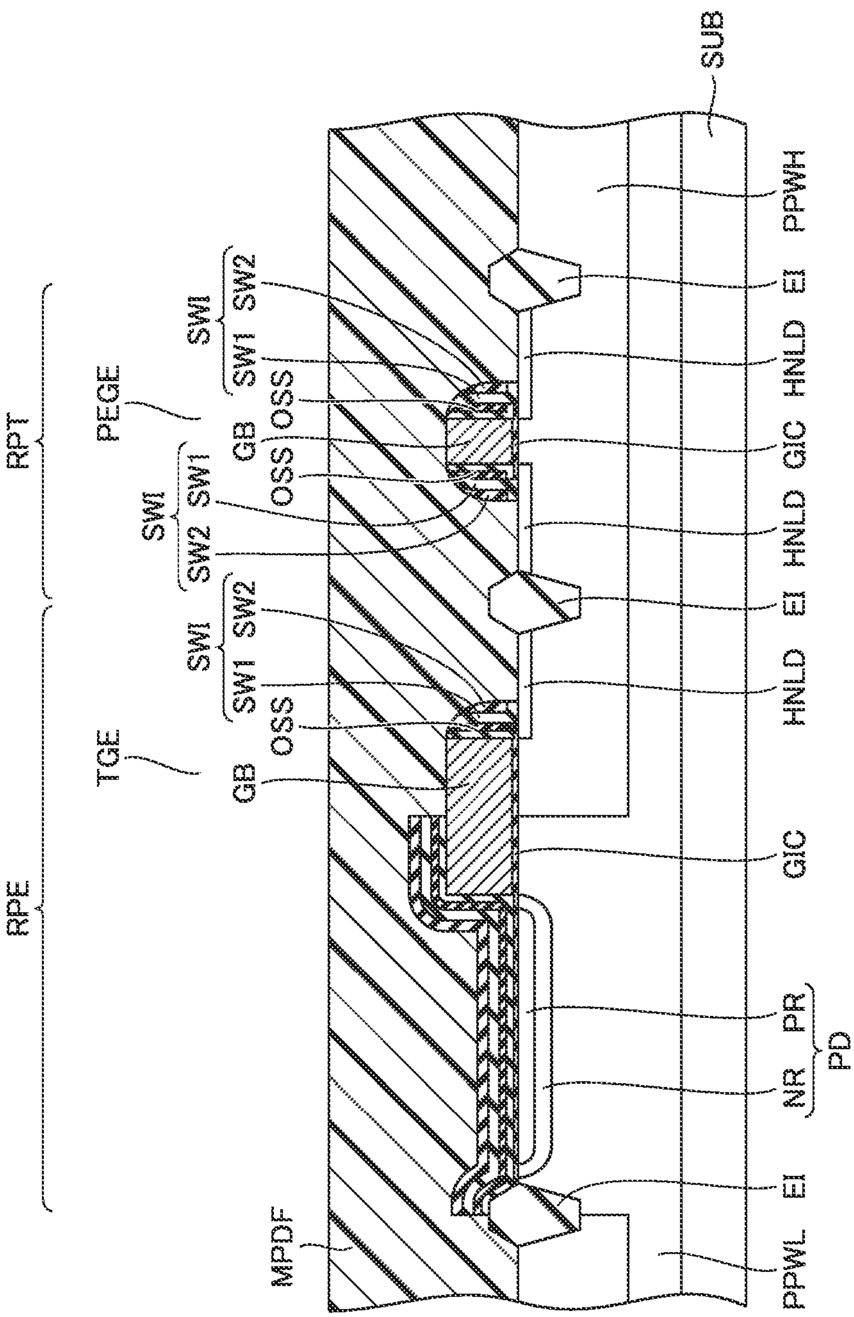
FIG. 18A is a cross sectional view of the pixel region and the like showing a step performed after the step shown in FIGS. 17A and 17B in the same embodiment.
Figure 18B:
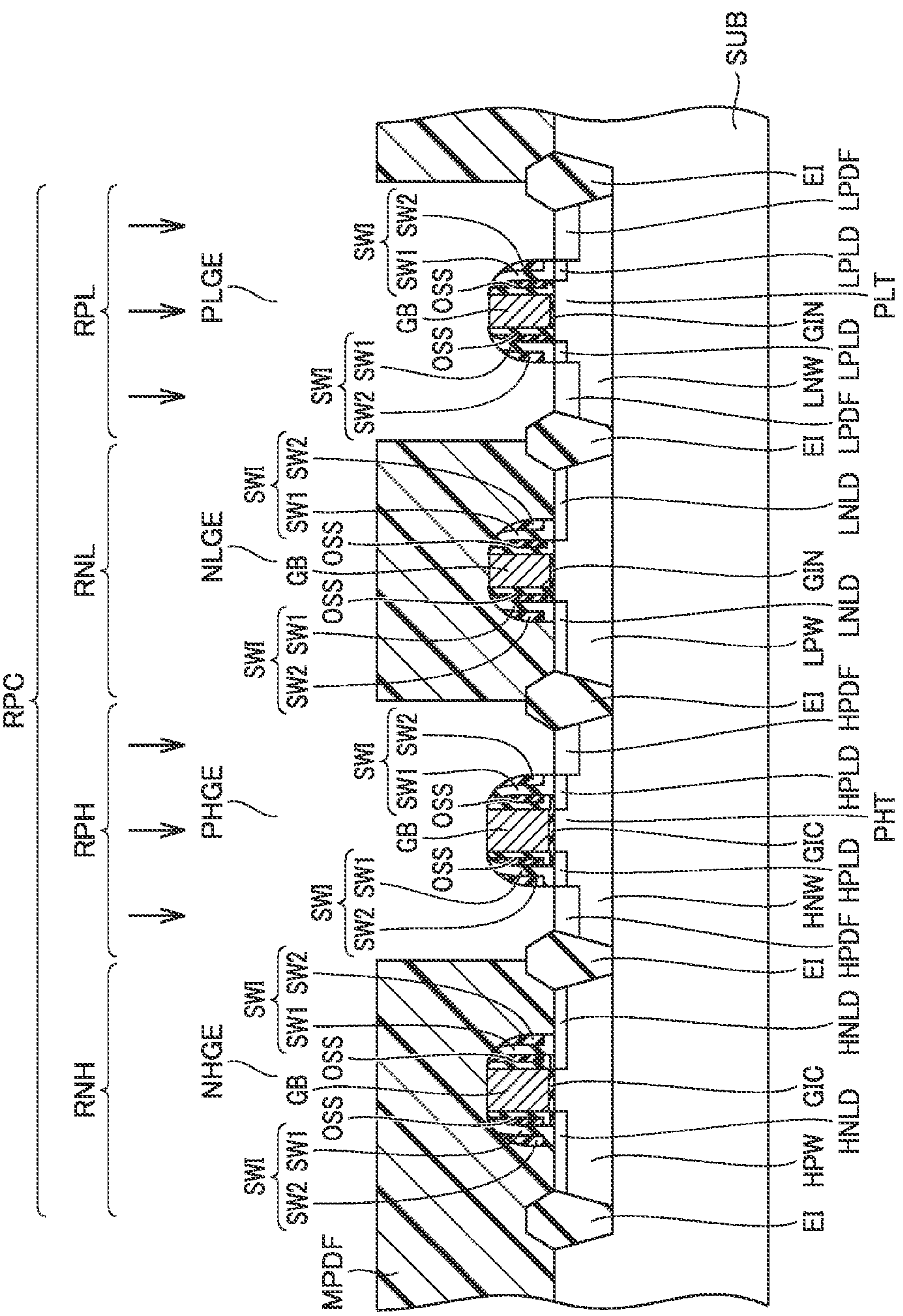
FIG. 18B is a cross sectional view of the peripheral region showing the step performed after the step shown in FIGS. 17A and 17B in the same embodiment.

Next, source/drain regions are formed in each of regions RPH, RPL in which the p-channel type field effect transistor is to be formed. By performing predetermined photolithographic treatment, a resist pattern MPDF which exposes regions RPH, RPL and covers other regions is formed as shown in FIG. 18A and FIG. 18B. Next, by implanting a p-type impurity using resist pattern MPDF and gate electrode portions PHGE, PLGE as an implantation mask, source/drain regions HPDF are formed in region RPH, and source/drain regions LPDF are formed in region RPL. Thereafter, resist pattern MPDF is removed.

Figure 19A:
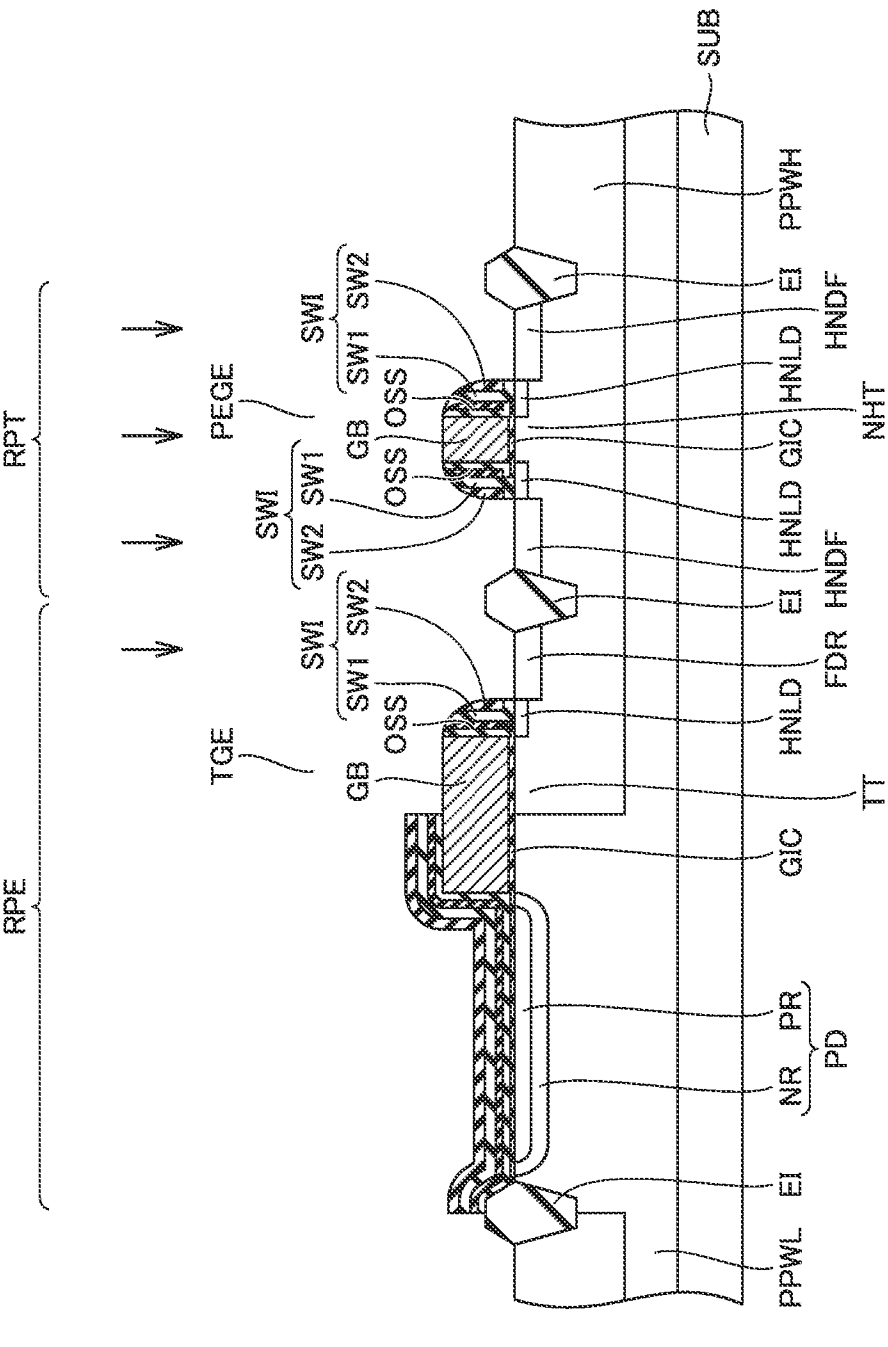
FIG. 19A is a cross sectional view of the pixel region and the like showing a step performed after the step shown in FIGS. 18A and 18B in the same embodiment.
Figure 19B:
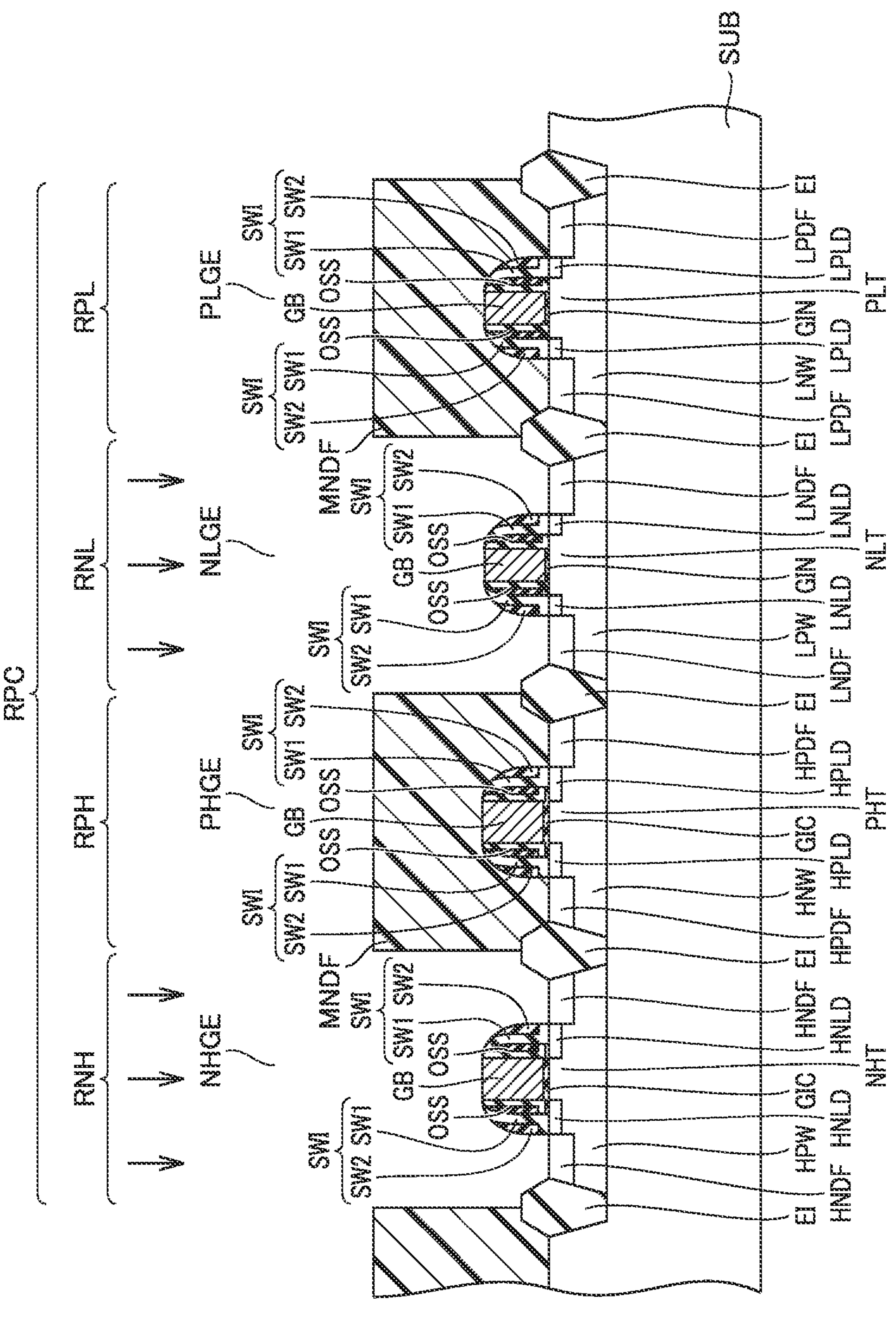
FIG. 19B is a cross sectional view of the peripheral region showing the step performed after the step shown in FIGS. 18A and 18B in the same embodiment.

Next, source/drain regions are formed in each of pixel transistor region RPT and regions RNH, RNL in which the n-channel type field effect transistor is to be formed. By performing predetermined photolithographic treatment, a resist pattern MNDF which exposes pixel transistor region RPT and regions RNH, RNL and covers other regions is formed as shown in FIG. 19A and FIG. 19B. Next, by implanting an n-type impurity using resist pattern MNDF and gate electrode portions TGE, PEGE, NHGE, NLGE as an implantation mask, source/drain regions HNDF are formed in each of pixel transistor region RPT and region RNH, and source/drain regions LNDF are formed in region RNL. Further, on this occasion, floating diffusion region FDR is formed in pixel region RPE. Thereafter, resist pattern MNDF is removed.

Through the above steps, transfer transistor TT is formed in pixel region RPE. An n-channel type field effect transistor NHT such as an amplification transistor is formed in pixel transistor region RPT. An n-channel type field effect transistor NHT is formed in region RNH of peripheral region RPC. A p-channel type field effect transistor PHT is formed in region RPH. An n-channel type field effect transistor NLT is formed in region RNL. A p-channel type field effect transistor PLT is formed in region RPL.

Figure 20A:
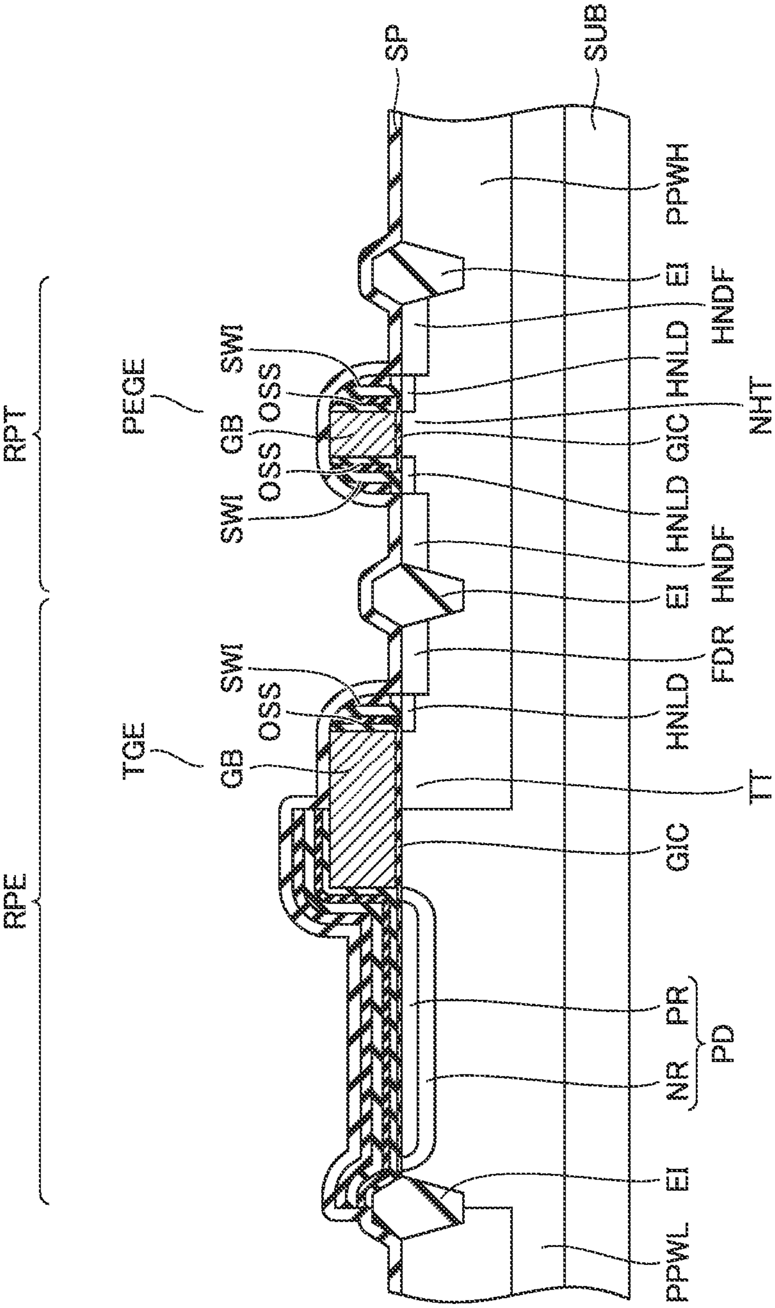
FIG. 20A is a cross sectional view of the pixel region and the like showing a step performed after the step shown in FIGS. 19A and 19B in the same embodiment.
Figure 20B:
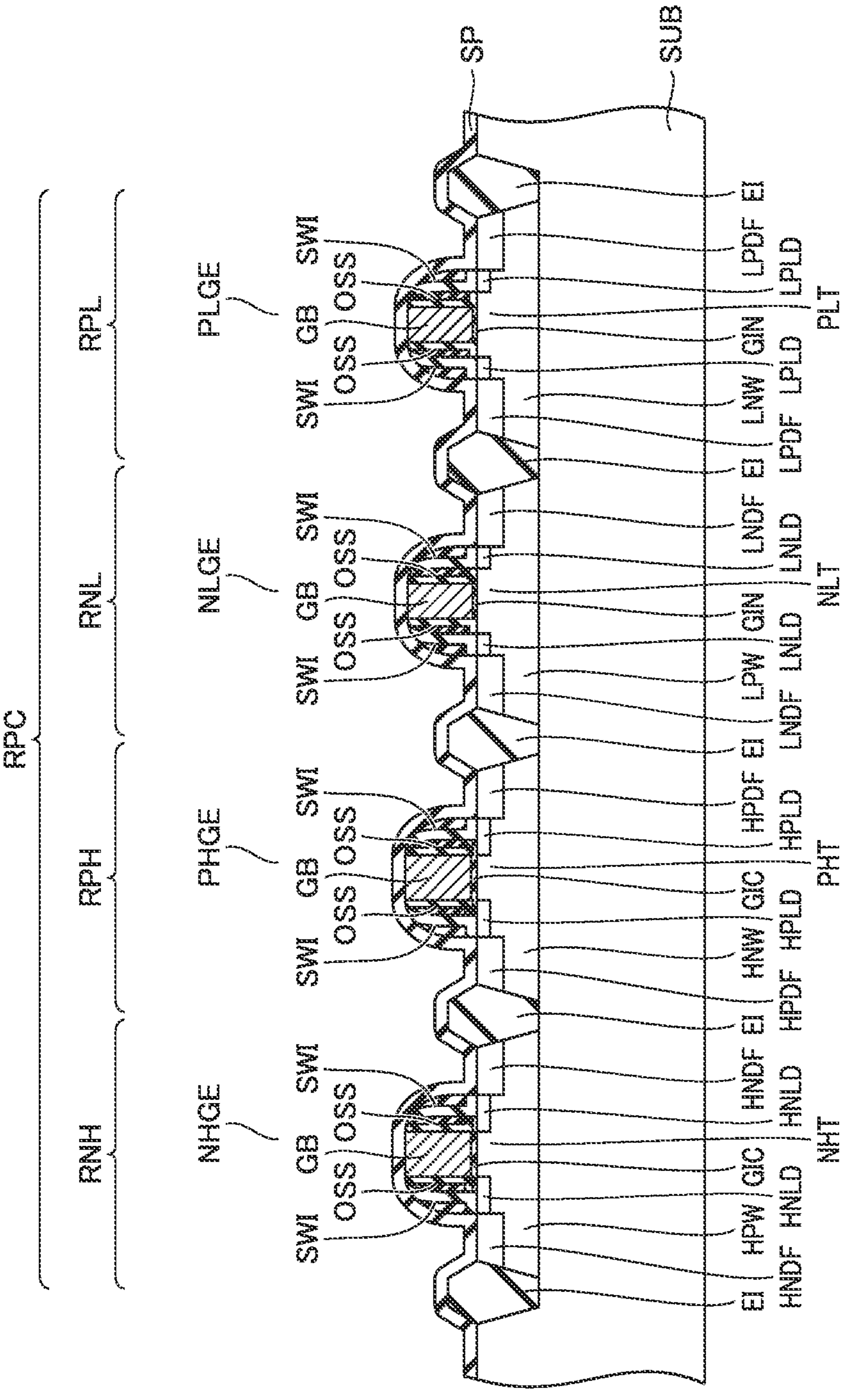
FIG. 20B is a cross sectional view of the peripheral region showing the step performed after the step shown in FIGS. 19A and 19B in the same embodiment.

Next, a silicide protection film for preventing silicidation is formed for a field effect transistor (not shown) in which no metal silicide film is to be formed. A silicide protection film SP for preventing silicidation is formed to cover gate electrode portions TGE, PEGE, NHGE, PHGE, NLGE, PLGE, and the like, as shown in FIG. 20A and FIG. 20B. As silicide protection film SP, for example, a silicon oxide film or the like is formed. Thereafter, the silicide protection film located in pixel transistor region RPT and peripheral region RPC is removed, with a portion of silicide protection film SP covering pixel region RPE, in which no metal silicide film is to be formed, being left (see FIG. 21A and FIG. 21B).

Figure 21A:
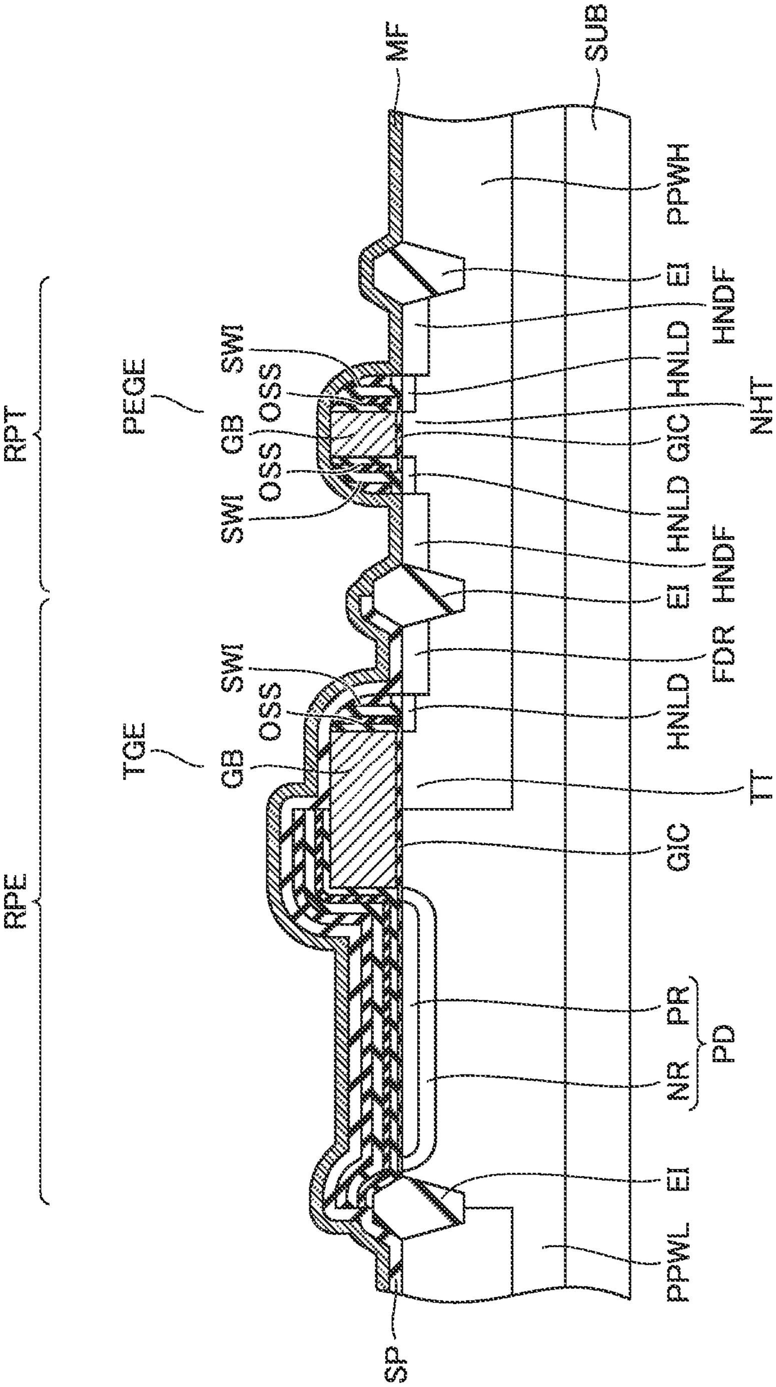
FIG. 21A is a cross sectional view of the pixel region and the like showing a step performed after the step shown in FIGS. 20A and 20B in the same embodiment.
Figure 21B:
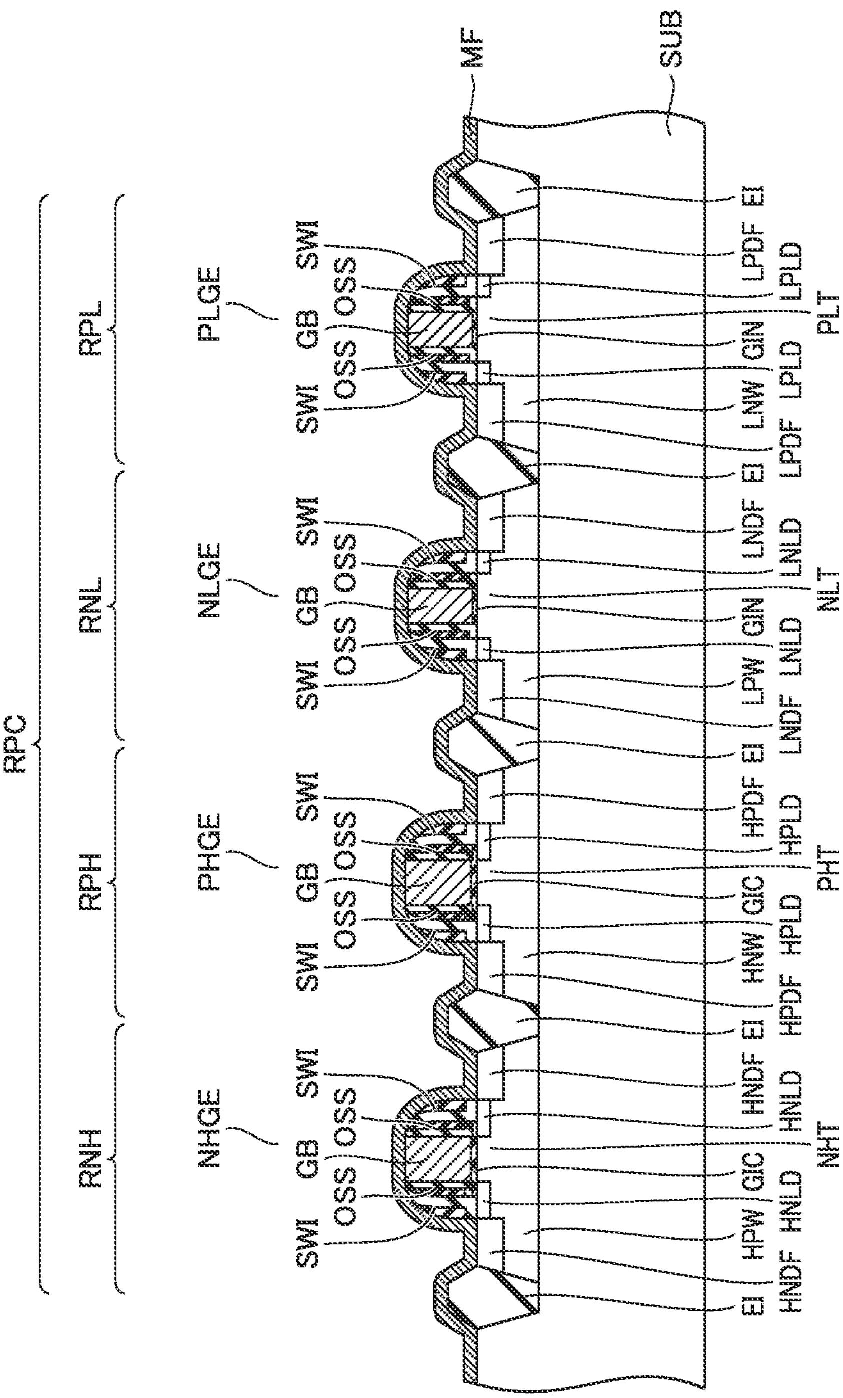
FIG. 21B is a cross sectional view of the peripheral region showing the step performed after the step shown in FIGS. 20A and 20B in the same embodiment.

Next, the metal silicide film is formed by a SALICIDE (Self ALIgned siliCIDE) method. First, a predetermined metal film MF made of such as cobalt is formed to cover gate electrode portions TGE, PEGE, NHGE, PHGE, NLGE, PLGE, as shown in FIG. 21A and FIG. 21B. Next, by performing predetermined heat treatment to cause metal film MF to react with silicon, metal silicide films MS are formed (see FIG. 22A and FIG. 22B). Thereafter, unreacted metal is removed.

Figure 22A:
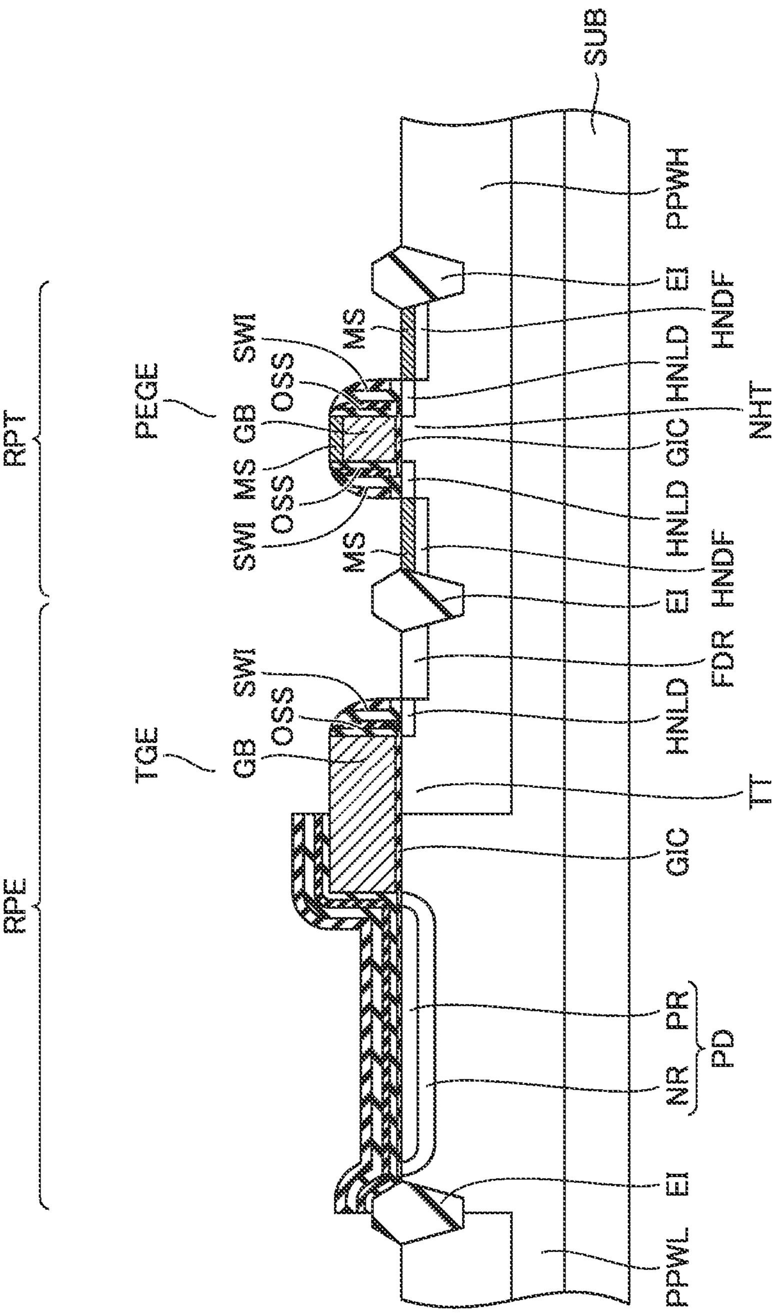
FIG. 22A is a cross sectional view of the pixel region and the like showing a step performed after the step shown in FIGS. 21A and 21B in the same embodiment.
Figure 22B:
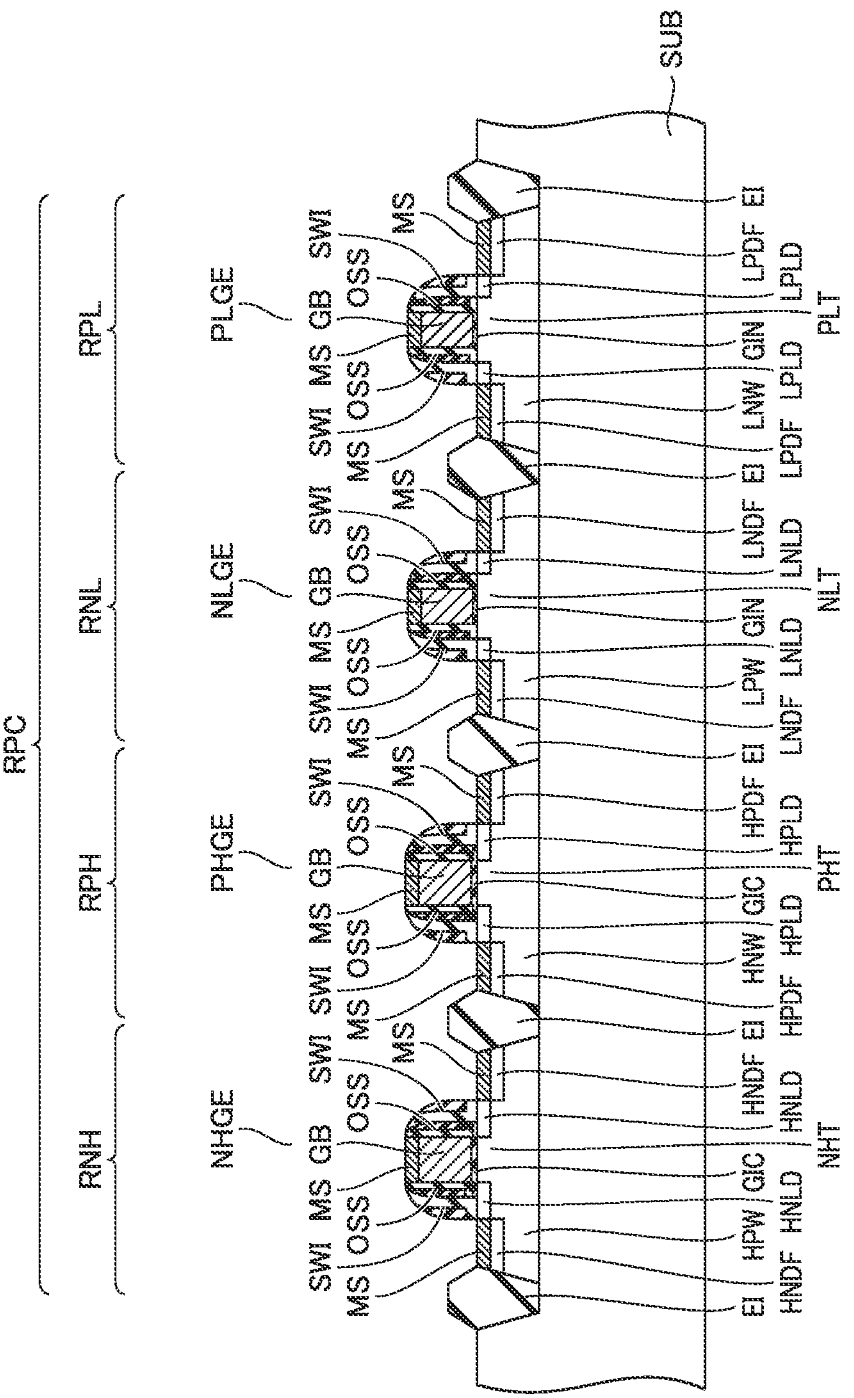
FIG. 22B is a cross sectional view of the peripheral region showing the step performed after the step shown in FIGS. 21A and 21B in the same embodiment.

Thereby, as shown in FIG. 22A and FIG. 22B, in pixel region RPE, no metal silicide film is formed, and in pixel transistor region RPT, metal silicide films MS are formed at an upper surface of gate electrode portion PEGE and surfaces of source/drain regions HNDF of field effect transistor NHT.

In peripheral region RPC, metal silicide films MS are formed at an upper surface of gate electrode portion NHGE and surfaces of source/drain regions HNDF of field effect transistor NHT. Metal silicide films MS are formed at an upper surface of gate electrode portion PHGE and surfaces of source/drain regions HPDF of field effect transistor PHT. Metal silicide films MS are formed at an upper surface of gate electrode portion NLGE and surfaces of source/drain regions LNDF of field effect transistor NLT. Metal silicide films MS are formed at an upper surface of gate electrode portion PLGE and surfaces of source/drain regions LPDF of field effect transistor PLT.

Figure 23A:
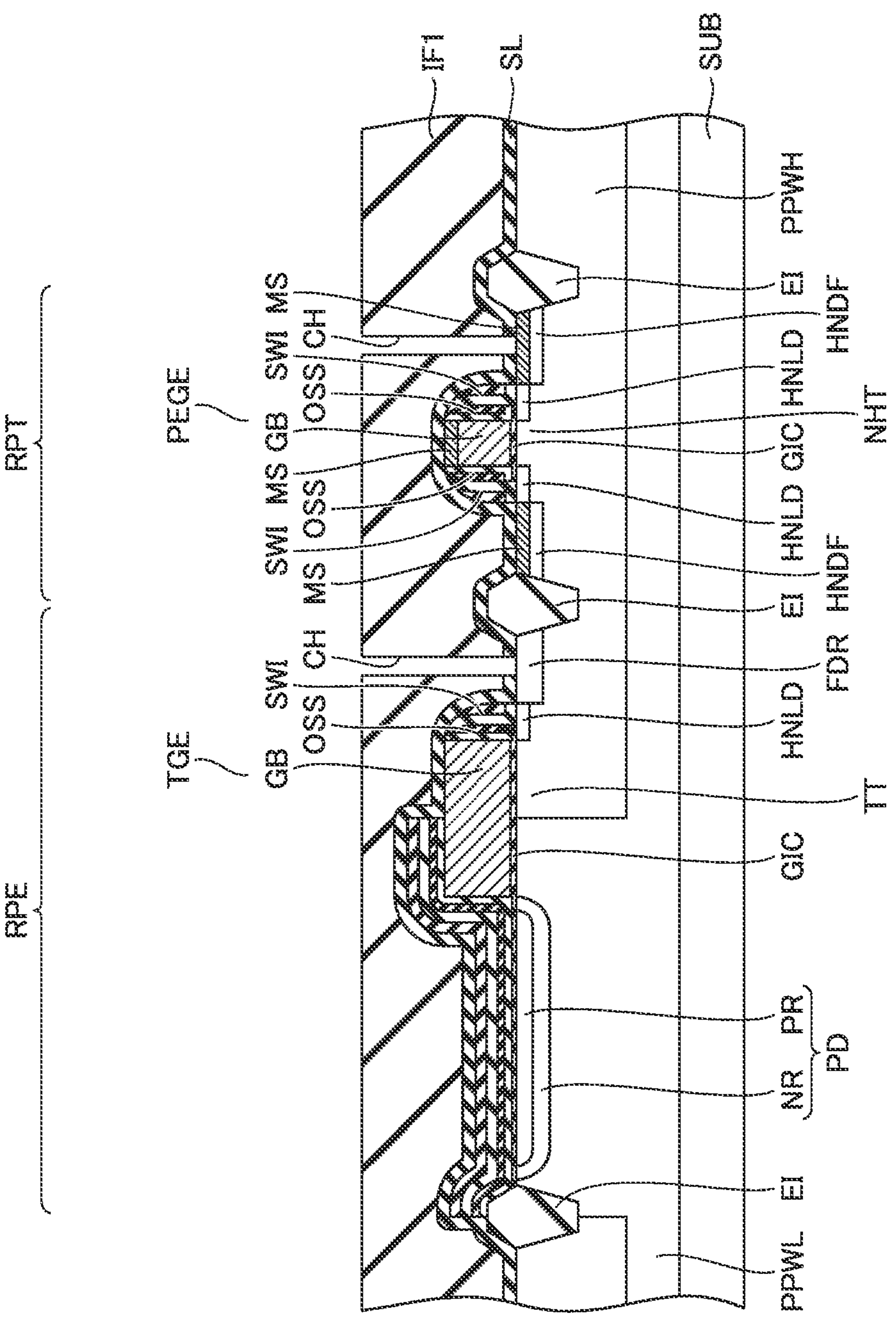
FIG. 23A is a cross sectional view of the pixel region and the like showing a step performed after the step shown in FIGS. 22A and 22B in the same embodiment.
Figure 23B:
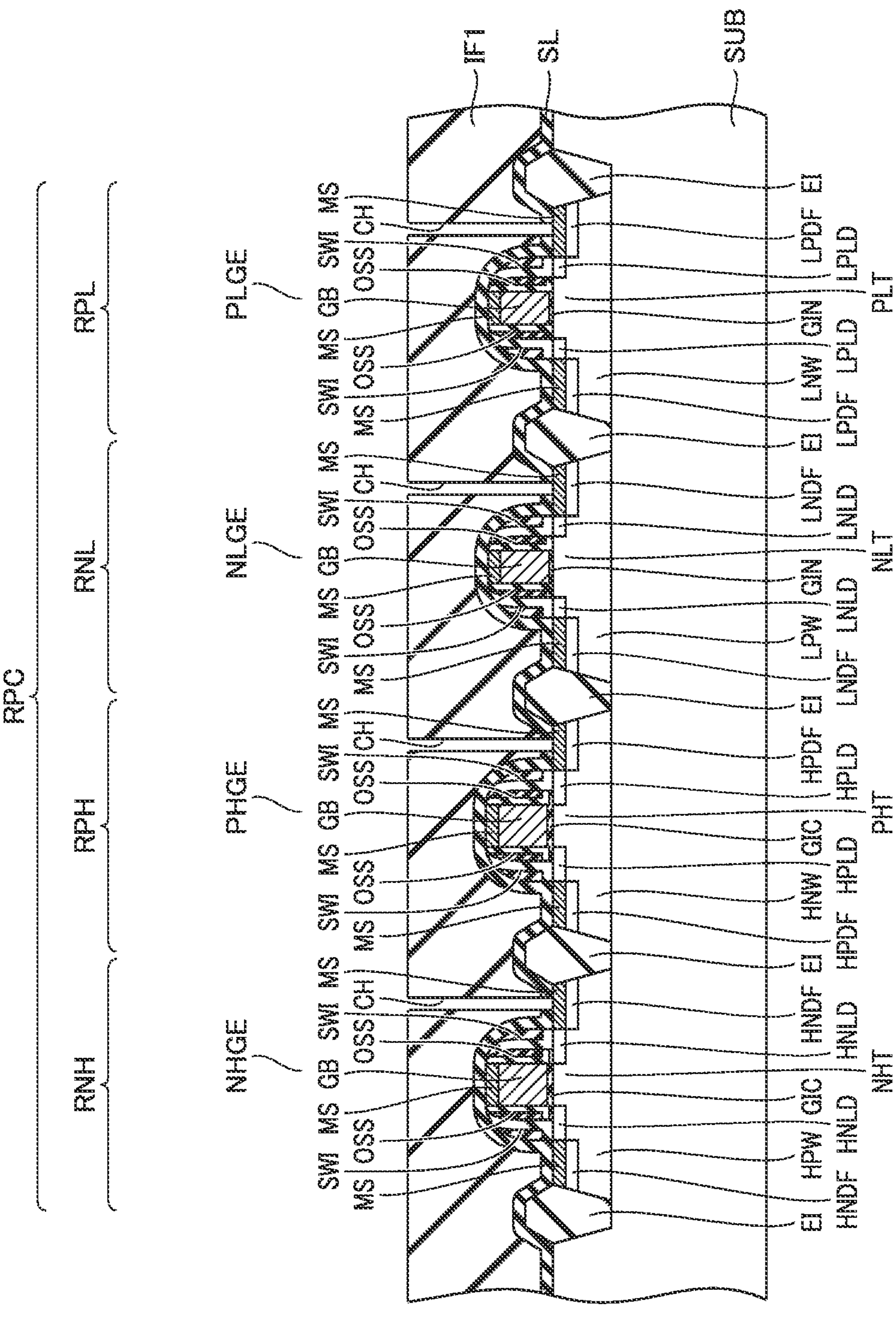
FIG. 23B is a cross sectional view of the peripheral region showing the step performed after the step shown in FIGS. 22A and 22B in the same embodiment.

Next, a stress liner film SL is formed to cover transfer transistor TT and field effect transistors NHT, PHT, NLT, PLT, and the like, as shown in FIG. 23A and FIG. 23B. Next, a first interlayer insulating film IF1 is formed as a contact interlayer film, to cover stress liner film SL. Next, by performing predetermined photolithographic treatment, a resist pattern (not shown) for forming contact holes is formed.

Next, by performing anisotropic etching treatment on first interlayer insulating film IF1 and the like by using the resist pattern as an etching mask, in pixel region RPE, a contact hole CH which exposes a surface of floating diffusion region FDR is formed. In pixel transistor region RPT, a contact hole CH which exposes a surface of metal silicide film MS formed in source/drain region HNDF is formed. In peripheral region RPC, a contact hole CH which exposes a surface of metal silicide film MS formed in each of source/drain regions HNDF, HPDF, LNDF, LPDF is formed.

Figure 24A:
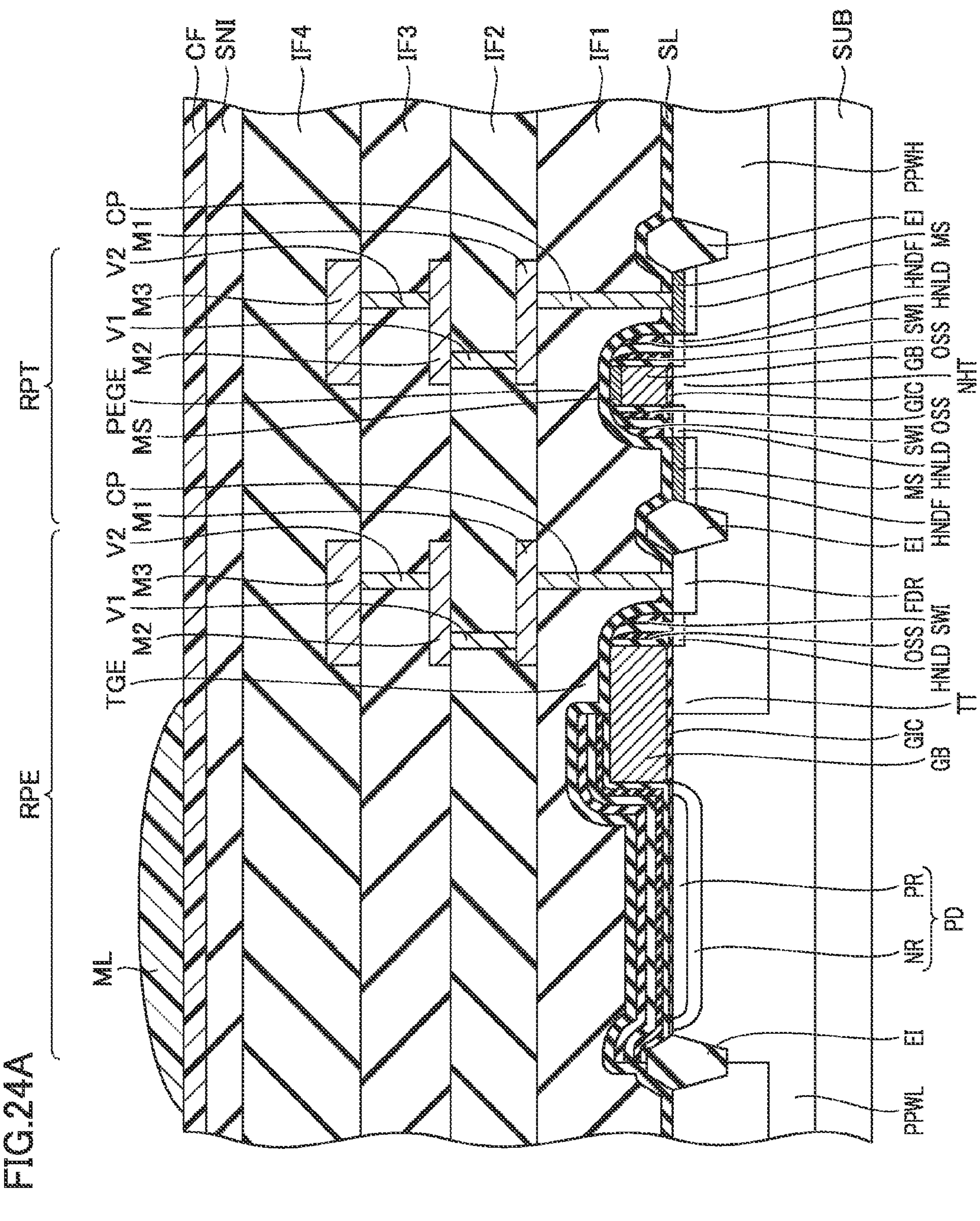
FIG. 24A is a cross sectional view of the pixel region and the like showing a step performed after the step shown in FIGS. 23A and 23B in the same embodiment.
Figure 24B:
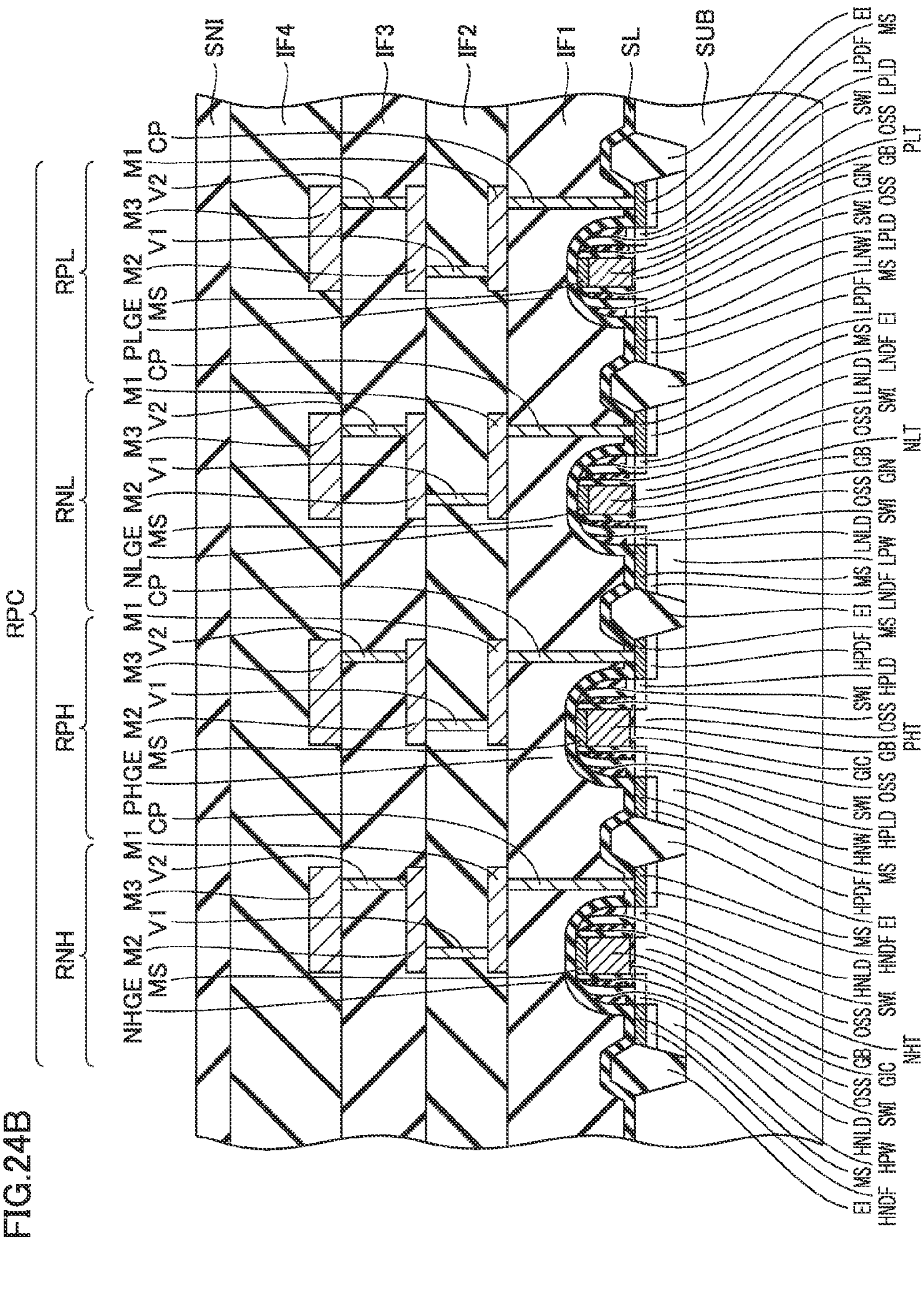
FIG. 24B is a cross sectional view of the peripheral region showing the step performed after the step shown in FIGS. 23A and 23B in the same embodiment.

Next, a contact plug CP is formed in each of contact holes CH, as shown in FIG. 24A and FIG. 24B. Next, first wires M1 are formed to be in contact with a surface of first interlayer insulating film IF1. A second interlayer insulating film IF2 is formed to cover first wires M1. Next, first vias V1 which are to be electrically connected to corresponding first wires M1 are respectively formed to penetrate second interlayer insulating film IF2. Next, second wires M2 are formed to be in contact with a surface of second interlayer insulating film IF2. Second wires M2 are respectively electrically connected to corresponding first vias V1.

Next, a third interlayer insulating film IF3 is formed to cover second wires M2. Next, second vias V2 which are to be electrically connected to corresponding second wires M2 are respectively formed to penetrate third interlayer insulating film IF3. Next, third wires M3 are formed to be in contact with a surface of third interlayer insulating film IF3. Third wires M3 are respectively electrically connected to corresponding second vias V2. Next, a fourth interlayer insulating film IF4 is formed to cover third wires M3. Next, an insulating film SNI such as a silicon nitride film, for example, is formed to be in contact with a surface of fourth interlayer insulating film IF4. Next, in pixel region RPE, a predetermined color filter CF corresponding to any of red, green, and blue is formed. Thereafter, in pixel region RPE, a micro lens ML for collecting light is arranged. In this way, the main part of the imaging apparatus is completed.

Silicon oxide film OS1 of offset spacer film OSS in each of gate electrode portions TGE, PEGE, NHGE, PHGE, NLGE, PLGE of the imaging apparatus has a portion which covers the sidewall surface of gate electrode GB (a first portion), and a portion which extends from the first portion to a side opposite to a side on which gate electrode GB is located (a second portion). Sidewall insulating film SWI is formed to cover an end surface (thickness direction) of the second portion of silicon oxide film OS1.

In the imaging apparatus described above, by forming an offset spacer film with a double-layer structure including a silicon nitride film as an offset spacer film, dangling bonds of silicon in the device formation region can be terminated, and read-out noise can be reduced. In this regard, a description will be given in connection with a method for manufacturing an imaging apparatus in accordance with a comparative example. It should be noted that members of the imaging apparatus in accordance with the comparative example which are identical to those of the imaging apparatus in accordance with the embodiment will be designated by the same reference numerals with a prefix letter "C", and the description thereof will not be repeated unless deemed necessary.

Figure 25A:
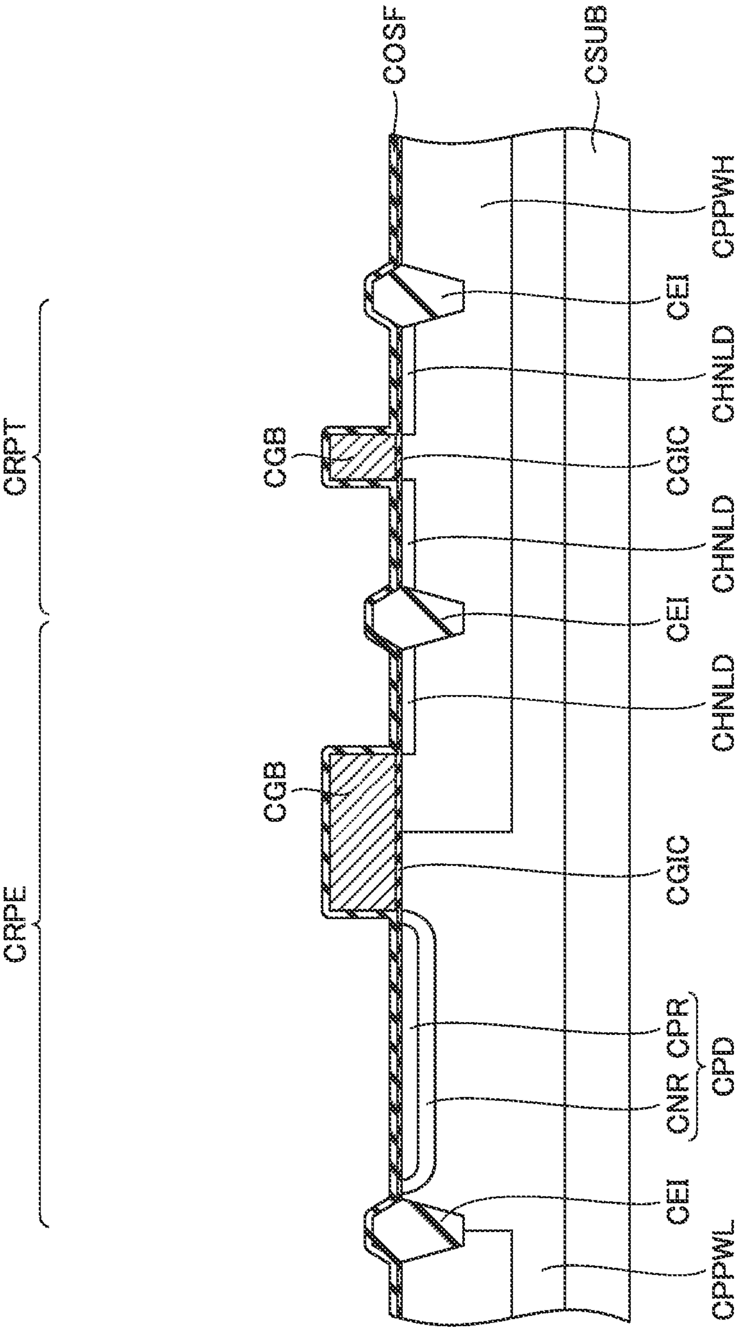
FIG. 25A is a cross sectional view of a pixel region and the like showing one step of a method for manufacturing an imaging apparatus in accordance with a comparative example.
Figure 25B:
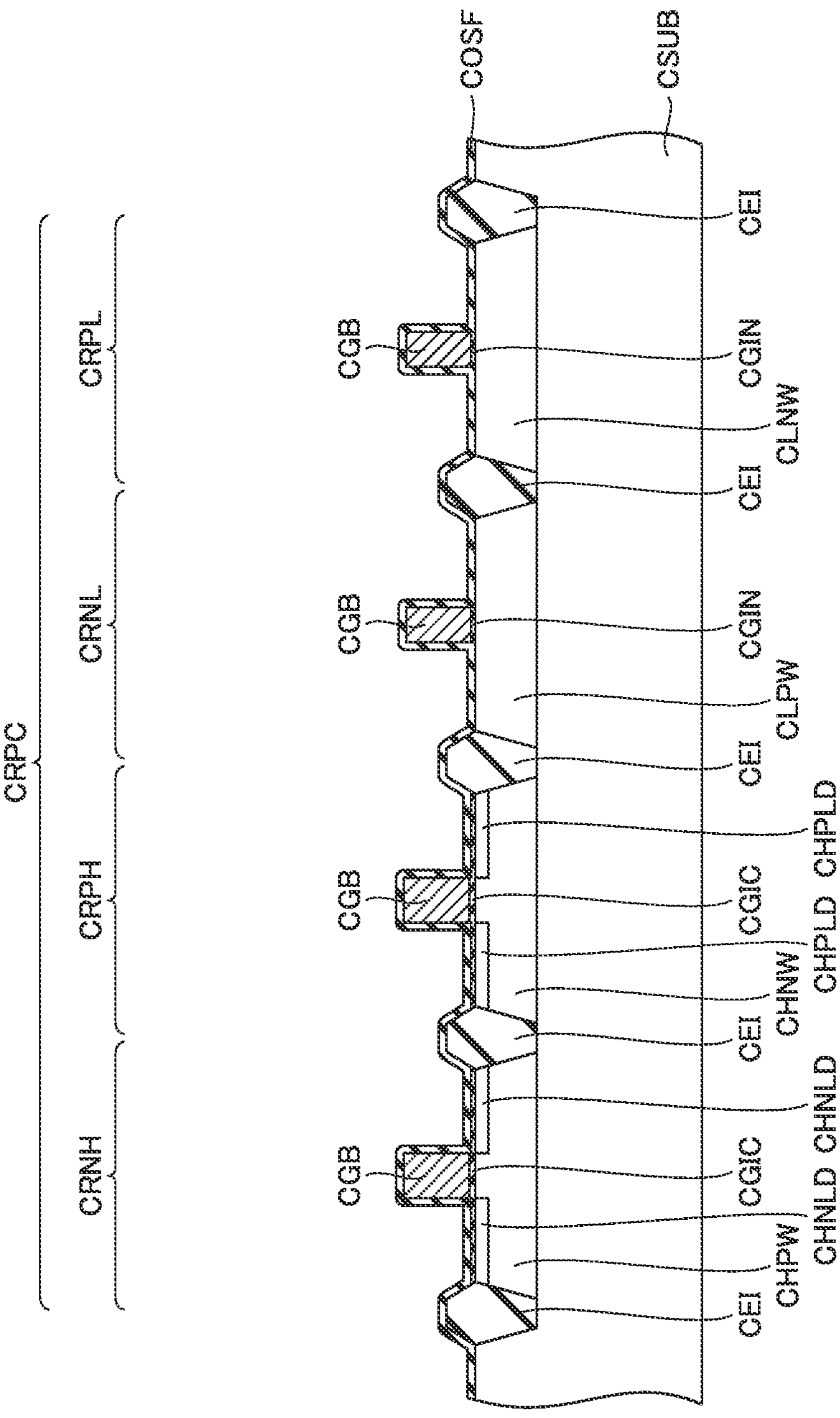
FIG. 25B is a cross sectional view of a peripheral region showing the one step of the method for manufacturing the imaging apparatus in accordance with the comparative example.
Figure 26A:
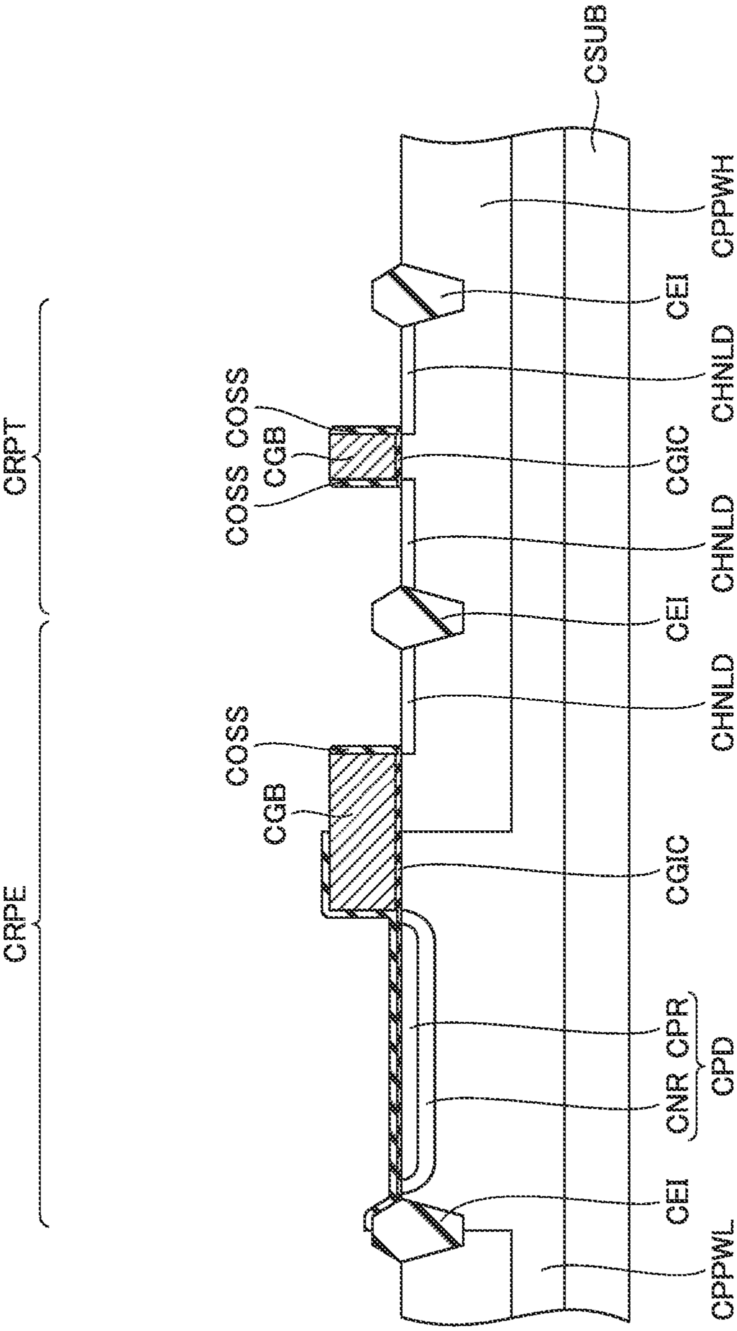
FIG. 26A is a cross sectional view of the pixel region and the like showing a step performed after the step shown in FIGS. 25A and 25B.
Figure 26B:
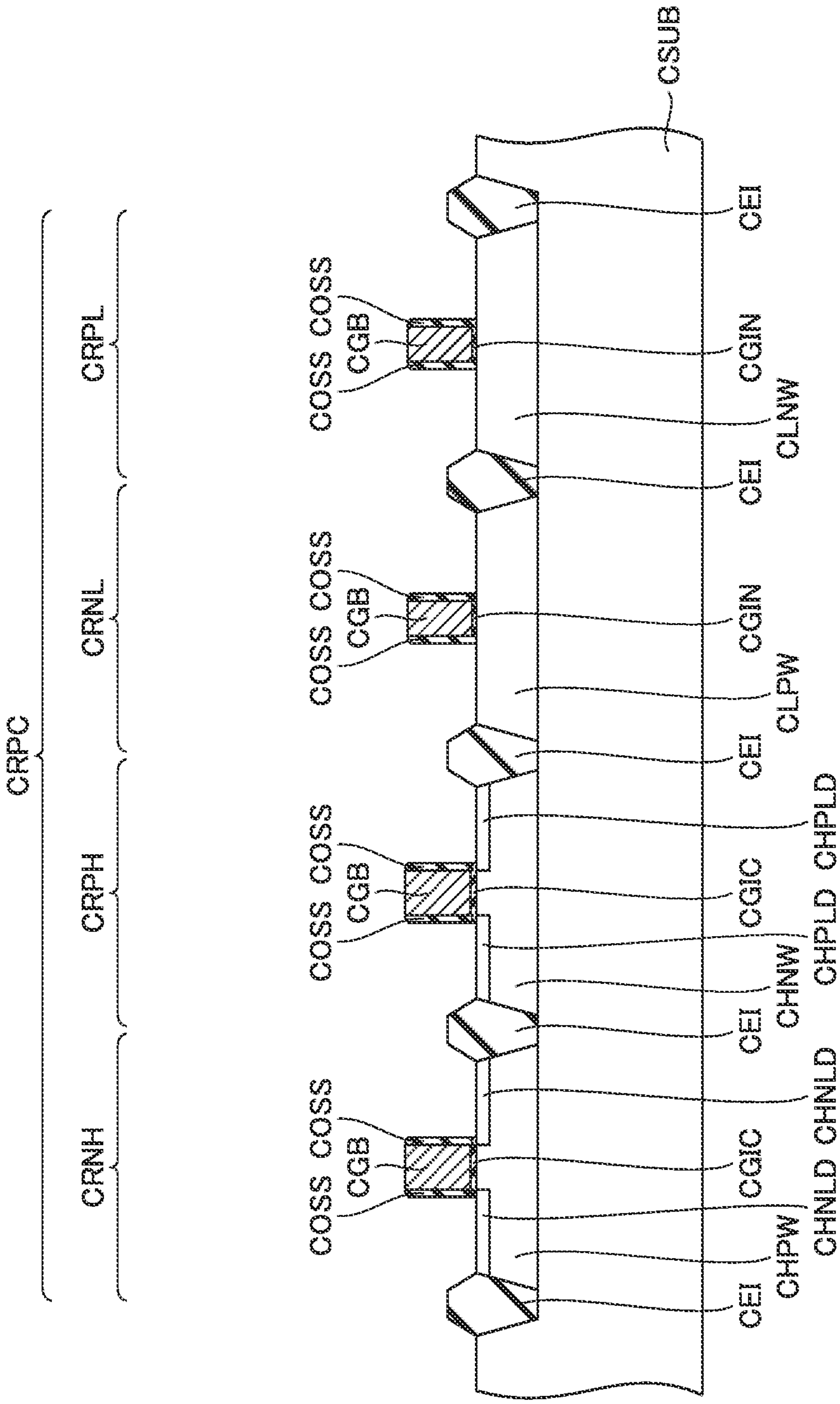
FIG. 26B is a cross sectional view of the peripheral region showing the step performed after the step shown in FIGS. 25A and 25B.

First, after the steps from the step identical to that shown in FIG. 5A and FIG. 5B to the step identical to that shown in FIG. 10A and FIG. 10B are performed, an insulating film COSF which is to be an offset spacer film is formed to cover gate electrodes CGB, as shown in FIG. 25A and FIG. 25B. Here, insulating film COSF which is to be the offset spacer film has a single-layer structure, and insulating film COSF made of a silicon oxide film is formed. Next, by performing anisotropic etching treatment on entire insulating film COSF, offset spacer films COSS are formed on sidewall surfaces of gate electrodes CGB, as shown in FIG. 26A and FIG. 26B.

Figure 27A:
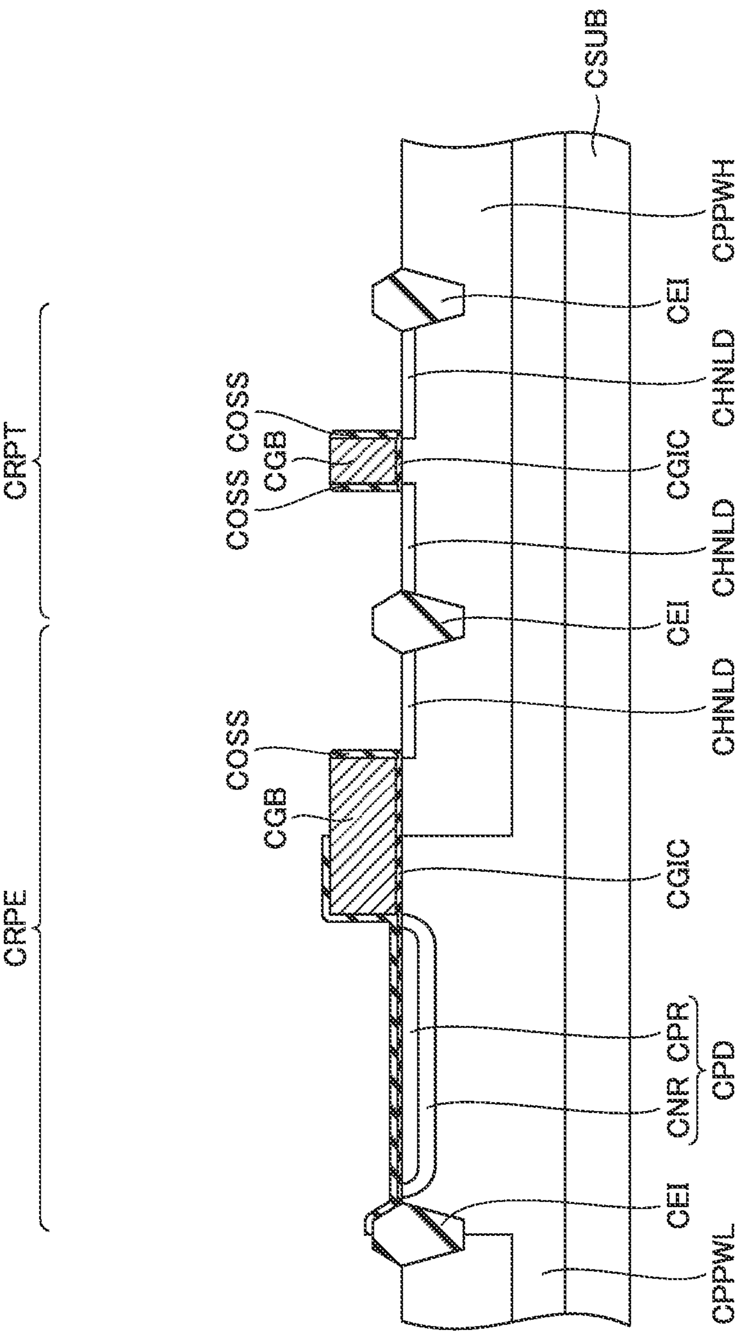
FIG. 27A is a cross sectional view of the pixel region and the like showing a step performed after the step shown in FIGS. 26A and 26B.
Figure 27B:
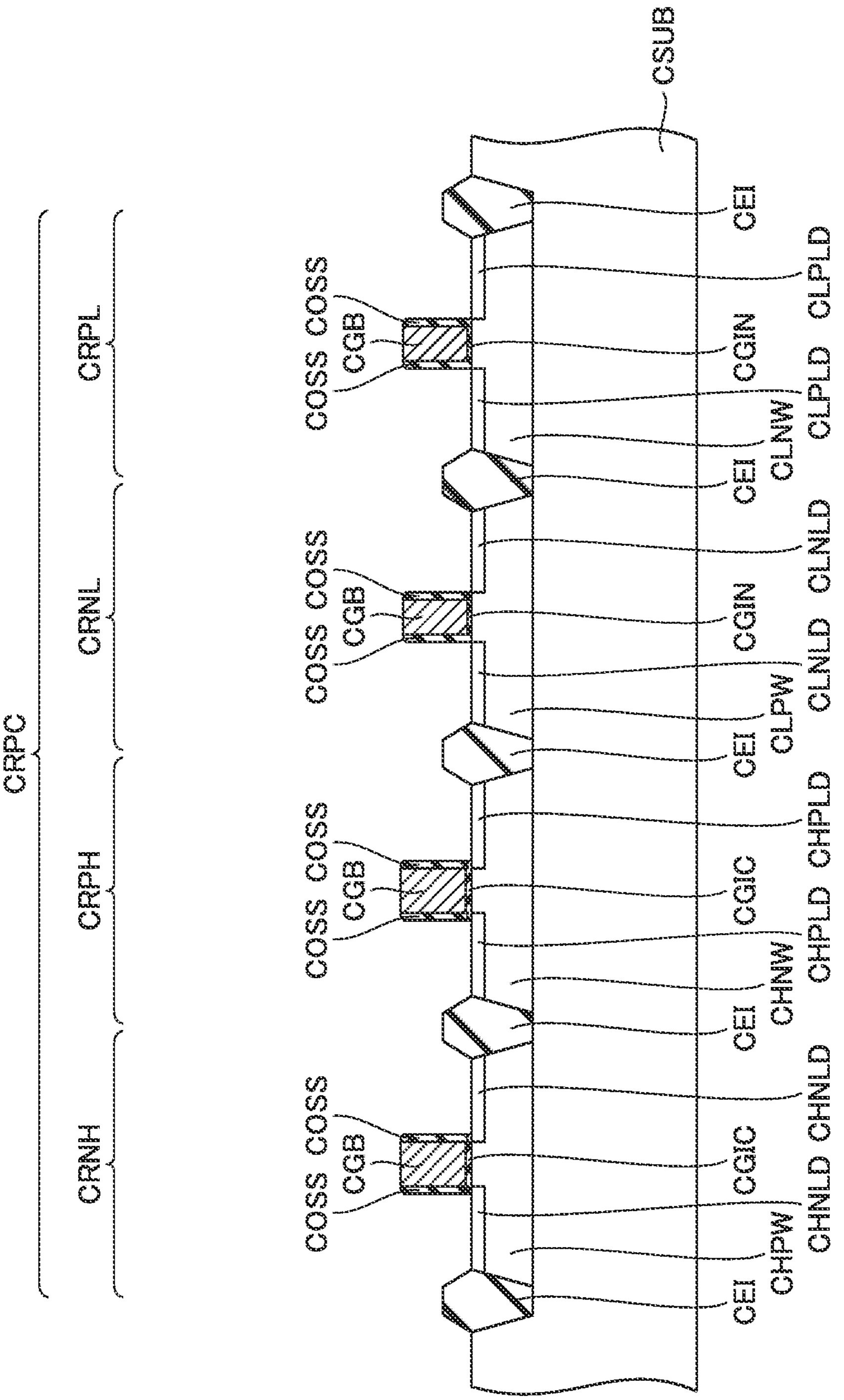
FIG. 27B is a cross sectional view of the peripheral region showing the step performed after the step shown in FIGS. 26A and 26B.

Next, by the step identical to that shown in FIG. 13A and FIG. 13B, an n-type impurity is implanted, using a predetermined resist pattern (not shown), gate electrode CGB, offset spacer films COSS, and the like as an implantation mask. Next, by the step identical to that shown in FIG. 14A and FIG. 14B, a p-type impurity is implanted, using a predetermined resist pattern (not shown), gate electrode CGB, offset spacer films COSS, and the like as an implantation mask. Thereby, extension regions CLNLD are formed in a region CRNL, and extension regions CLPLD are formed in a region CRPL, as shown in FIG. 27A and FIG. 27B.

Figure 28A:
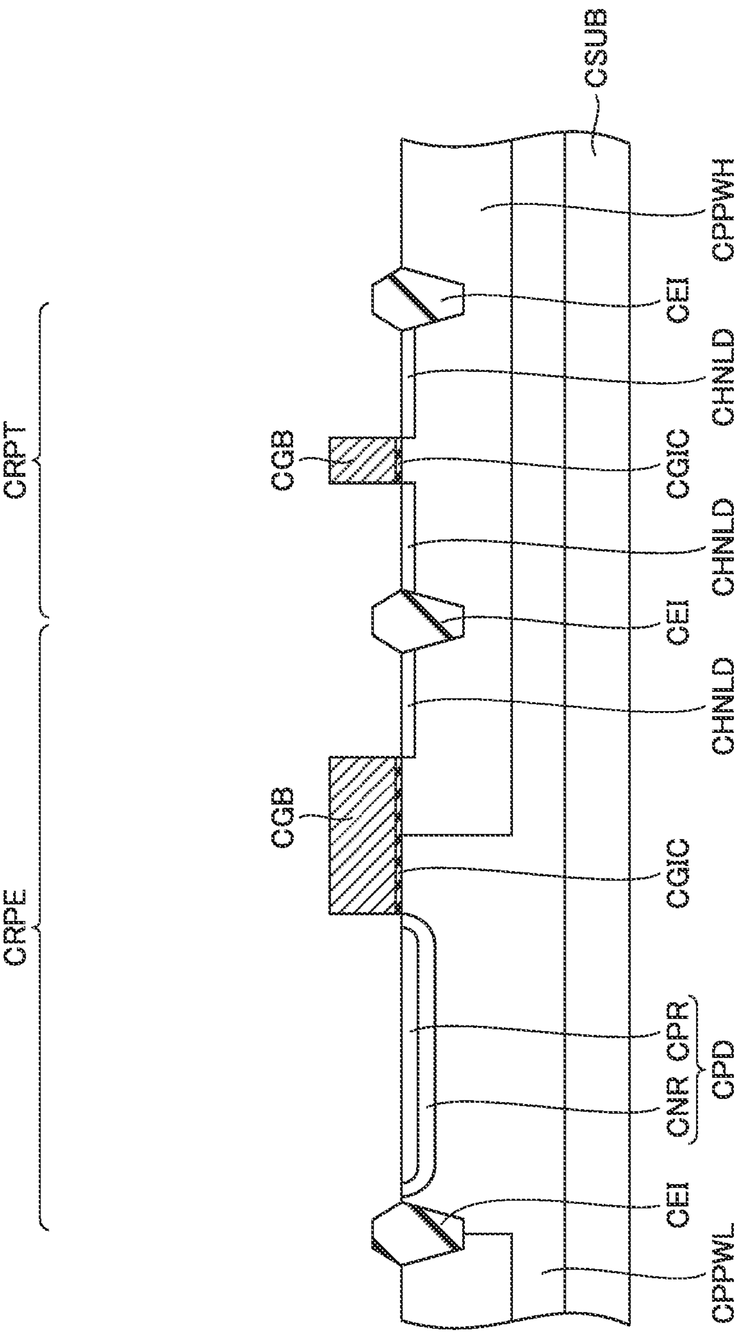
FIG. 28A is a cross sectional view of the pixel region and the like showing a step performed after the step shown in FIGS. 27A and 27B.
Figure 28B:
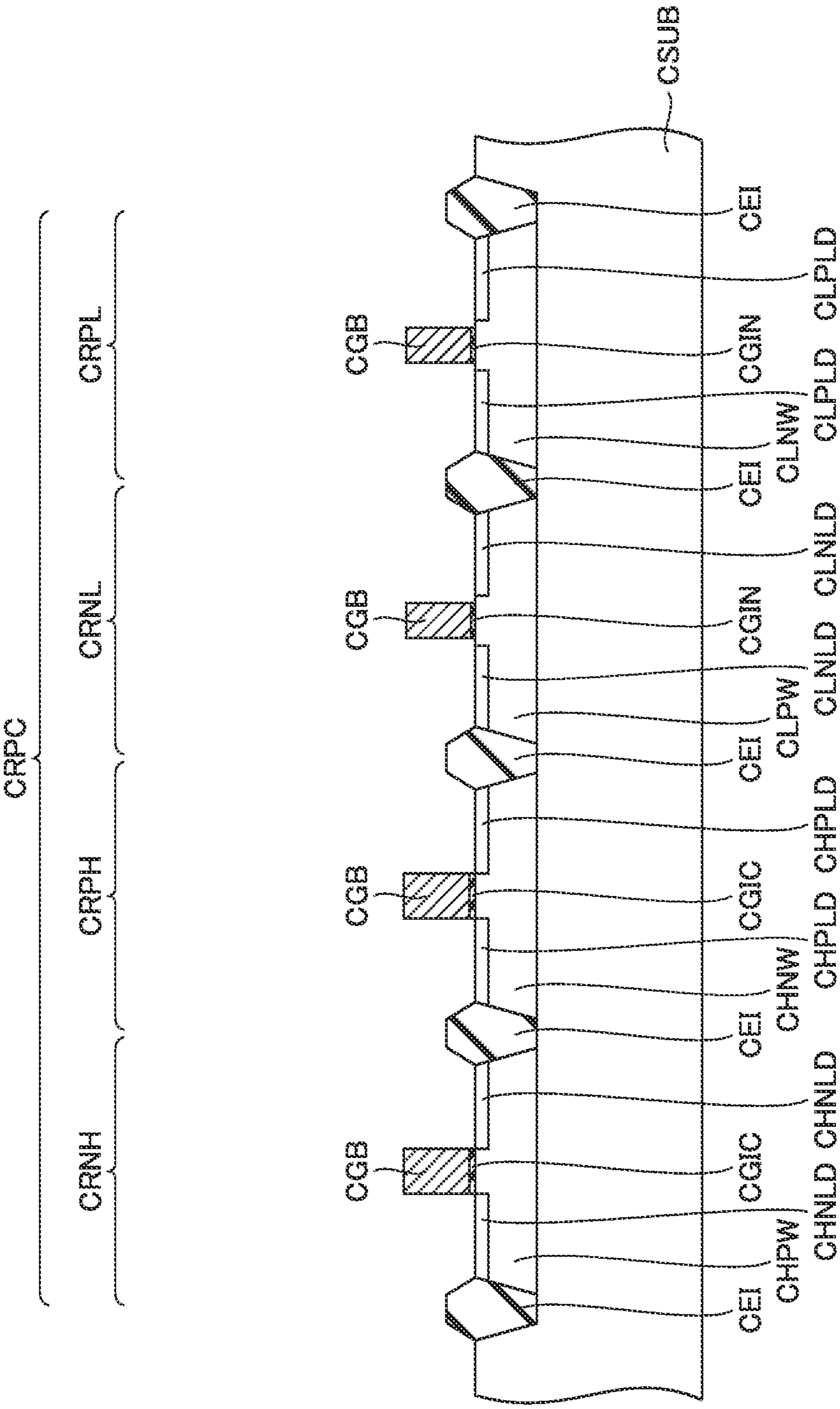
FIG. 28B is a cross sectional view of the peripheral region showing the step performed after the step shown in FIGS. 27A and 27B.
Figure 29A:
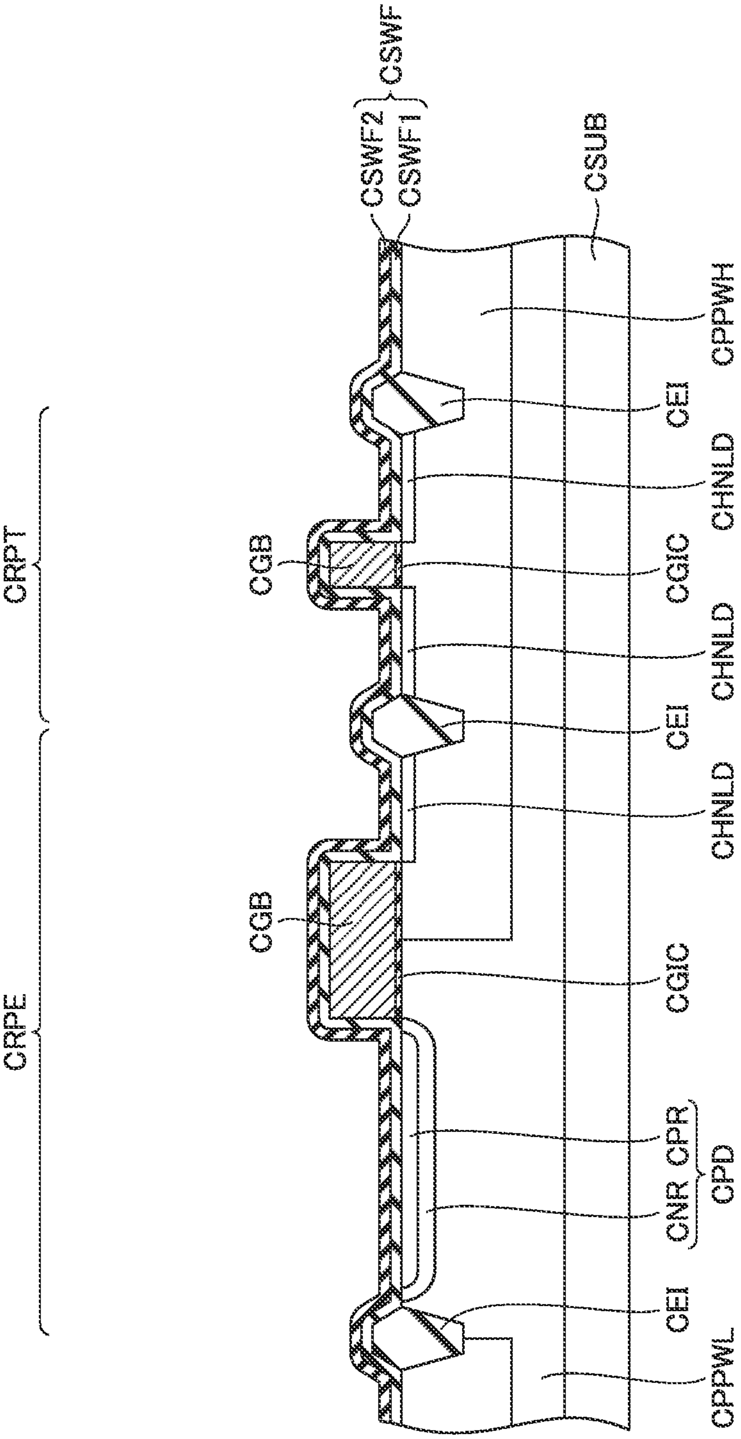
FIG. 29A is a cross sectional view of the pixel region and the like showing a step performed after the step shown in FIGS. 28A and 28B.
Figure 29B:
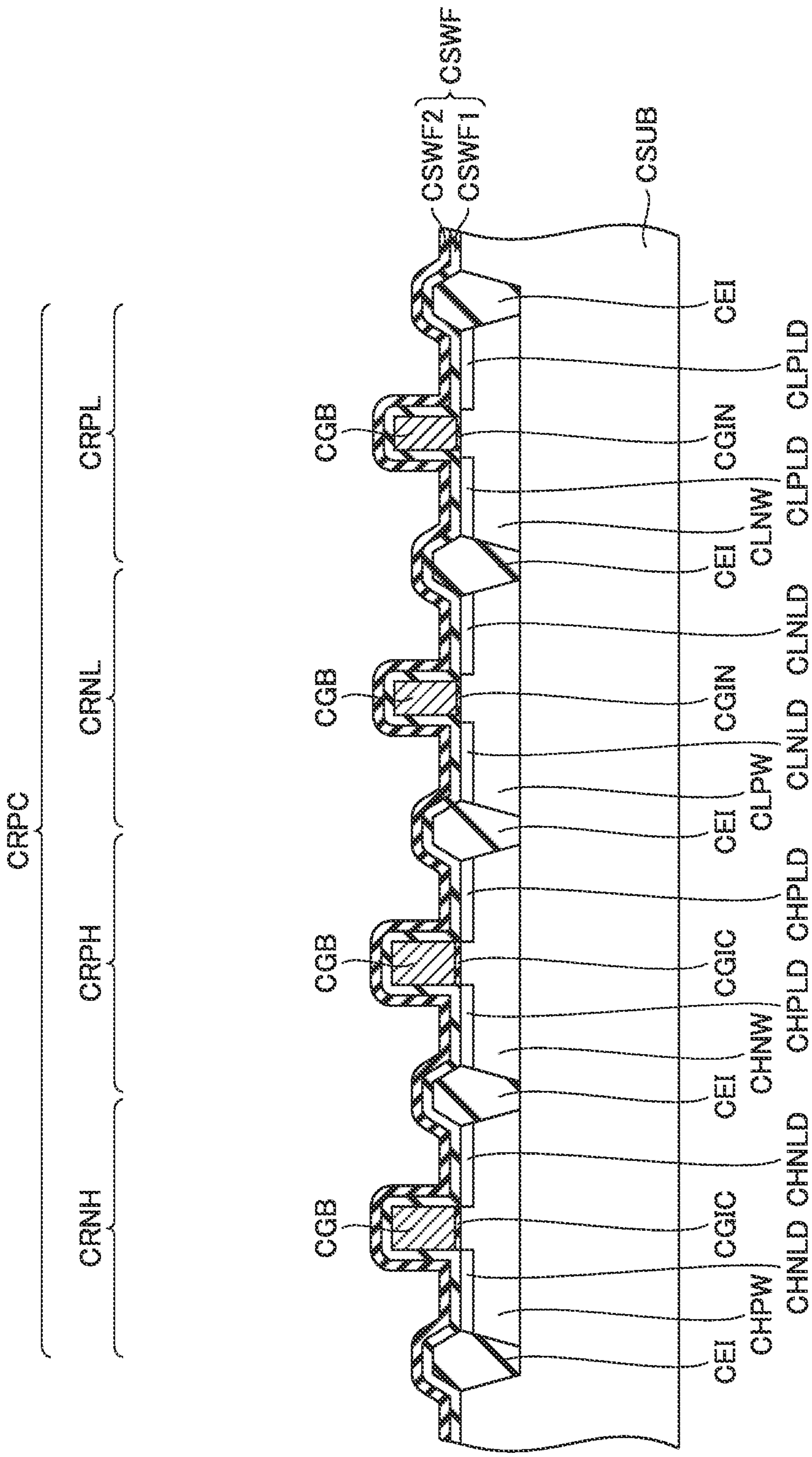
FIG. 29B is a cross sectional view of the peripheral region showing the step performed after the step shown in FIGS. 28A and 28B.
Figure 30A:
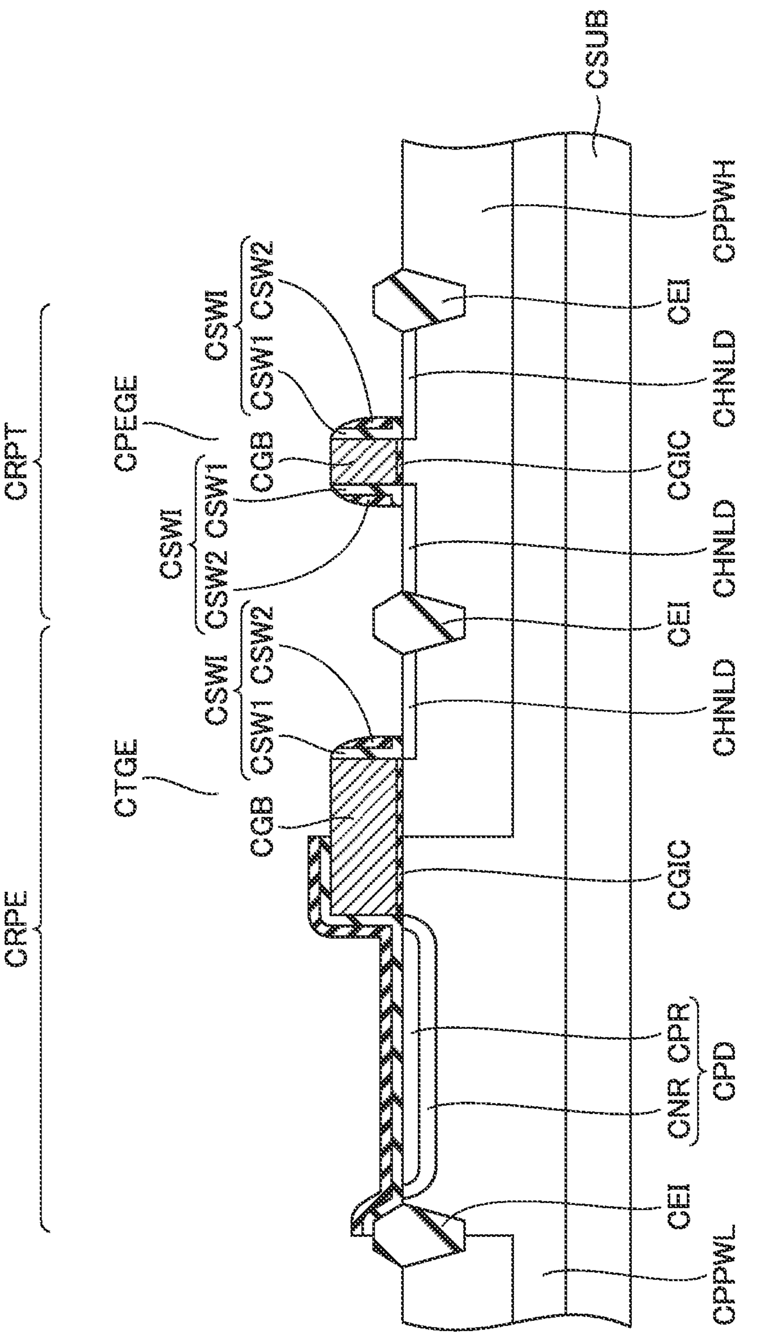
FIG. 30A is a cross sectional view of the pixel region and the like showing a step performed after the step shown in FIGS. 29A and 29B.
Figure 30B:
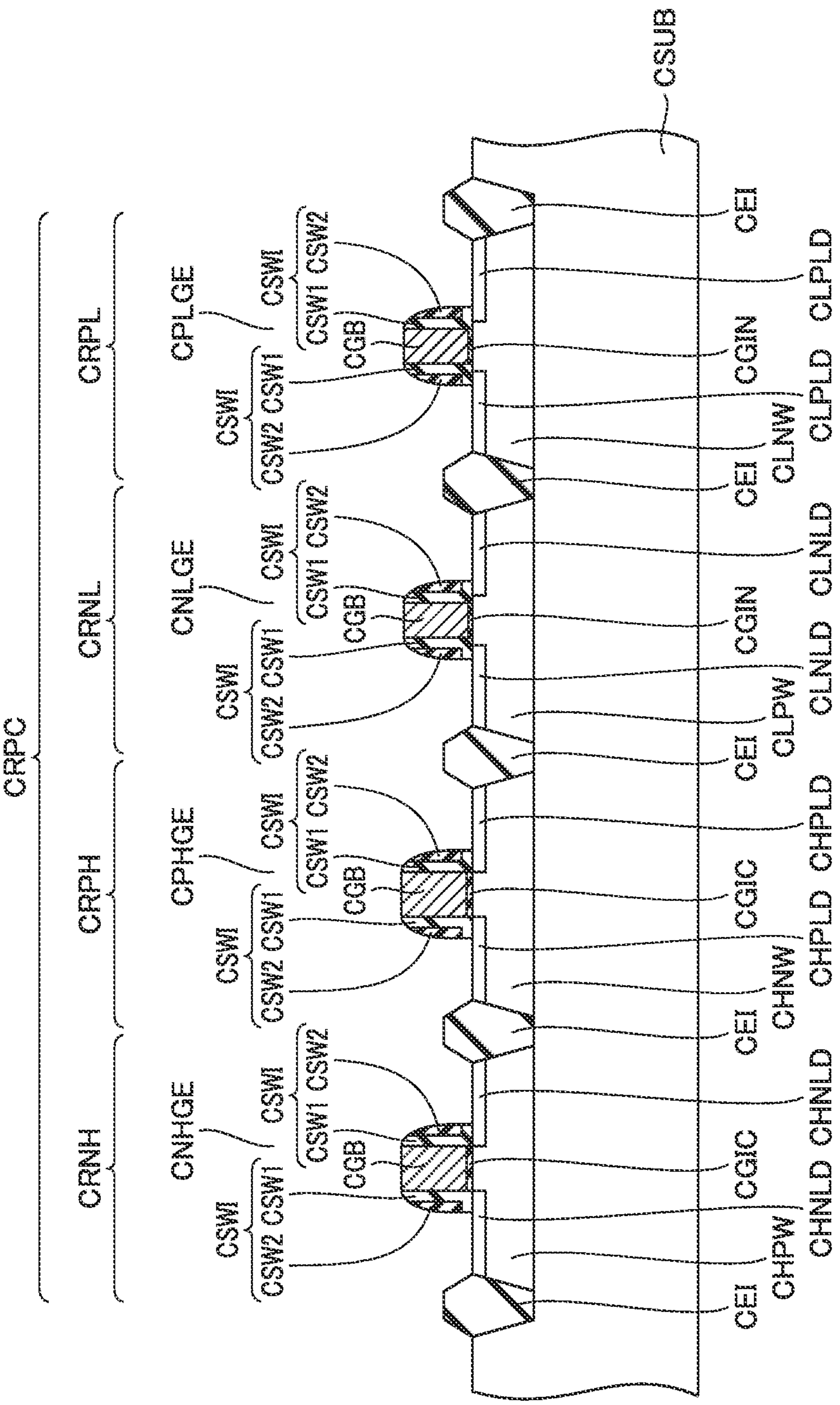
FIG. 30B is a cross sectional view of the peripheral region showing the step performed after the step shown in FIGS. 29A and 29B.

Next, by performing wet etching treatment using a predetermined chemical solution, offset spacer films COSS are removed as shown in FIG. 28A and FIG. 28B. Next, an insulating film CSWF which is to be a sidewall insulating film is formed to cover gate electrodes CGB, as shown in FIG. 29A and FIG. 29B. As insulating film CSWF, first, a silicon oxide film CSWF1 is formed, and then a silicon nitride film CSWF2 is formed. Next, by performing anisotropic etching treatment on insulating film CSWF, sidewall insulating films CSWI are formed on the sidewall surfaces of gate electrodes CGB, as shown in FIG. 30A and FIG. 30B.

Next, by the step identical to that shown in FIG. 18A and FIG. 18B, a p-type impurity is implanted, using a predetermined resist pattern (not shown) and gate electrode portions CPHGE, CPLGE as an implantation mask. Next, by the step identical to that shown in FIG. 19A and FIG. 19B, an n-type impurity is implanted, using a predetermined resist pattern (not shown) and gate electrode portions CTGE, CPEGE, CNHGE, CNLGE as an implantation mask.

Figure 31A:
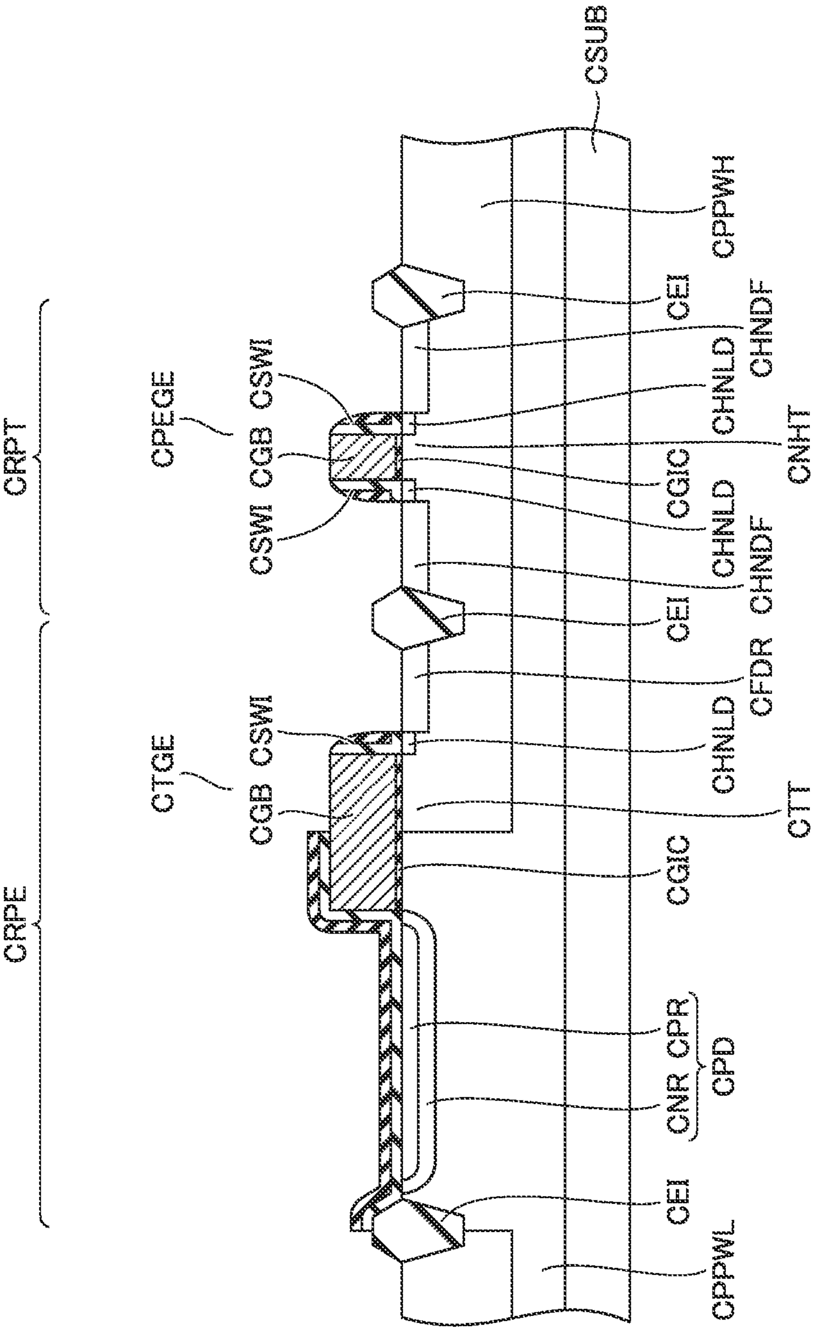
FIG. 31A is a cross sectional view of the pixel region and the like showing a step performed after the step shown in FIGS. 30A and 30B.
Figure 31B:
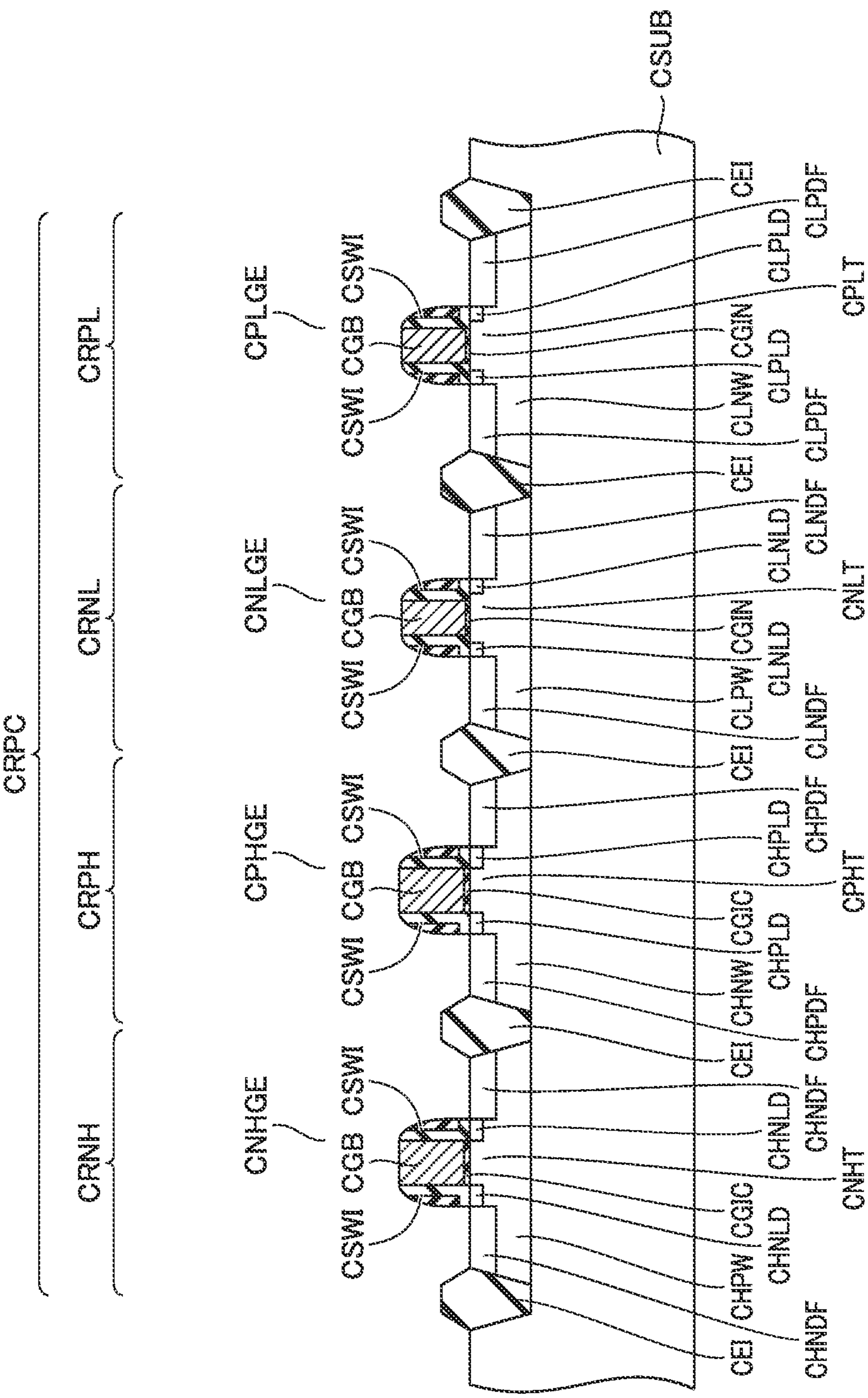
FIG. 31B is a cross sectional view of the peripheral region showing the step performed after the step shown in FIGS. 30A and 30B.

Thereby, as shown in FIG. 31A and FIG. 31B, in a region CRPH, source/drain regions CHPDF are formed, and in region CRPL, source/drain regions CLPDF are formed. In each of a pixel transistor region CRPT and a region CRNH, source/drain regions CHNDF are formed, and in region CRNL, source/drain regions CLNDF are formed. In a pixel region CRPE, a floating diffusion region CFDR is formed.

Figure 32A:
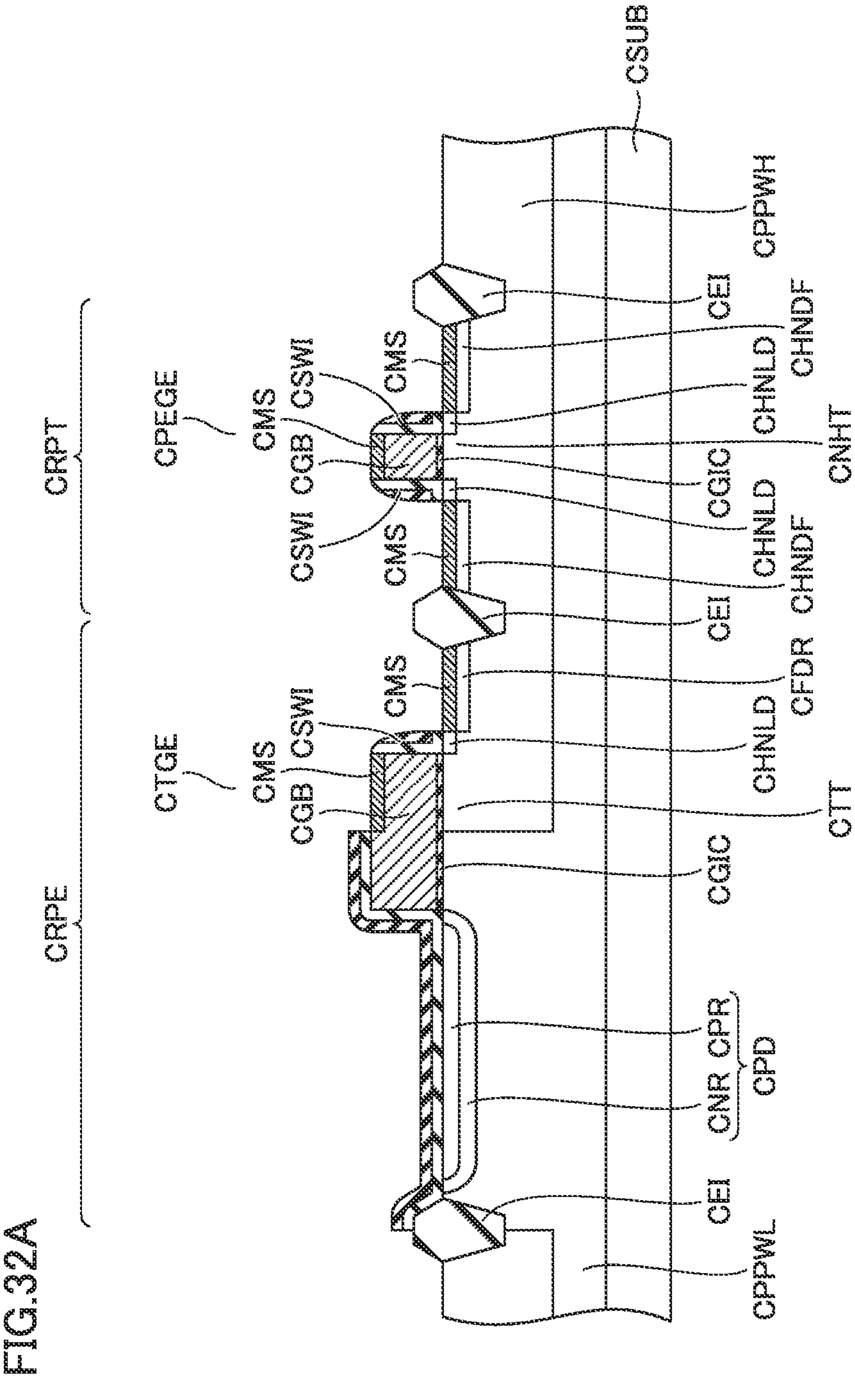
FIG. 32A is a cross sectional view of the pixel region and the like showing a step performed after the step shown in FIGS. 31A and 31B.
Figure 32B:
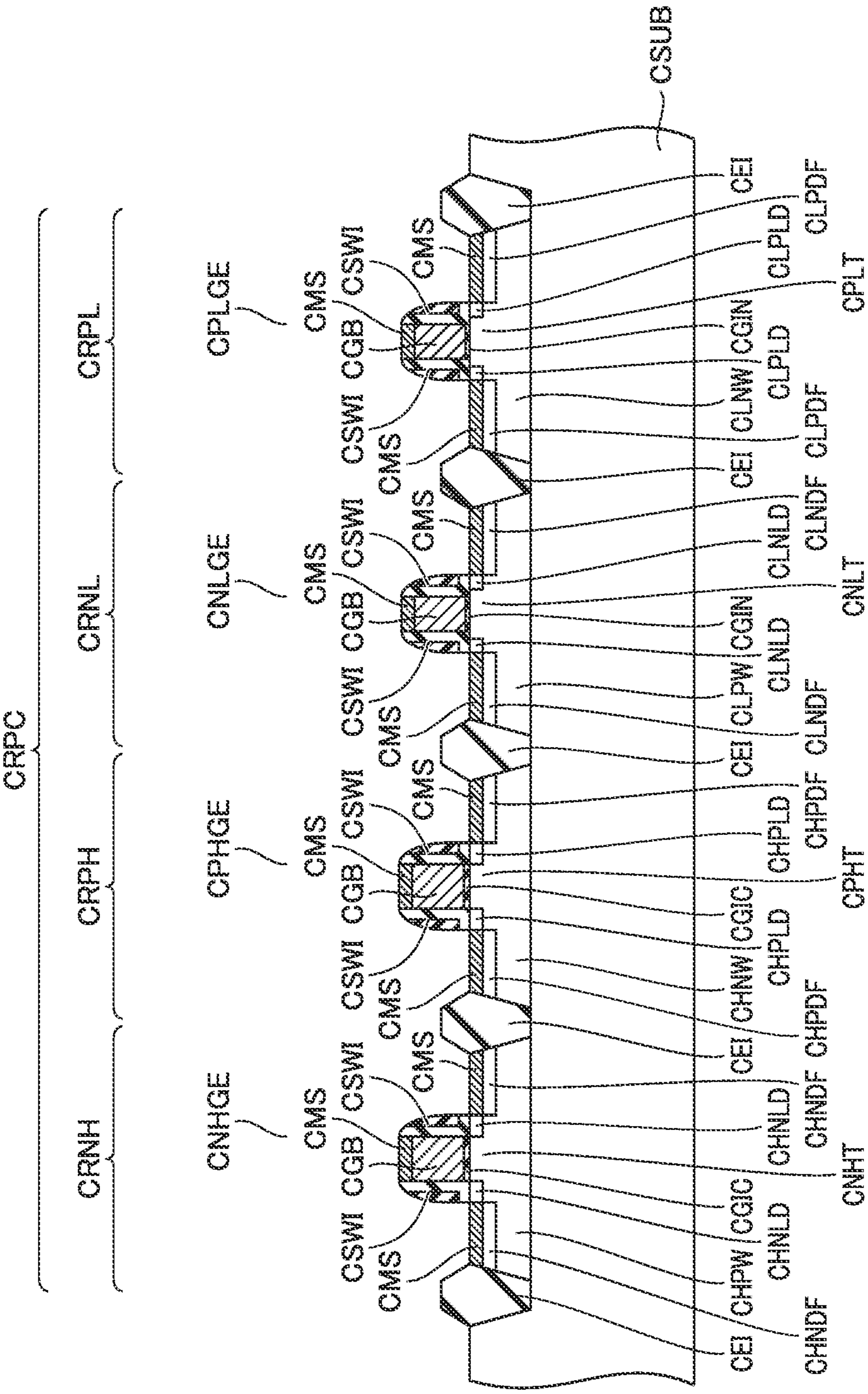
FIG. 32B is a cross sectional view of the peripheral region showing the step performed after the step shown in FIGS. 31A and 31B.
Figure 33A:
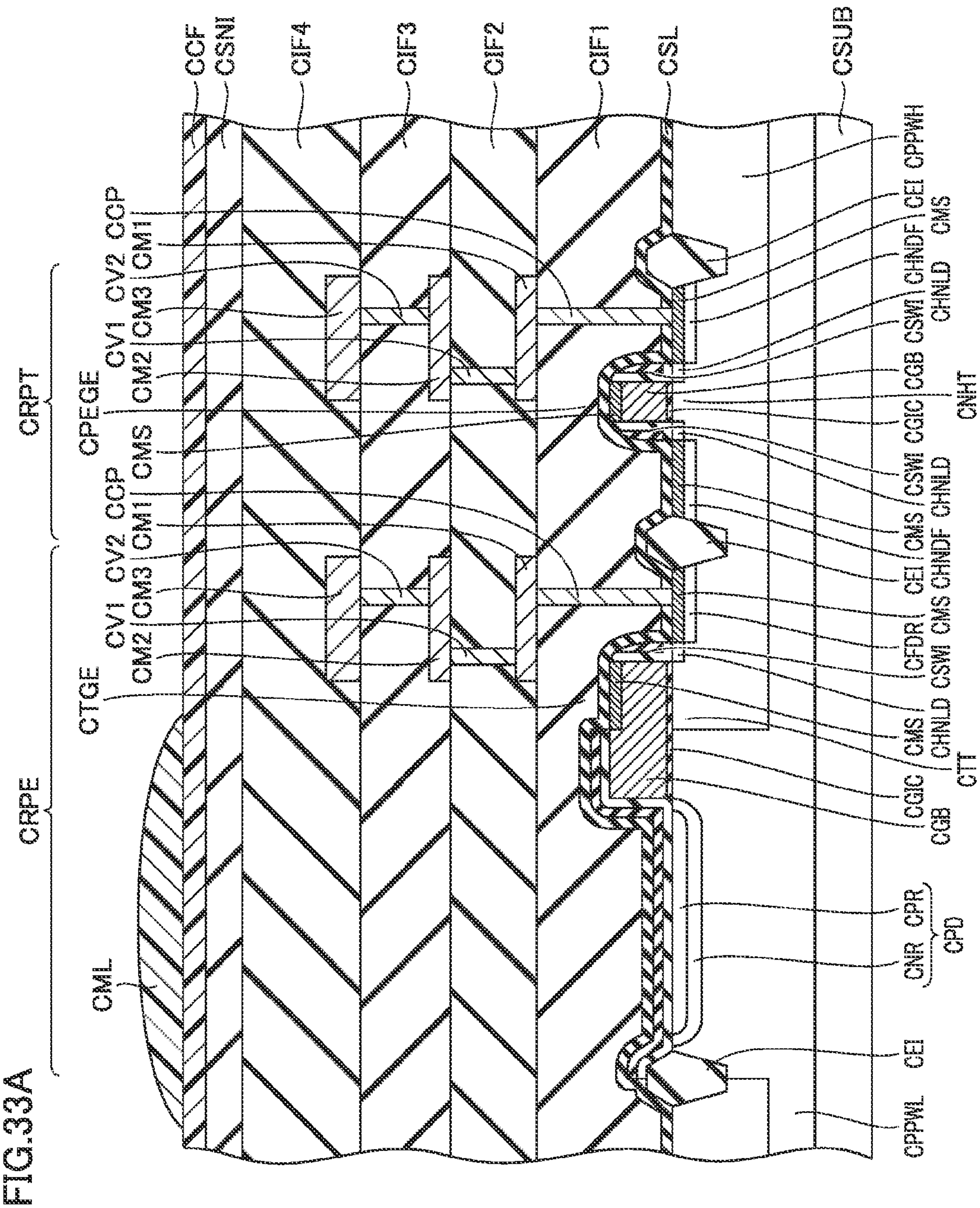
FIG. 33A is a cross sectional view of the pixel region and the like showing a step performed after the step shown in FIGS. 32A and 32B.
Figure 33B:
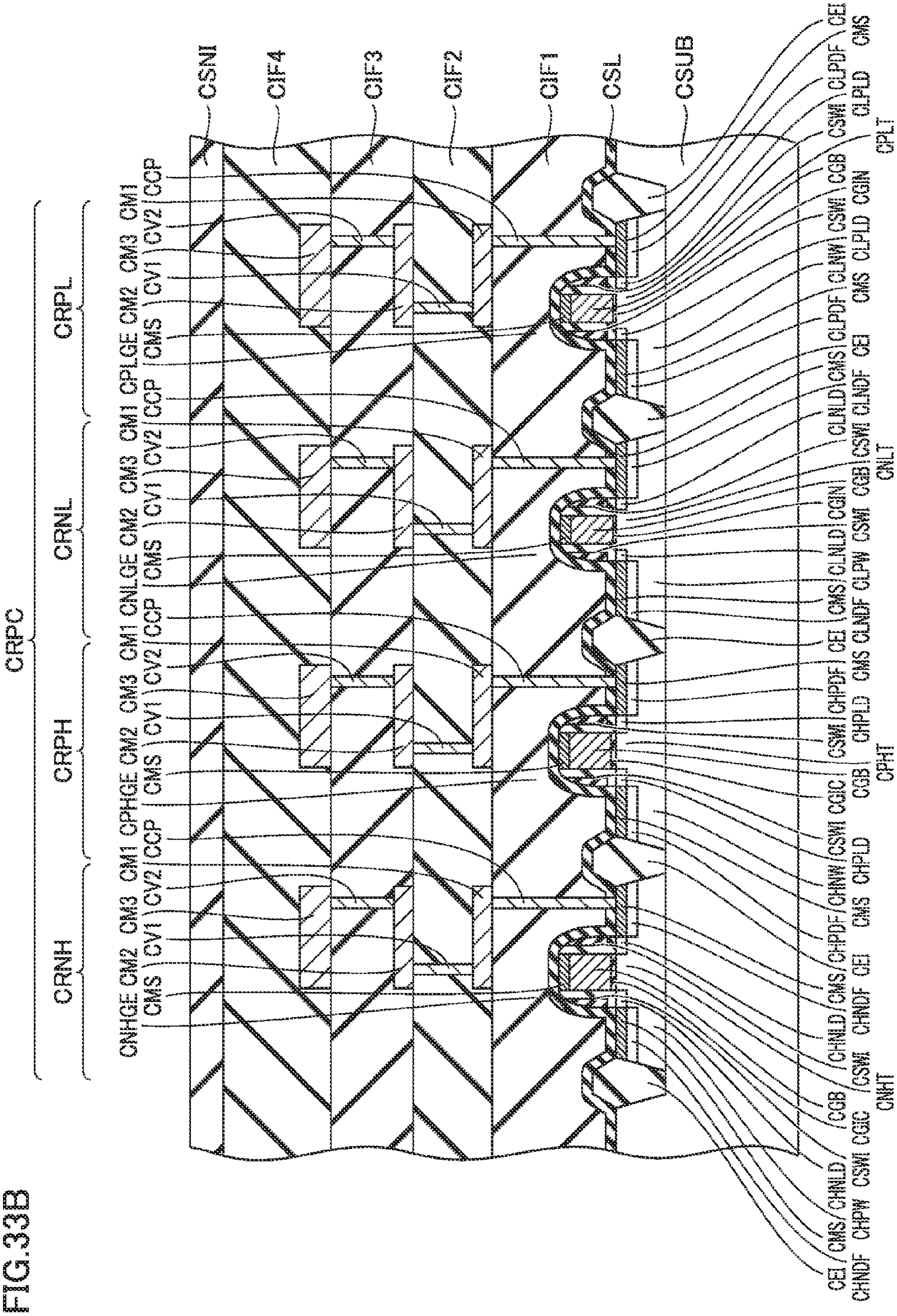
FIG. 33B is a cross sectional view of the peripheral region showing the step performed after the step shown in FIGS. 32A and 32B.

Next, metal silicide films CMS are formed in pixel region CRPE, pixel transistor region CRPT, and peripheral region CRPC by the SALICIDE method, as shown in FIG. 32A and FIG. 32B. Thereafter, after the step identical to that shown in FIG. 23A and FIG. 23B and the step identical to that shown in FIG. 24A and FIG. 24B are performed, the main part of the imaging apparatus in accordance with the comparative example is completed as shown in FIG. 33A and FIG. 33B.

As described above, a semiconductor device such as a field effect transistor in an imaging apparatus is formed in a device formation region (a region in a semiconductor substrate) defined by trench isolation. The field effect transistor includes field effect transistors NHT, PHT (CNHT, CPHT) driven at a relatively high voltage, and field effect transistors NLT, PLT (CNLT, CPLT) driven at a relatively low voltage.

Gate insulating film GIC (CGIC) of field effect transistor NHT, PHT (CNHT, CPHT) is formed thicker than gate insulating film GIN (CGIN) of field effect transistor NLT, PLT (CNLT, CPLT). Gate insulating films GIC, GIN (CGIC, CGIN) having film thicknesses different from each other are formed by combining thermal oxidation treatment with treatment for partially removing an insulating film formed by the thermal oxidation treatment.

Here, when gate insulating film GIC (CGIC) having a thick film thickness is formed, a sacrificial oxide film is removed beforehand by wet treatment. Further, when gate insulating film GIN (CGIN) is formed, a thick sacrificial oxide film formed when gate insulating film GIC (CGIC) having a thick film thickness is formed is removed beforehand by wet treatment.

Figure 35:
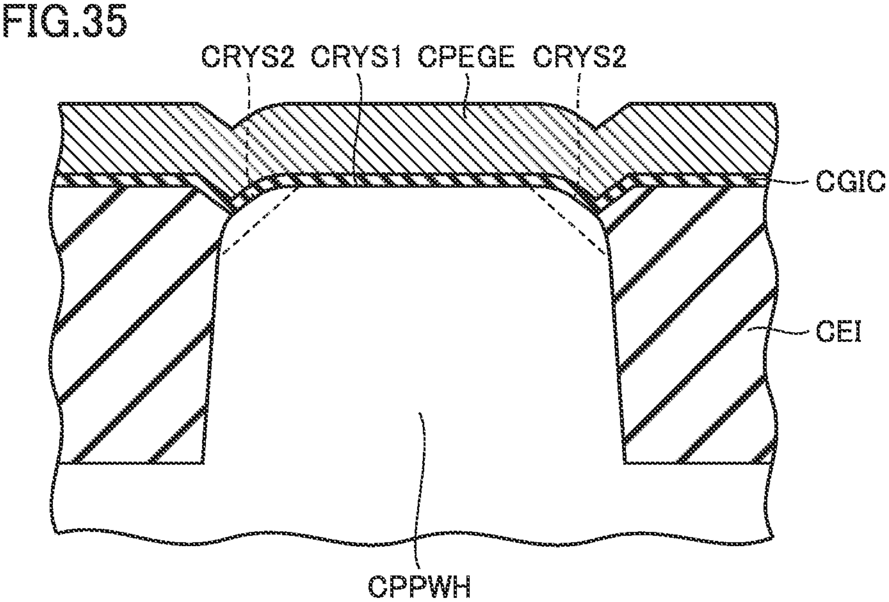
FIG. 35 is a partial cross sectional view along a section line XXXV-XXXV shown in FIG. 34 in the same embodiment.

On this occasion, there is a possibility that a boundary portion between a device isolation insulating film formed in a trench and a device formation region (semiconductor substrate) is etched and a depression is generated, and a Si (111) plane CRYS2 (or a plane parallel to a Si (111) crystal plane) may appear in the device formation region, as a crystal plane of the semiconductor substrate (silicon substrate) (see FIG. 35). Such a depression is called an "STI Divot". It should be noted that the dotted line shown in FIG. 35 indicates a Si (111) plane (crystal plane).

Figure 34:
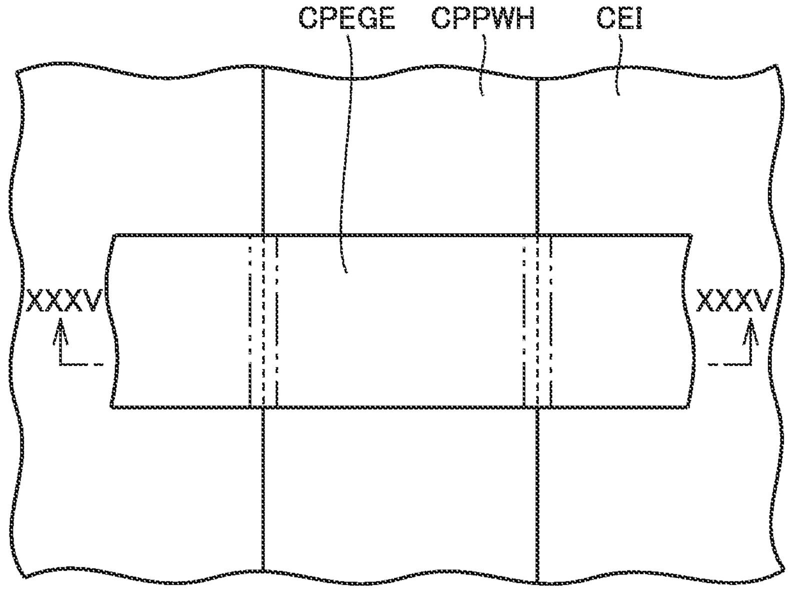
FIG. 34 is a partial plan view of the imaging apparatus in accordance with the comparative example for illustrating the function and effect, in the same embodiment.

In the imaging apparatus in accordance with the comparative example, gate electrode portion CPEGE of the field effect transistor or the like is formed to cover such (111) plane CRYS2 of silicon, as shown in FIG. 34 and FIG. 35. It is known that there are many dangling bonds of silicon and many interface states resulting from the dangling bonds in (111) plane CRYS2 of silicon. Thus, in the field effect transistor, read-out noise increases due to the influence of the interface states.

In particular, in the amplification transistor electrically connected to the floating diffusion region, a channel is influenced by an interface state and noise (1/f noise) increases, and in an amplifying circuit including the amplification transistor, the 1/f noise and random noise including thermal noise (FD amplifier noise) increase. These increase read-out noise. It should be noted that the random noise includes dark-current shot noise, FD reset noise, and optical shot noise, other than FD amplifier noise.

Figure 36:
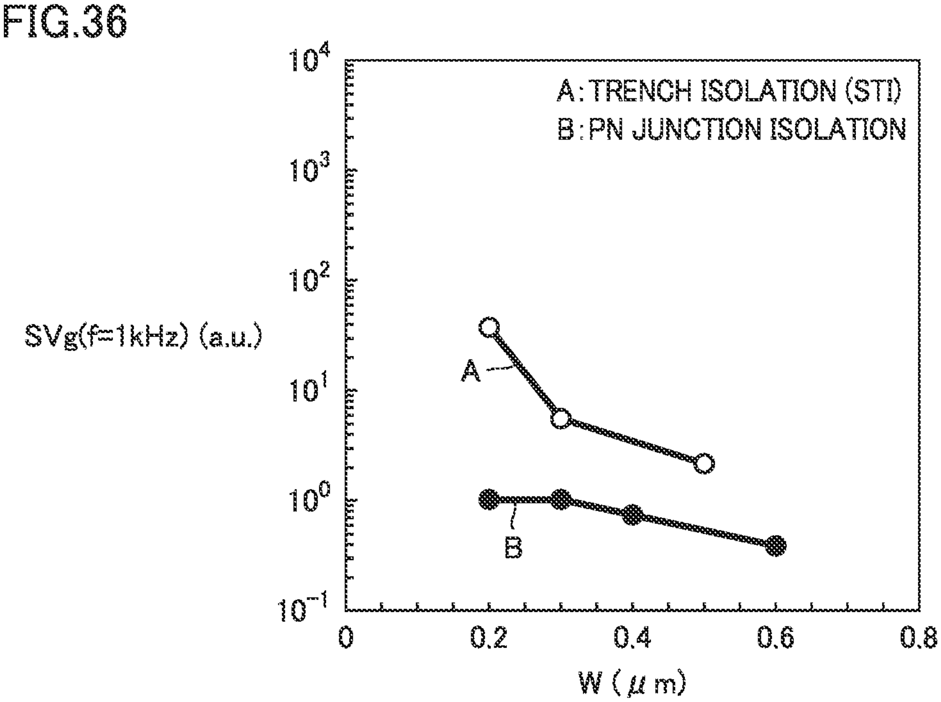
FIG. 36 is a graph showing the relation between noise spectral density and channel width in the same embodiment.

It has been reported that read-out noise increases as the channel width of a field effect transistor becomes shorter in association with miniaturization (see NPD 1). FIG. 36 is a graph showing the relation between noise spectrum and channel width, in which the axis of abscissas represents a channel width W and the axis of ordinates represents a noise spectral density SVg. As shown in FIG. 36, in an imaging apparatus adopting trench isolation (STI) (graph A), read-out noise increases exponentially when channel width W of a field effect transistor becomes shorter than 0.3 μm. On the other hand, in an imaging apparatus adopting isolation by pn junction (graph B), read-out noise increases less than that in graph A, and increases linearly. As read-out noise increases, the SN ratio worsens, and image sharpness, contrast, a feeling of depth of color, and the like are lost. In addition, this constitutes a factor that inhibits miniaturization of pixels of the imaging apparatus.

Figure 37:
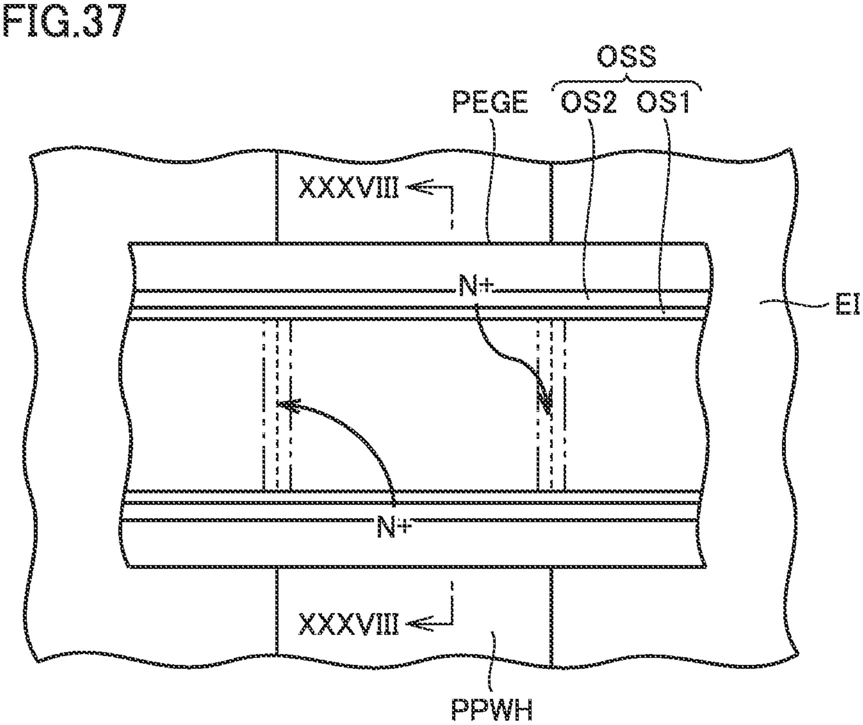
FIG. 37 is a partial plan view of the imaging apparatus in accordance with the embodiment for illustrating the function and effect, in the same embodiment.
Figure 38:
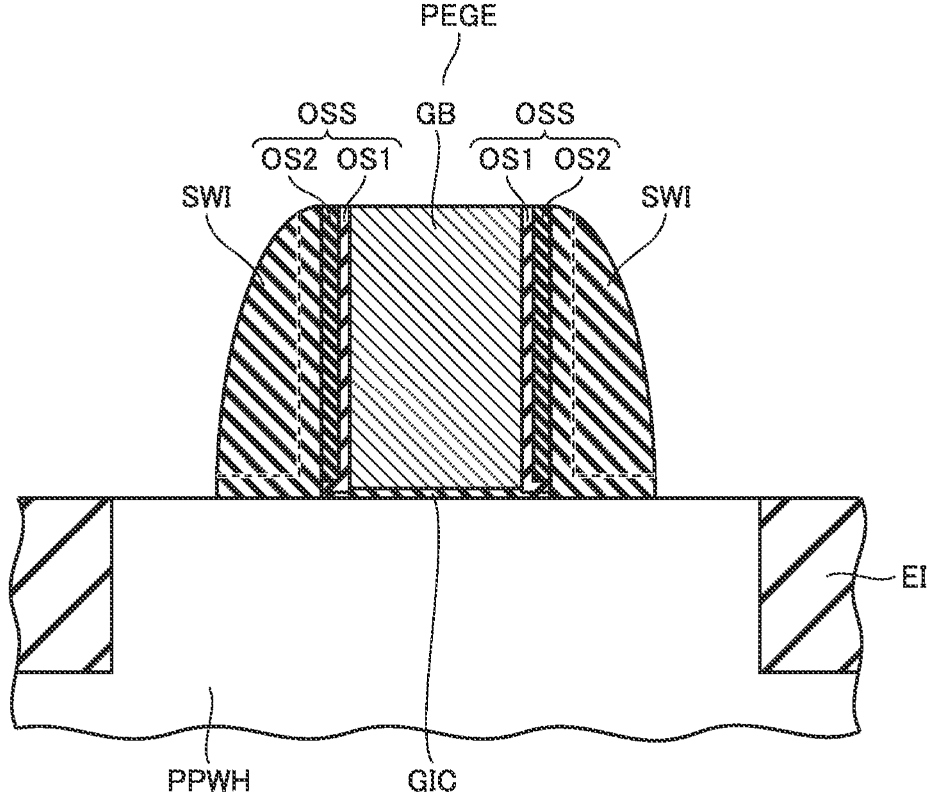
FIG. 38 is a partial cross sectional view along a section line XXXVIII-XXXVIII shown in FIG. 37 in the same embodiment.

In contrast to the imaging apparatus in accordance with the comparative example, in the imaging apparatus in accordance with the embodiment, a predetermined film is formed which contains at least one of nitrogen (N) and hydrogen (H) as an element for terminating dangling bonds in the device formation region (the Si (111) plane at an end portion of STI). Namely, as shown in FIG. 37 and FIG. 38, offset spacer film OSS including silicon nitride film OS2 is formed herein as such a predetermined film (see FIG. 12A and FIG. 12B).

It is believed that nitrogen (N) or hydrogen (H) having unpaired bonding hands in the silicon nitride film is diffused by the heat (about 670° C. or more) at the time of forming the silicon nitride film (OSF2). Thus, by quenching heat treatment after formation of insulating film OSF which is to be the offset spacer film as well as heat treatment after implantation at the time of forming source/drain regions HPDF, LPDF, HNDF, LNDF, nitrogen (N) (or hydrogen (H)) is diffused as shown in FIG. 37, a portion thereof is bonded to unpaired bonding hands of silicon, and thereby can terminate dangling bonds of silicon.

This can reduce read-out noise due to the dangling bonds of silicon. As a result, this can prevent loss of image sharpness, contrast, a feeling of depth of color, and the like in the imaging apparatus. Further, this allows miniaturization of the imaging apparatus. It should be noted that forming silicon nitride film OS2 on silicon oxide film OS1 as offset spacer film OSS can improve resistance to the chemical solution at the time of removing a resist pattern, and can suppress film reduction of offset spacer film OSS.

Second Embodiment

Here, a description will be given of a case where an offset spacer film with a double-layer structure is formed, then a silicon nitride film as an upper-layer film is removed with a silicon oxide film as a lower-layer film being left, and thereafter a sidewall insulating film with a double-layer structure is formed. It should be noted that members identical to those of the aforementioned imaging apparatus will be designated by the same reference numerals, and the description thereof will not be repeated unless deemed necessary.

Figure 39A:
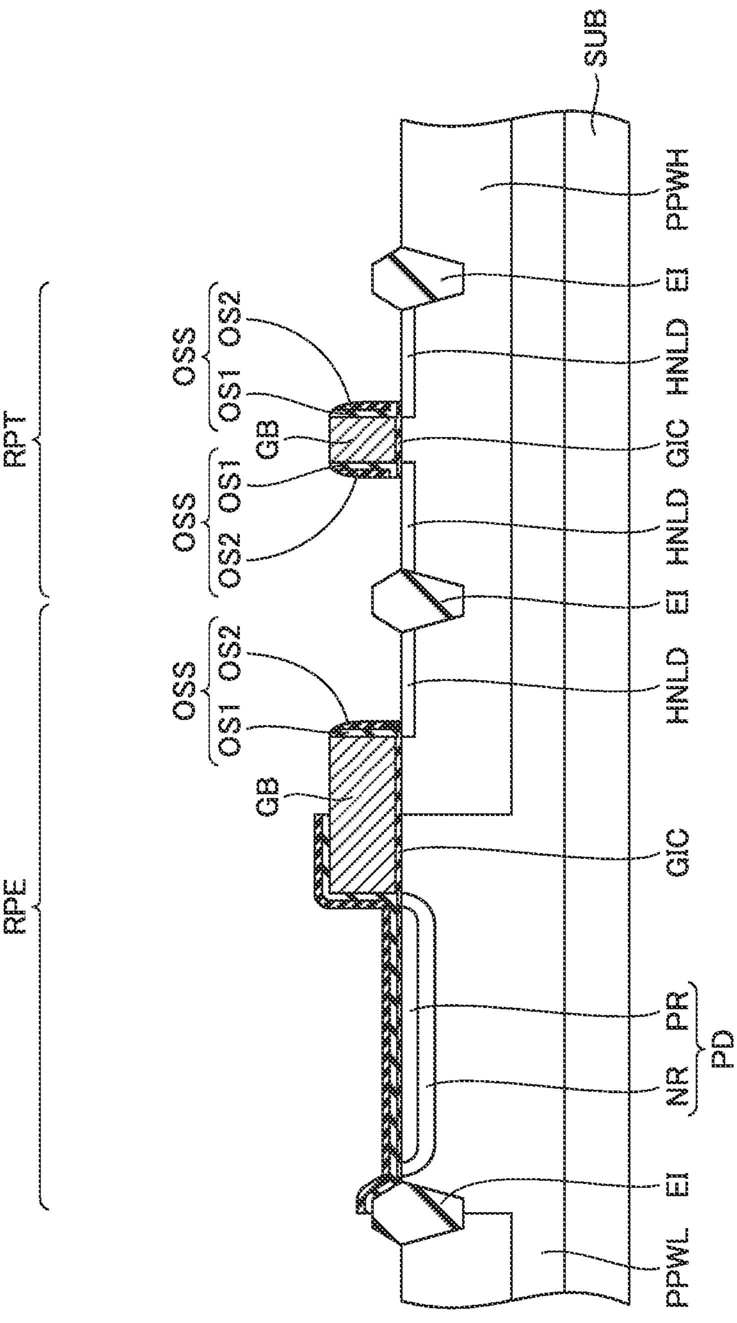
FIG. 39A is a cross sectional view of a pixel region and the like showing one step of a method for manufacturing an imaging apparatus in accordance with a second embodiment.
Figure 39B:
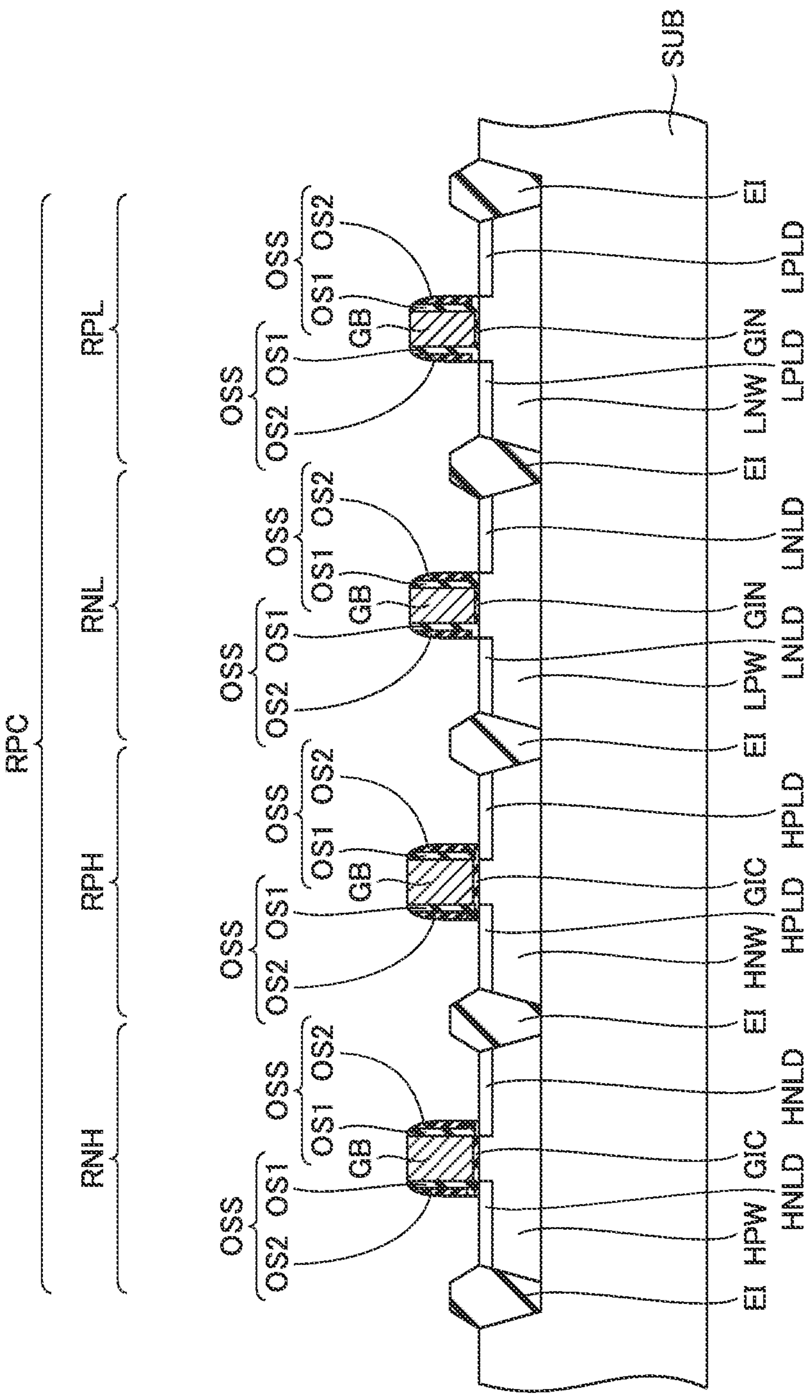
FIG. 39B is a cross sectional view of a peripheral region showing the one step of the method for manufacturing the imaging apparatus in accordance with the second embodiment.

After the steps from the step identical to that shown in FIG. 5A and FIG. 5B to the step identical to that shown in FIG. 15A and FIG. 15B are performed, offset spacer films OSS with a double-layer structure including silicon oxide film OS1 as a lower-layer film and silicon nitride film OS2 as an upper-layer film are formed, and extension regions LNLD, LPLD are formed, as shown in FIG. 39A and FIG. 39B.

Figure 40A:
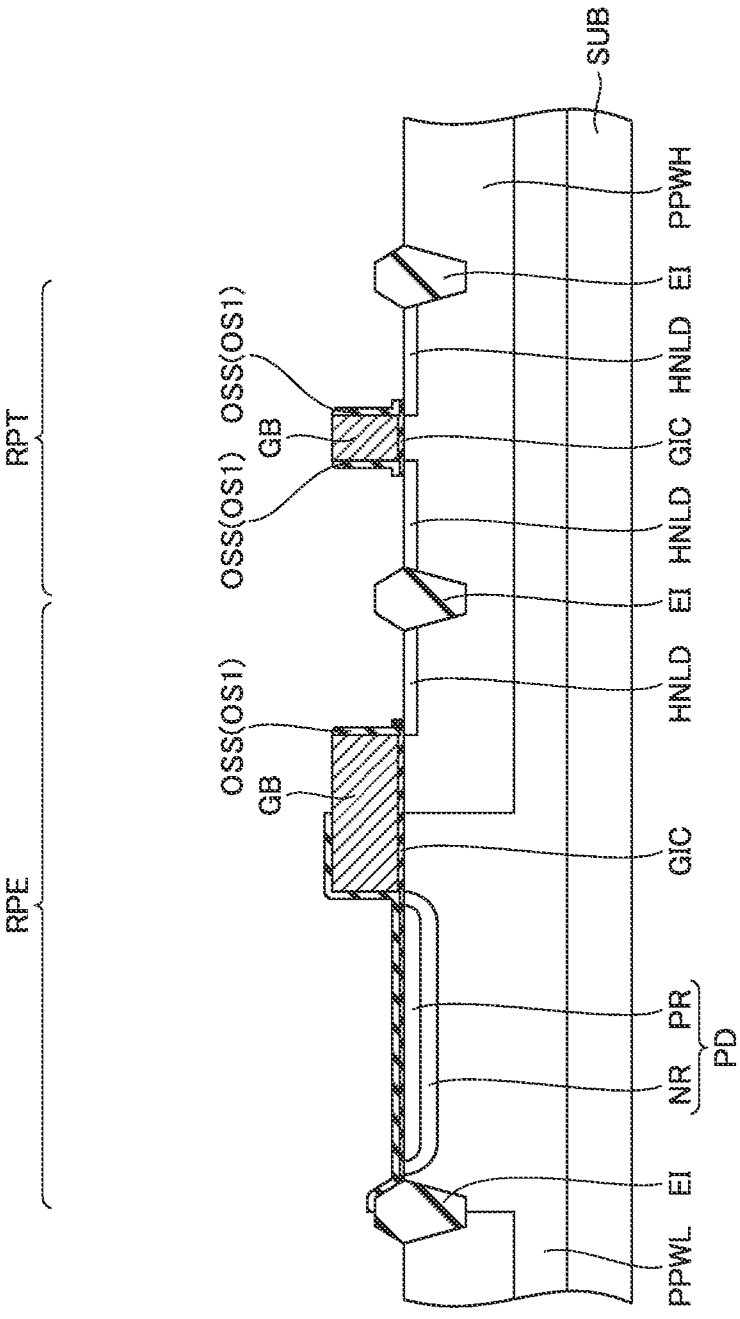
FIG. 40A is a cross sectional view of the pixel region and the like showing a step performed after the step shown in FIGS. 39A and 39B in the same embodiment.
Figure 40B:
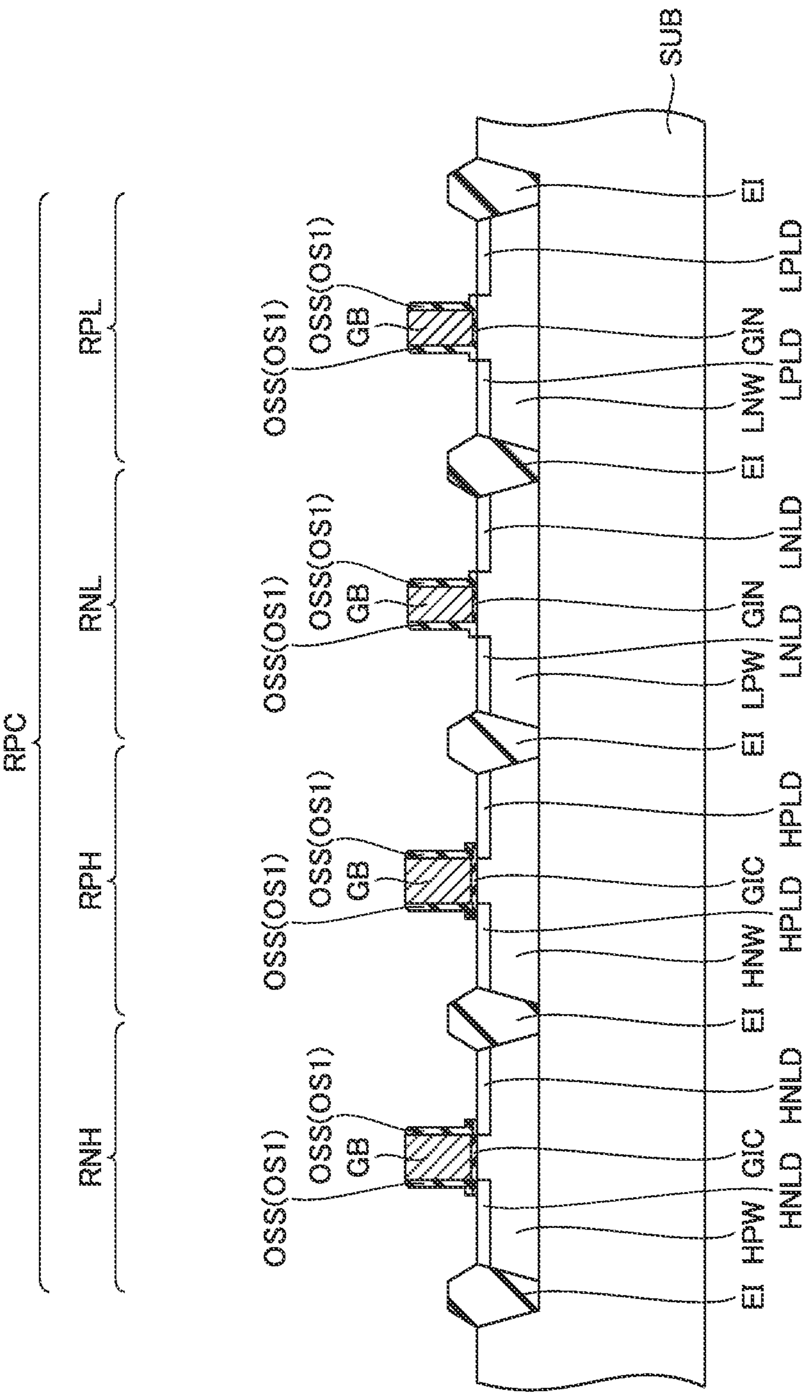
FIG. 40B is a cross sectional view of the peripheral region showing the step performed after the step shown in FIGS. 39A and 39B in the same embodiment.
Figure 41A:
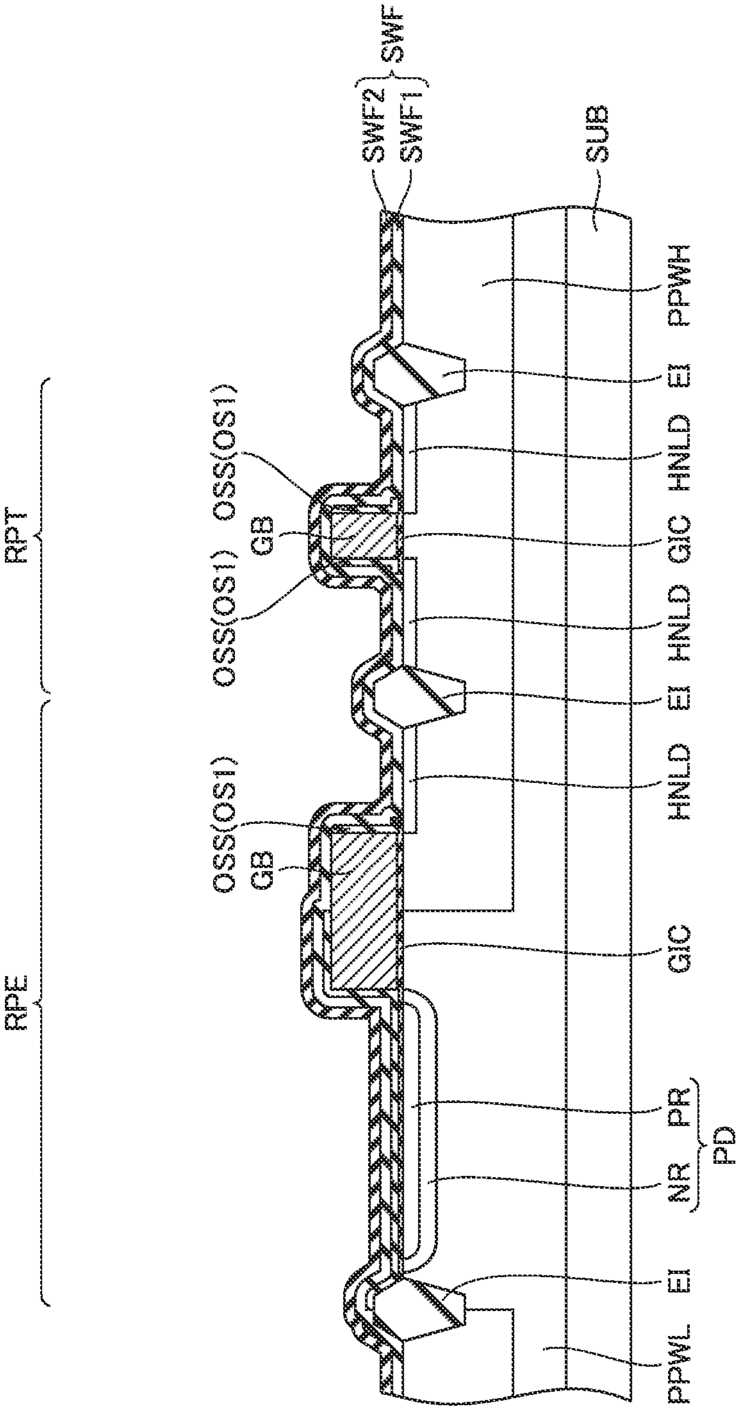
FIG. 41A is a cross sectional view of the pixel region and the like showing a step performed after the step shown in FIGS. 40A and 40B in the same embodiment.
Figure 41B:
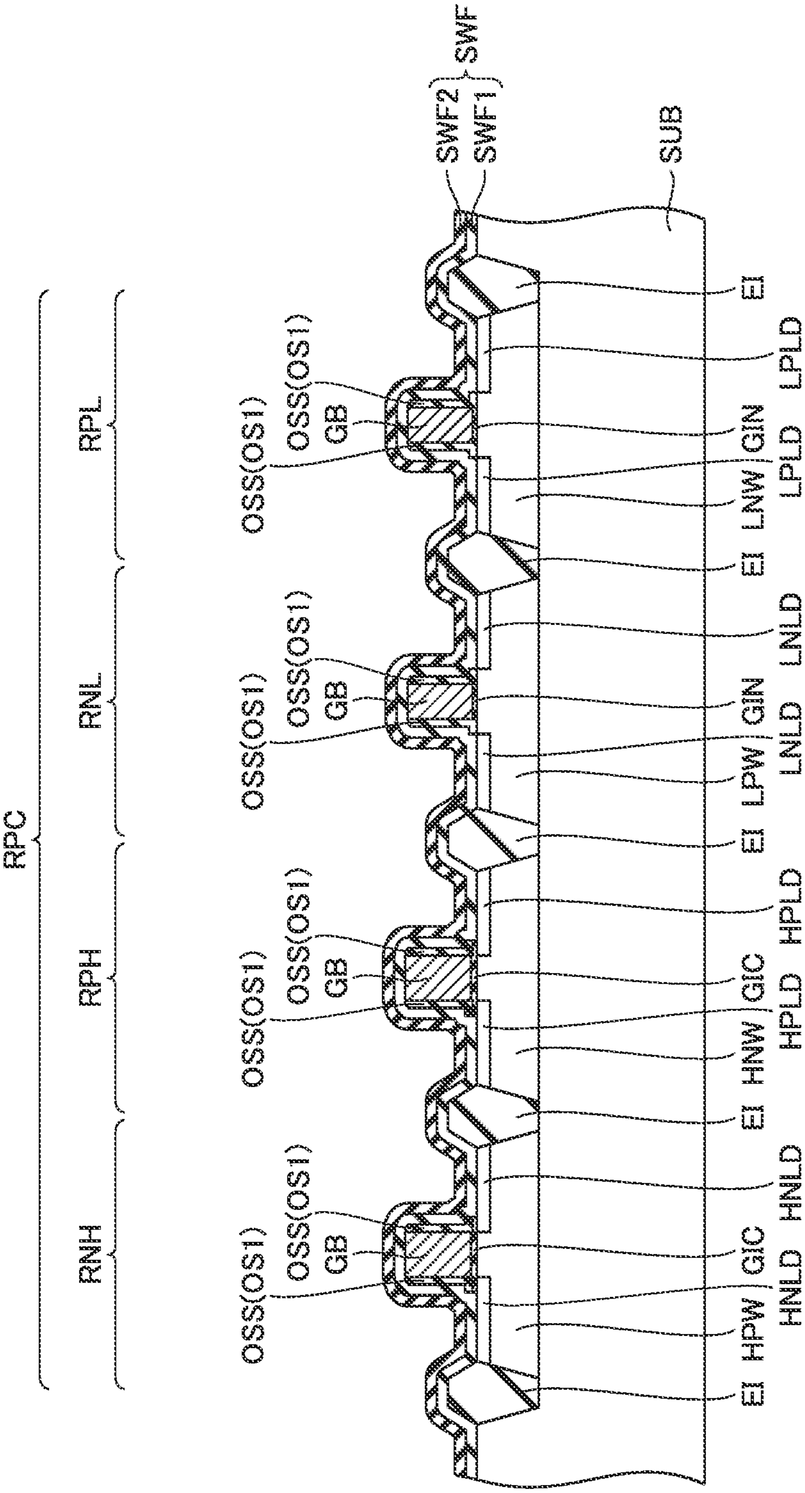
FIG. 41B is a cross sectional view of the peripheral region showing the step performed after the step shown in FIGS. 40A and 40B in the same embodiment.

Next, by performing wet etching treatment using a predetermined chemical solution, silicon nitride film OS2 of each offset spacer film OSS is removed, with silicon oxide film OS1 being left, as shown in FIG. 40A and FIG. 40B. Next, insulating film SWF which is to be a sidewall insulating film, including silicon oxide film SWF1 as a lower-layer film and silicon nitride film SWF2 as an upper-layer film, is formed to cover gate electrodes GB and offset spacer films OSS, as shown in FIG. 41A and FIG. 41B.

Figure 42A:
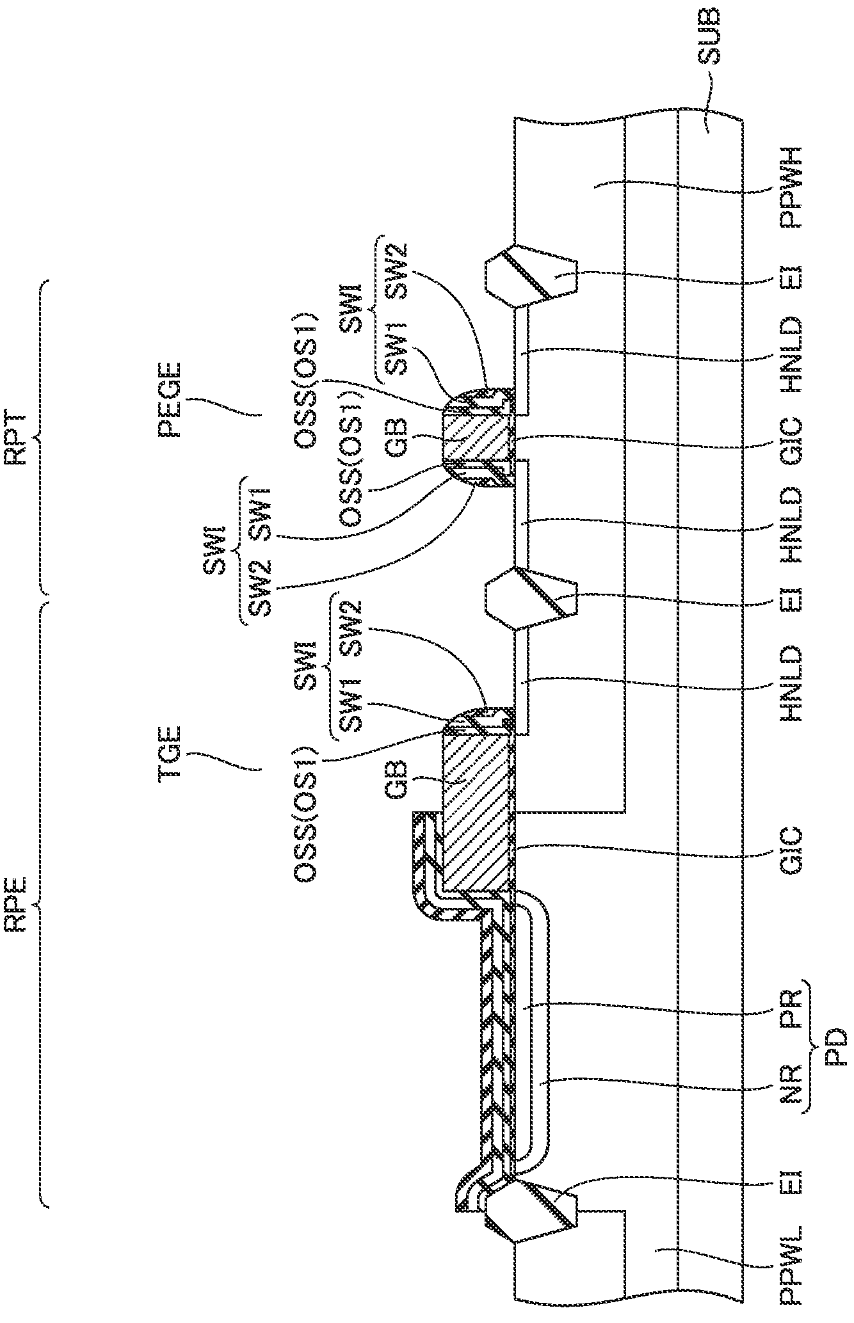
FIG. 42A is a cross sectional view of the pixel region and the like showing a step performed after the step shown in FIGS. 41A and 41B in the same embodiment.
Figure 42B:
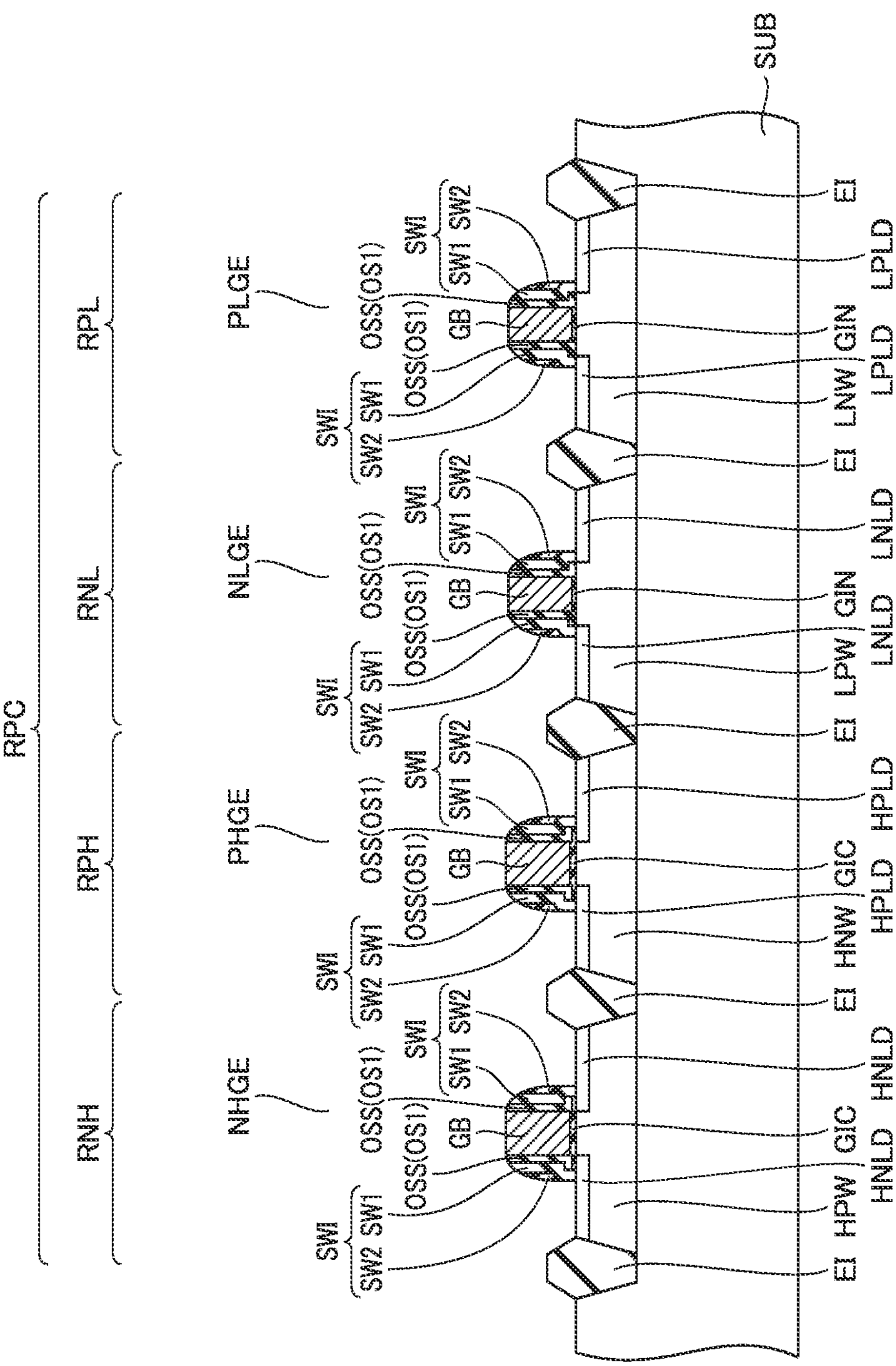
FIG. 42B is a cross sectional view of the peripheral region showing the step performed after the step shown in FIGS. 41A and 41B in the same embodiment.
Figure 43A:
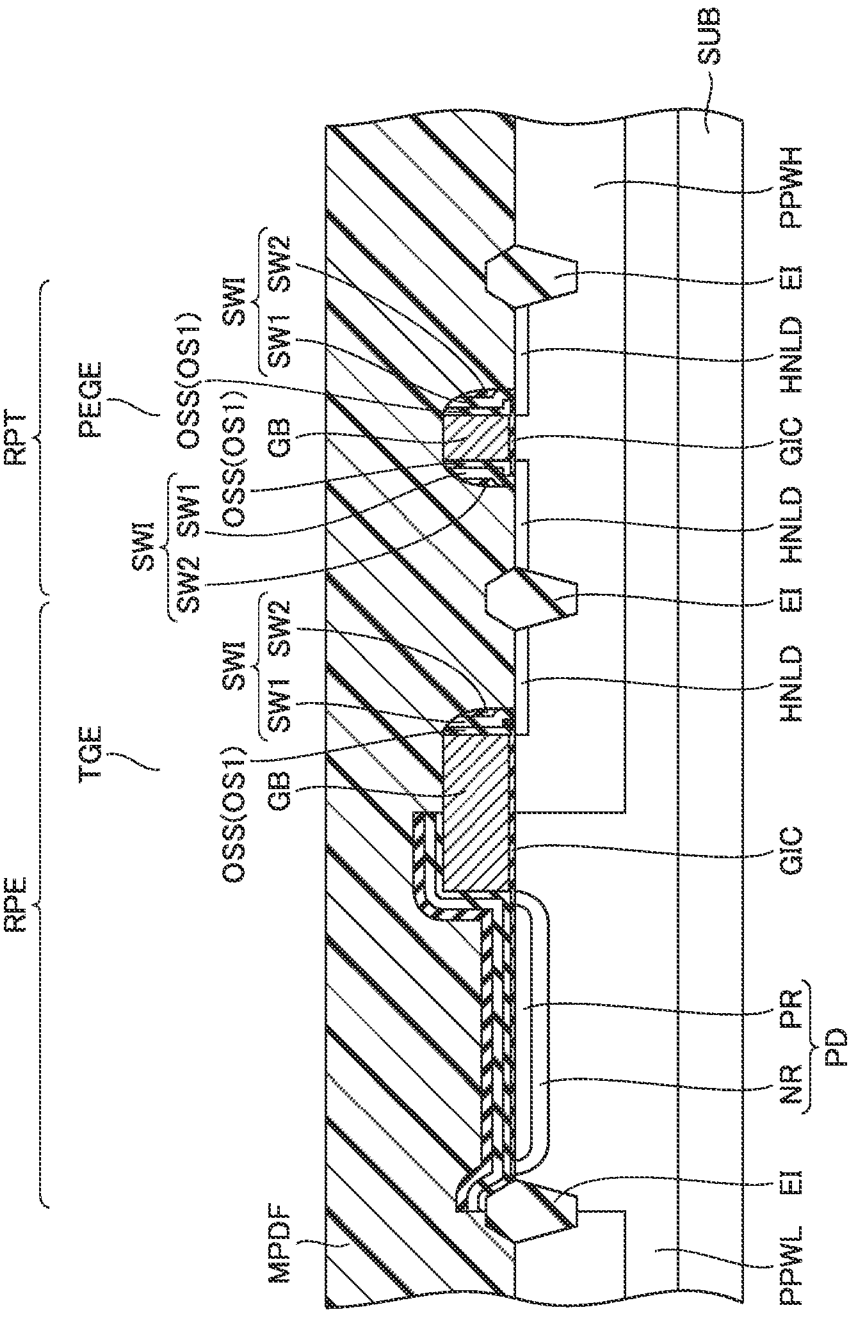
FIG. 43A is a cross sectional view of the pixel region and the like showing a step performed after the step shown in FIGS. 42A and 42B in the same embodiment.
Figure 43B:
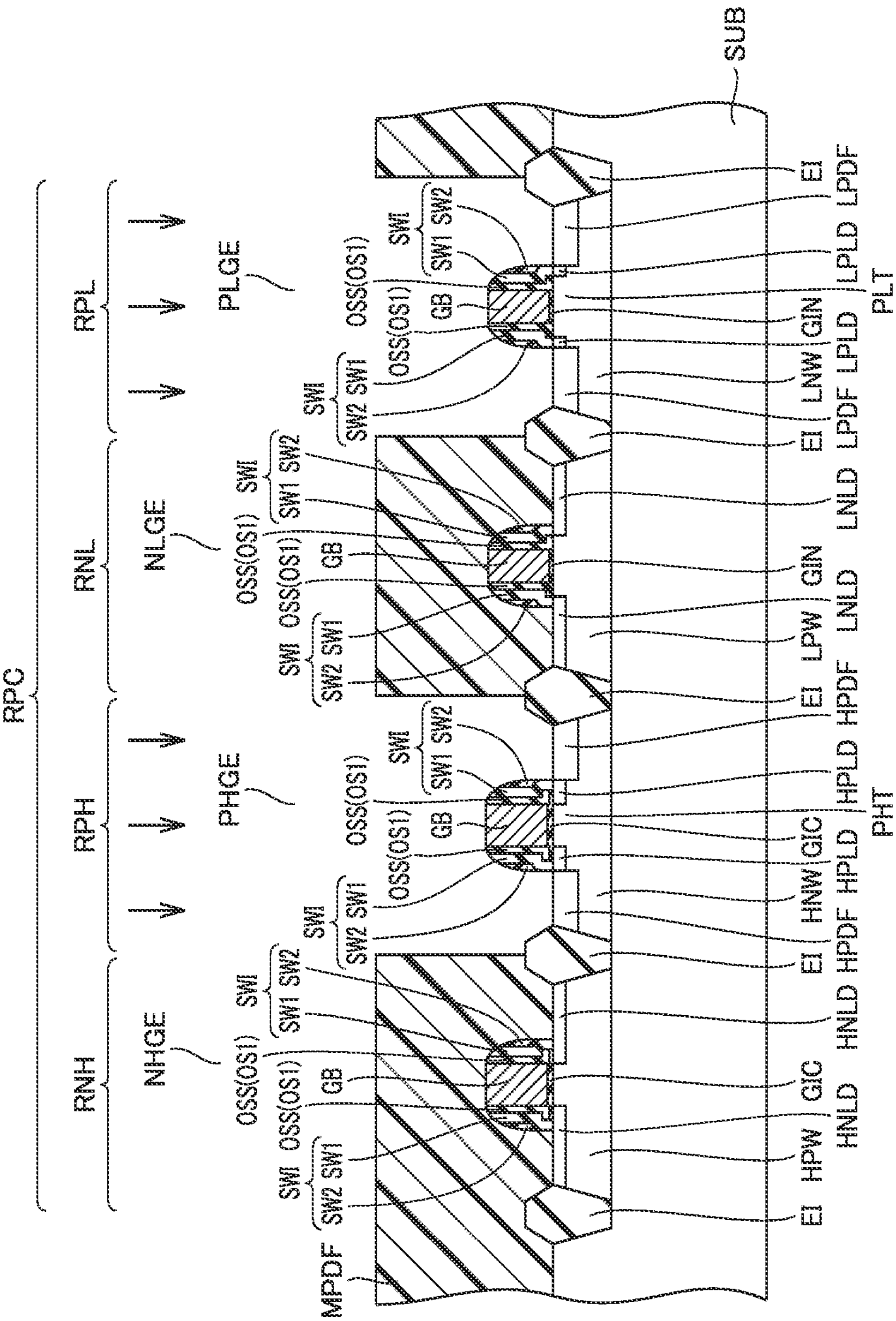
FIG. 43B is a cross sectional view of the peripheral region showing the step performed after the step shown in FIGS. 42A and 42B in the same embodiment.

Next, by performing anisotropic etching treatment on insulating film SWF, sidewall insulating films SWI are formed on the sidewall surfaces of gate electrodes GB, as shown in FIG. 42A and FIG. 42B. Next, by implanting a p-type impurity using resist pattern MPDF and gate electrode portions PHGE, PLGE as an implantation mask, source/drain regions HPDF are formed in region RPH, and source/drain regions LPDF are formed in region RPL, as shown in FIG. 43A and FIG. 43B. Thereafter, resist pattern MPDF is removed.

Figure 44A:
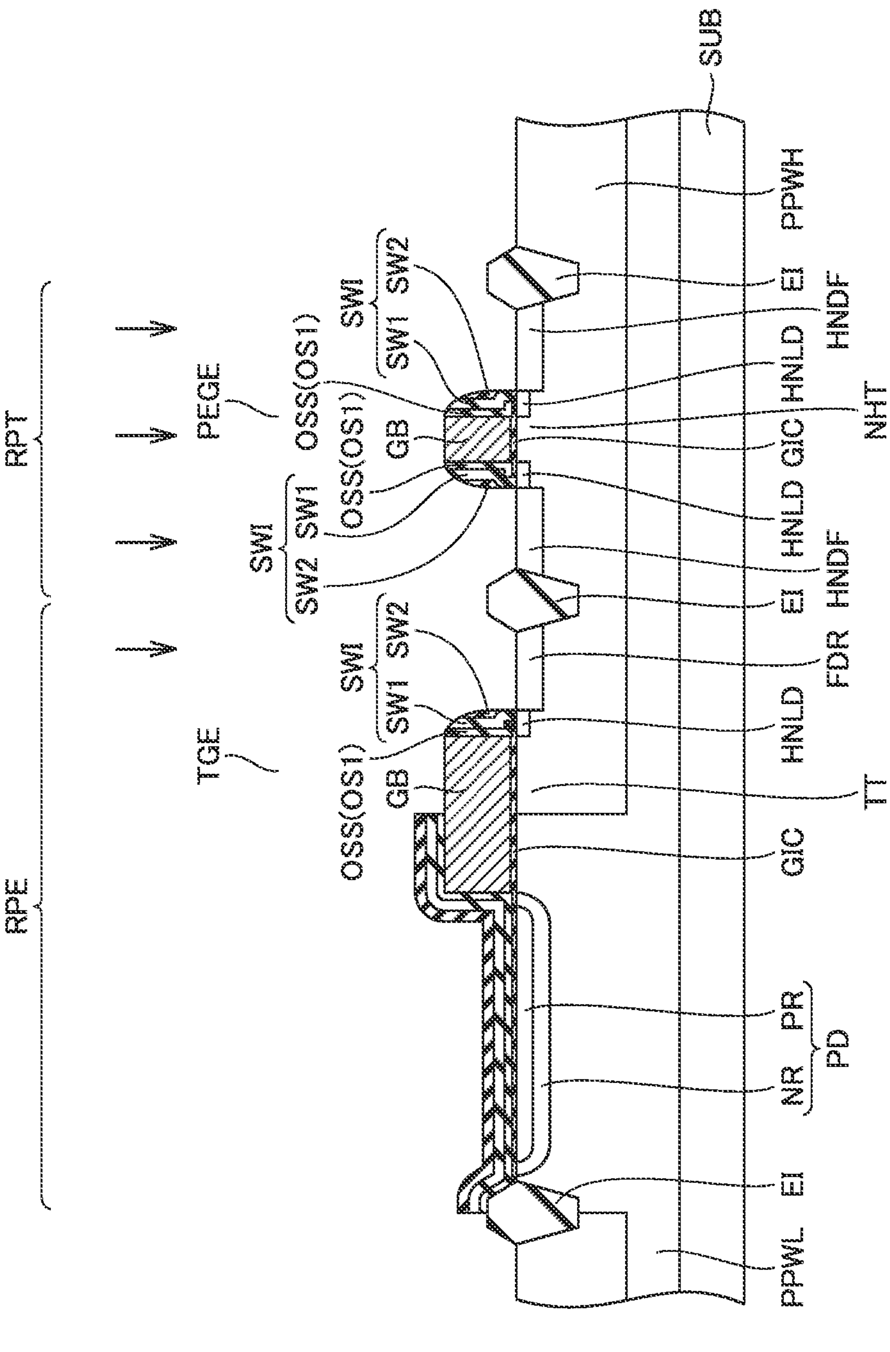
FIG. 44A is a cross sectional view of the pixel region and the like showing a step performed after the step shown in FIGS. 43A and 43B in the same embodiment.
Figure 44B:
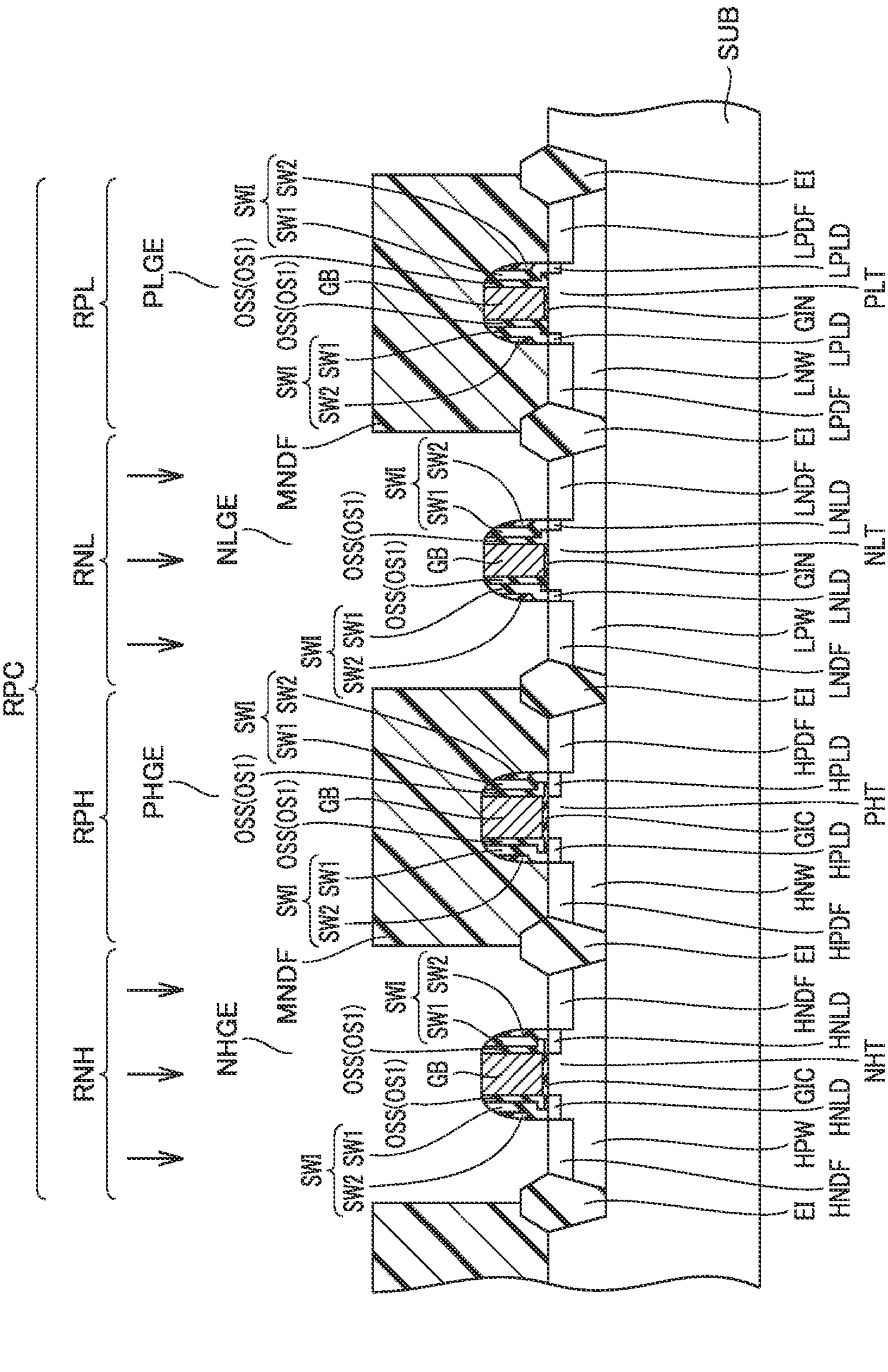
FIG. 44B is a cross sectional view of the peripheral region showing the step performed after the step shown in FIGS. 43A and 43B in the same embodiment.

Next, by implanting an n-type impurity using resist pattern MNDF and gate electrode portions TGE, PEGE, NHGE, NLGE as an implantation mask, as shown in FIG. 44A and FIG. 44B, source/drain regions HNDF are formed in each of pixel transistor region RPT and region RNH. Source/drain regions LNDF are formed in region RNL. Floating diffusion region FDR is formed in pixel region RPE. Thereafter, resist pattern MNDF is removed.

Figure 45A:
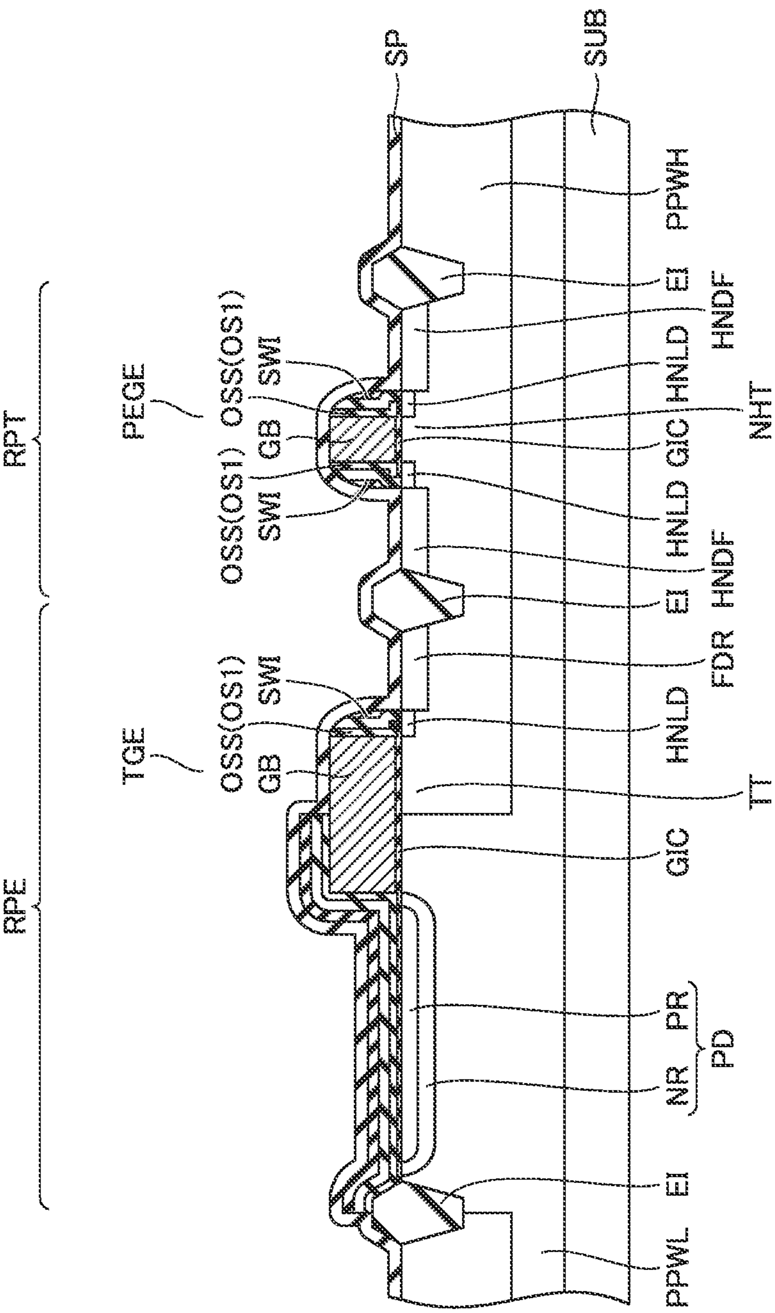
FIG. 45A is a cross sectional view of the pixel region and the like showing a step performed after the step shown in FIGS. 44A and 44B in the same embodiment.
Figure 45B:
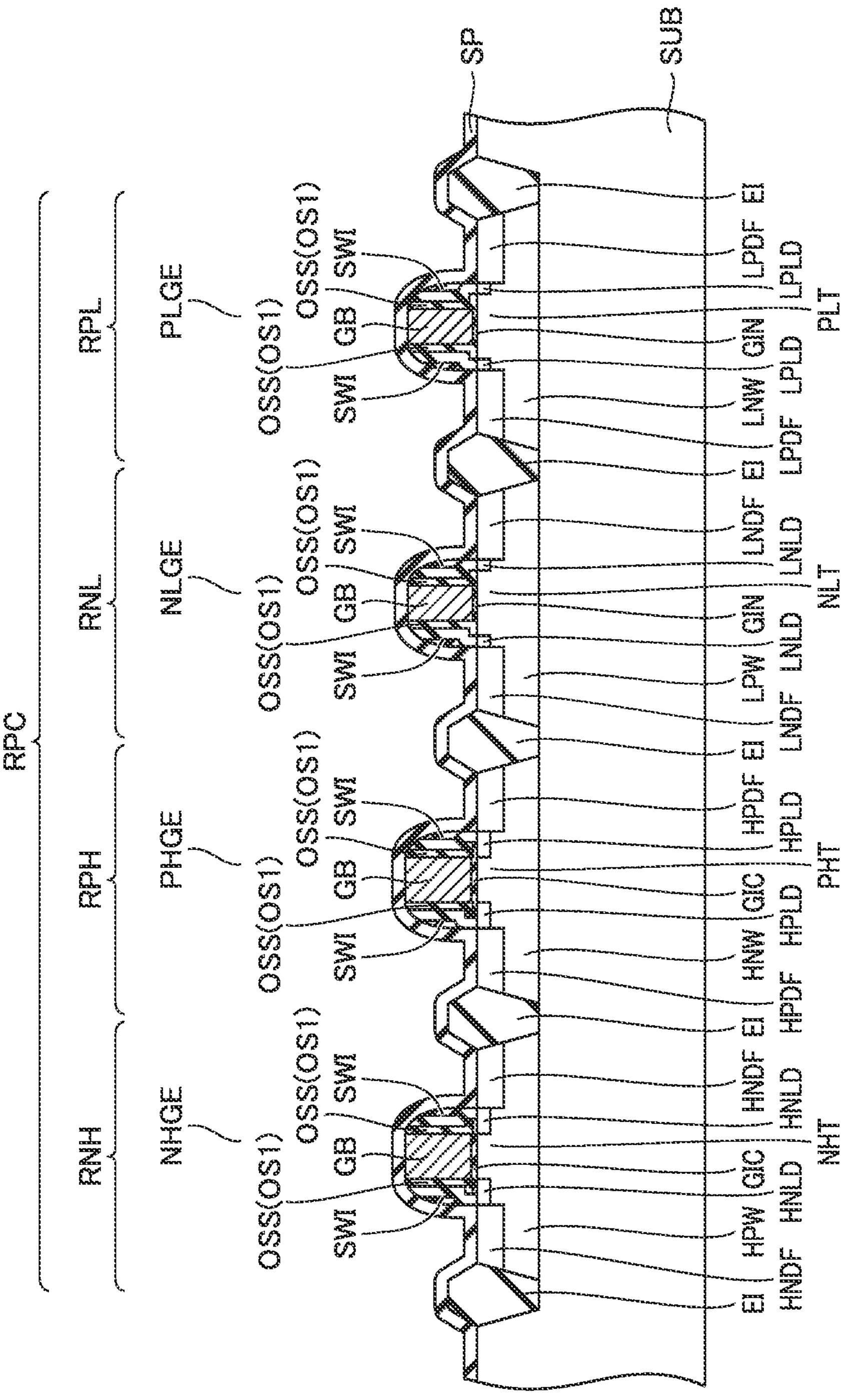
FIG. 45B is a cross sectional view of the peripheral region showing the step performed after the step shown in FIGS. 44A and 44B in the same embodiment.

Next, silicide protection film SP is formed to cover gate electrode portions TGE, PEGE, NHGE, PHGE, NLGE, PLGE, and the like, as shown in FIG. 45A and FIG. 45B. Thereafter, with a portion of the silicide protection film covering a field effect transistor (not shown) in which no metal silicide film is to be formed being left, the silicide protection film located in other regions is removed.

Figure 46A:
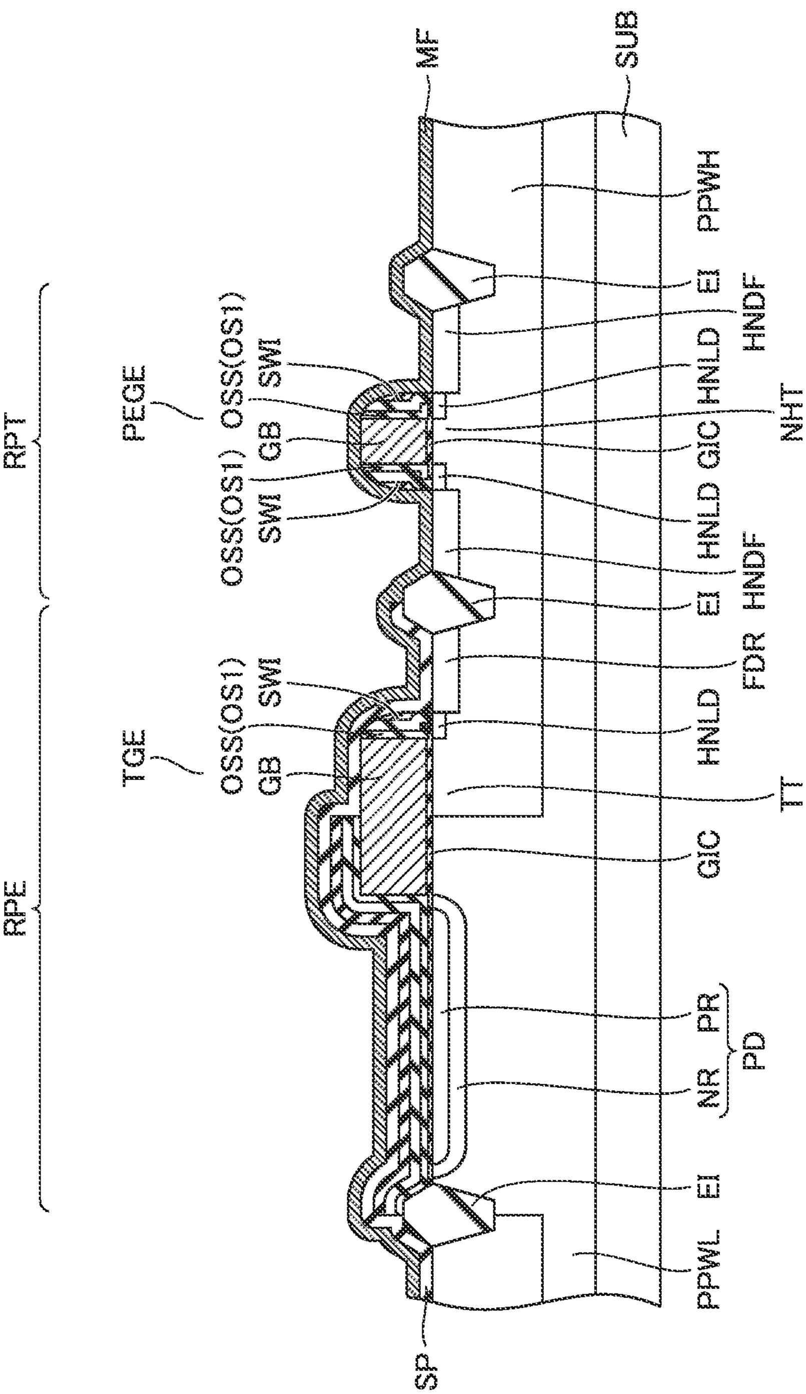
FIG. 46A is a cross sectional view of the pixel region and the like showing a step performed after the step shown in FIGS. 45A and 45B in the same embodiment.
Figure 46B:
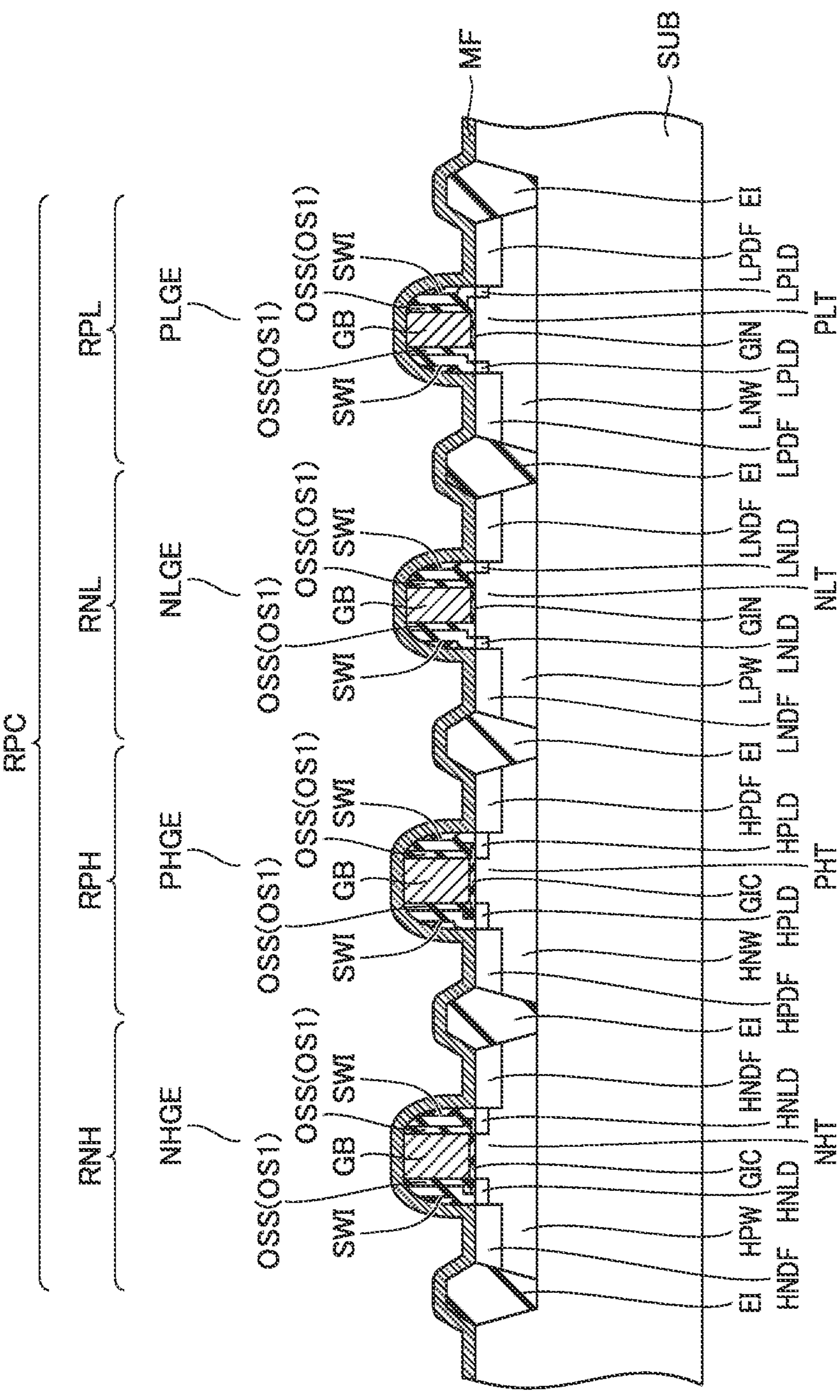
FIG. 46B is a cross sectional view of the peripheral region showing the step performed after the step shown in FIGS. 45A and 45B in the same embodiment.
Figure 47A:
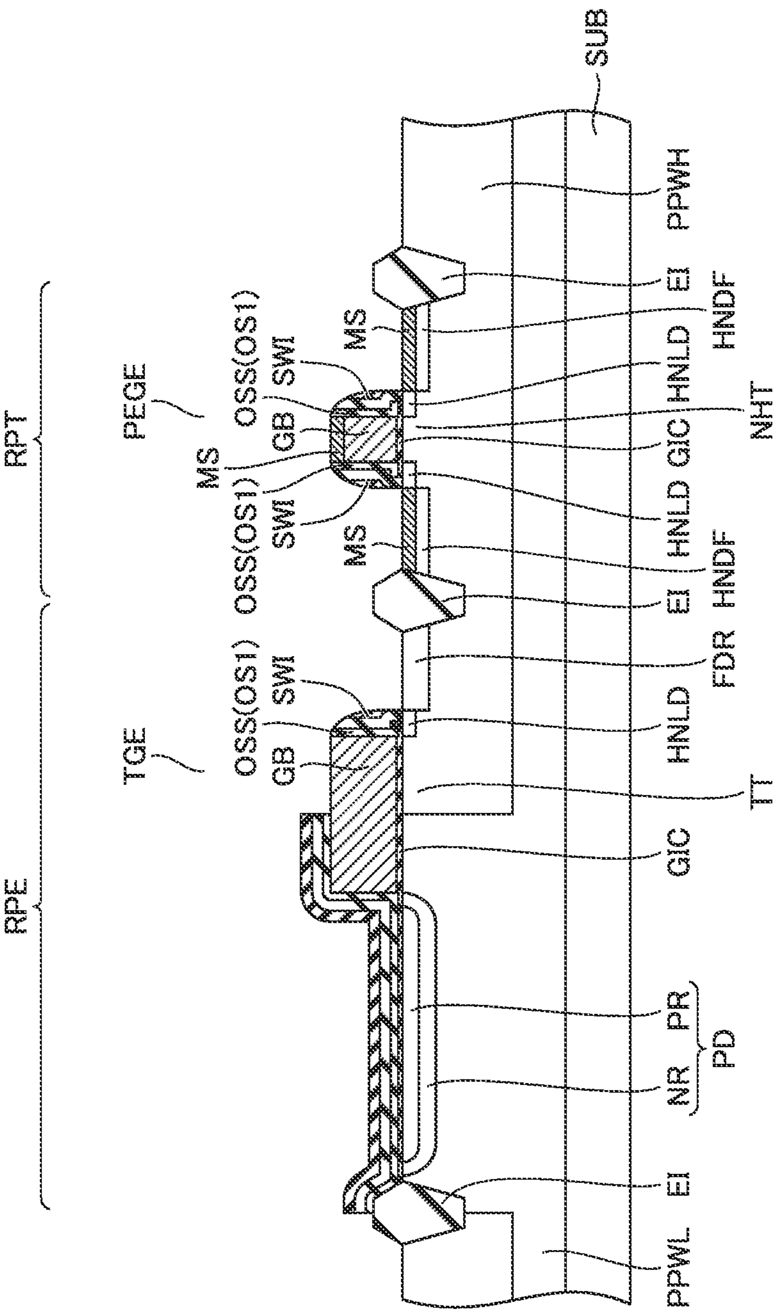
FIG. 47A is a cross sectional view of the pixel region and the like showing a step performed after the step shown in FIGS. 46A and 46B in the same embodiment.
Figure 47B:
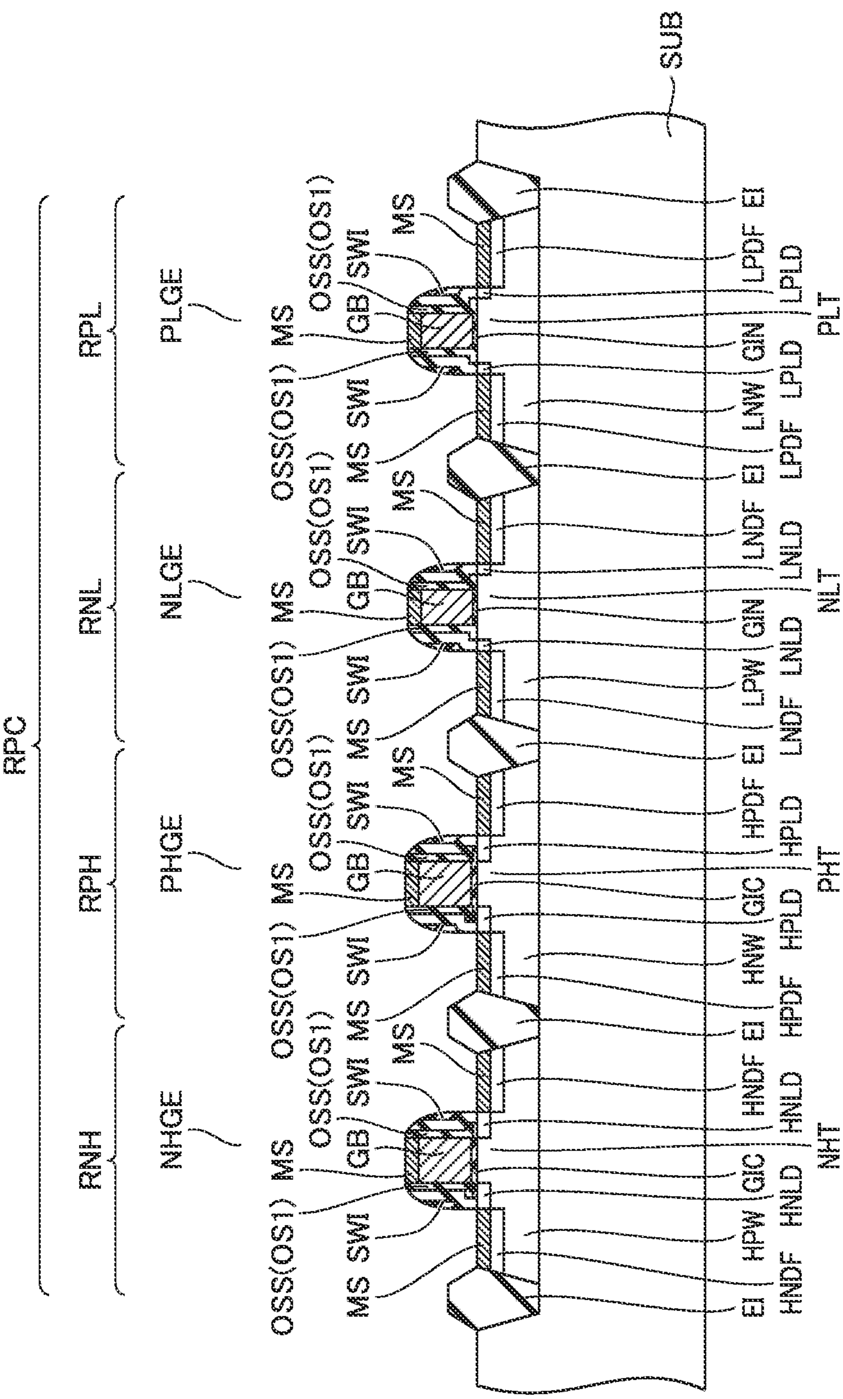
FIG. 47B is a cross sectional view of the peripheral region showing the step performed after the step shown in FIGS. 46A and 46B in the same embodiment.

Next, predetermined metal film MF is formed to cover gate electrode portions TGE, PEGE, NHGE, PHGE, NLGE, PLGE, and the like, as shown in FIG. 46A and FIG. 46B. Next, by performing predetermined heat treatment to cause metal film MF to react with silicon, and then removing unreacted metal, metal silicide films MS are formed as shown in FIG. 47A and FIG. 47B.

Figure 48A:
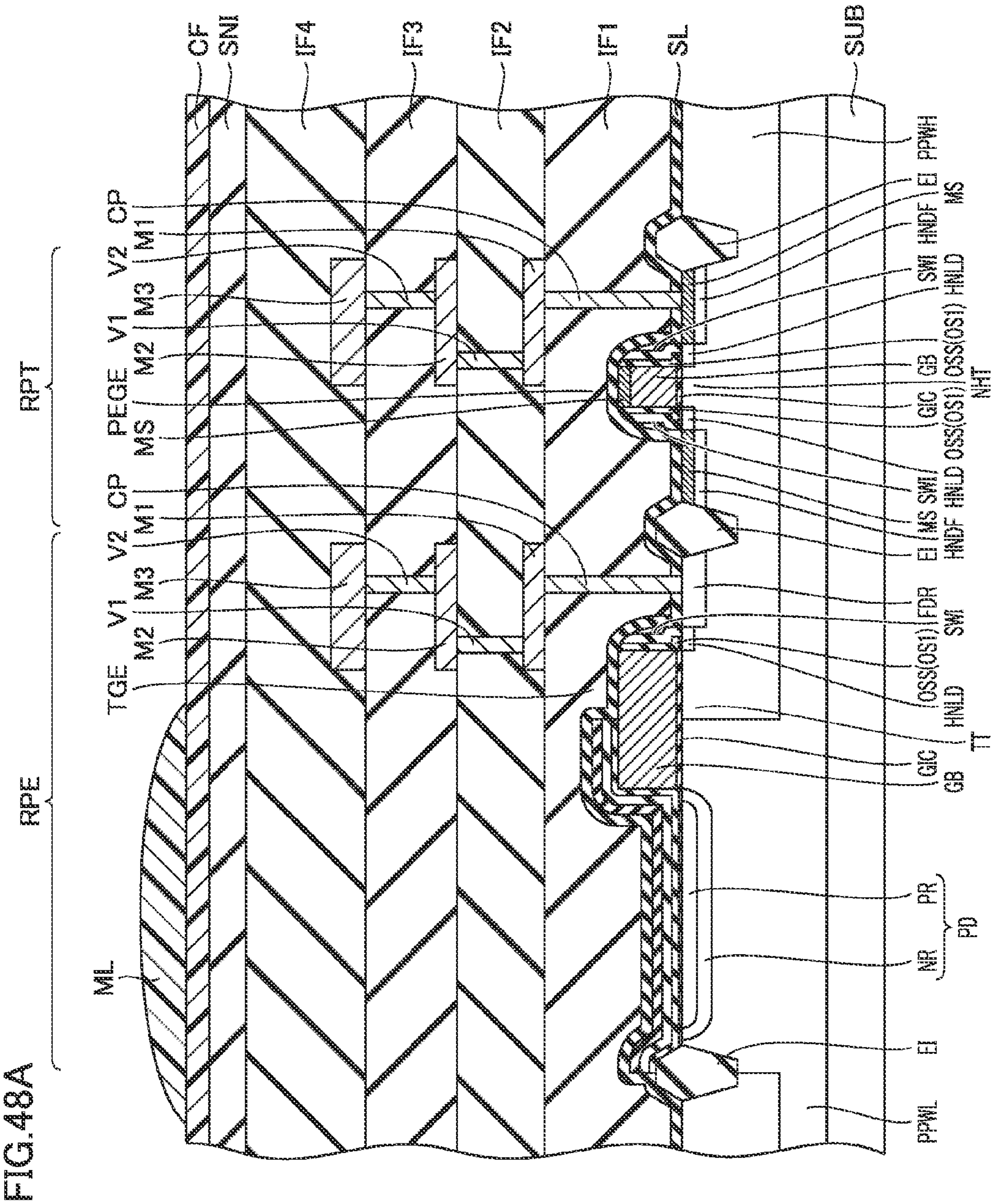
FIG. 48A is a cross sectional view of the pixel region and the like showing a step performed after the step shown in FIGS. 47A and 47B in the same embodiment.
Figure 48B:
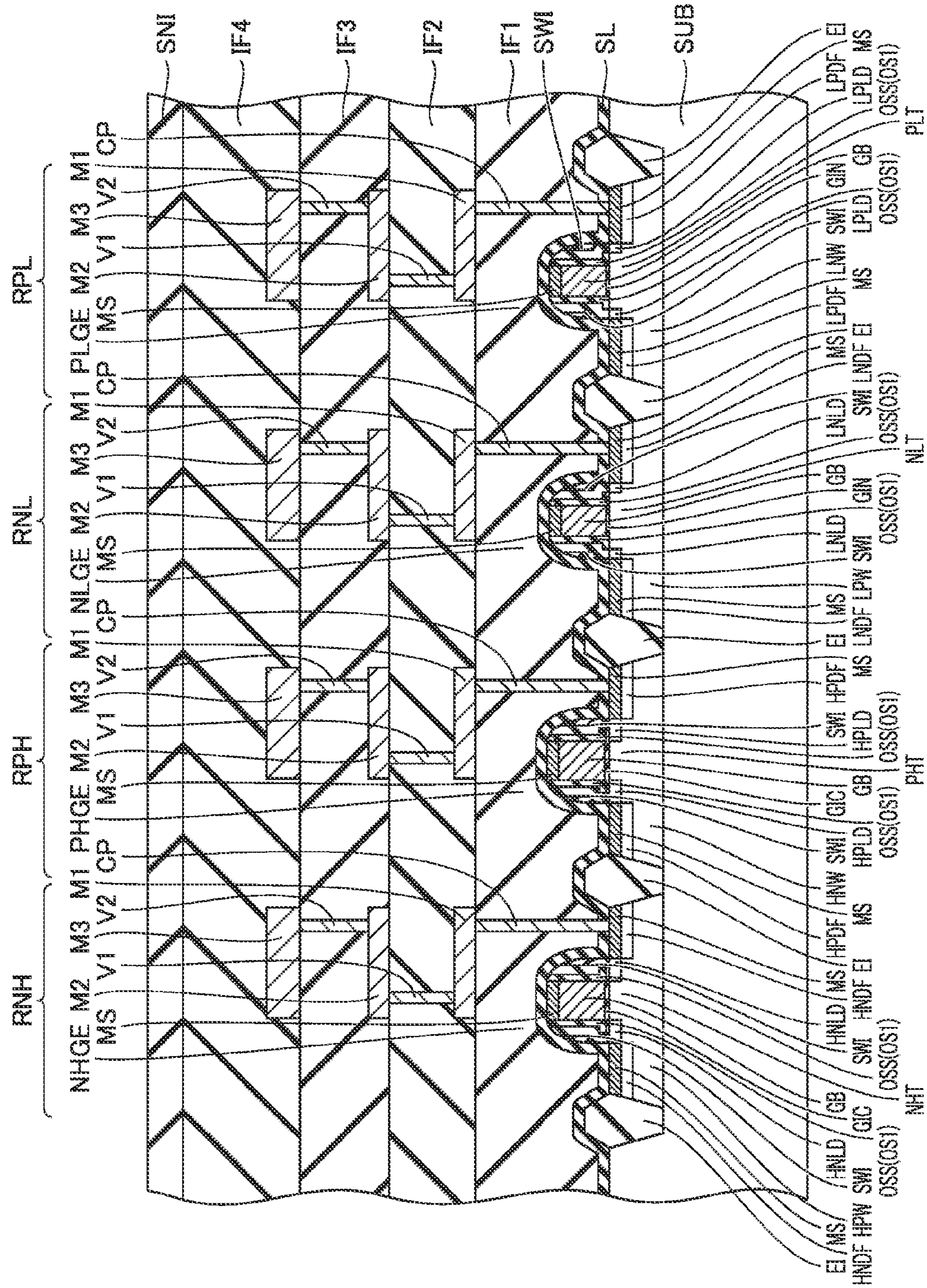
FIG. 48B is a cross sectional view of the peripheral region showing the step performed after the step shown in FIGS. 47A and 47B in the same embodiment.

Next, after the step identical to that shown in FIG. 23A and FIG. 23B and the step identical to that shown in FIG. 24A and FIG. 24B are performed, the main part of the imaging apparatus is completed as shown in FIG. 48A and FIG. 48B. Silicon oxide film OS1 of offset spacer film OSS in the imaging apparatus has a portion which covers the sidewall surface of gate electrode GB (a first portion), and a portion which extends from the first portion to photodiode PD (a second portion) (a portion which extends in a direction away from gate electrode GB). Sidewall insulating film SWI is formed to cover an end surface (thickness direction) of the second portion of silicon oxide film OS1.

In the imaging apparatus described above, offset spacer film OSS with a double-layer structure including silicon oxide film OS1 as a lower-layer film and silicon nitride film OS2 as an upper-layer film is formed as an offset spacer film, and before the step of forming the sidewall insulating film, silicon nitride film OS2 is removed with silicon oxide film OS1 being left. After silicon nitride film OSF2 is formed and before silicon nitride film OS2 is removed, quenching heat treatment after formation of insulating film OSF which is to be the offset spacer film is performed.

Thereby, as described in the first embodiment, nitrogen (N) or hydrogen (H) is diffused and a portion thereof is bonded to unpaired bonding hands of silicon, and thus dangling bonds of silicon can be terminated, which can reduce read-out noise due to the dangling bonds. As a result, this can prevent loss of image sharpness, contrast, a feeling of depth of color, and the like in the imaging apparatus. Further, this allows miniaturization of the imaging apparatus.

Further, by removing silicon nitride film OS2 of offset spacer film OSS, films located on photodiode PD (stacked films) have an improved transmissivity, and the imaging apparatus can have an improved sensitivity.

Third Embodiment

Here, a description will be given of a case where a sidewall insulating film with a single-layer structure is formed, with an offset spacer film with a double-layer structure being left intact. It should be noted that members identical to those of the imaging apparatus described in the first embodiment will be designated by the same reference numerals, and the description thereof will not be repeated unless deemed necessary.

Figure 49A:
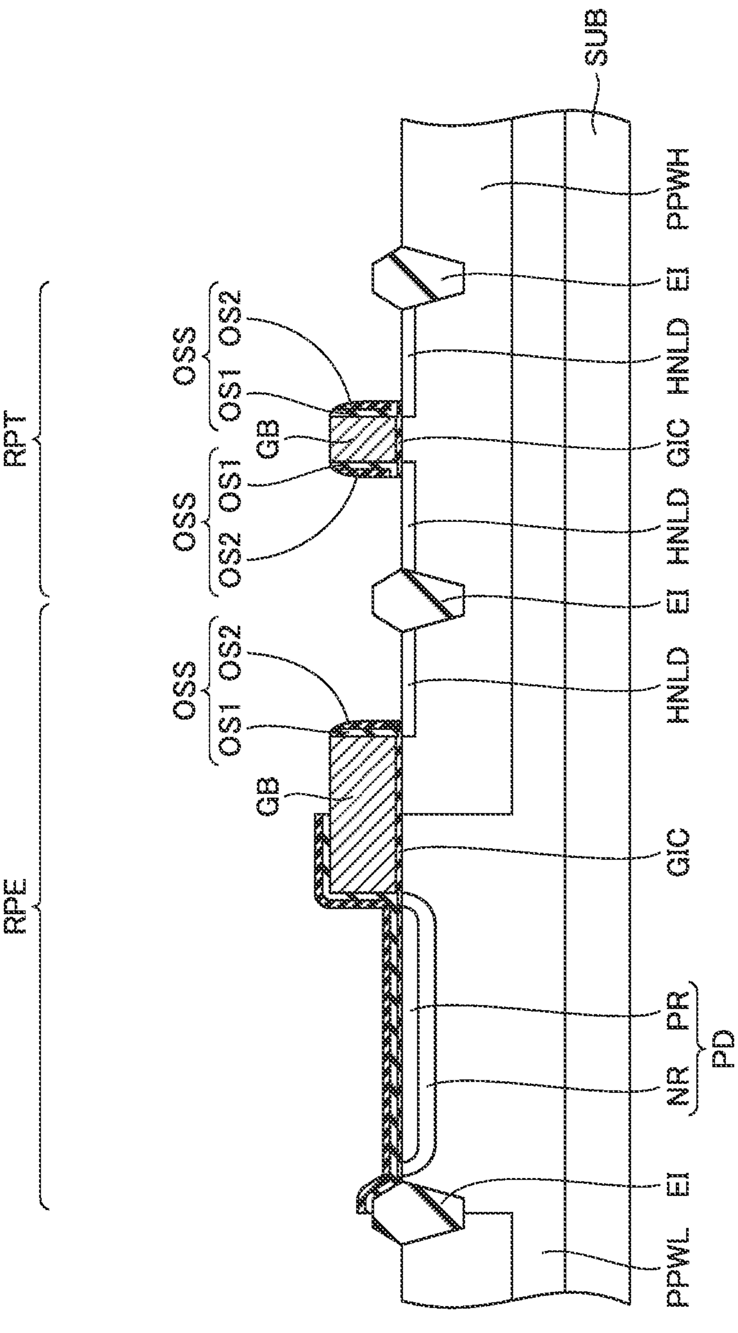
FIG. 49A is a cross sectional view of a pixel region and the like showing one step of a method for manufacturing an imaging apparatus in accordance with a third embodiment.
Figure 49B:
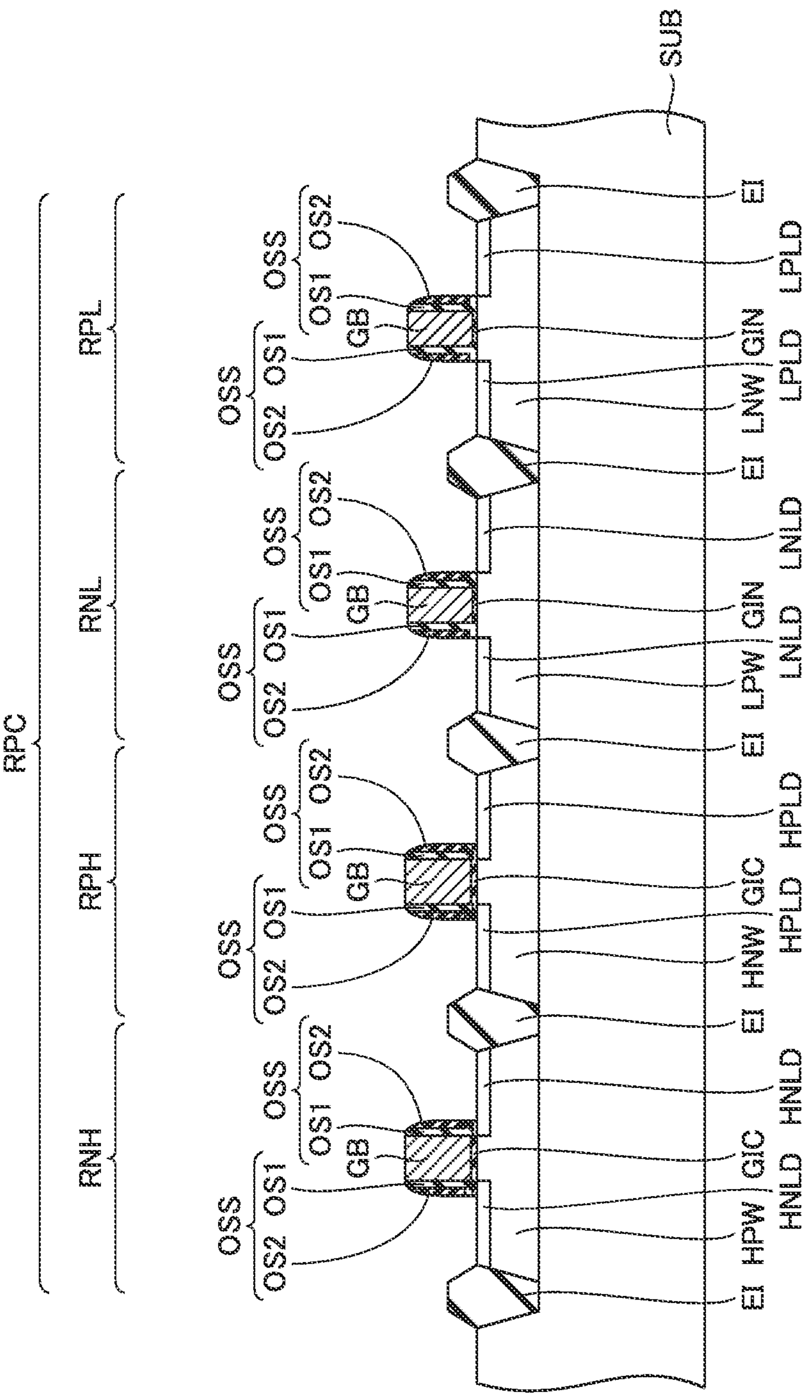
FIG. 49B is a cross sectional view of a peripheral region showing the one step of the method for manufacturing the imaging apparatus in accordance with the third embodiment.

After the steps from the step identical to that shown in FIG. 5A and FIG. 5B to the step identical to that shown in FIG. 15A and FIG. 15B are performed, offset spacer films OSS with a double-layer structure including silicon oxide film OS1 as a lower-layer film and silicon nitride film OS2 as an upper-layer film are formed, and extension regions LNLD, LPLD are formed, as shown in FIG. 49A and FIG. 49B.

Figure 50A:
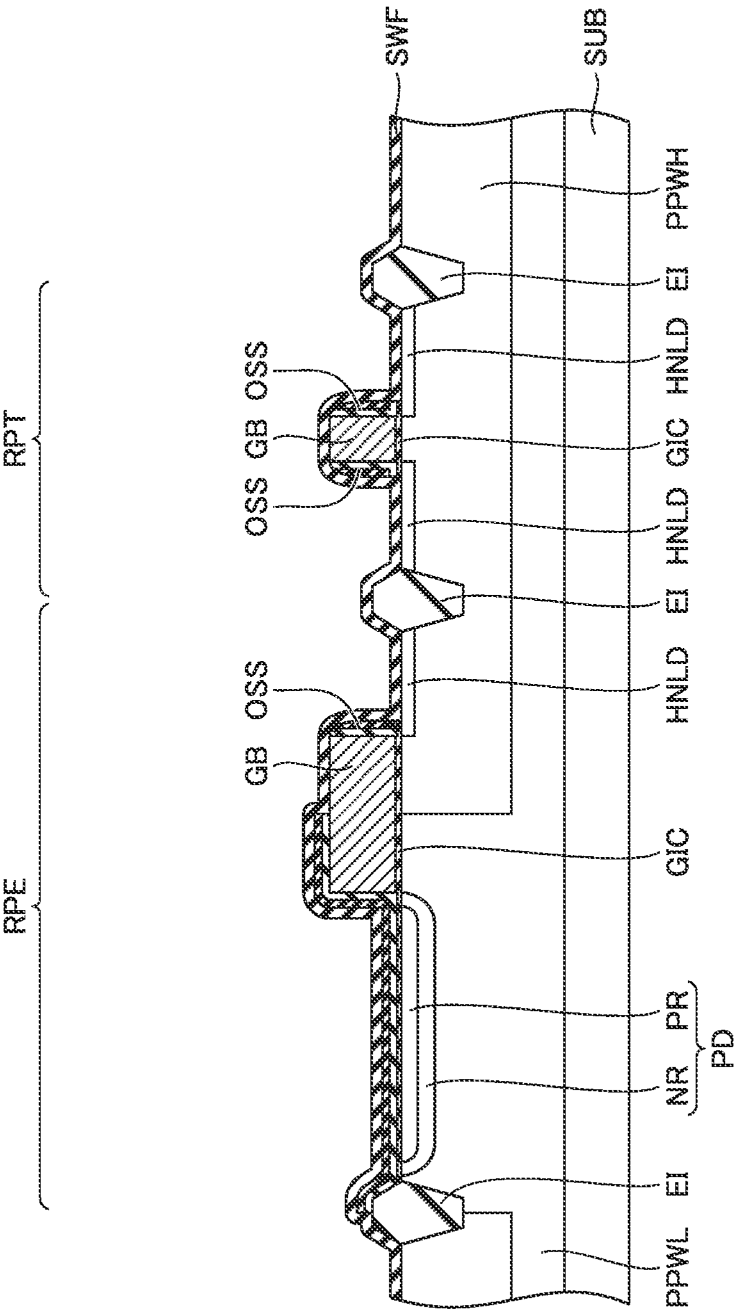
FIG. 50A is a cross sectional view of the pixel region and the like showing a step performed after the step shown in FIGS. 49A and 49B in the same embodiment.
Figure 50B:
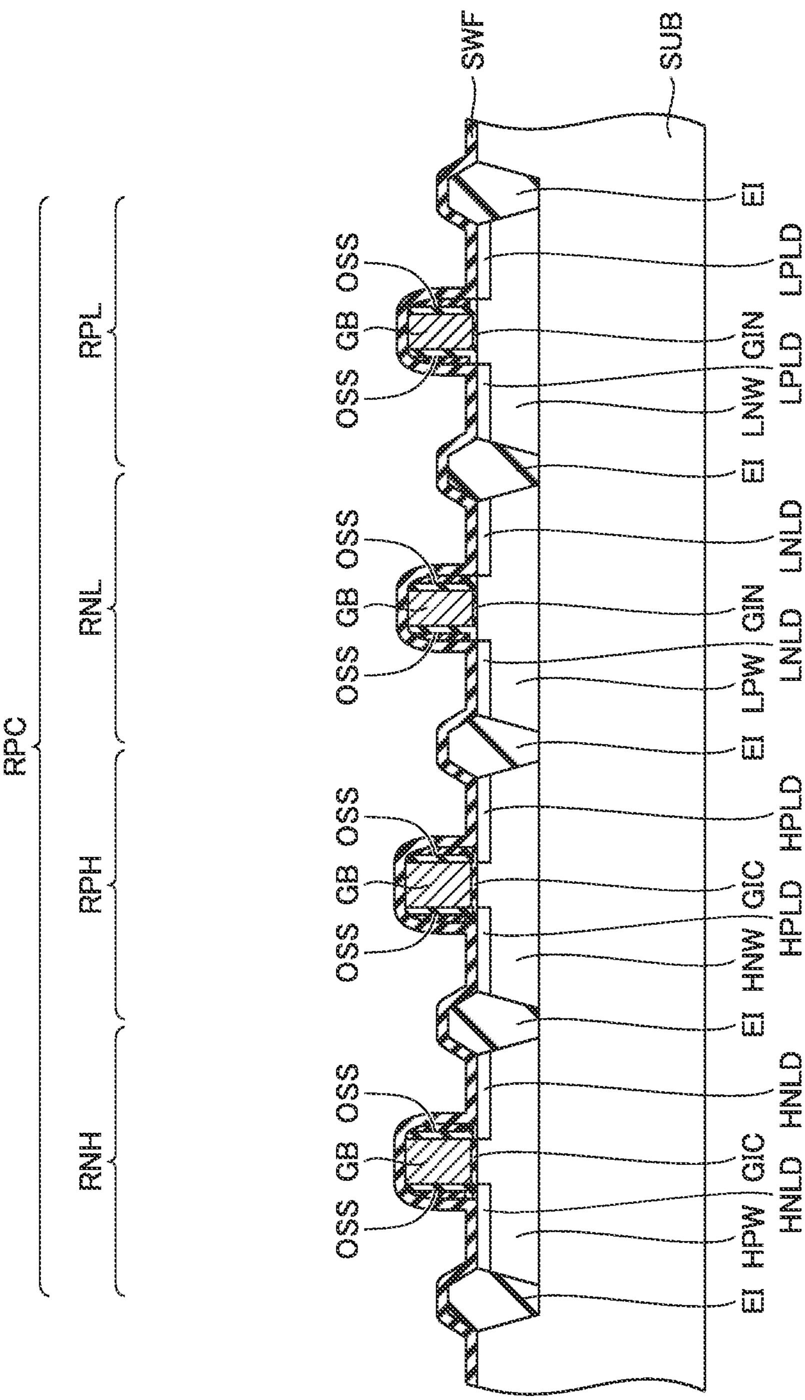
FIG. 50B is a cross sectional view of the peripheral region showing the step performed after the step shown in FIGS. 49A and 49B in the same embodiment.
Figure 51A:
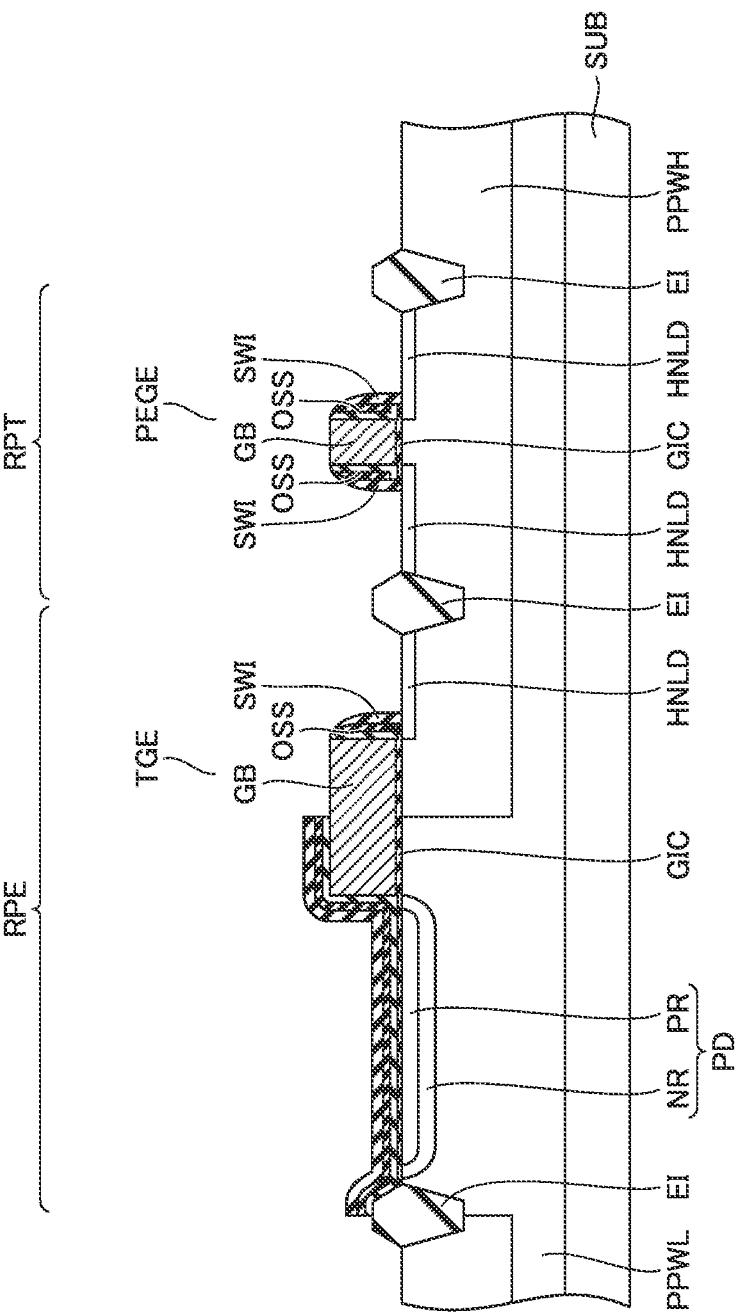
FIG. 51A is a cross sectional view of the pixel region and the like showing a step performed after the step shown in FIGS. 50A and 50B in the same embodiment.
Figure 51B:
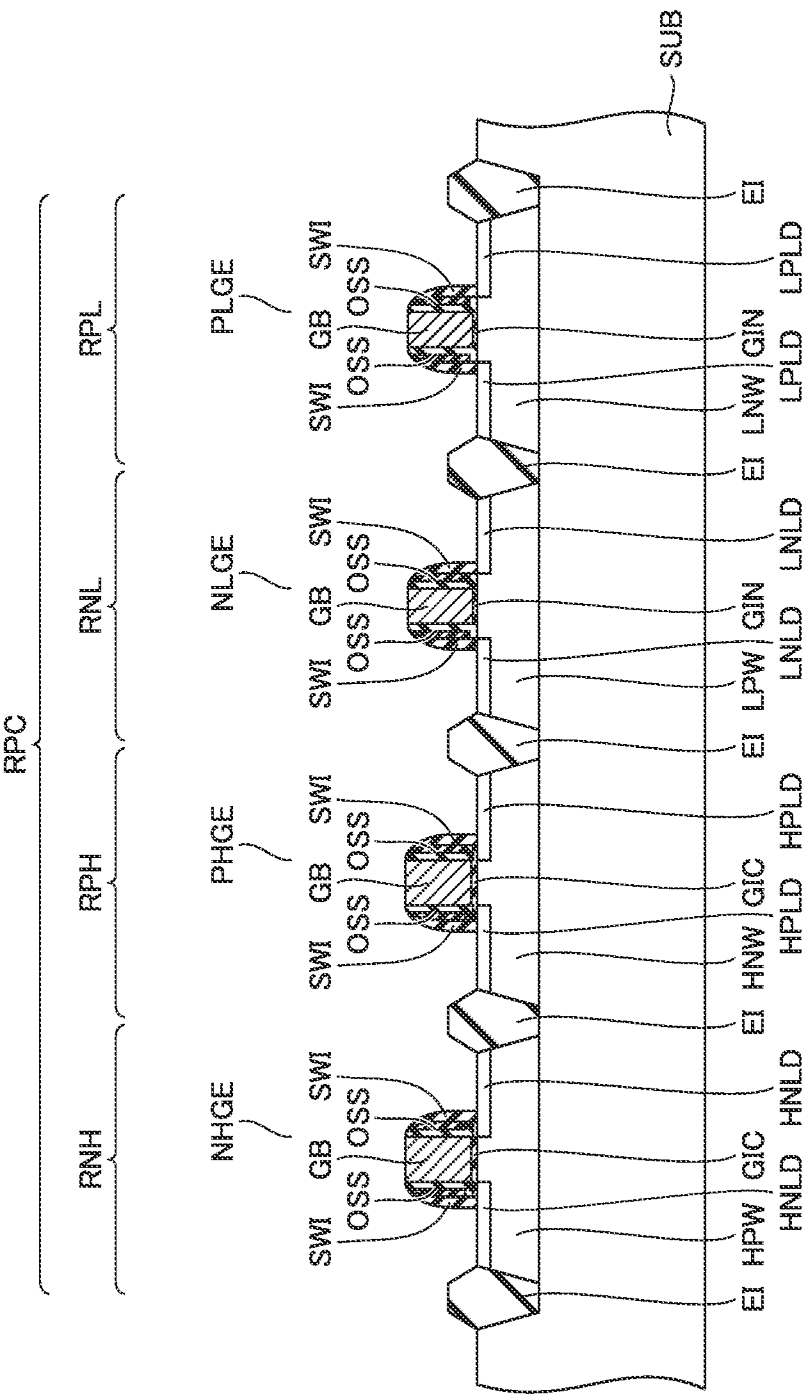
FIG. 51B is a cross sectional view of the peripheral region showing the step performed after the step shown in FIGS. 50A and 50B in the same embodiment.

Next, insulating film SWF which is to be a sidewall insulating film is formed to cover gate electrodes GB and offset spacer films OSS, as shown in FIG. 50A and FIG. 50B. As insulating film SWF, a silicon nitride film is formed. Next, anisotropic etching treatment is performed on insulating film SWF. Thereby, portions of insulating film SWF located on the upper surfaces of gate electrodes GB are removed, and sidewall insulating films SWI with a single-layer structure are formed by portions of insulating film SWF left on the sidewall surfaces of gate electrodes GB, as shown in FIG. 51A and FIG. 51B.

Figure 52A:
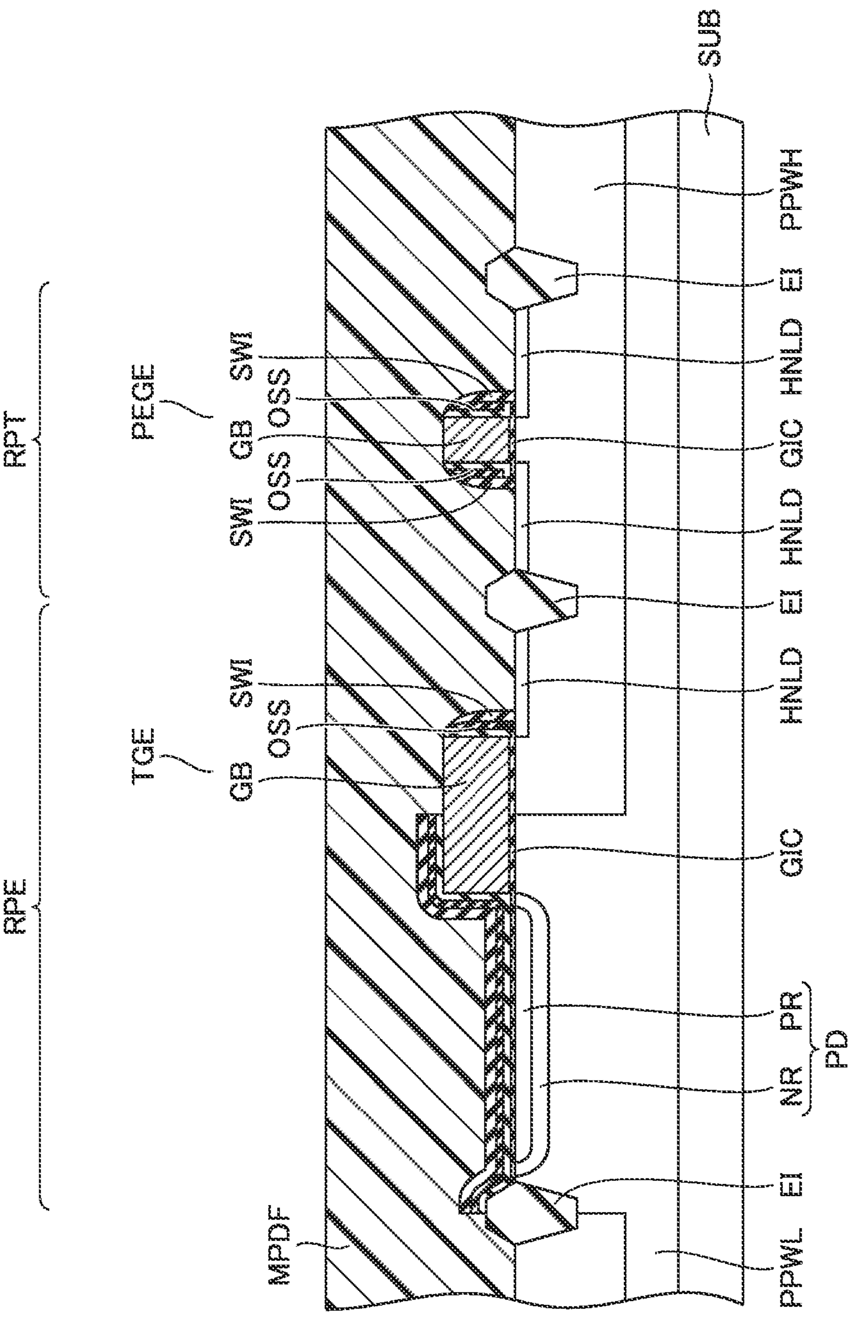
FIG. 52A is a cross sectional view of the pixel region and the like showing a step performed after the step shown in FIGS. 51A and 51B in the same embodiment.
Figure 52B:
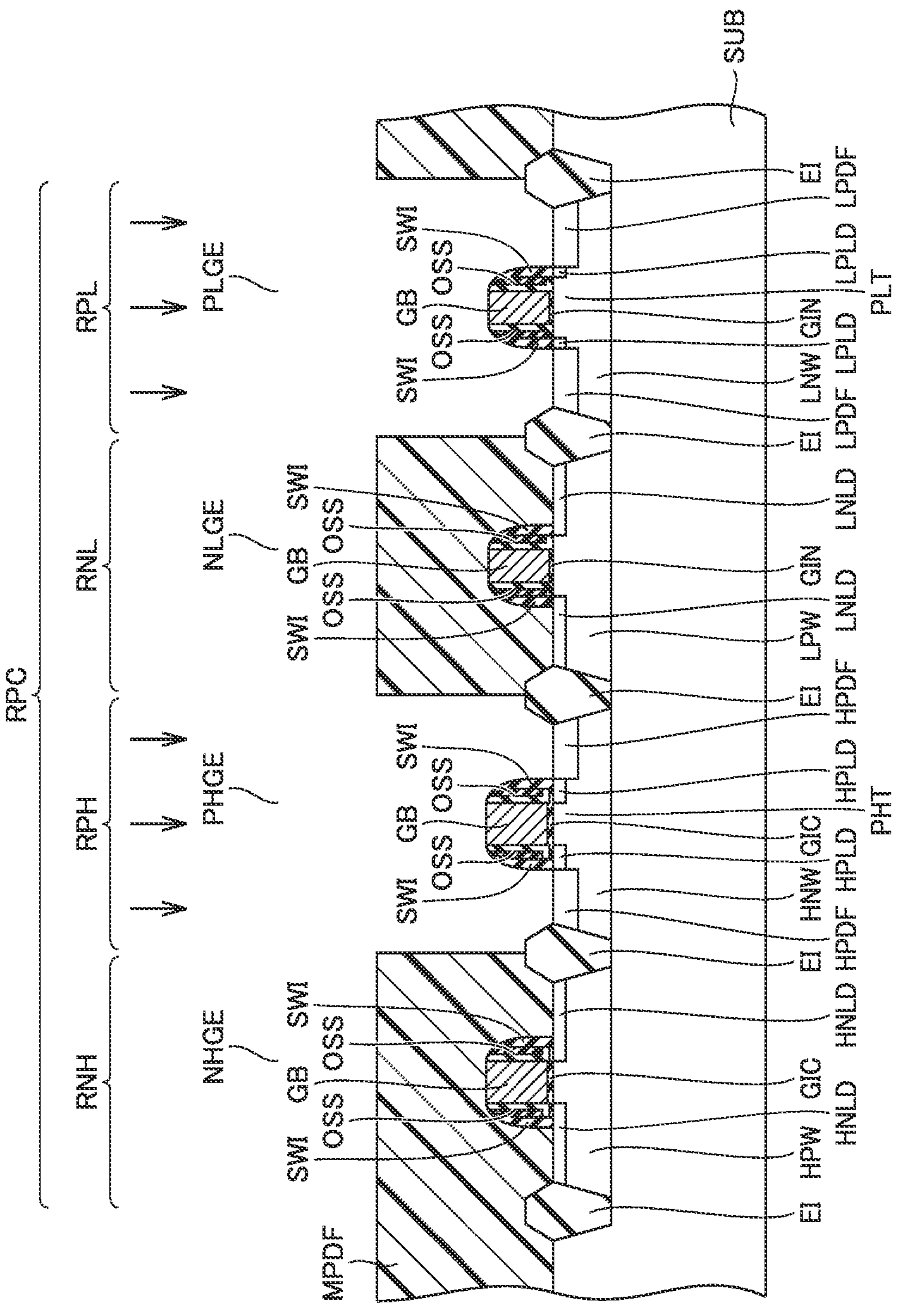
FIG. 52B is a cross sectional view of the peripheral region showing the step performed after the step shown in FIGS. 51A and 51B in the same embodiment.
Figure 53A:
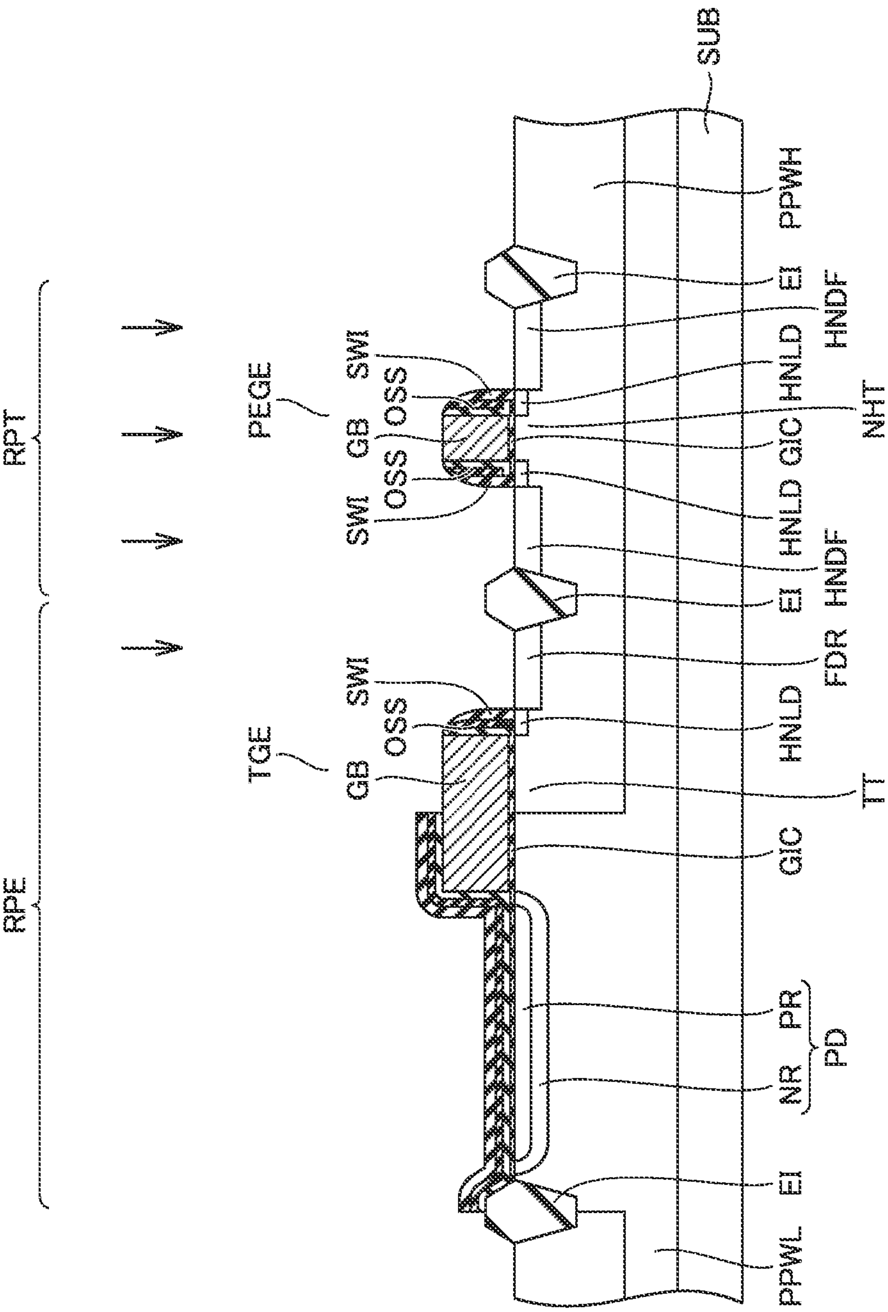
FIG. 53A is a cross sectional view of the pixel region and the like showing a step performed after the step shown in FIGS. 52A and 52B in the same embodiment.
Figure 53B:
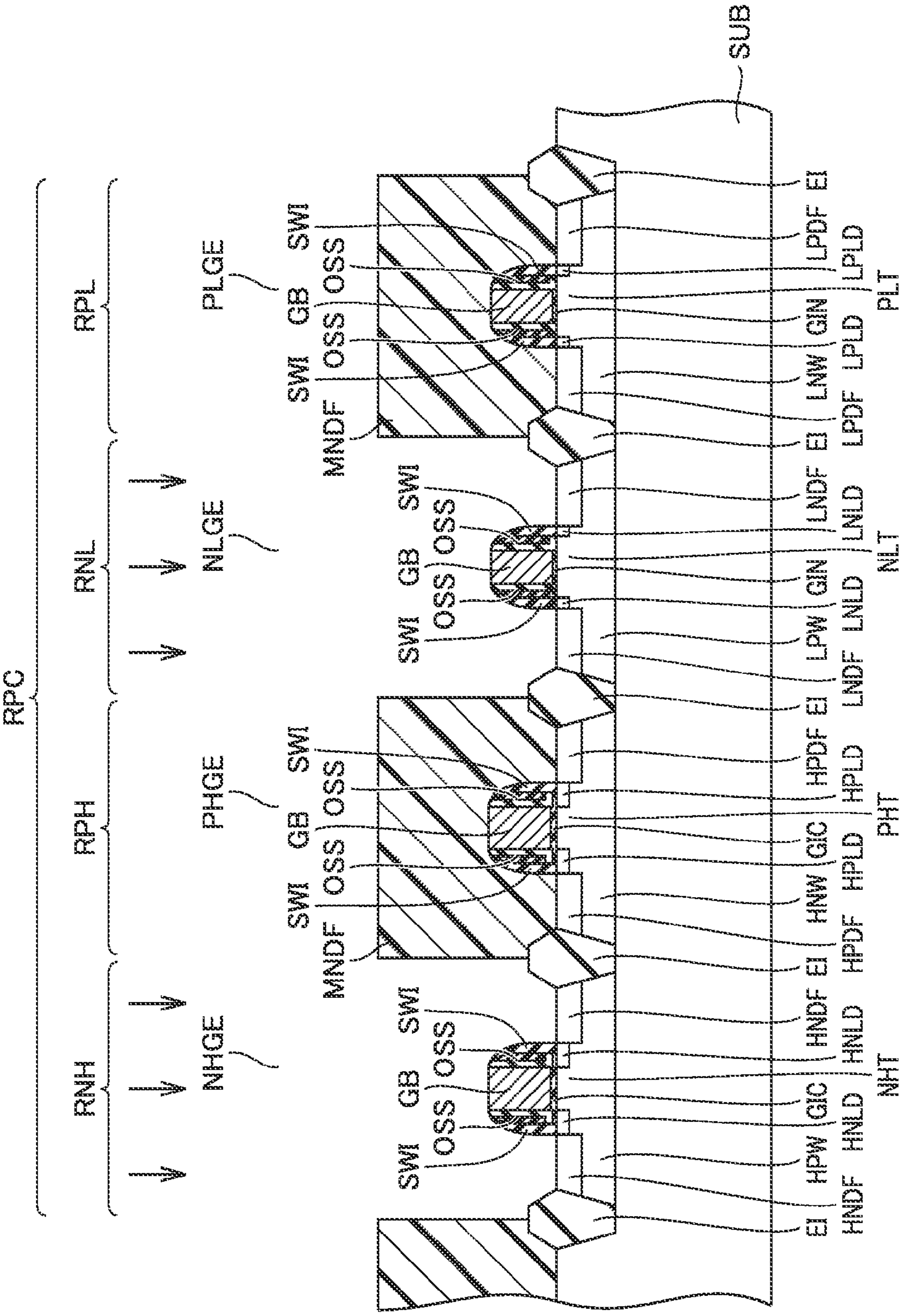
FIG. 53B is a cross sectional view of the peripheral region showing the step performed after the step shown in FIGS. 52A and 52B in the same embodiment.

Next, by implanting a p-type impurity using resist pattern MPDF and gate electrode portions PHGE, PLGE as an implantation mask, source/drain regions HPDF are formed in region RPH, and source/drain regions LPDF are formed in region RPL, as shown in FIG. 52A and FIG. 52B. Thereafter, resist pattern MPDF is removed.

Next, by implanting an n-type impurity using resist pattern MNDF and gate electrode portions TGE, PEGE, NHGE, NLGE as an implantation mask, source/drain regions HNDF are formed in each of pixel transistor region RPT and region RNH. Source/drain regions LNDF are formed in region RNL. Floating diffusion region FDR is formed in pixel region RPE. Thereafter, resist pattern MNDF is removed.

Figure 54A:
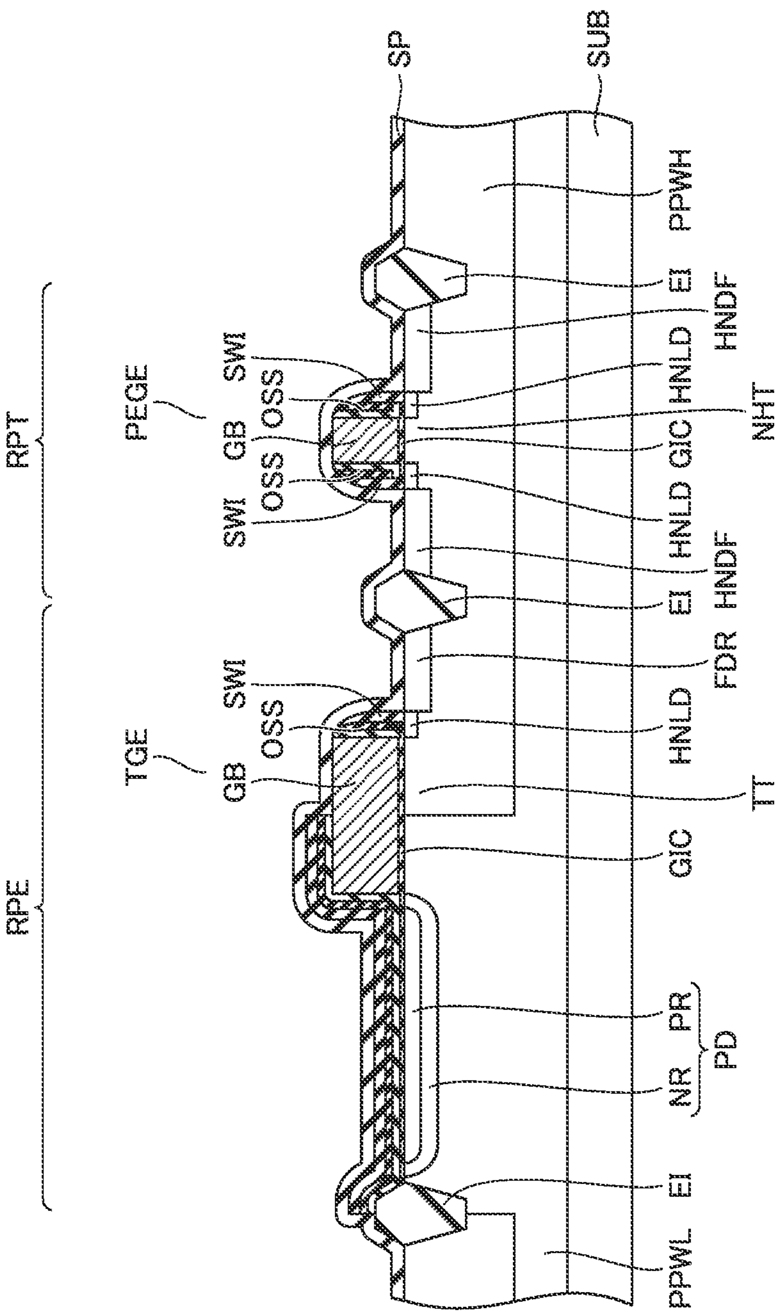
FIG. 54A is a cross sectional view of the pixel region and the like showing a step performed after the step shown in FIGS. 53A and 53B in the same embodiment.
Figure 54B:
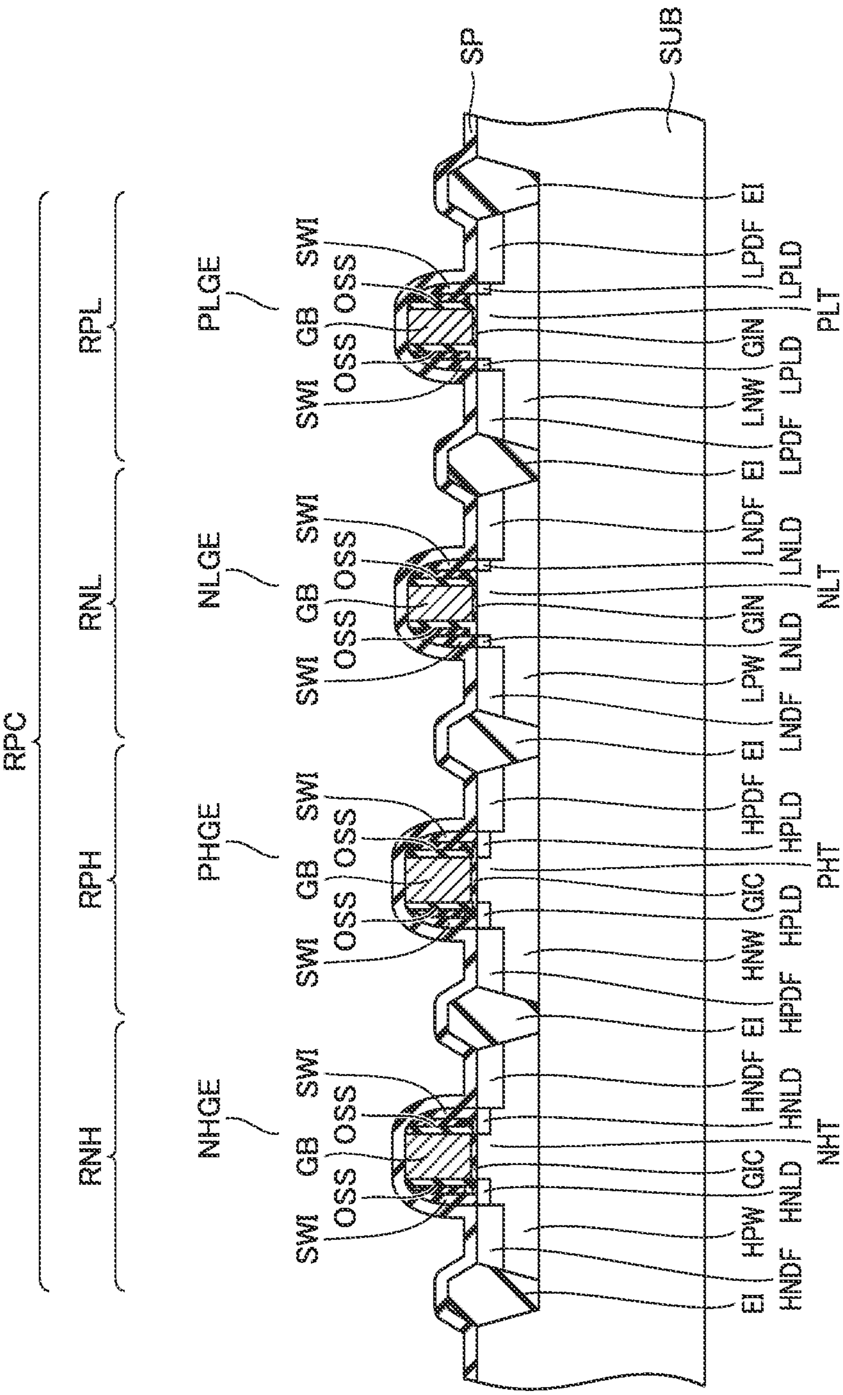
FIG. 54B is a cross sectional view of the peripheral region showing the step performed after the step shown in FIGS. 53A and 53B in the same embodiment.

Next, silicide protection film SP is formed to cover gate electrode portions TGE, PEGE, NHGE, PHGE, NLGE, PLGE, and the like, as shown in FIG. 54A and FIG. 54B. Thereafter, with a portion of the silicide protection film covering a field effect transistor (not shown) in which no metal silicide film is to be formed being left, the silicide protection film located in other regions is removed.

Figure 55A:
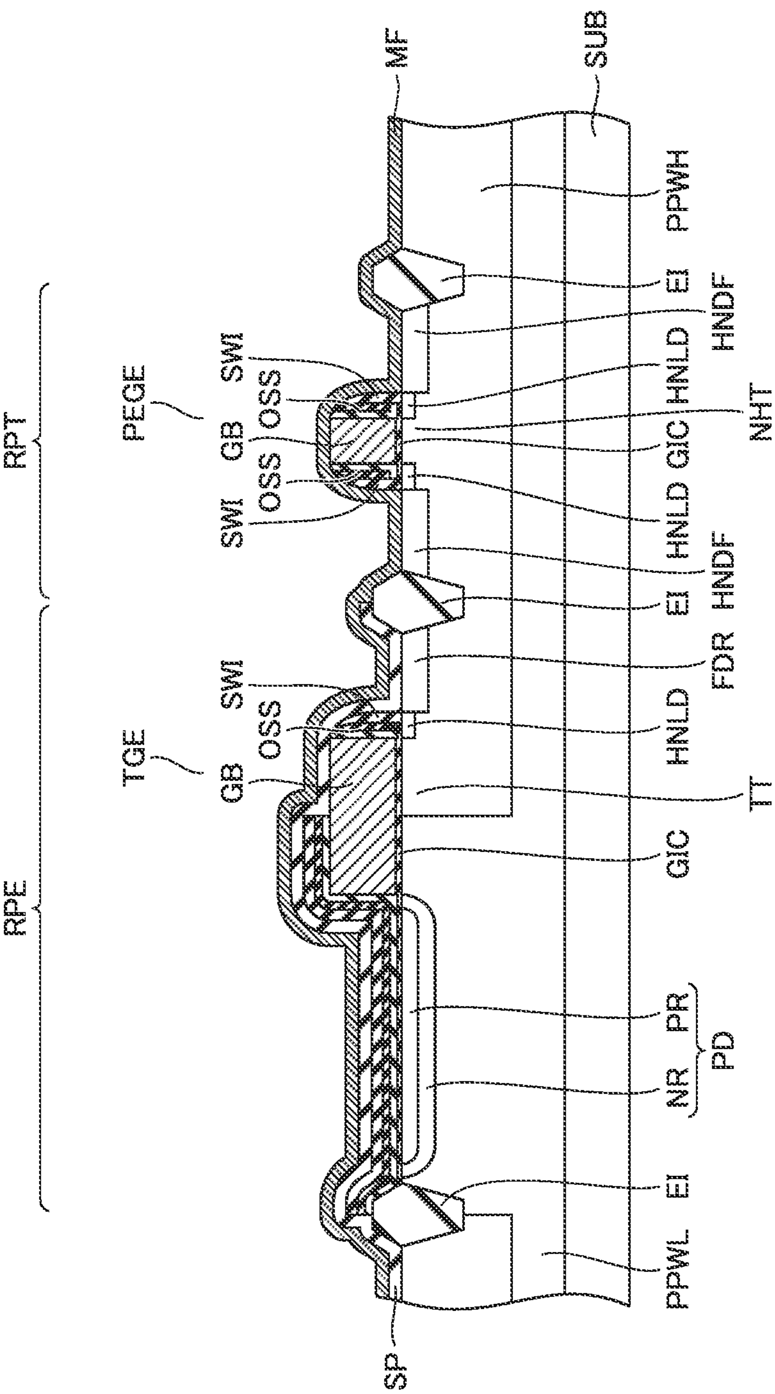
FIG. 55A is a cross sectional view of the pixel region and the like showing a step performed after the step shown in FIGS. 54A and 54B in the same embodiment.
Figure 55B:
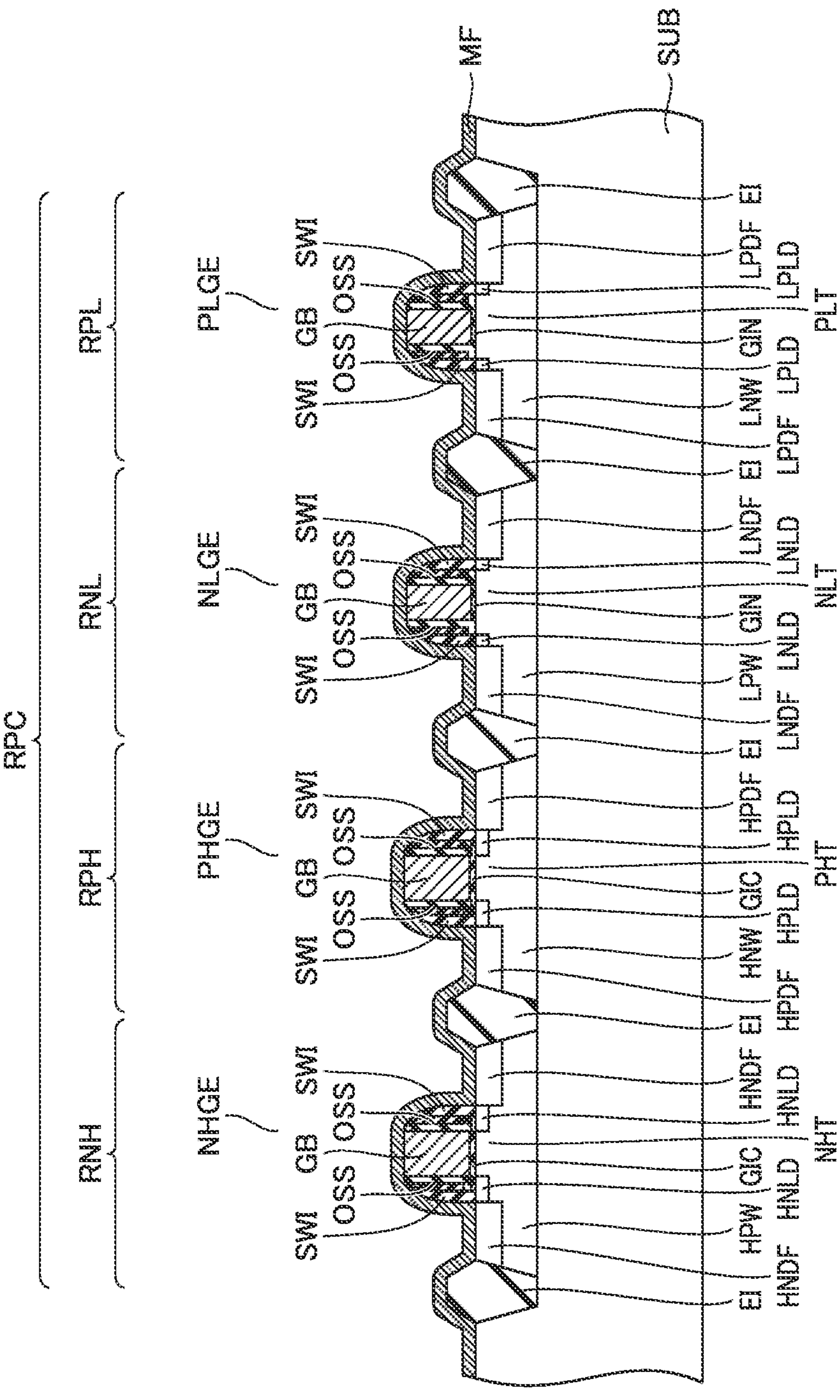
FIG. 55B is a cross sectional view of the peripheral region showing the step performed after the step shown in FIGS. 54A and 54B in the same embodiment.
Figure 56A:
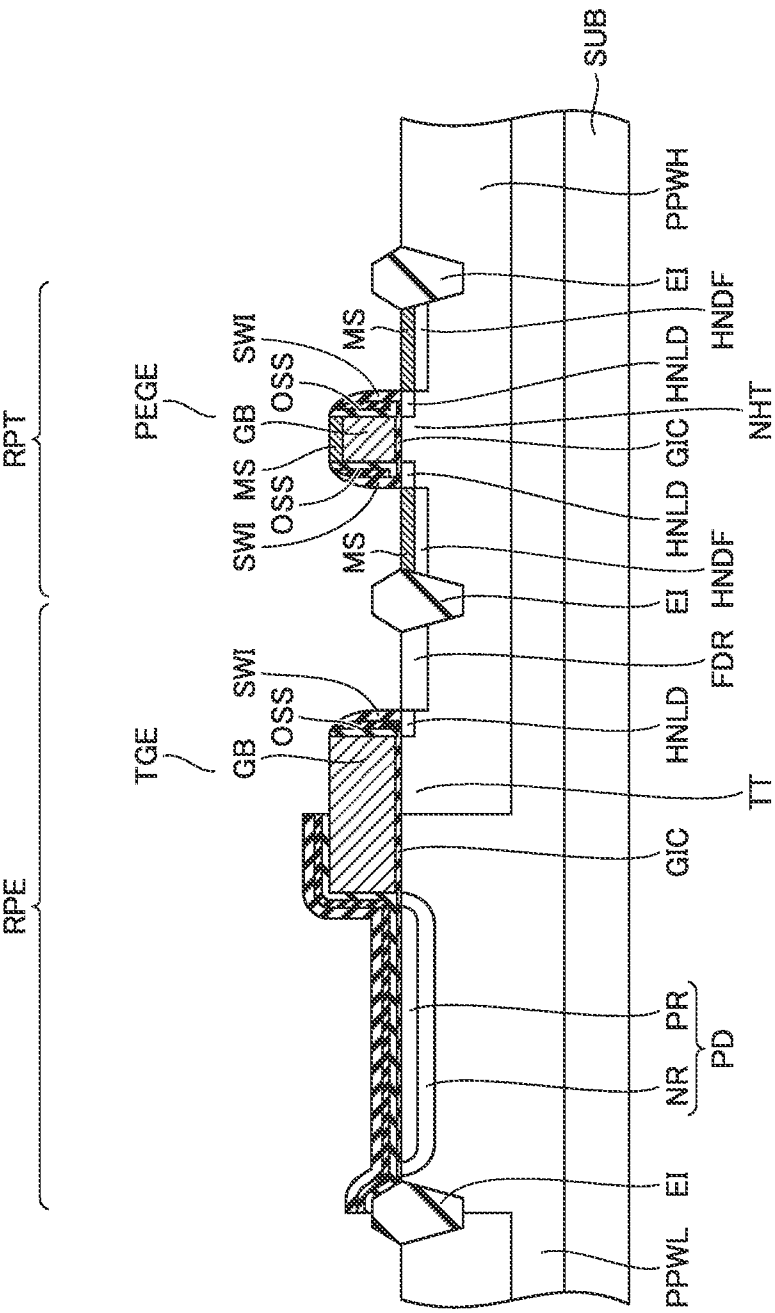
FIG. 56A is a cross sectional view of the pixel region and the like showing a step performed after the step shown in FIGS. 55A and 55B in the same embodiment.
Figure 56B:
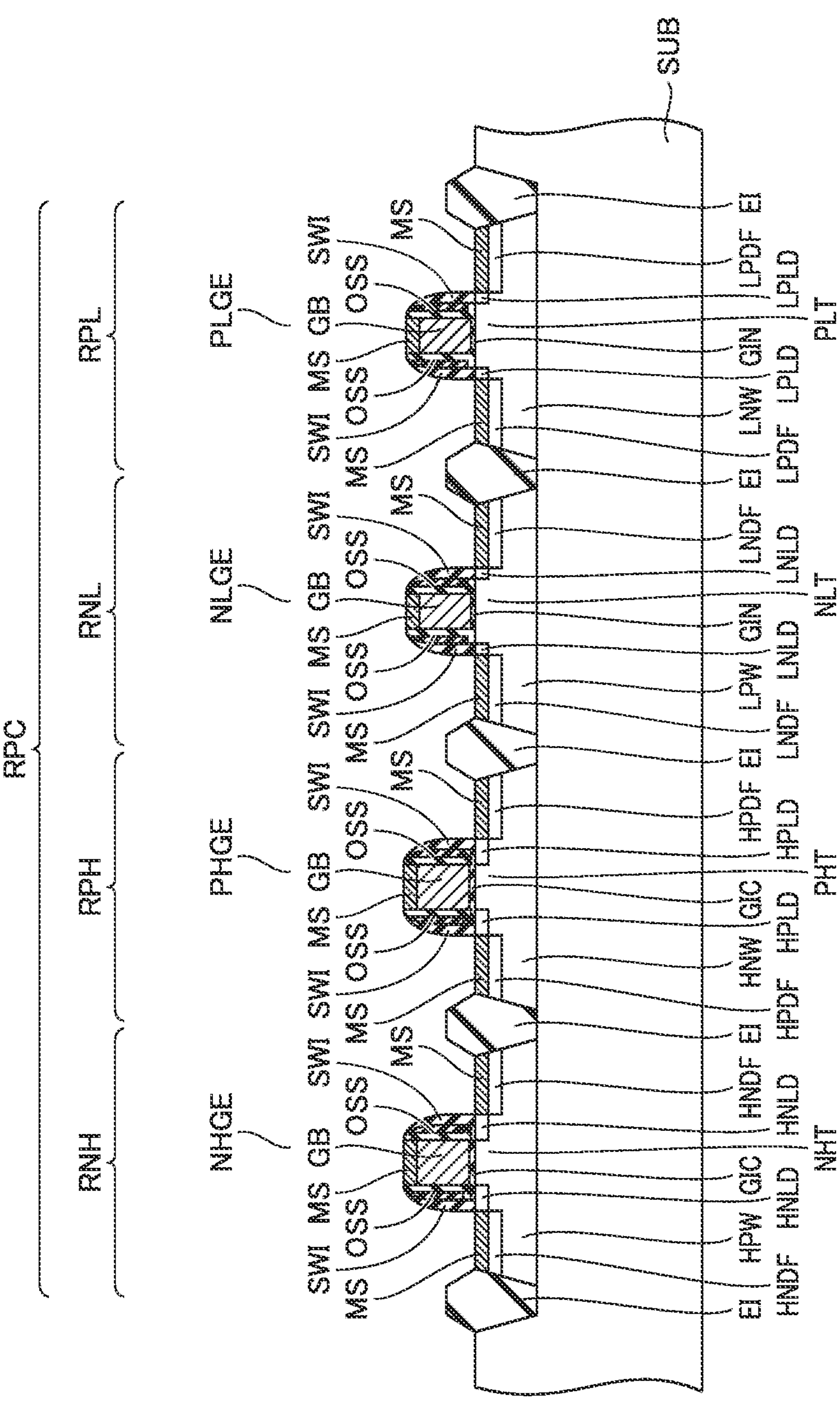
FIG. 56B is a cross sectional view of the peripheral region showing the step performed after the step shown in FIGS. 55A and 55B in the same embodiment.

Next, predetermined metal film MF is formed to cover gate electrode portions TGE, PEGE, NHGE, PHGE, NLGE, PLGE, and the like, as shown in FIG. 55A and FIG. 55B. Next, by performing predetermined heat treatment to cause metal film MF to react with silicon, and then removing unreacted metal, metal silicide films MS are formed as shown in FIG. 56A and FIG. 56B.

Figure 57A:
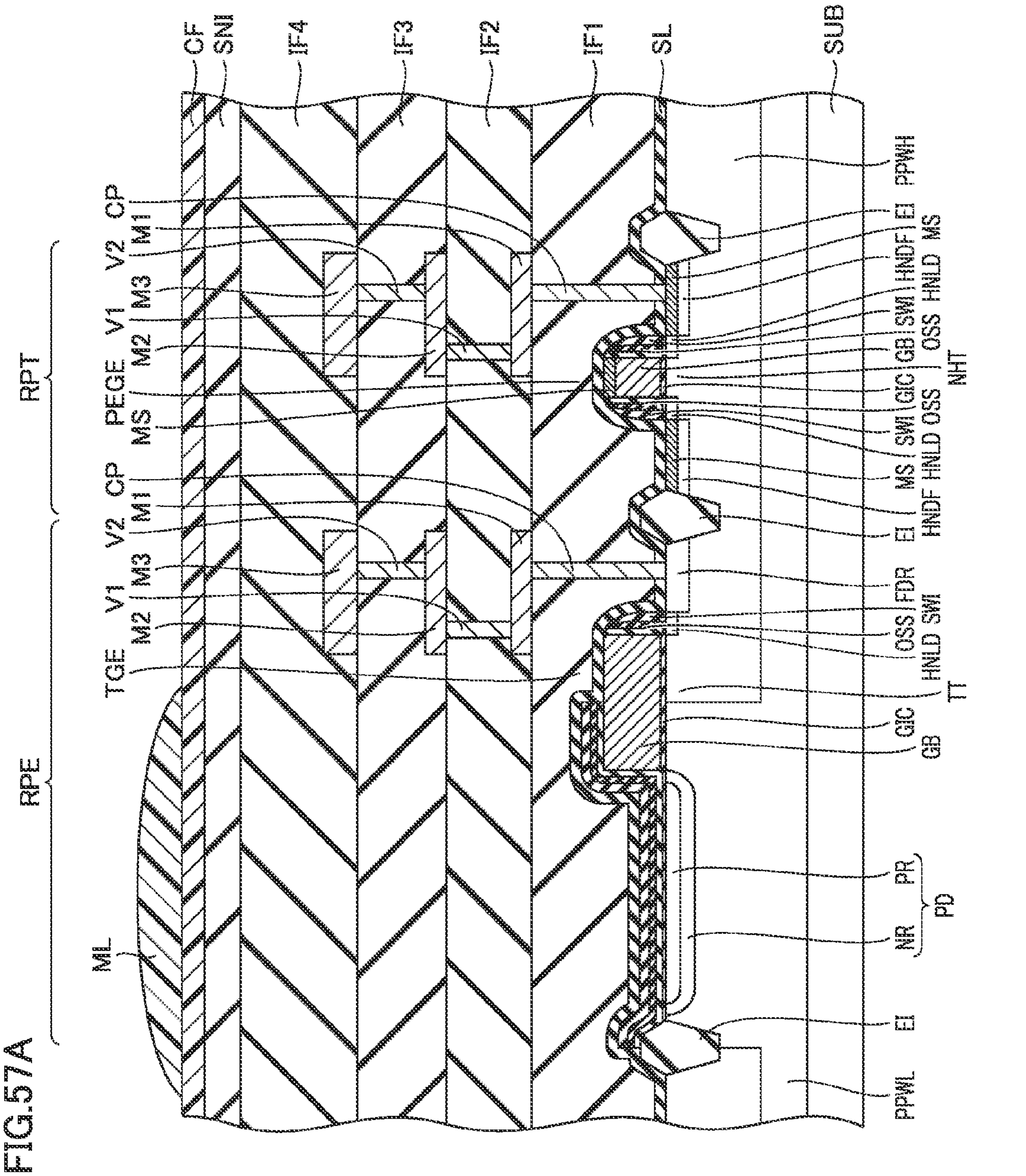
FIG. 57A is a cross sectional view of the pixel region and the like showing a step performed after the step shown in FIGS. 56A and 56B in the same embodiment.
Figure 57B:
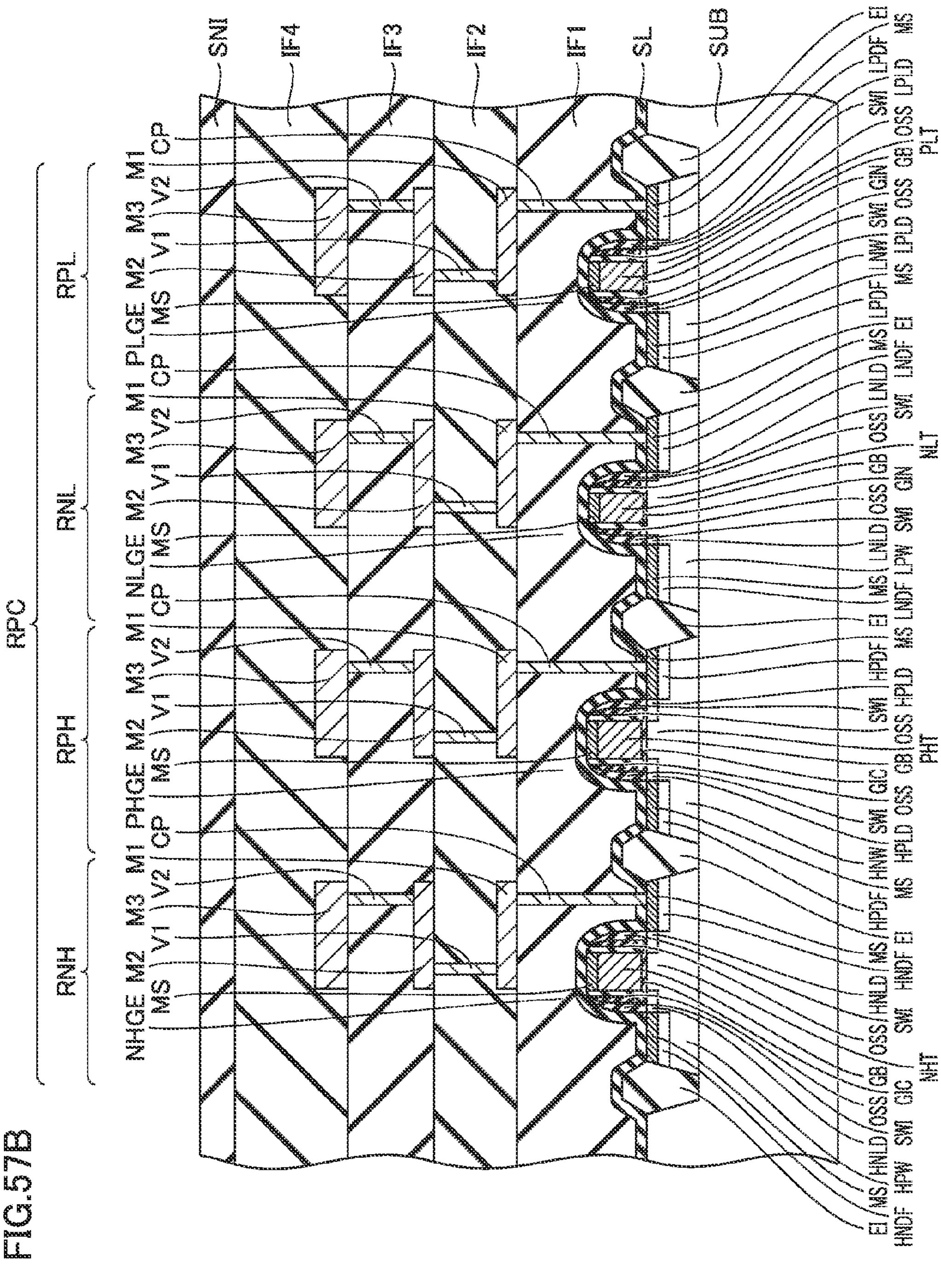
FIG. 57B is a cross sectional view of the peripheral region showing the step performed after the step shown in FIGS. 56A and 56B in the same embodiment.

Next, after the step identical to that shown in FIG. 23A and FIG. 23B and the step identical to that shown in FIG. 24A and FIG. 24B are performed, the main part of the imaging apparatus is completed as shown in FIG. 57A and FIG. 57B. Silicon oxide film OS1 of offset spacer film OSS in the imaging apparatus has a portion which covers the sidewall surface of gate electrode GB (a first portion), and a portion which extends from the first portion to a side opposite to a side on which gate electrode GB is located (a second portion). Sidewall insulating film SWI with a single-layer structure made of a silicon nitride film is formed to cover an end surface (thickness direction) of the second portion of silicon oxide film OS1.

In the imaging apparatus described above, in addition to the effect of terminating the dangling bonds described in the first embodiment, leak at floating diffusion region FDR caused by a metal silicide film can be suppressed in pixel region RPE. Further, deterioration of the S/N ratio of field effect transistor NHT can be suppressed in pixel transistor region RPT. In this regard, a description will be given in connection with a method for manufacturing an imaging apparatus in accordance with a comparative example. It should be noted that members of the imaging apparatus in accordance with the comparative example which are identical to those of the imaging apparatus in accordance with the embodiment will be designated by the same reference numerals with a prefix letter "C", and the description thereof will not be repeated unless deemed necessary.

Figure 58:
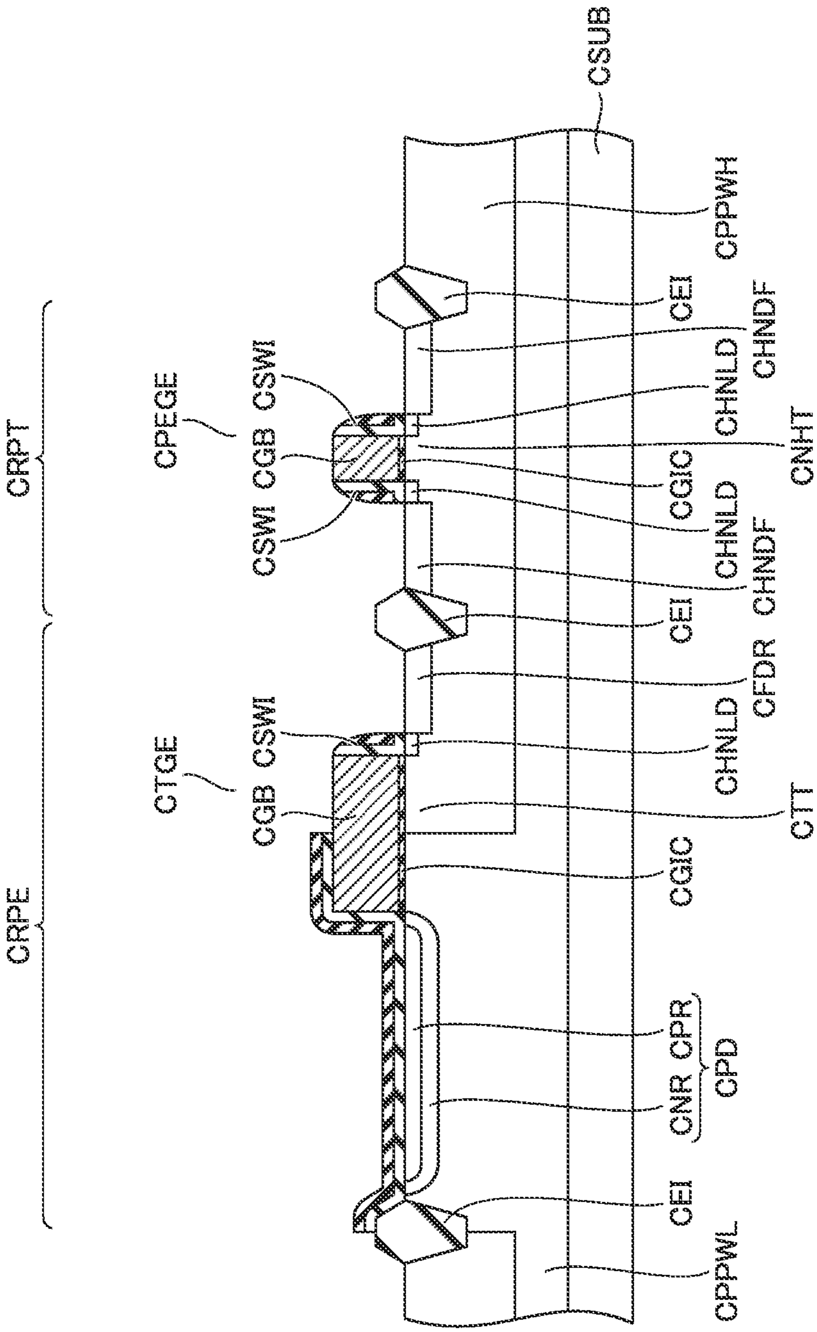
FIG. 58 is a cross sectional view of a pixel region and the like showing one step of a method for manufacturing an imaging apparatus in accordance with a comparative example.

As shown in FIG. 58, in the imaging apparatus in accordance with the comparative example, sidewall insulating films CSWI with a double-layer structure including a silicon oxide film as a lower-layer film and a silicon nitride film as an upper-layer film are each formed as a sidewall insulating film. After sidewall insulating films CSWI are formed and before a metal film for forming a metal silicide film is formed, the step of forming source/drain regions, the step of forming a silicide protection film for preventing silicidation, and the like are performed.

At the step of forming the source/drain regions, each resist pattern used as an implantation mask is removed by a predetermined chemical solution. Further, after the silicide protection film is formed, portions of the silicide protection film located in the regions in which a metal silicide film is to be formed are removed by a predetermined chemical solution (a hydrofluoric acid-based chemical solution). In this manner, sidewall insulating films CSWI are exposed to various chemical solutions before the metal film is formed.

Figure 59A:
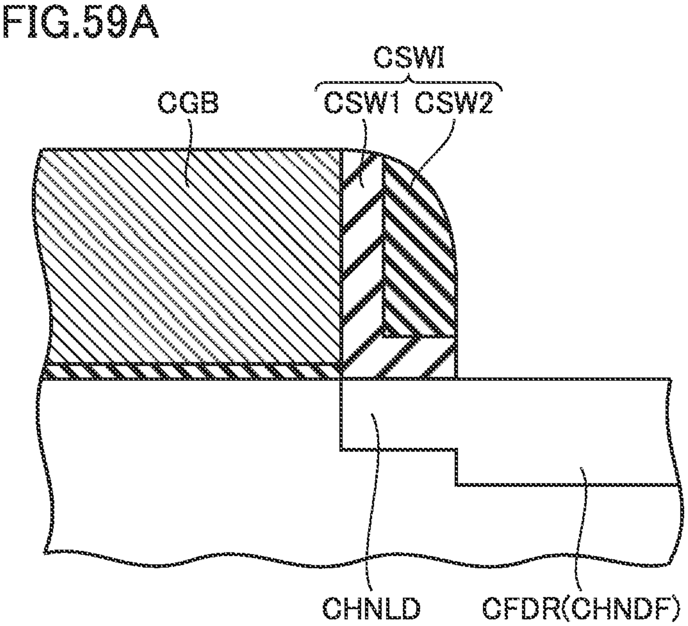
FIG. 59A is a partially enlarged cross sectional view in the vicinity of a gate electrode portion, showing one step of the method for manufacturing the imaging apparatus in accordance with the comparative example.
Figure 59B:
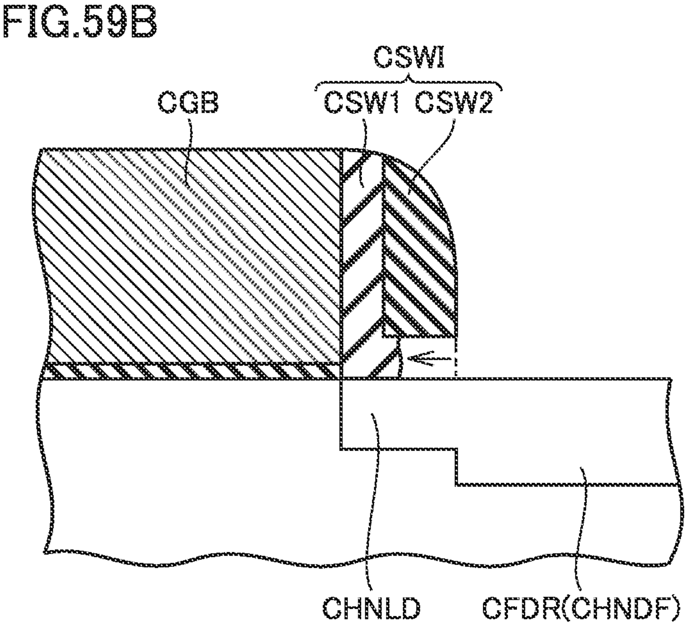
FIG. 59B is a partially enlarged cross sectional view in the vicinity of the gate electrode portion, showing a step performed after the step shown in FIG. 59A.

Thus, although an end surface of a silicon oxide film CSW1 is initially located at the substantially same position as (flush with) a side surface (a surface) of a silicon nitride film CSW2 in sidewall insulating film CSWI as shown in FIG. 59A, after sidewall insulating film CSWI is exposed to chemical solutions, in particular silicon oxide film CSW1 is etched, and as a result, the end surface of silicon oxide film CSW1 recedes toward gate electrode CGB as shown in FIG. 59B (see the arrow).

Figure 59C:
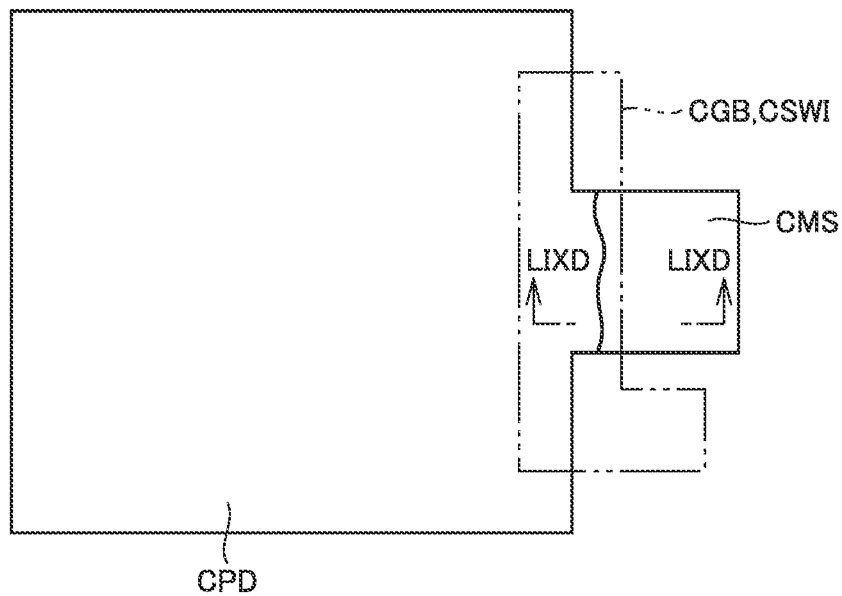
FIG. 59C is a partially enlarged plan view in the vicinity of the gate electrode portion, showing a step performed after the step shown in FIG. 59B.
Figure 59D:
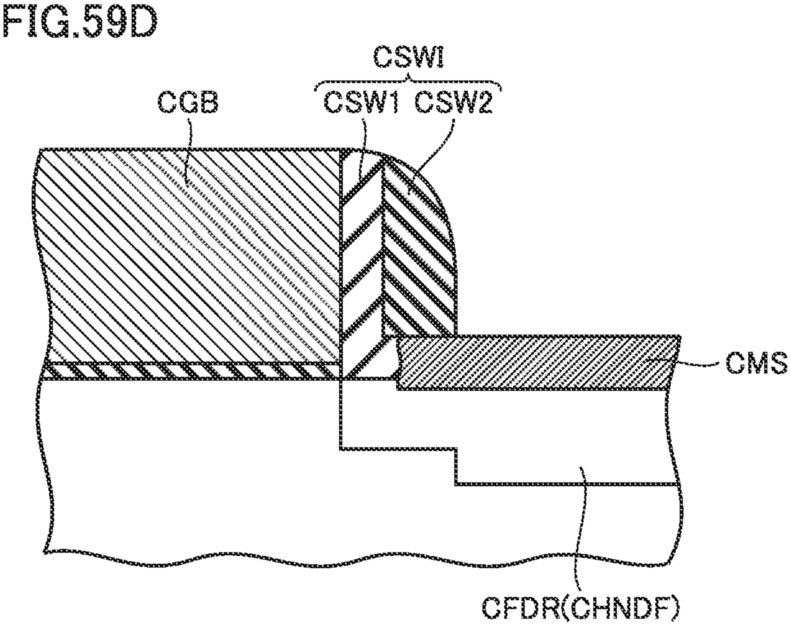
FIG. 59D is a partially enlarged cross sectional view along a section line LIXD-LIXD shown in FIG. 59C.

If an attempt is made to form a metal silicide film in such a state, a metal silicide film CMS will be formed to extend into the portion from which silicon oxide film CSW1 has receded, as shown in FIG. 59C and FIG. 59D.

Accordingly, in particular in a transfer transistor, due to the extension of the metal silicide film, the substantial length of floating diffusion region CFDR in a channel length direction becomes shorter, and a leak component called GIDL (Gate Induced Drain Leak) may increase as one of leak (FD leak) components in floating diffusion region CFDR. An increase in FD leak may cause a defect such as impaired image sharpness. Further, in pixel transistor region CRPT, the S/N ratio of field effect transistor CNHT may be deteriorated.

Figure 60A:
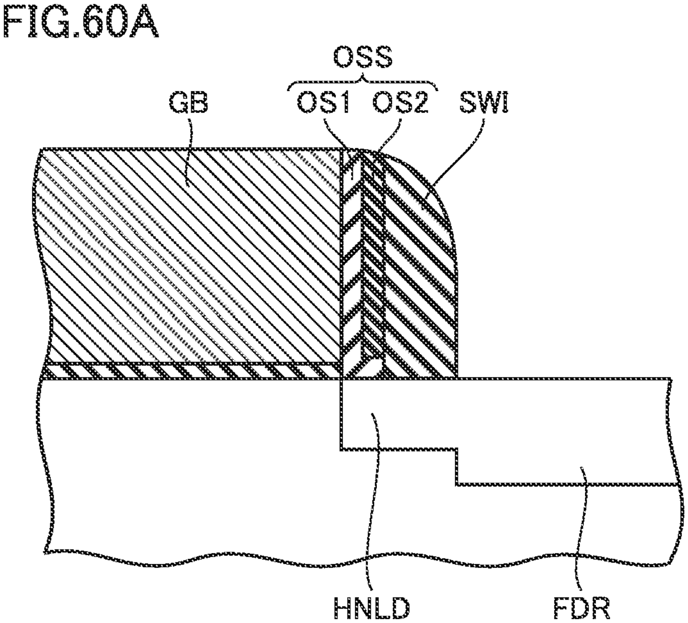
FIG. 60A is a partially enlarged cross sectional view in the vicinity of a gate electrode portion, showing one step of the method for manufacturing the imaging apparatus in the same embodiment.
Figure 60B:
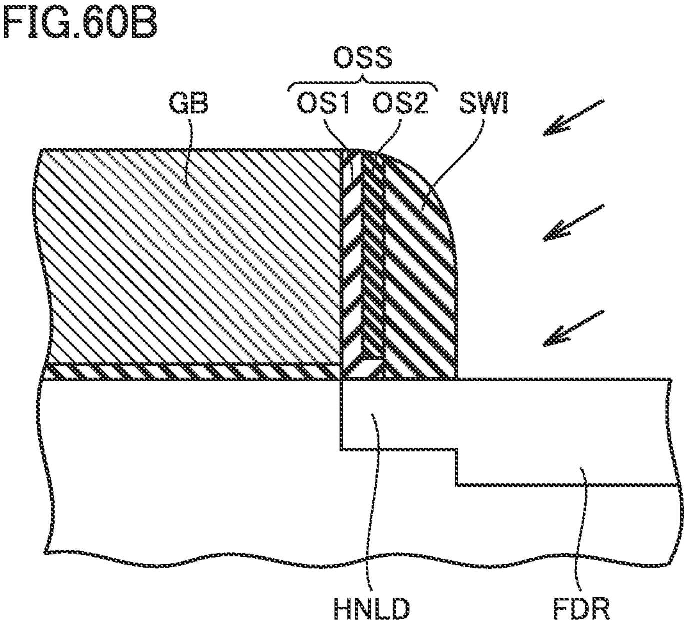
FIG. 60B is a partially enlarged cross sectional view in the vicinity of the gate electrode portion, showing a step performed after the step shown in FIG. 60A in the same embodiment.

In contrast to the imaging apparatus in accordance with the comparative example, in the imaging apparatus in accordance with the embodiment, sidewall insulating film SWI with a single-layer structure made of a silicon nitride film is formed as a sidewall insulating film, as shown in FIG. 60A. Therefore, even if sidewall insulating film SWI is exposed to chemical solutions such as hydrofluoric acid as shown in FIG. 60B (see the arrows), sidewall insulating film SWI is hardly etched and hardly recedes. Moreover, no metal silicide film is formed in pixel region RPE, as shown in FIG.

Figure 60C:
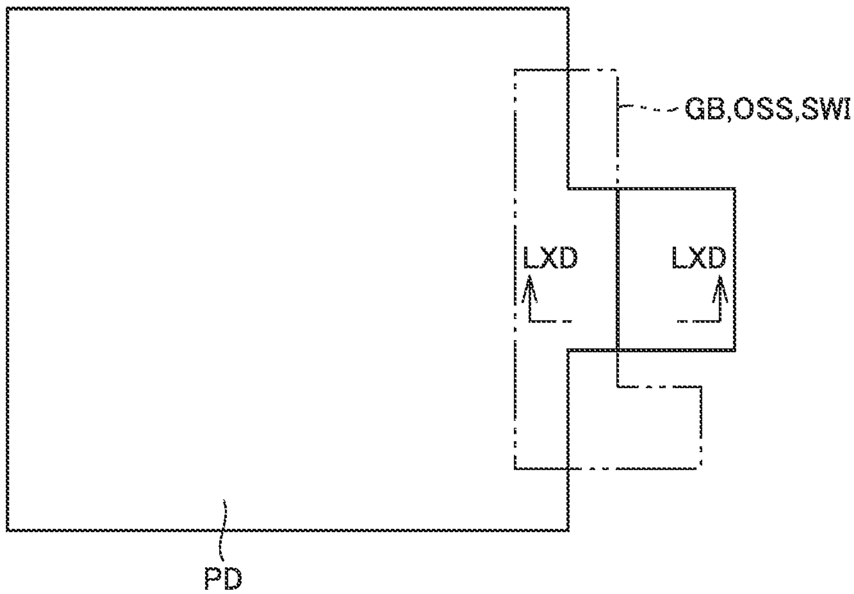
FIG. 60C is a partially enlarged plan view in the vicinity of the gate electrode portion, showing a step performed after the step shown in FIG. 60B in the same embodiment.
Figure 60D:
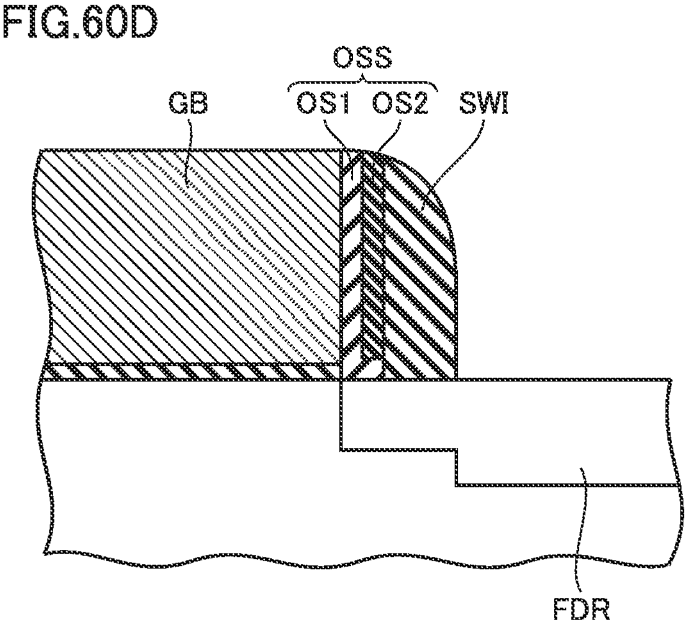
FIG. 60D is a partially enlarged cross sectional view along a section line LXD-LXD shown in FIG. 60C in the same embodiment.

60C and FIG. 60D. Thereby, the substantial length of floating diffusion region FDR in the channel length direction can be ensured, and FD leak (GIDL) can be suppressed.

Figure 60E:
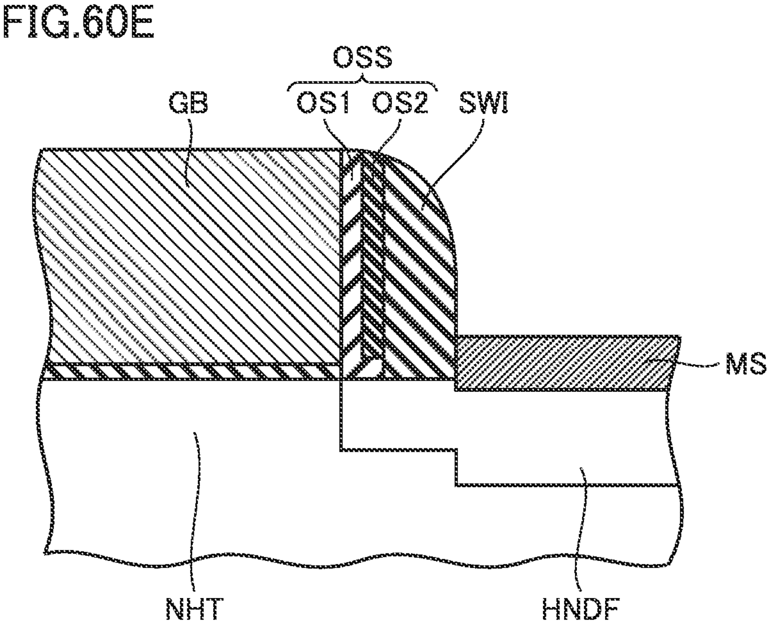
FIG. 60E is a partially enlarged cross sectional view showing a gate electrode portion of a field effect transistor in a pixel transistor region, showing a step performed after the step shown in FIG. 60B in the same embodiment.

Further, as shown in FIG. 60E, at field effect transistor NHT in pixel transistor region RPT, metal silicide film MS is not formed to extend under sidewall insulating film SWI, and metal silicide film MS is formed in a region which is not covered with sidewall insulating film SWI. Thereby, deterioration of the S/N ratio of field effect transistor NHT can be suppressed.

Fourth Embodiment

Here, a description will be given of a case where an offset spacer film with a double-layer structure is formed, then a silicon nitride film as an upper-layer film is removed with a silicon oxide film as a lower-layer film being left, and thereafter a sidewall insulating film with a single-layer structure is formed. It should be noted that members identical to those of the imaging apparatus described in the first embodiment will be designated by the same reference numerals, and the description thereof will not be repeated unless deemed necessary.

Figure 61A:
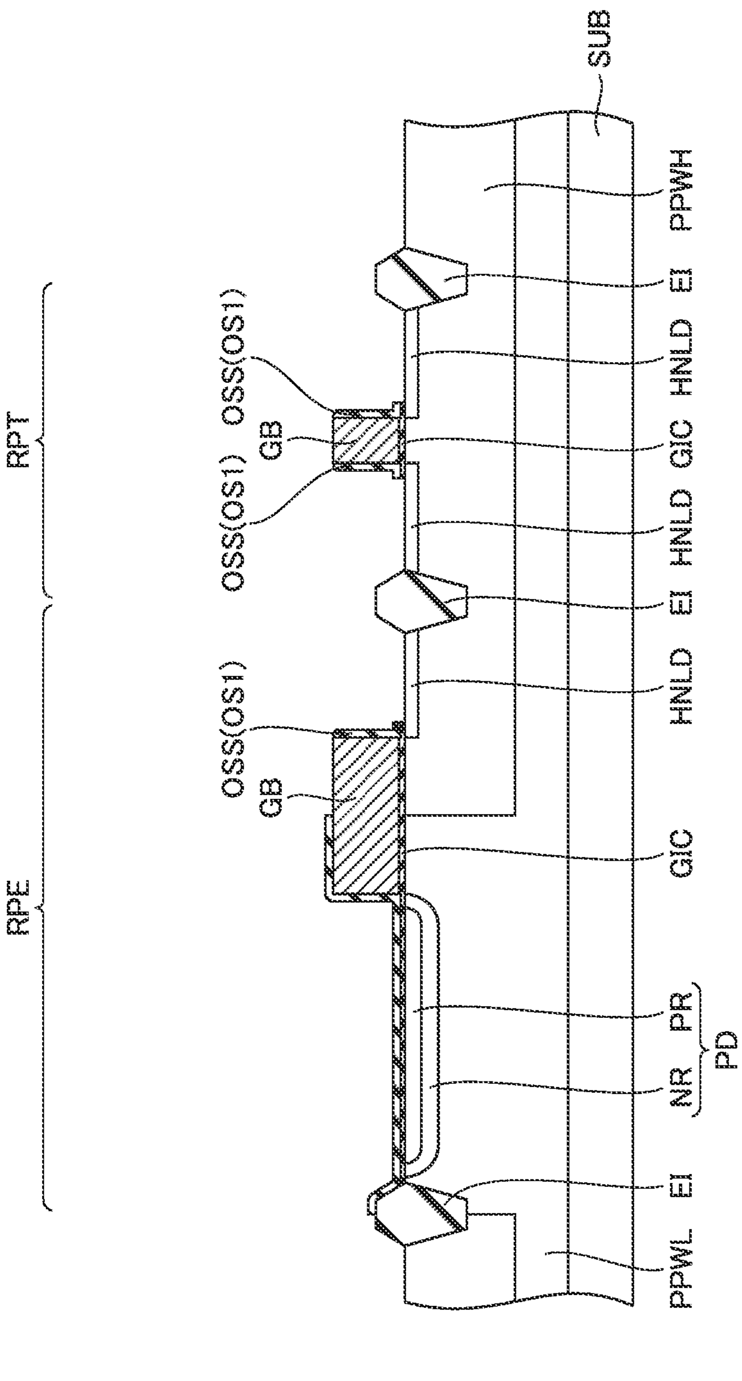
FIG. 61A is a cross sectional view of a pixel region and the like showing one step of a method for manufacturing an imaging apparatus in accordance with a fourth embodiment.
Figure 61B:
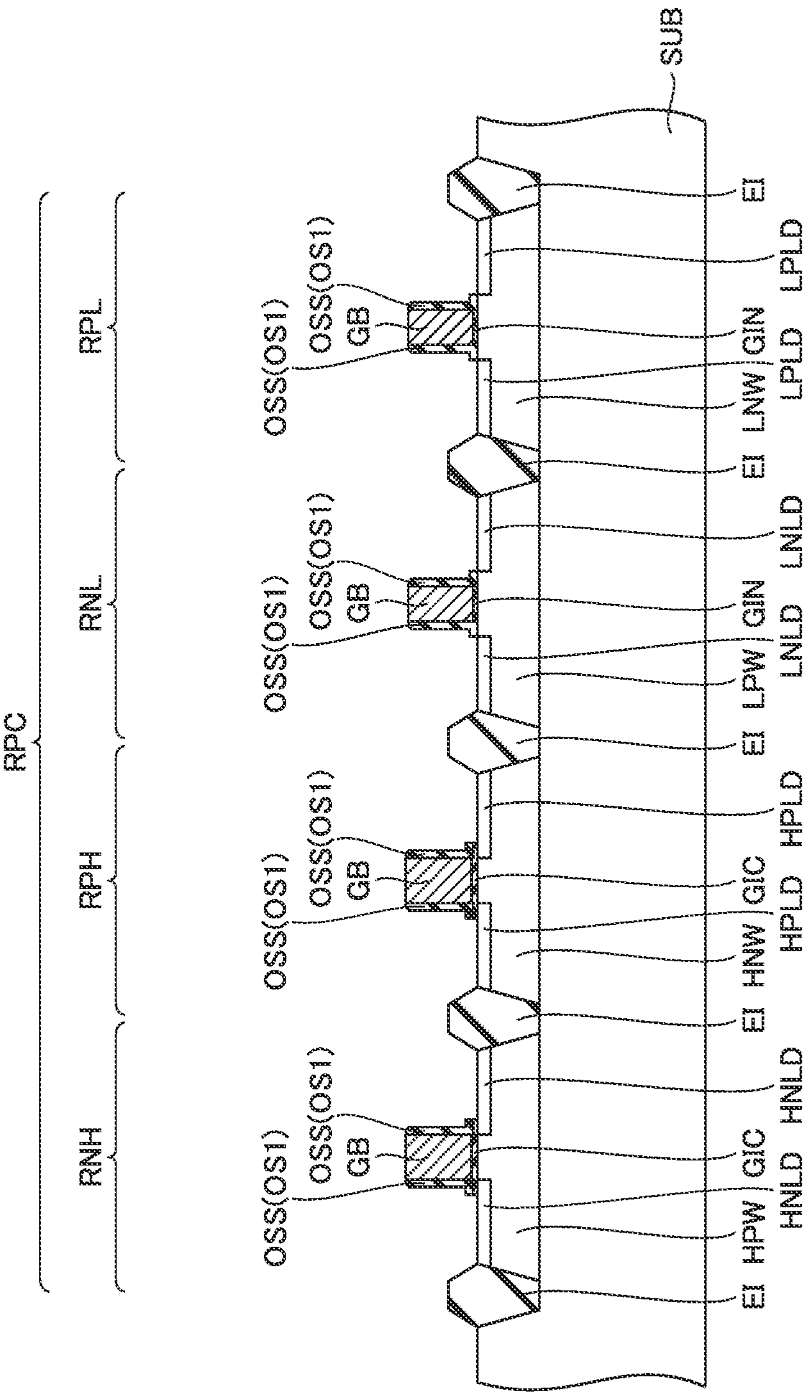
FIG. 61B is a cross sectional view of a peripheral region showing the one step of the method for manufacturing the imaging apparatus in accordance with the fourth embodiment.

First, after the steps from the step identical to that shown in FIG. 5A and FIG. 5B to the step identical to that shown in FIG. 15A and FIG. 15B are performed, offset spacer films OSS with a double-layer structure including silicon oxide film OS1 as a lower-layer film and silicon nitride film OS2 as an upper-layer film are formed, and extension regions LNLD, LPLD are formed (see FIG. 39A and FIG. 39B). Next, by performing the step identical to that shown in FIG. 40A and FIG. 40B, silicon nitride film OS2 of each offset spacer film OSS is removed, with silicon oxide film OS1 being left, as shown in FIG. 61A and FIG. 61B.

Figure 62A:
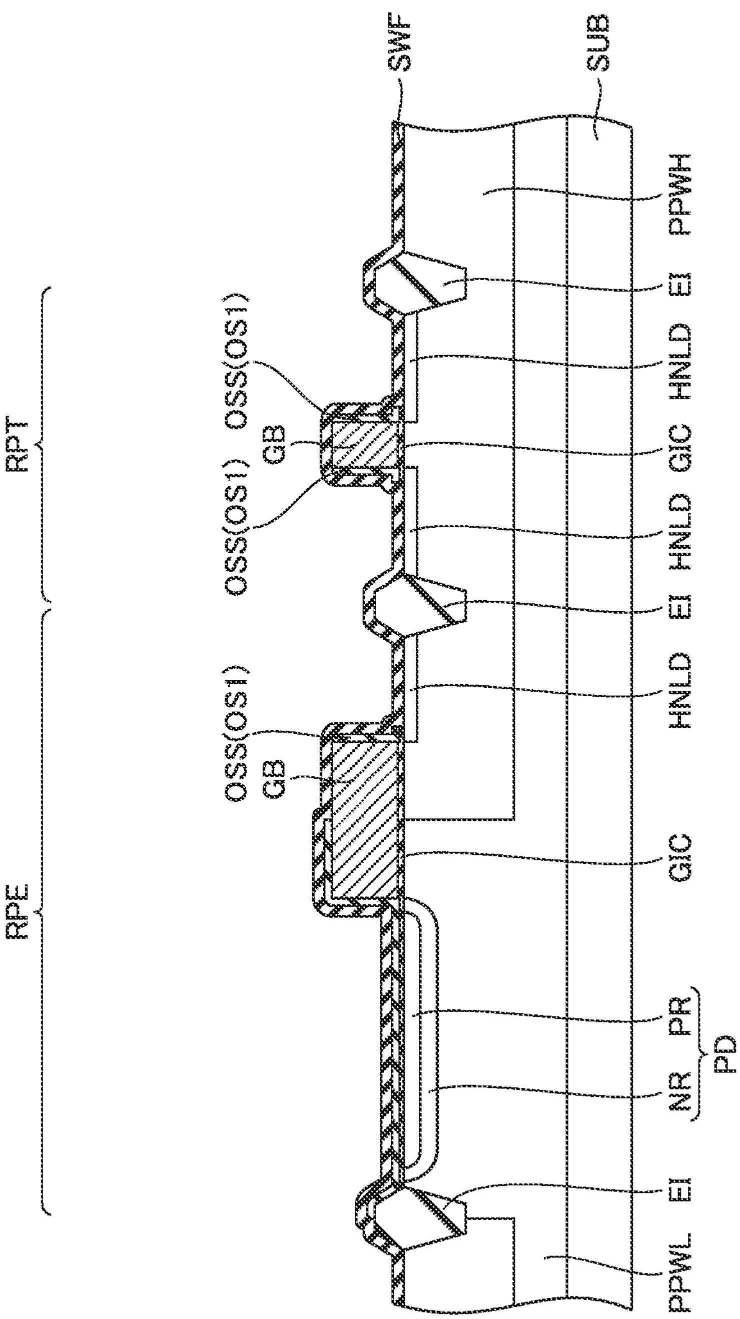
FIG. 62A is a cross sectional view of the pixel region and the like showing a step performed after the step shown in FIGS. 61A and 61B in the same embodiment.
Figure 62B:
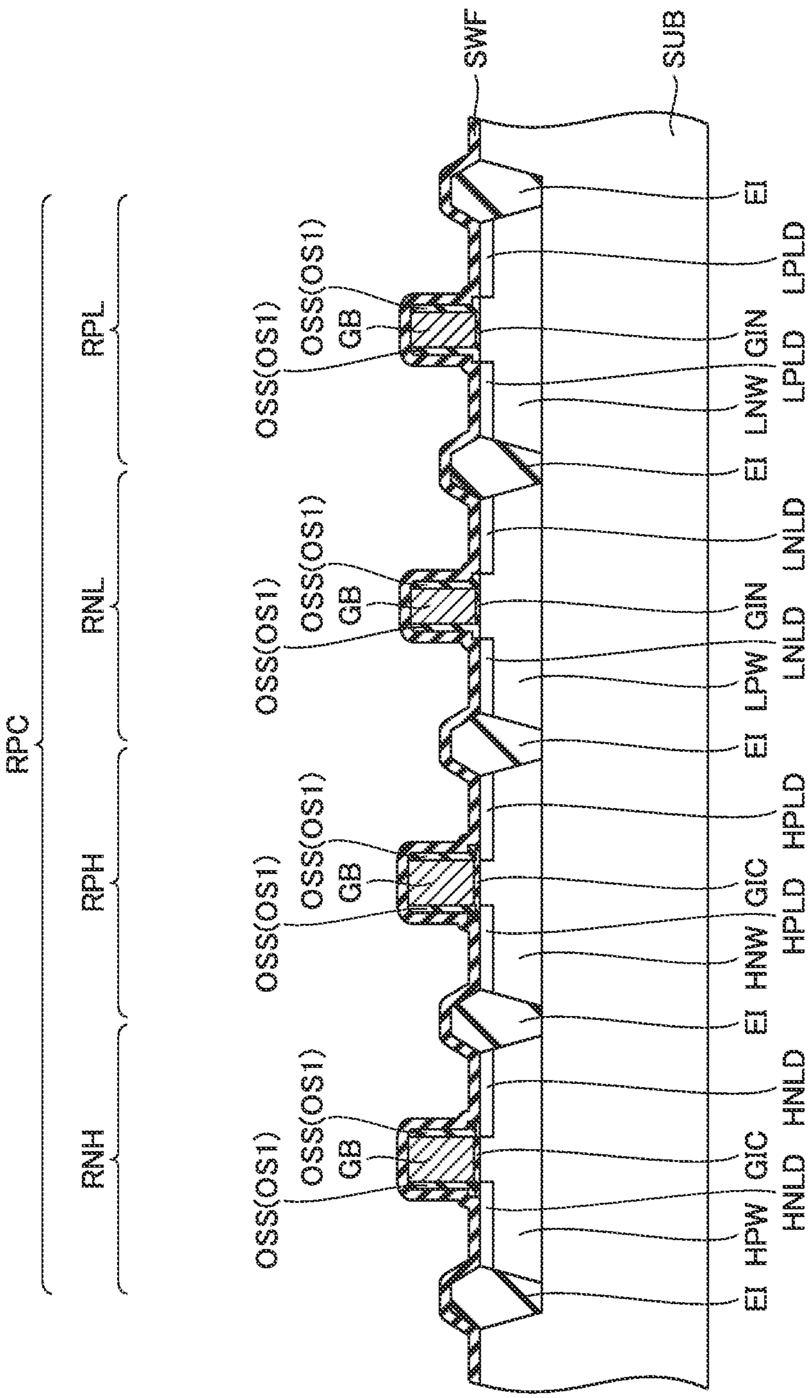
FIG. 62B is a cross sectional view of the peripheral region showing the step performed after the step shown in FIGS. 61A and 61B in the same embodiment.
Figure 63A:
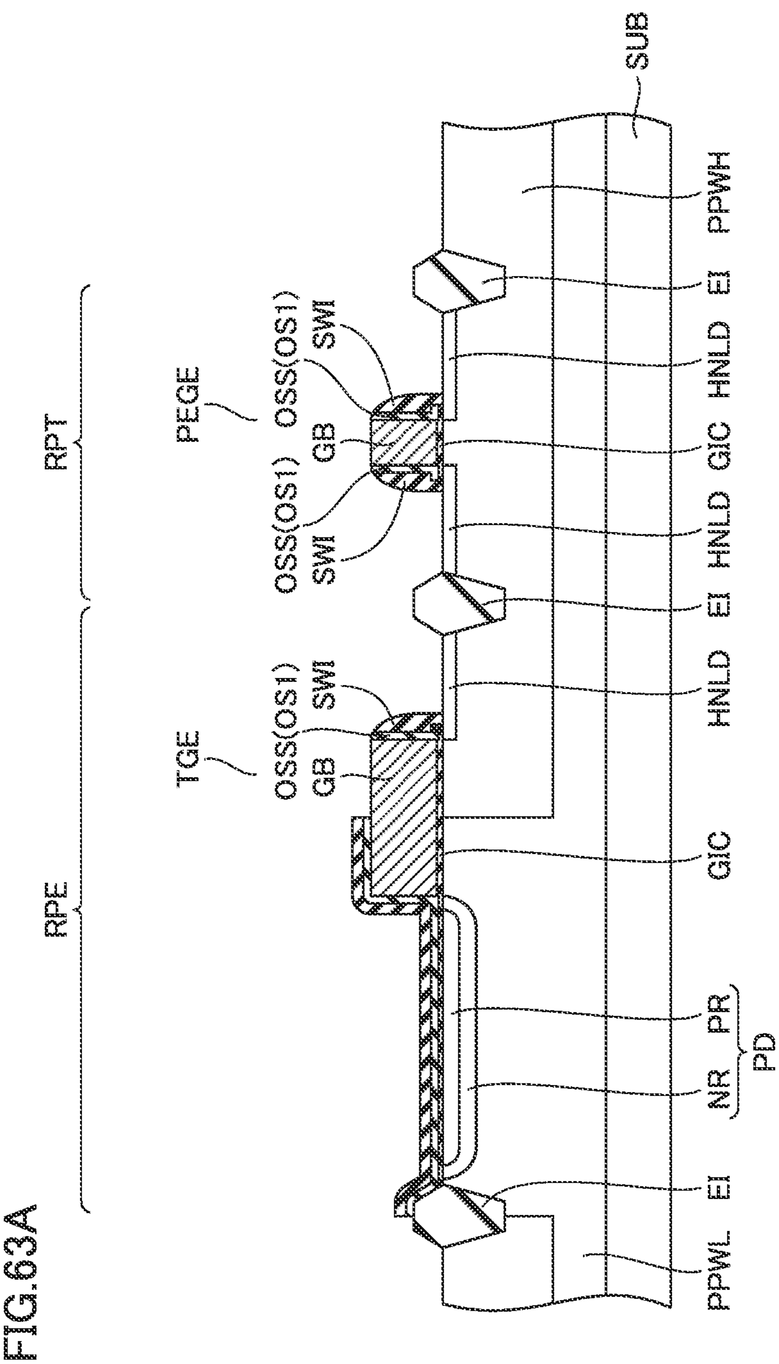
Figure 63B:
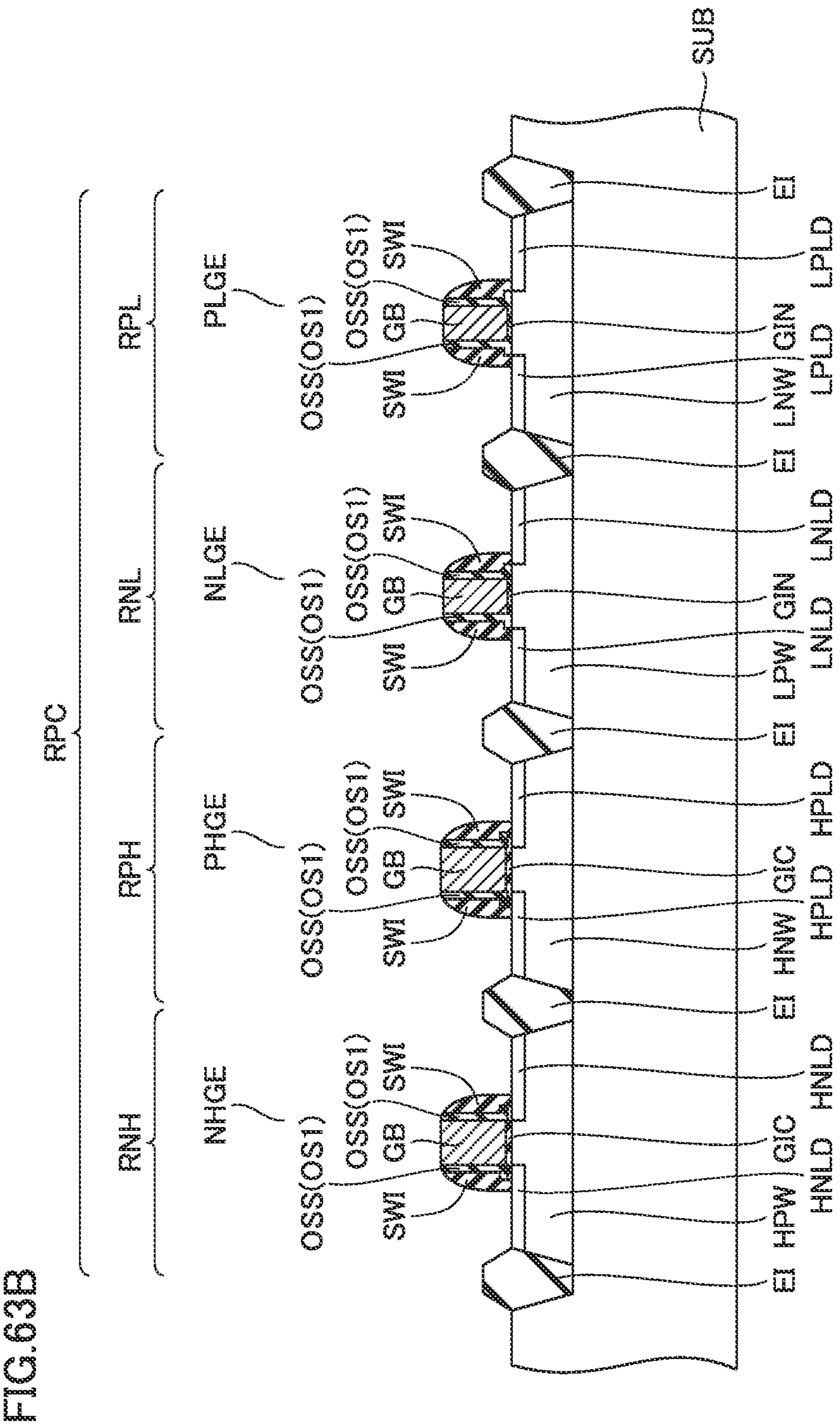

Next, insulating film SWF which is to be a sidewall insulating film, made of a silicon nitride film, is formed to cover gate electrodes GB and offset spacer films OSS, as shown in FIG. 62A and FIG. 62B. Next, by performing anisotropic etching treatment on insulating film SWF, sidewall insulating films SWI with a single-layer structure made of a silicon nitride film are formed, as shown in FIG. 63A and FIG. 63B.

Figure 64A:
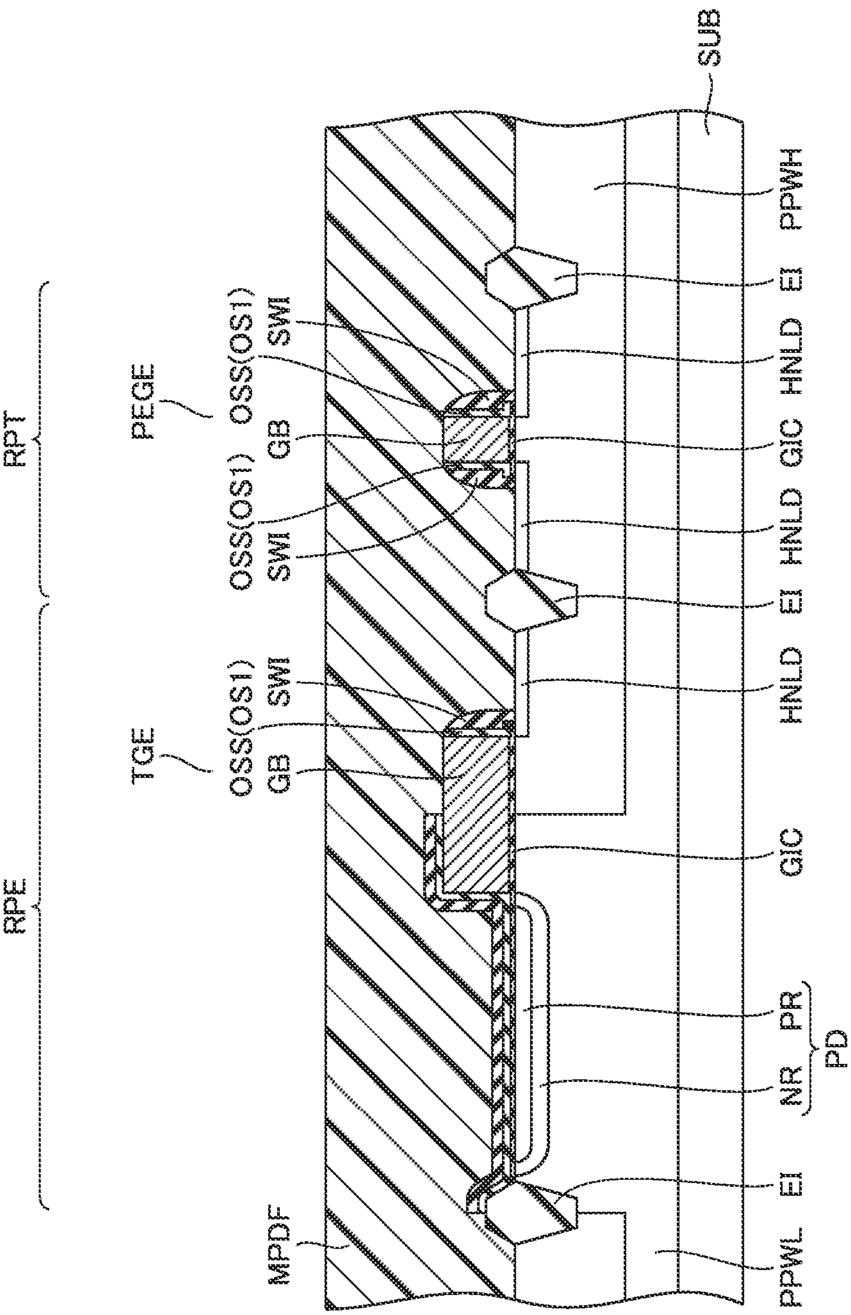
Figure 64B:
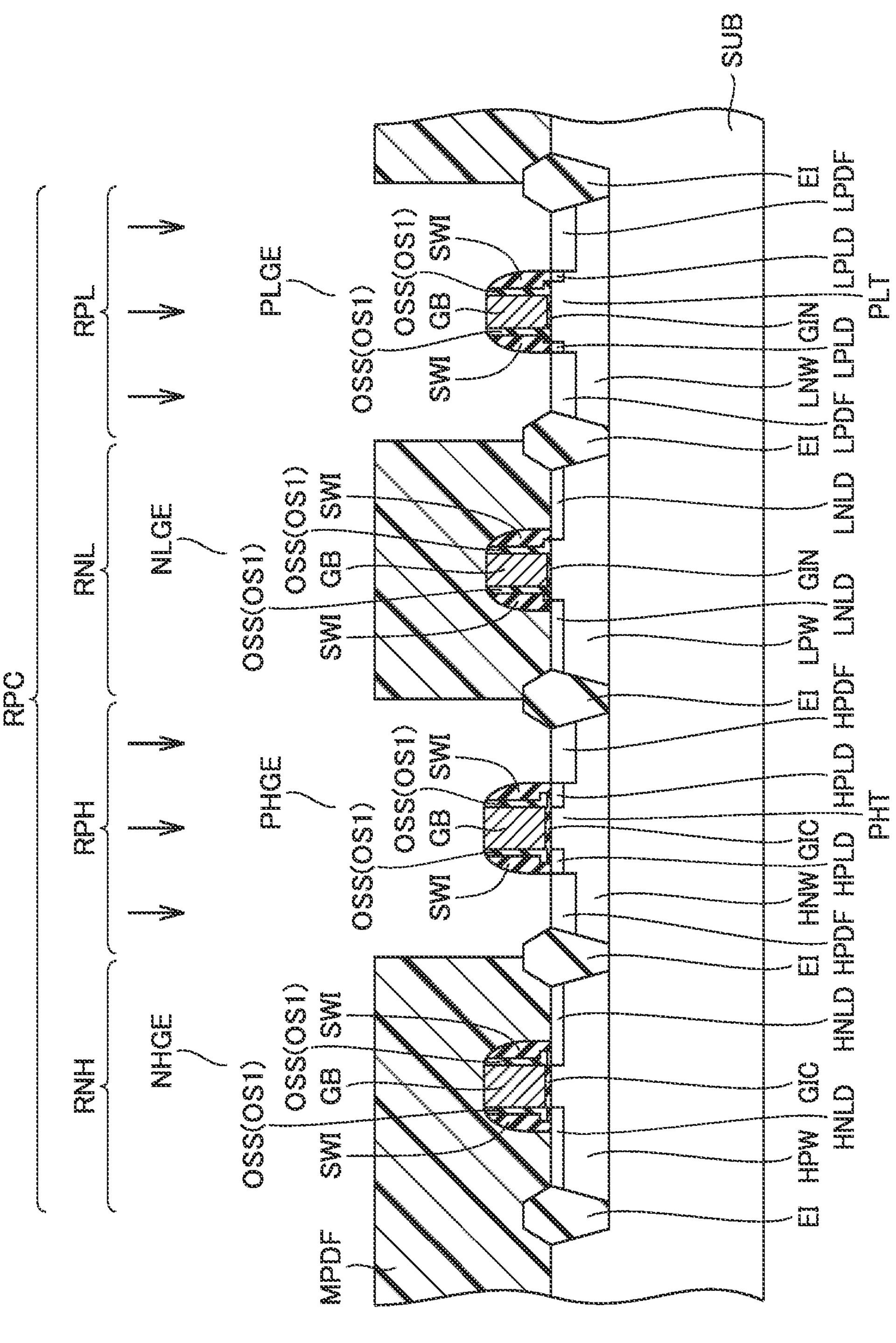

Next, by implanting a p-type impurity using resist pattern MPDF and gate electrode portions PHGE, PLGE as an implantation mask, source/drain regions HPDF are formed in region RPH, and source/drain regions LPDF are formed in region RPL, as shown in FIG. 64A and FIG. 64B. Thereafter, resist pattern MPDF is removed.

Figure 65A:
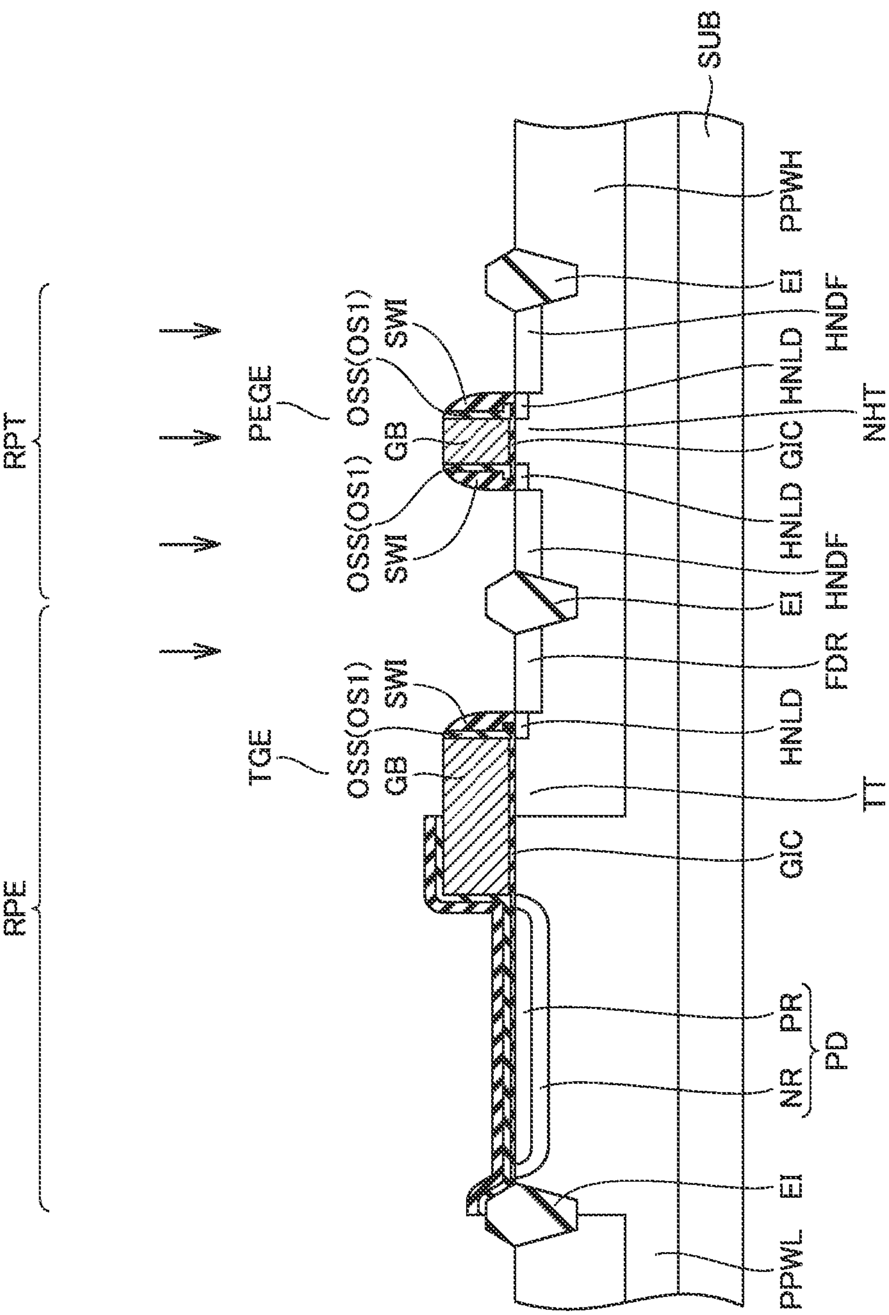
Figure 65B:
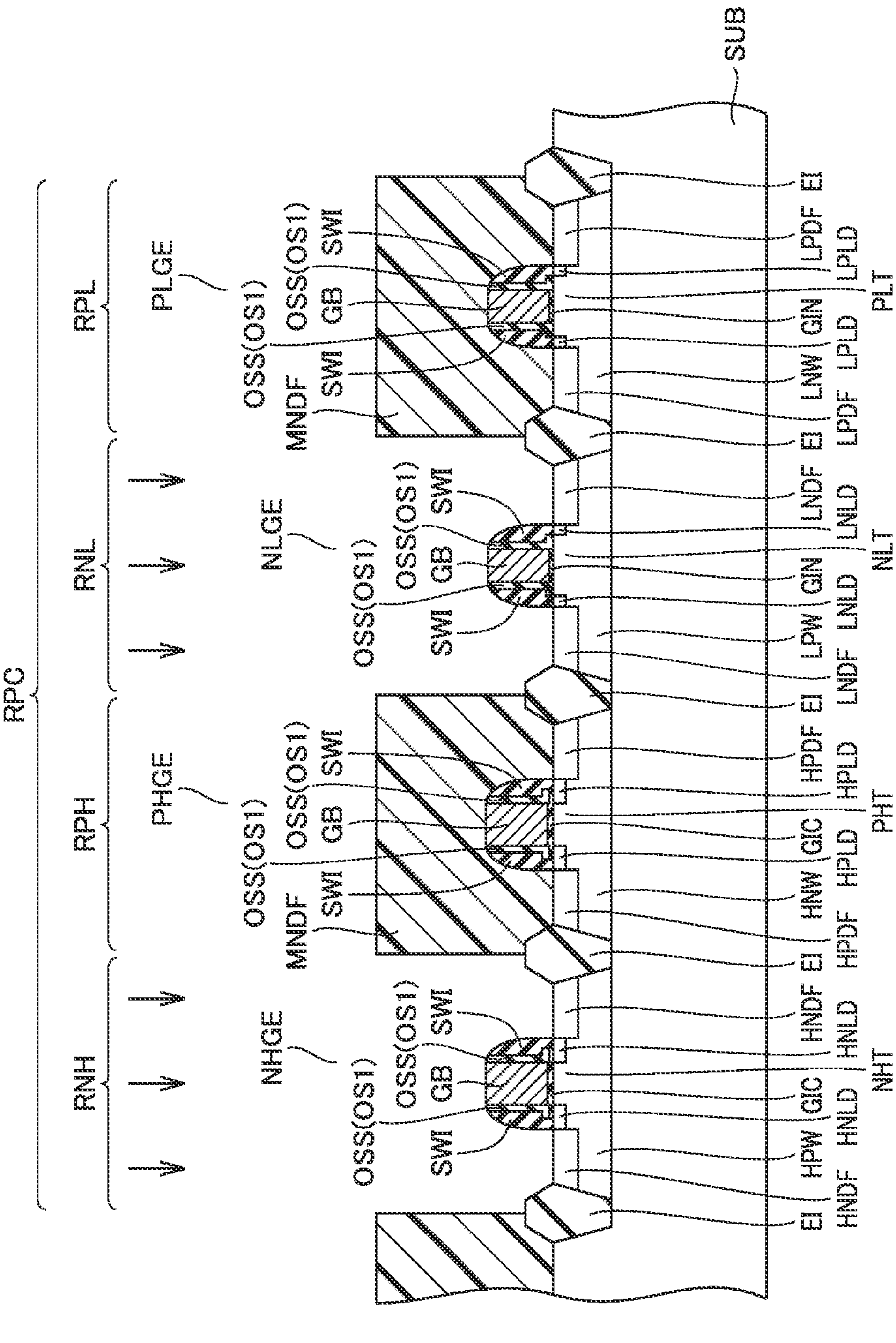

Next, by implanting an n-type impurity using resist pattern MNDF and gate electrode portions TGE, PEGE, NHGE, NLGE as an implantation mask, as shown in FIG. 65A and FIG. 65B, source/drain regions HNDF are formed in each of pixel transistor region RPT and region RNH. Source/drain regions LNDF are formed in region RNL. Floating diffusion region FDR is formed in pixel region RPE. Thereafter, resist pattern MNDF is removed.

Figure 66A:
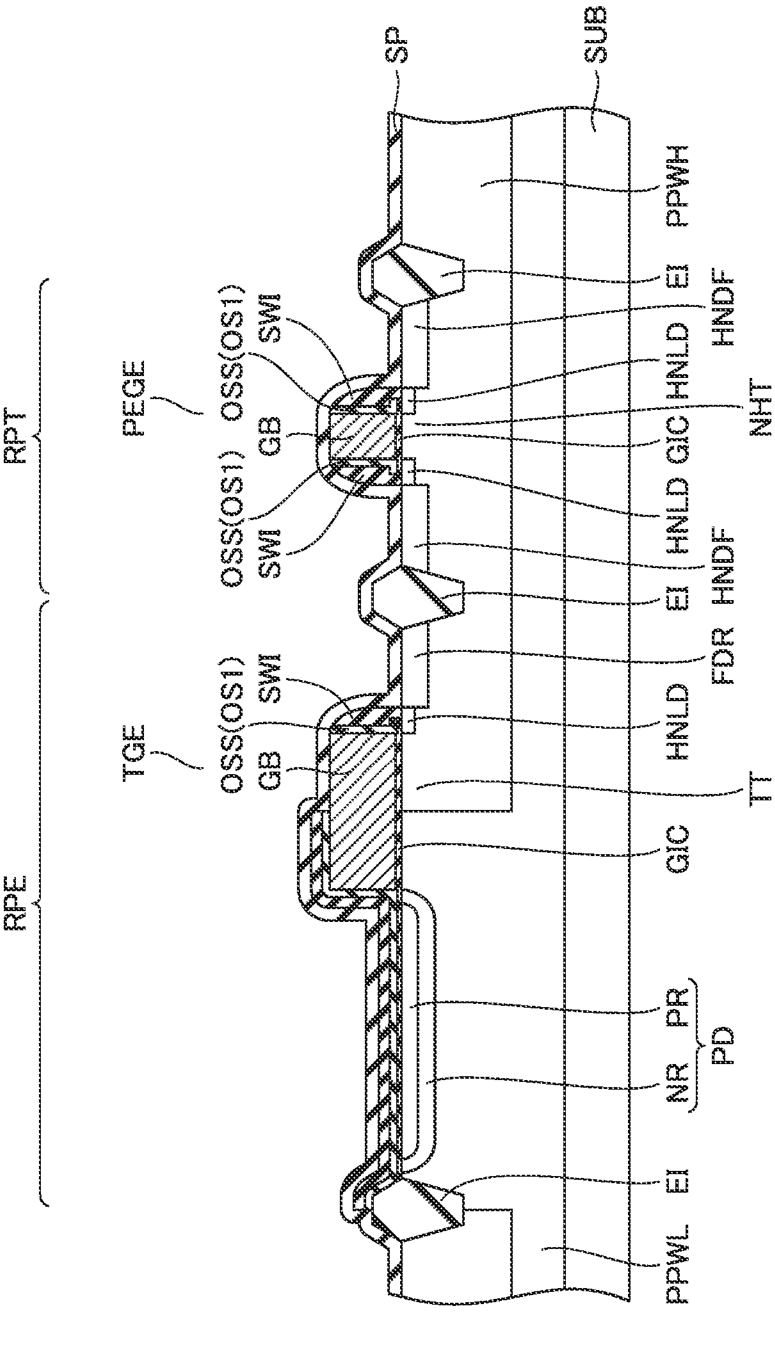
Figure 66B:
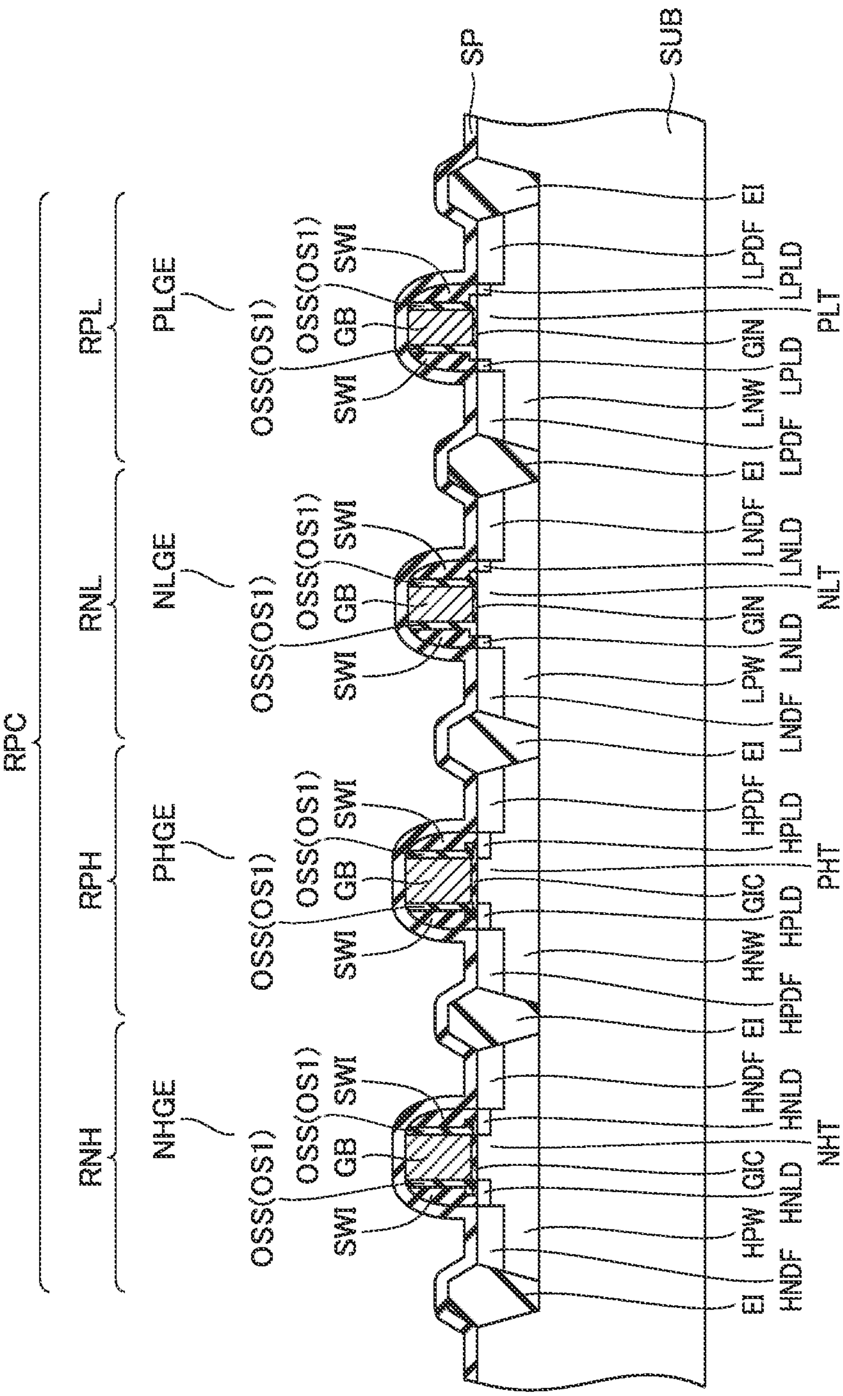

Next, silicide protection film SP is formed to cover gate electrode portions TGE, PEGE, NHGE, PHGE, NLGE, PLGE, and the like, as shown in FIG. 66A and FIG. 66B. Thereafter, with a portion of the silicide protection film covering a field effect transistor (not shown) in which no metal silicide film is to be formed being left, the silicide protection film located in other regions is removed.

Figure 67A:
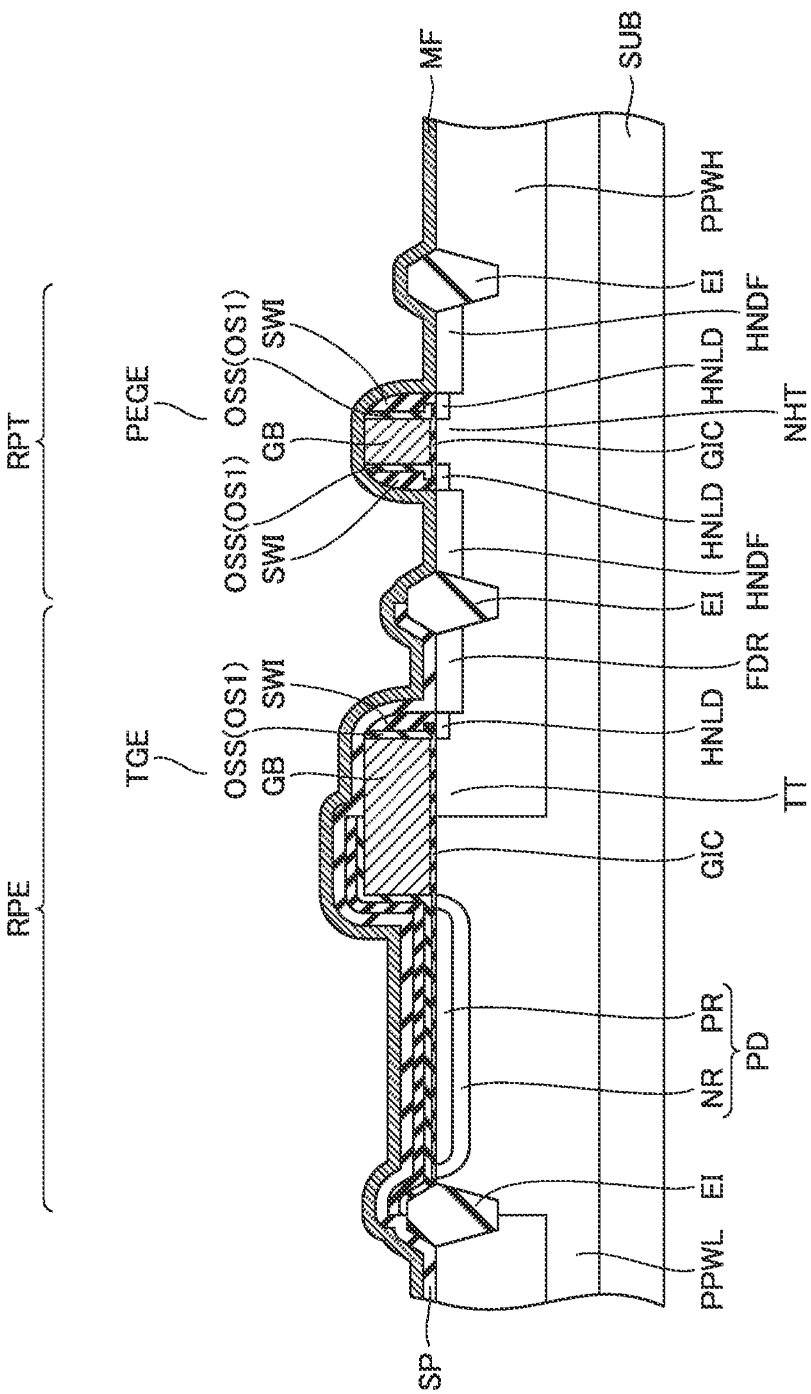
Figure 67B:
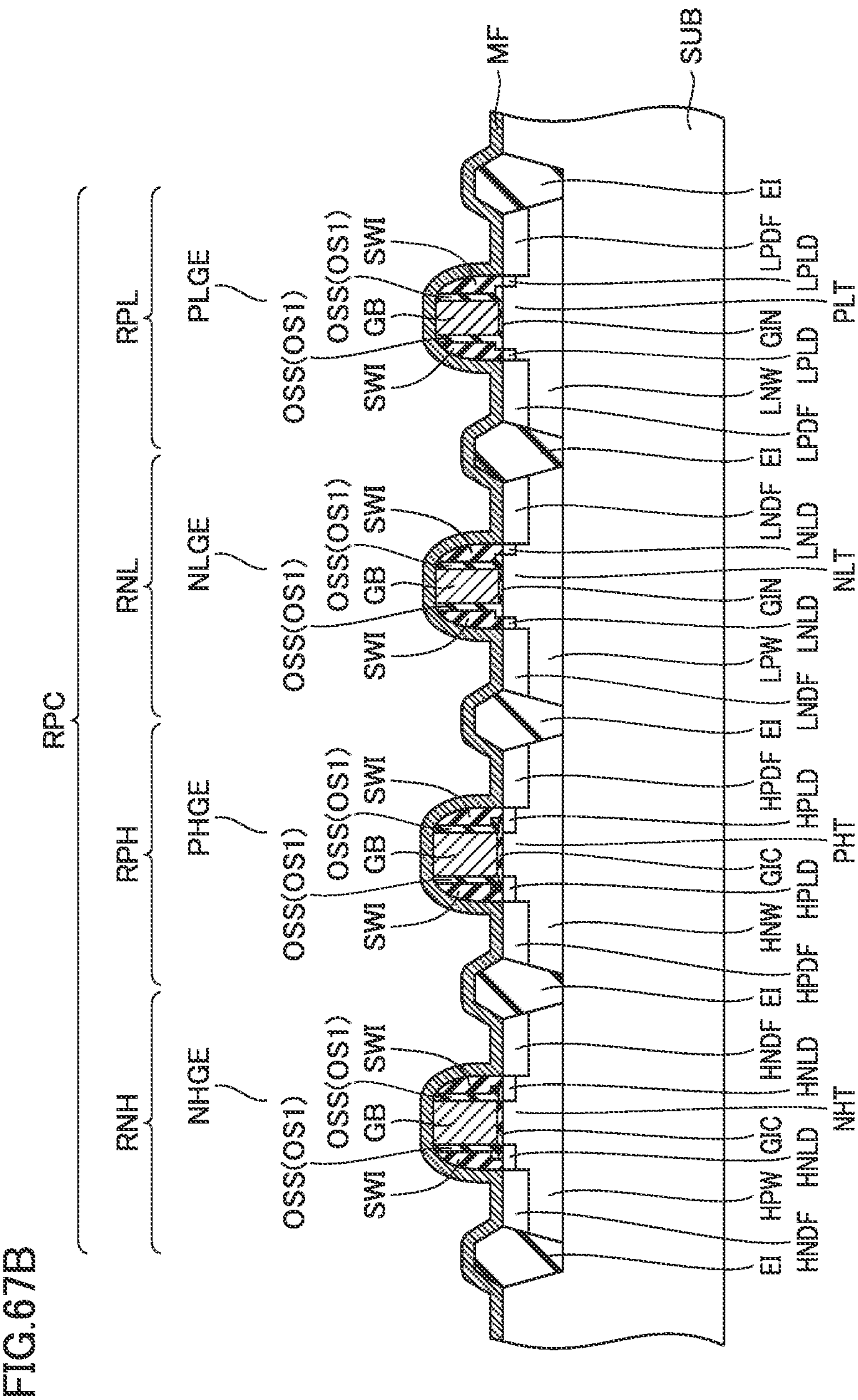

Next, predetermined metal film MF is formed to cover gate electrode portions TGE, PEGE, NHGE, PHGE, NLGE, PLGE, as shown in FIG. 67A and FIG. 67B. Next, by performing predetermined heat treatment to cause metal film MF to react with silicon, and then removing unreacted metal, metal silicide films MS are formed as shown in FIG. 68A and FIG. 68B.

Next, after the step identical to that shown in FIG. 23A and FIG. 23B and the step identical to that shown in FIG. 24A and FIG. 24B are performed, the main part of the imaging apparatus is completed as shown in FIG. 69A and FIG. 69B. Silicon oxide film OS1 of offset spacer film OSS in the imaging apparatus has a portion which covers the sidewall surface of gate electrode GB (a first portion), and a portion which extends from the first portion to a side opposite to a side on which gate electrode GB is located (a second portion). Sidewall insulating film SWI with a single-layer structure made of a silicon nitride film is formed to cover an end surface (thickness direction) of the second portion of silicon oxide film OS1.

In the imaging apparatus described above, as with the imaging apparatus described in the second embodiment, offset spacer film OSS with a double-layer structure including silicon oxide film OS1 as a lower-layer film and silicon nitride film OS2 as an upper-layer film is formed as an offset spacer film, and before the step of forming the sidewall insulating film, silicon nitride film OS2 is removed with silicon oxide film OS1 being left. Before silicon nitride film OS2 is removed, quenching heat treatment after formation of insulating film OSF which is to be the offset spacer film is performed.

Thereby, as described in the first embodiment, nitrogen (N) or hydrogen (H) is diffused and a portion thereof is bonded to unpaired bonding hands of silicon, and thus dangling bonds of silicon can be terminated, which can reduce read-out noise due to the dangling bonds. As a result, this can prevent loss of image sharpness, contrast, a feeling of depth of color, and the like in the imaging apparatus. Further, this allows miniaturization of the imaging apparatus.

Further, as with the imaging apparatus described in the third embodiment, sidewall insulating film SWI with a single-layer structure made of a silicon nitride film is formed as a sidewall insulating film. Therefore, even if sidewall insulating film SWI is exposed to chemical solutions such as hydrofluoric acid, sidewall insulating film SWI is hardly etched and hardly recedes (see FIG. 60B). Moreover, no metal silicide film is formed in pixel region RPE (see FIG. 60C and FIG. 60D). Thereby, the substantial length of floating diffusion region FDR in the channel length direction can be ensured, and FD leak (GIDL) can be suppressed.

Further, at field effect transistor NHT in pixel transistor region RPT, metal silicide film MS is not formed to extend under sidewall insulating film SWI, and metal silicide film MS is formed in a region which is not covered with sidewall insulating film SWI (see FIG. 60E). Thereby, deterioration of the S/N ratio of field effect transistor NHT can be suppressed.

It should be noted that, although a silicon nitride film has been described in each of the imaging apparatuses described above as an example of a predetermined film containing at least one of nitrogen (N) and hydrogen (H) as an element for terminating dangling bonds of silicon, the predetermined film is not limited to a silicon nitride film as long as it allows at least one of nitrogen (N) and hydrogen (H) to be bonded to the dangling bonds. Further, the element is not limited to nitrogen (N) or hydrogen (H) as long as it can terminate the dangling bonds of silicon.

Further, in each of the third embodiment and the fourth embodiment, the imaging apparatus which can achieve a reduction in FD leak as well as termination of dangling bonds has been described. An imaging apparatus intended to reduce FD leak only needs to include a configuration as described below.

The imaging apparatus has a plurality of device formation regions defined by a trench isolation insulating film in a main surface of a semiconductor substrate, and a semiconductor device formed in each of the plurality of device formation regions. The semiconductor device includes a photoelectric conversion portion, and a transfer transistor having a transistor gate electrode portion, which transfers a charge generated in the photoelectric conversion portion. The transfer gate electrode portion includes a transfer gate electrode formed to traverse a predetermined device formation region of the plurality of device formation regions, and a sidewall insulating film formed on a sidewall surface of the transfer gate electrode. The photoelectric conversion portion is formed in a portion of the predetermined device formation region located on one side, and a floating diffusion region is formed in a portion of the predetermined device formation region located on the other side, with respect to the transfer gate electrode portion. As the sidewall insulating film of the transfer gate electrode portion, a single-layer sidewall insulating film made of a silicon nitride film is formed.

Further, a method for manufacturing an imaging apparatus intended to reduce FD leak only needs to include the steps as described below.

The method includes the steps of: forming trenches in a semiconductor substrate; defining a plurality of device formation regions by forming a device isolation insulating film in the trenches; and forming a semiconductor device in each of the plurality of device formation regions. The step of forming the semiconductor device includes the steps of forming a photoelectric conversion portion, and forming a transfer transistor having a transfer gate electrode portion, which transfers a charge generated in the photoelectric conversion portion. The step of forming the transfer gate electrode portion of the transfer transistor includes the steps of forming a transfer gate electrode to traverse a predetermined device formation region of the plurality of device formation regions, and forming a sidewall insulating film on a sidewall surface of the transfer gate electrode. The photoelectric conversion portion is formed in a portion of the predetermined device formation region located on one side, and a floating diffusion region is formed in a portion of the predetermined device formation region located on the other side, with respect to the transfer gate electrode portion. A metal silicide film is formed in a portion of a surface of the semiconductor substrate other than a portion covered with the sidewall insulating film. In the step of forming the sidewall insulating film, a single-layer sidewall insulating film made of a silicon nitride film is formed.

Although the invention made by the present inventor has been specifically described based on the embodiments, it is needless to say that the present invention is not limited to the embodiments described above, and can be modified in various manners within a range not departing from the gist thereof.

REFERENCE SIGNS LIST

PE: pixel; PD: photodiode; CS: column selection circuit; RS: row selection/read-out circuit; TT: transfer transistor; TGE: gate electrode portion; FDR: floating diffusion region; RT: reset transistor; RGE: gate electrode portion; AT: amplification transistor; AGE: gate electrode portion; ST: selection transistor; SGE: gate electrode portion; PEGE: gate electrode portion; SUB: semiconductor substrate; TOF: silicon oxide film; TNF: silicon nitride film; TRC: trench; EIF: insulating film; EI: device isolation insulating film; RPE: pixel region; RPT: pixel transistor region; RPC: peripheral region; RNH, RPH, RNL, RPL: region; NHT, PHT, NLT, PLT: field effect transistor; GIC, GIN: gate insulating film; GB: gate electrode; PPWL, PPWH: P well; HPW: P well; HNW: N well; LPW: P well; LNW: N well; OSF1, OS1: silicon oxide film; OSF2, OS2: silicon nitride film; OSF: film to be an offset spacer film; OSS: offset spacer film; SWF1, SW1: silicon oxide film; SWF2, SW2: silicon nitride film; SWF: film to be a sidewall insulating film; SWI: sidewall insulating film; PEGE, NHGE, PHGE, NLGE, PLGE: gate electrode portion; HNLD, HPLD: extension region; LNLD, LPLD: extension region; HPDF, LPDF, HNDF, LNDF: source/drain region; SP: silicide protection film; MF: metal film; MS: metal silicide film; SL: stress liner film; IF1: first interlayer insulating film; CH: contact hole; CP: contact plug; M1: first wire; IF2: second interlayer insulating film; V1: first via; M2: second wire; IF3: third interlayer insulating film; V2: second via; M3: third wire; IF4: fourth interlayer insulating film; SNI: insulating film; CF: color filter; ML: micro lens; MHNL, MHPL, MLNL, MLPL, MPDF, MNDF: resist pattern.

The invention claimed is:

1. A method for manufacturing an imaging apparatus, comprising the steps of:

forming trenches in a semiconductor substrate;

defining a plurality of device formation regions by forming a device isolation insulating film in said trenches; and forming a semiconductor device in each of said plurality of device formation regions, the step of forming said semiconductor device including the steps of forming a photoelectric conversion portion, and forming a transistor having a gate electrode portion, which processes a charge generated in said photoelectric conversion portion as a signal, the step of forming said gate electrode portion of said transistor including the steps of forming a gate electrode to traverse a predetermined device formation region of said plurality of device formation regions, in a manner to cover a boundary between said predetermined device formation region and said device isolation insulating film, forming a film which is to be an offset spacer film having a first insulating film as a lower-layer film and a predetermined film different from said first insulating film as an upper-layer film, to cover said gate electrode, forming the offset spacer film including at least said first insulating film, on a sidewall surface of said gate electrode, by working the film which is to be said offset spacer film, and forming a sidewall insulating film on said sidewall surface of said gate electrode, with said offset spacer film being interposed therebetween, wherein in the step of forming the film which is to be said offset spacer film, a film containing at least one of nitrogen (N) and hydrogen (H) is formed as said predetermined film, in the step of forming said offset spacer film, said first insulating film is worked to leave a first portion which covers said sidewall surface of said gate electrode, and a second portion which extends from a lower end portion of said first portion to a side opposite to a side on which said gate electrode is located, and covers a surface of said predetermined device formation region, and in the step of forming said sidewall insulating film, said sidewall insulating film is formed to cover an end surface of said second portion of said first insulating film.

2. The method for manufacturing the imaging apparatus according to claim 1, wherein, in the step of forming the film which is to be said offset spacer film, a first silicon nitride film is formed as said predetermined film.

3. The method for manufacturing the imaging apparatus according to claim 2, wherein, in the step of forming said offset spacer film, said first silicon nitride film is formed such that said first portion is interposed between said first silicon nitride film and said sidewall surface of said gate electrode, and said second portion is interposed between said first silicon nitride film and said predetermined device formation region.

4. The method for manufacturing the imaging apparatus according to claim 1, comprising the step of removing said predetermined film, with said first insulating film being left, in said offset spacer film, before the step of forming said sidewall insulating film.

5. The method for manufacturing the imaging apparatus according to claim 1, wherein the step of forming said transistor includes the step of forming an amplification transistor which amplifies said signal, in a first device formation region as said predetermined device formation region.

6. The method for manufacturing the imaging apparatus according to claim 1, wherein the step of forming said gate electrode portion includes the step of forming a single-layer sidewall insulating film made of a second silicon nitride film, as said sidewall insulating film, and the step of forming said transistor includes the step of forming a metal silicide film in a portion of a surface of said semiconductor substrate other than a portion covered with said sidewall insulating film.

7. An imaging apparatus, comprising:

a plurality of device formation regions defined by a trench isolation insulating film in a main surface of a semiconductor substrate; and a semiconductor device formed in each of said plurality of device formation regions, said semiconductor device including a photoelectric conversion portion, and a transistor having a gate electrode portion, which processes a charge generated in said photoelectric conversion portion as a signal, said gate electrode portion including a gate electrode formed to traverse a predetermined device formation region of said plurality of device formation regions, in a manner to cover a boundary between said predetermined device formation region and said trench isolation insulating film, an offset spacer film formed on a sidewall surface of said gate electrode and having at least a first insulating film, and a sidewall insulating film formed on said sidewall surface of said gate electrode, with said offset spacer film being interposed therebetween, wherein said first insulating film of said offset spacer film includes a first portion which covers said sidewall surface of said gate electrode, and a second portion which extends from a lower end portion of said first portion to a side opposite to a side on which said gate electrode is located, and covers a surface of said predetermined device formation region, and said sidewall insulating film is formed to cover an end surface of said second portion of said first insulating film.

8. The imaging apparatus according to claim 7, wherein said transistor includes an amplification transistor which amplifies said signal, formed in a first device formation region as said predetermined device formation region.

9. The imaging apparatus according to claim 7, wherein said offset spacer film includes a predetermined film containing at least one of nitrogen (N) and hydrogen (H), and said predetermined film is formed on said first insulating film such that said first portion is interposed between said predetermined film and said sidewall surface of said gate electrode, and said second portion is interposed between said predetermined film and said semiconductor substrate.

10. The imaging apparatus according to claim 9, wherein said predetermined film includes a first silicon nitride film.

11. The imaging apparatus according to claim 7, wherein said offset spacer film is a single-layer offset spacer film made of said first insulating film.

12. The imaging apparatus according to claim 7, wherein a single-layer sidewall insulating film made of a second silicon nitride film is formed as said sidewall insulating film of said gate electrode portion, and a metal silicide film is formed in a portion of the main surface of said semiconductor substrate other than a portion covered with said sidewall insulating film.

* * * * *